US010666385B2

(12) United States Patent
Ouchi et al.

(10) Patent No.: US 10,666,385 B2
(45) Date of Patent: May 26, 2020

(54) TRANSMISSION DEVICE, TRANSMISSION METHOD, RECEPTION DEVICE, RECEPTION METHOD, INTEGRATED CIRCUIT, AND PROGRAM

(71) Applicant: Panasonic Corporation, Osaka (JP)

(72) Inventors: Mikihiro Ouchi, Osaka (JP); Noritaka Iguchi, Osaka (JP); Tomohiro Kimura, Osaka (JP)

(73) Assignee: SUN PATENT TRUST, New York, NY (US)

( * ) Notice: Subject to any disclaimer, the term of this patent is extended or adjusted under 35 U.S.C. 154(b) by 313 days.

(21) Appl. No.: 14/980,511

(22) Filed: Dec. 28, 2015

(65) Prior Publication Data

US 2016/0119081 A1    Apr. 28, 2016

Related U.S. Application Data

(63) Continuation of application No. 14/376,946, filed as application No. PCT/JP2013/007175 on Dec. 6, 2013, now Pat. No. 9,258,083.

(30) Foreign Application Priority Data

Dec. 7, 2012 (JP) ................................ 2012-268864
Apr. 9, 2013 (JP) ................................ 2013-081217

(51) Int. Cl.
*H04L 1/00* (2006.01)
*H04B 7/06* (2006.01)
(Continued)

(52) U.S. Cl.
CPC ...... *H04L 1/0041* (2013.01); *H03M 13/6541* (2013.01); *H04B 7/0413* (2013.01); *H04B 7/068* (2013.01); *H04L 1/0057* (2013.01)

(58) Field of Classification Search
CPC ............... H04L 27/2602; H04L 5/0048; H04L 27/2601; H04L 5/0007; H04L 27/2647
See application file for complete search history.

(56) References Cited

U.S. PATENT DOCUMENTS 5,150,113 A * 9/1992 Bluthgen ............... G09B 5/065
340/12.55
5,173,901 A    12/1992 DeSomer
(Continued)

FOREIGN PATENT DOCUMENTS

JP        7-183862        7/1995
JP      2005-260342       9/2005
(Continued)

OTHER PUBLICATIONS

International Search Report dated Feb. 4, 2014 in International Application No. PCT/JP2013/007175.
(Continued)

*Primary Examiner* — Shuwang Liu
*Assistant Examiner* — Gina M McKie
(74) *Attorney, Agent, or Firm* — Wenderoth, Lind & Ponack, L.L.P.

(57) ABSTRACT

A transmission device that performs multiple-input multiple-output (MIMO) transmission of transmit data using a plurality of fundamental bands. The transmission device includes an error correction coding unit, a mapping unit, and a MIMO coding unit. The error correction coding unit, for each data block of predefined length, performs error correction coding and thereby generates an error correction coded frame. The mapping unit maps each predefined number of bits in the error correction coded frame to a corresponding symbol and thereby generates an error correction coded block. The MIMO coding unit performs MIMO coding with respect to the error correction coded block. Components of data included in the error correction coded block are allo- (Continued)

cated to at least two of the fundamental bands and transmitted.

5 Claims, 78 Drawing Sheets

(51) Int. Cl.
*H04B 7/0413* (2017.01)
*H03M 13/00* (2006.01)

(56) References Cited

U.S. PATENT DOCUMENTS

| | | | |
|---|---|---|---|
| 6,440,780 B1* | 8/2002 | Kimura | G06F 17/505 438/129 |
| 8,054,903 B2 | 11/2011 | Chang et al. | |
| 2005/0128966 A1* | 6/2005 | Yee | H04B 7/0669 370/310 |
| 2005/0276245 A1* | 12/2005 | Hidaka | H04L 1/0009 370/328 |
| 2006/0205357 A1* | 9/2006 | Kim | H04B 7/04 455/69 |
| 2007/0064687 A1* | 3/2007 | Nakao | H04B 7/0413 370/358 |
| 2008/0080631 A1 | 4/2008 | Forenza et al. | |
| 2009/0213955 A1 | 8/2009 | Higuchi et al. | |
| 2009/0316807 A1* | 12/2009 | Kim | H04B 7/061 375/260 |
| 2010/0002644 A1* | 1/2010 | Choi | H04L 1/0015 370/329 |
| 2010/0067465 A1 | 3/2010 | Miki et al. | |
| 2010/0135428 A1 | 6/2010 | Yuda et al. | |
| 2010/0189191 A1 | 7/2010 | Taoka et al. | |
| 2011/0069778 A1 | 3/2011 | Kim | |
| 2011/0207222 A1 | 8/2011 | Mehta et al. | |
| 2011/0307766 A1 | 12/2011 | Picchi | |
| 2012/0202504 A1* | 8/2012 | Wegmann | H04W 16/08 455/438 |
| 2013/0142278 A1 | 6/2013 | Taoka et al. | |
| 2013/0272448 A1 | 10/2013 | Moon et al. | |
| 2016/0049998 A1 | 2/2016 | Choi et al. | |

FOREIGN PATENT DOCUMENTS

| | | |
|---|---|---|
| JP | 2006-186805 | 7/2006 |
| JP | 2007-28569 | 2/2007 |
| JP | 2008-167347 | 7/2008 |
| JP | 2008-526081 | 7/2008 |
| JP | 2010-124259 | 6/2010 |
| JP | 2010-147630 | 7/2010 |
| JP | 2010-246067 | 10/2010 |
| JP | 2012-049740 | 3/2012 |
| WO | 2006/068344 | 6/2006 |
| WO | 2008/018468 | 2/2008 |
| WO | 2008/156081 | 12/2008 |
| WO | 2011/123458 | 10/2011 |

OTHER PUBLICATIONS

Digital Video Broadcasting (DVB); Next Generation broadcasting system to Handheld, physical layer specification (DVB-NGH), DVB Document A160, 2012.11.
ETSI EN 302 755 V1.3.1 (Apr. 2012): Frame structure channel coding and modulation for a second generation digital terrestrial television broadcasting system (DVB-T2).
ETSI TS 102 831 V1.2.1 (Aug. 2012): Implementation guidelines for a second generation digital terrestrial television broadcasting system (DVB-T2).
Next Generation broadcasting system to Handheld, physical layer specification (DVB-NGH) (Draft ETSI EN 303 105 V1.1.1 Sep. 2012).
Arib Standard Arib Std-B31 Version 2.1(Dec. 2012): Transmission System for Digital Terrestrial Television Broadcasting (with English translation).
"BER Performance Evaluation in 2×2 MIMO Spatial Multiplexing Systems under Rician Fading Channels," IEICE Trans. Fundamentals, vol. E91-A, No. 10, pp. 2798-2807, Oct. 2008.
Extended European Search Report dated Sep. 28, 2015 in corresponding Application No. 13860110.9.
Office Action dated Sep. 3, 2019 in U.S. Appl. No. 16/281,270.
Office Action dated Aug. 2, 2019 in U.S. Appl. No. 16/297,988.
Transmission Performance of Dual-polarized MIMO, Ultra-multilevel OFDM in Multipath Environment (with English Abstract), Nov. 2012.
Notice of Allowance dated Feb. 7, 2020 in U.S. Appl. No. 16/281,270.
Notice of Allowance dated Feb. 5, 2020 in U.S. Appl. No. 16/297,988.

* cited by examiner

FIG.60

(a) Carrier modulation mapping scheme in ISDB-T scheme

| $B_{28}-B_{30}$ / $B_{41}-B_{43}$ / $B_{54}-B_{56}$<br>$B_{68}-B_{70}$ / $B_{81}-B_{83}$ / $B_{94}-B_{96}$ | Meaning |
|---|---|
| 000 | DQPSK |
| 001 | QPSK |
| 010 | 16QAM |
| 011 | 64QAM |
| 100 | Undefined |
| 101 | Undefined |
| 110 | Undefined |
| 111 | Unused hierarchical layer |

(b) Carrier modulation mapping scheme in embodiment 9

| $B_{28}-B_{30}$ / $B_{41}-B_{43}$ / $B_{54}-B_{56}$<br>$B_{68}-B_{70}$ / $B_{81}-B_{83}$ / $B_{94}-B_{96}$ | Meaning |
|---|---|
| 000 | DQPSK |
| 001 | QPSK |
| 010 | 16QAM |
| 011 | 64QAM |
| 100 | MISO |
| 101 | MIMO |
| 110 | Undefined |
| 111 | Unused hierarchical layer |

(c) $B_{110}-B_{121}$ in ISDB-T scheme

| $B_{110}-B_{121}$ | Meaning |
|---|---|
| (All "1") | Undefined |

(d) $B_{110}-B_{121}$ in embodiment 9

| $B_{110}-B_{112}$ | Meaning |
|---|---|
| 000 | QPSK (MISO/MIMO) |
| 001 | 16QAM (MISO/MIMO) |
| 010 | 64QAM (MISO/MIMO) |
| 011-111 | Undefined |

| $B_{113}-B_{121}$ | Meaning |
|---|---|
| (All "1") | Undefined |

(e) Segment format identification in ISDB-T scheme

| $B_{17}-B_{19}$ | Meaning |
|---|---|
| 000 | Coherent modulation portion |
| 111 | Differential modulation portion |

(f) Segment format identification in embodiment 9

| $B_{17}-B_{19}$ | Meaning |
|---|---|
| 000 | Coherent modulation portion or MISO/MIMO Coherent modulation portion |
| 111 | Differential modulation portion or MISO/MIMO Coherent modulation portion |

FIG.68

(a) Convolution coding rate in ISDB-T scheme

| $B_{31}$–$B_{33}$ / $B_{44}$–$B_{46}$ / $B_{57}$–$B_{59}$ $B_{71}$–$B_{73}$ / $B_{84}$–$B_{86}$ / $B_{97}$–$B_{99}$ | Meaning |
|---|---|
| 000 | 1/2 |
| 001 | 2/3 |
| 010 | 3/4 |
| 011 | 5/6 |
| 100 | 7/8 |
| 101 | Undefined |
| 110 | Undefined |
| 111 | Unused hierarchical layer |

(b) Convolution coding rate in embodiment 10

| $B_{31}$–$B_{33}$ / $B_{44}$–$B_{46}$ / $B_{57}$–$B_{59}$ $B_{71}$–$B_{73}$ / $B_{84}$–$B_{86}$ / $B_{97}$–$B_{99}$ | Meaning |
|---|---|
| 000 | 1/2 |
| 001 | 2/3 |
| 010 | 3/4 |
| 011 | 5/6 |
| 100 | 7/8 |
| 101 | LDPC coding |
| 110 | Undefined |
| 111 | Unused hierarchical layer |

(c) $B_{110}$–$B_{121}$ in embodiment 10

| $B_{110}$–$B_{112}$ | Meaning |
|---|---|
| 000 | QPSK (MISO/MIMO) |
| 001 | 16QAM (MISO/MIMO) |
| 010 | 64QAM (MISO/MIMO) |
| 011–111 | Undefined |

| $B_{113}$–$B_{115}$ | Meaning |
|---|---|
| 000 | 1/2 (LDPC coding rate) |
| 001 | 2/3 (LDPC coding rate) |
| 010 | 3/4 (LDPC coding rate) |
| 011 | 5/6 (LDPC coding rate) |
| 100 | 7/8 (LDPC coding rate) |
| 101–111 | Undefined |

| $B_{116}$–$B_{121}$ | Meaning |
|---|---|
| (All "1") | Undefined |

TRANSMISSION DEVICE, TRANSMISSION METHOD, RECEPTION DEVICE, RECEPTION METHOD, INTEGRATED CIRCUIT, AND PROGRAM

TECHNICAL FIELD

The present invention relates to multiple-input multiple-output (MIMO) technology.

BACKGROUND ART

MIMO is conventional technology. MIMO is useful for large-capacity transmission. MIMO is characterized by parallel transmission/reception of multiple signals, by using multiple antennas to transmit and to receive. For example, MIMO has been adopted in the Digital Video Broadcasting Next Generation broadcasting system to Handheld (DVB-NGH) standard, which is a European transmission standard for handheld receiving apparatus (Non-Patent Literature 3).

CITATION LIST

Patent Literature

[Patent Literature 1]
Japanese Translation of PCT International Application Publication No. 2008/526081 (WO 2006/068344)

Non-Patent Literature

[Non-Patent Literature 1]
"Frame structure channel coding and modulation for a second generation digital terrestrial television broadcasting system (DVB-T2)," ETSI EN 302 755 V1.3.1, April 2012
[Non-Patent Literature 2]
"Implementation guidelines for a second generation digital terrestrial television broadcasting system (DVB-T2)," ETSI TS 102 831 V1.2.1, August 2012
[Non-Patent Literature 3]
"Next Generation broadcasting system to Handheld, physical layer specification (DVB-NGH) (Draft ETSI EN 303 105 V1.1.1)," DVB-TM document TM4701r3, September 2012
[Non-Patent Literature 4]
"Transmission system for digital terrestrial television broadcasting," ARIB standard ARIB STD-B31 Version 2.1, December 2012
[Non-Patent Literature 5]
"BER performance evaluation in 2×2 MIMO spatial multiplexing systems under Rician fading channels," IEICE Trans. Fundamentals, vol. E91-A, no. 10, pp. 2798-2807, October 2008

SUMMARY OF INVENTION

Technical Problem

Improvement in reception quality for MIMO is generally being sought. The present invention aims to provide a transmission device that improves reception quality for MIMO.

Solution to Problem

In order to achieve the above-described aims, a transmission device pertaining to an aspect of the present invention is a transmitter that performs multiple-input multiple-output (MIMO) transmission of transmit data using a plurality of fundamental bands, comprising: an error correction coding unit that, for each data block of predefined length, performs error correction coding and thereby generates an error correction coded frame; a mapping unit that maps each predefined number of bits in the error correction coded frame to a corresponding symbol and thereby generates an error correction coded block; and a MIMO coding unit that performs MIMO coding with respect to the error correction coded block, wherein components of data included in the error correction coded block are allocated to at least two of the fundamental bands and transmitted.

Advantageous Effects of Invention

According to the above-described transmission device, reception quality for MIMO is improved.

BRIEF DESCRIPTION OF DRAWINGS

FIG. 60 illustrates a portion of definitions of a transmission and multiplexing configuration control (TMCC) signal in embodiment 9.

FIG. 68 illustrates definitions of a TMCC signal related to LDPC coding in embodiment 10.

DESCRIPTION OF EMBODIMENTS

Embodiments and Consideration by Inventors (Part 1)

The Digital Video Broadcasting-Terrestrial (DVB-T) scheme, which is a transmission standard of digital terrestrial television broadcasting from Europe, is pushing forward the conversion from conventional television broadcasting to digital broadcasting not only in Europe, but also in many other countries. Also, with an aim of improving frequency usage efficiency, standardization of the DVB-Second Generation Terrestrial (DVB-T2) scheme began in 2006, and HDTV service using DVB-T2 broadcasting was started in the UK in 2009. Like DVB-T, DVB-T2 uses an orthogonal frequency division multiplexing (OFDM) scheme (Non-Patent Literature 1 and 2).

Also, standardization of the DVB-Next Generation broadcasting system to Handheld (DVB-NGH) scheme began in 2010, and a draft standard thereof was approved by the DVB-Technical Module (DVB-TM) group in September 2012 (Non-Patent Literature 3). DVB-NGH is the first digital television broadcasting standard to have adopted multiple-input multiple-output (MIMO).

Figure 53:
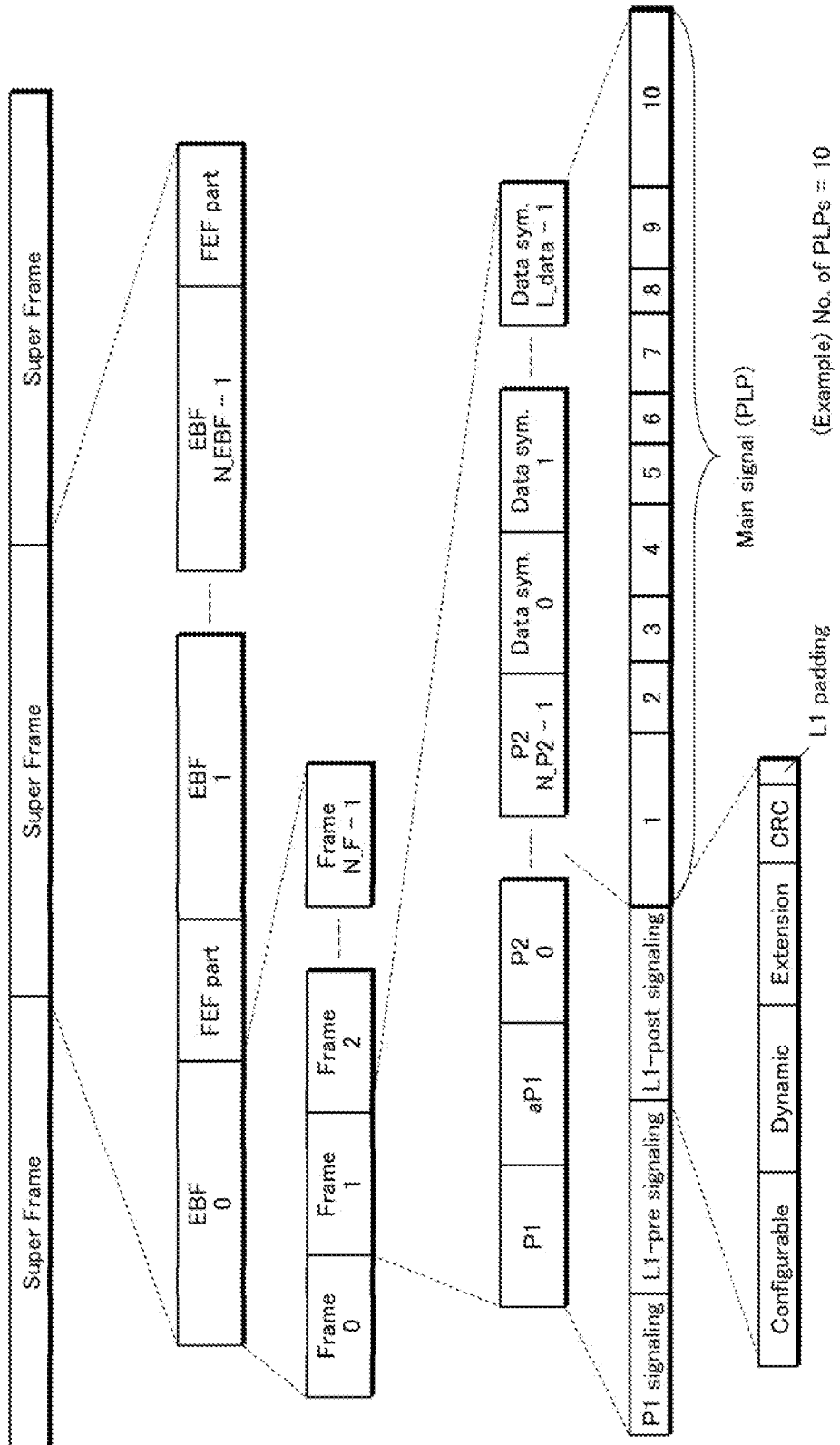
FIG. 53 illustrates a configuration of transmission frames of a DVB-NGH scheme.

FIG. 53 illustrates a configuration of frames of the DVB-NGH scheme. The DVB-NGH scheme uses a concept called physical layer pipes (PLPs). One feature of PLPs is that each PLP can have independently configured transmission parameters such as a modulation scheme and a coding rate. The number of PLPs is at least 1 and at most 255, and as an example, FIG. 53 illustrates a case in which there are 10 PLPs.

The following illustrates configurations of transmission frames.

Super frame=N_EBF elementary blocks of frames (N_EBF=2 to 255)
Elementary block of frames=N_F frame(s) (N_F=1 to 255)
Frame=P1 symbol+aP1 symbol+P2 symbol+data symbols
P1 symbol=1 symbol
aP1 symbol=0 to 1 symbol(s)
P2 symbol=N_P2 symbol(s) (N_P2 is unique, depending on fast Fourier transform (FFT) size)
Data symbols=L_data symbols (L_data is variable, and has a lower limit and an upper limit)

The P1 symbol is transmitted at an FFT size of 1 k and a guard interval (GI) of ½. The P1 symbol conveys, by 3 bits of S1, a format of the frame that starts from the P1 symbol (NGH_SISO, NGH_MISO, ESC (which indicates a format other than NGH_SISO or NGH_MISO), etc.).

Further, when the format of the frame is NGH_SISO or NGH_MISO, the P1 symbol conveys, by four bits of S2, information about FFT sizes, etc., of the one or more P2 symbol(s) and the data symbols following the P1 symbol. Further, when the format of the frame is ESC, which indicates a format other than NGH_SISO or NGH_MISO, the P1 symbol conveys, by four bits of S2, the format indicated by ESC (NGH_MIMO, etc.).

The aP1 symbol is only transmitted when ESC is conveyed by S1 in the P1 symbol. The aP1 symbol is transmitted at an FFT size of 1 k and a GI of ½, the same as the P1 symbol, but the generation method of the GI of the aP1 symbol is different from that of the GI of the P1 symbol. The aP1 symbol conveys, by 3 bits of S3, information about FFT sizes, etc., of the one or more P2 symbols and the data symbols following the aP1 symbol.

The first part of the one or more P2 symbols includes L1 signalling information, and the remaining part includes main signal data. The data symbols include continuation of the main signal data.

The L1 signalling information transmitted by the one or more P2 symbols is composed of L1-pre information that transmits primarily information common to all PLPs, and L1-post information that transmits primarily information to each PLP. In FIG. 53, a configuration of logical channel (LC) type A is illustrated, which transmits the L1-post information following the L1-pre information. Note that in LC type B, the L1-post information is not necessarily next in transmission order after L1-pre information.

Figure 54:
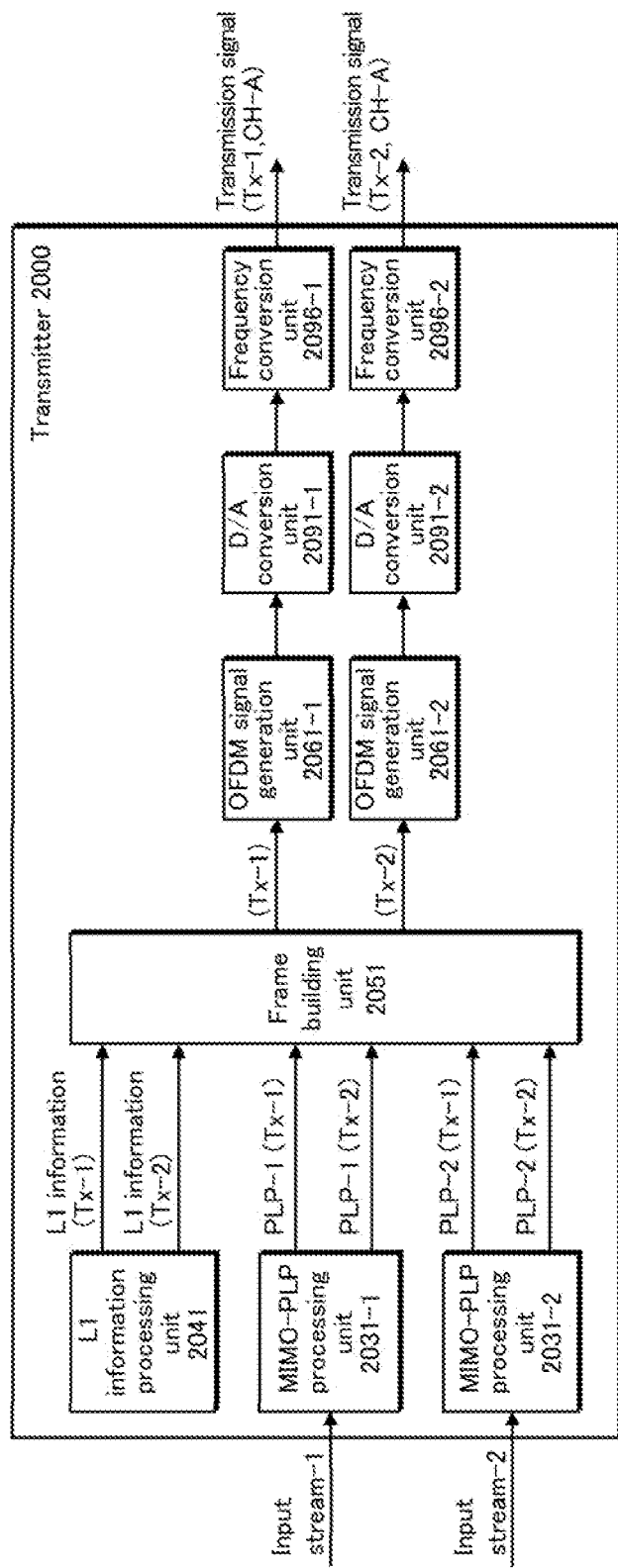
FIG. 54 illustrates a configuration of a transmitter 2000 in a MIMO profile of a conventional DVB-NGH scheme.

FIG. 54 illustrates a configuration of a transmitter 2000 in a MIMO profile of the DVB-NGH scheme (see Non-Patent Literature 3). The transmitter 2000 is an example in which two streams are inputted, i.e. a case in which two PLPs are generated, and the transmitter 2000 has a MIMO-PLP processing unit 2031 for each PLP. The transmitter 2000 further includes a layer-1 (L1) information processing unit 2041 and a frame building unit 2051. Furthermore, the transmitter 2000 has, for each transmit antenna, an OFDM signal generation unit 2061, a digital/analog (D/A) conversion unit 2091, and a frequency conversion unit 2096.

The following describes operations of the transmitter 2000. Each MIMO-PLP processing unit 2031 corresponds to a PLP, allocates an input stream to the PLP, performs processing related to the PLP, and outputs mapping data (cells) of the PLP for each of two transmit antennas (Tx-1, Tx-2). As an example of an input stream, the input stream may be a transport stream (TS), an audio/video service/component included in a program in a TS, a service/subcomponent of a base layer, enhancement layer, etc., of a video using scalable video coding (SVC), etc. As an example of information source coding, the information source coding may be H.264, HEVC (H.265), etc.

The L1 information processing unit 2041 performs processing related to L1 information, and outputs mapping data of the L1 information for each of the two transmit antennas (Tx-1, Tx-2). The frame building unit 2051 generates and outputs transmission frames of the DVB-NGH scheme, as illustrated in FIG. 53, by using (i) the mapping data of the corresponding PLP for each of the two transmit antennas (Tx-1, Tx-2), which is outputted from one of the MIMO-PLP processing units 2031, and (ii) the mapping data of the L1 information for the two transmit antennas (Tx-1, Tx-2), which is outputted from the L1 information processing unit 2041.

Each of the OFDM signal generation units 2061, which each correspond to one of the transmit antennas, performs operations with respect to a transmission frame of the DVB-NGH scheme outputted from the frame building unit 2051, and outputs a digital baseband transmission signal of the DVB-NGH scheme. The operations include adding a pilot signal, performing an inverse fast Fourier transform (IFFT), inserting a GI, and inserting a P1 symbol and an aP1 symbol. Each of the D/A conversion units 2091, which each correspond to one of the transmit antennas, performs D/A conversion of a digital baseband transmission signal of the DVB-NGH scheme outputted from a corresponding one of the OFDM signal generation units 2061, and outputs an analog baseband transmission signal of the DVB-NGH scheme. Each of the frequency conversion units 2096, which each correspond to one of the transmit antennas, performs frequency conversion to a frequency channel A with respect to an analog baseband transmission signal of the DVB-NGH scheme outputted from a corresponding one of the D/A conversion units 2091, and outputs an analog radio frequency (RF) transmission signal of the DVB-NGH scheme from a corresponding one of the transmit antennas (not illustrated).

Figure 55:
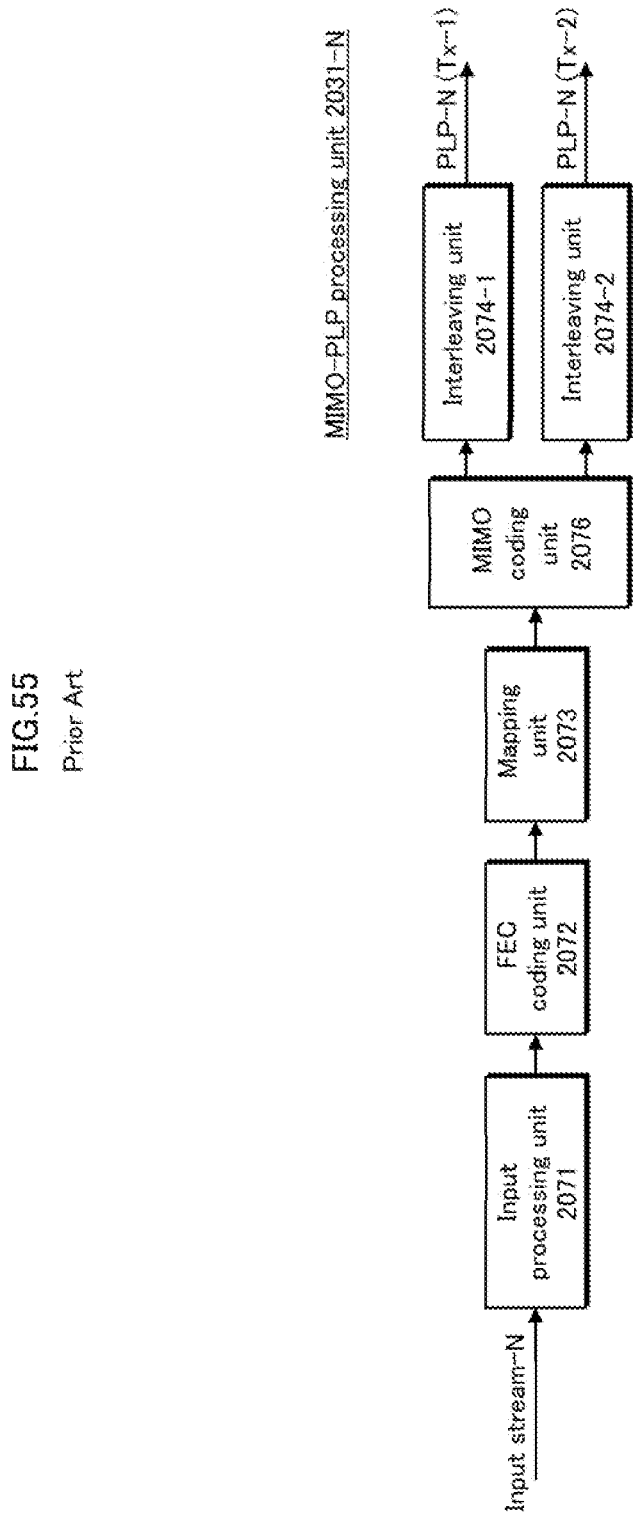
FIG. 55 illustrates a configuration of a MIMO-PLP processing unit 2031 in the conventional DVB-NGH scheme.

Next, details of the operations of the MIMO-PLP processing unit 2031 are described. As illustrated in FIG. 55, the MIMO-PLP processing unit 2031 includes an input processing unit 2071, a forward error correction (FEC) coding unit 2072, a mapping unit 2073, a MIMO coding unit 2076, and, for each of the two transmit antennas, an interleaving unit 2074.

In the MIMO-PLP processing unit 2031, the input processing unit 2071 converts an input stream to baseband frames. The FEC coding unit 2072 performs Bose-Chaudhuri-Hocquenghem (BCH) coding and low-density parity-check code (LDPC) coding with respect to each baseband frame, thereby adding a parity bit to each baseband frame and generating an FEC frame from each baseband frame. The mapping unit 2073 performs mapping to I/Q coordinates to convert each FEC frame to an FEC block, and outputs mapping data (cells). The MIMO coding unit 2076 performs MIMO coding. Each of the interleaving units 2074, which each correspond to one of the two transmit antennas, performs interleaving of the mapping data (cells) of an integer number of FEC blocks included in a time interleaving (TI) block.

Figure 56:
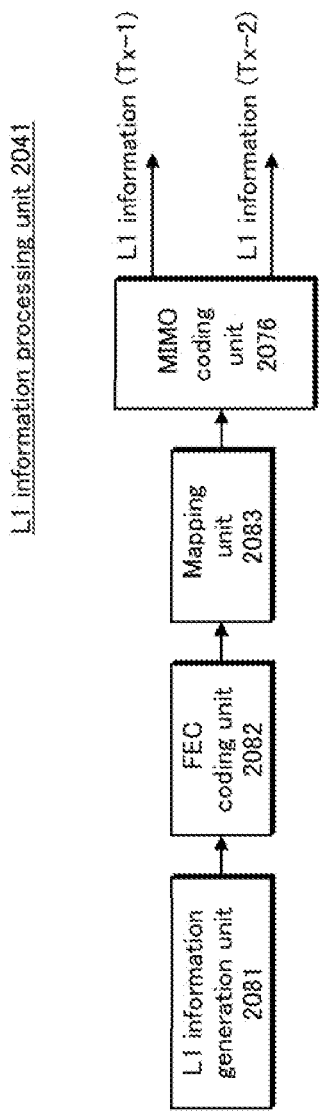
FIG. 56 illustrates a configuration of an L1 information processing unit 2041 in the conventional DVB-NGH scheme.

Next, details of the operations of the L1 information processing unit 2041 are described. As illustrated in FIG. 56, the L1 information processing unit 2041 includes an L1 information generation unit 2081, an FEC coding unit 2082, a mapping unit 2083, and a MIMO coding unit 2076.

In the L1 information processing unit 2041, the L1 information generation unit 2081 generates a transmission parameter and converts the transmission parameter into L1-pre information and L1-post information. The FEC coding unit 2082 performs BCH coding and LDPC coding with respect to each of the L1-pre information and the L1-post information, thereby adding a parity bit to each of the L1-pre information and the L1-post information. The mapping unit 2083 performs mapping to I/Q coordinates and outputs mapping data (cells). The MIMO coding unit 2076 performs MIMO coding.

Note that UHDTV (ultra HDTV) service, which surpasses the resolution of HDTV service, is widely being considered. In particular, in order to implement an 8 k image quality (7,680 horizontal×4,320 vertical resolution) service, even if HEVC (H.265) is used, transmission at a payload bit rate in excess of 100 Mbit/s is required. In actual broadcasting using the DVB-T2 scheme in the UK, transmission is performed at a payload bit rate of about 40 Mbit/s, by using a bandwidth of 8 MHz. Even if MIMO using two transmit antennas is applied to the DVB-T2 scheme, the payload bit rate would be at most about 80 Mbit/s, and transmission of an 8 k image quality service would not be possible. Accordingly, consideration of MIMO using a plurality of fundamental bands (for example, 8 MHz) is important. Here, a "fundamental band" indicates a frequency channel as described above, and in FIG. 54 the fundamental band corresponds to channel A (CH-A). In other words, "fundamental band" indicates a bandwidth for a modulated RF transmission signal.

Here, in the Long Term Evolution Advanced (LTE-Advanced) standard (LTE Rel. 10), MIMO using a plurality of fundamental bands is specified. However, modulation and transmission channel coding is performed independently for each fundamental band ("component carrier", (CC)) in transport block units, and mapping is performed only with respect to each individual CC. Accordingly, a frequency diversity effect achieved by transmission channel coding is limited to within each fundamental band.

In Patent Literature 1, with respect to MIMO using a plurality of fundamental bands, a configuration is disclosed such that, prior to MIMO coding, interleaving is performed with respect to all of the plurality of fundamental bands, but no disclosure is made of specific processing involved in the interleaving.

As stated above, with regard to MIMO using a plurality of fundamental bands, a technical problem exists that a frequency diversity effect with respect to a plurality of fundamental bands is insufficient.

Embodiments 1-8 of the present invention, described below, aim to solve this technical problem, and aim to provide a transmitter, transmission method, receiver, reception method, integrated circuit, and program, each of which exhibits a frequency diversity effect with respect to a plurality of fundamental bands.

The following is a detailed description of each embodiment, with reference to the drawings.

Embodiment 1

<Transmitter and Transmission Method>

Figure 1:
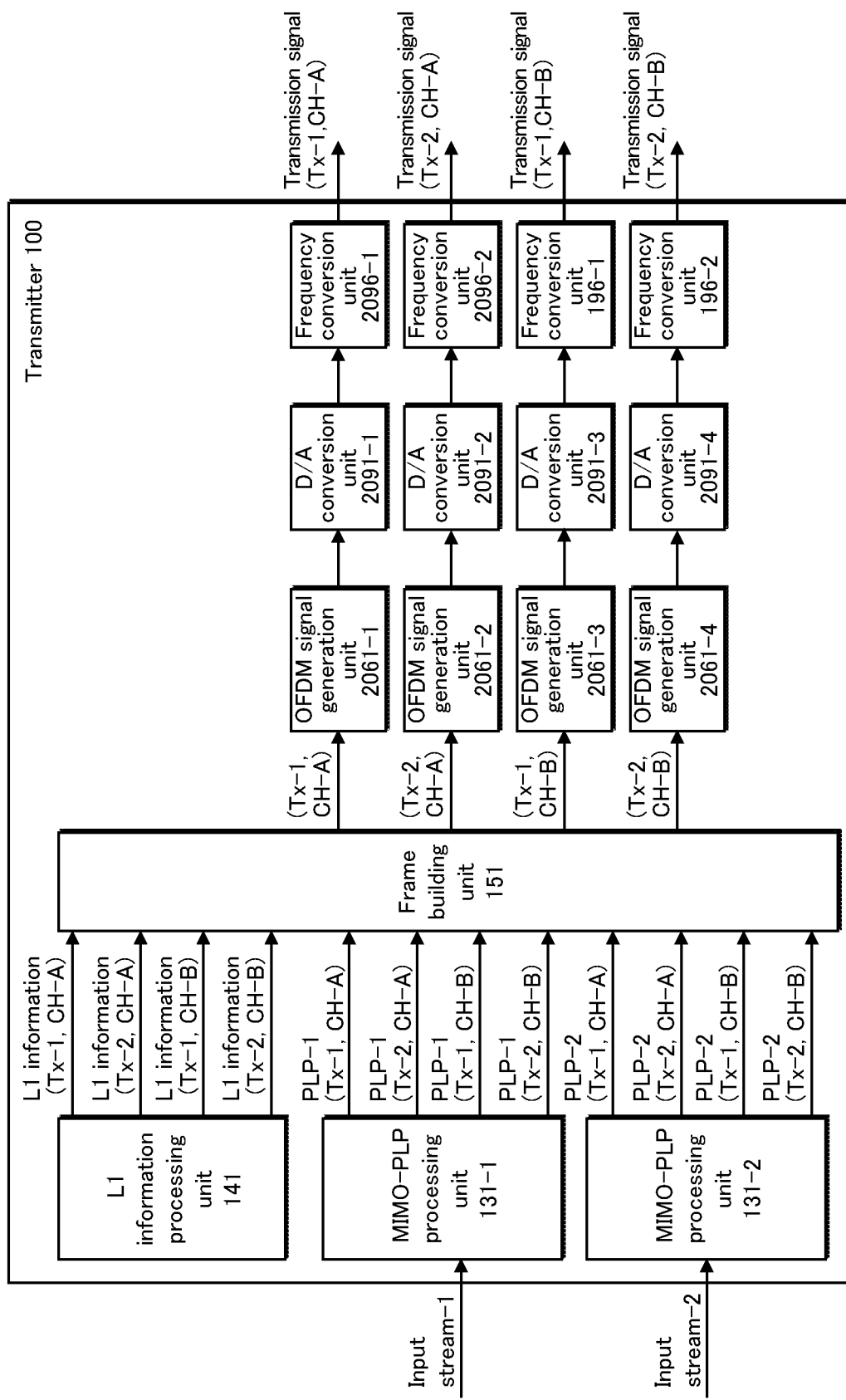
FIG. 1 illustrates a configuration of a transmitter 100 in embodiment 1.

FIG. 1 illustrates a configuration of a transmitter 100 in embodiment 1. Components that are the same as in the conventional transmitter have the same reference signs, and description thereof is omitted here.

In the transmitter 100 illustrated in FIG. 1, when compared with the transmitter 2000, which is conventional and illustrated in FIG. 54, the MIMO-PLP processing units 2031-1 and 2031-2, the L1 information processing unit 2041, and the frame building unit 2051 are each replaced by a corresponding one of MIMO-PLP processing units 131-1 and 131-2, an L1 information processing unit 141, and a frame building unit 151. Further, in the transmitter 100, the OFDM signal generation units 2061 and the D/A conversion units 2091 are provided on a one-for-one basis for each combination of frequency channel and transmit antenna. Furthermore, in the transmitter 100, on a one-for-one basis for each transmit antenna, the frequency conversion units 2096 are provided corresponding to the frequency channel A and frequency conversion units 196 are provided corresponding to a frequency channel B.

The following describes operations of the transmitter 100. Each MIMO-PLP processing unit 131 corresponds to a PLP of an input stream, performs processing related to the PLP, and outputs mapping data (cells) of the PLP for each of two frequency channels (CH-A, CH-B) of each of two transmit antennas (Tx-1, Tx-2).

The L1 information processing unit 141 performs processing related to L1 information, and outputs mapping data of the L1 information for each of the two frequency channels (CH-A, CH-B) of each of the two transmit antennas (Tx-1, Tx-2).

The frame building unit 151 generates and outputs transmission frames, as illustrated in FIG. 53, by using (i) the mapping data of the corresponding PLP for each of the two frequency channels (CH-A, CH-B) of each of the two transmit antennas (Tx-1, Tx-2), which is outputted from each of the MIMO-PLP processing units 131, and (ii) the mapping data of the L1 information for each of the two frequency channels (CH-A, CH-B) of each of the two transmit antennas (Tx-1, Tx-2), which is outputted from the L1 information processing unit 141. Here, a point of difference between the transmitter 100 and the transmitter 2000, which is conventional and illustrated in FIG. 54, is that transmission frames are generated for each of the two frequency channels (CH-A, CH-B) of each of the two transmit antennas (Tx-1, Tx-2).

Each of the OFDM signal generation units 2061, which correspond to one of the frequency channels of one of the two transmit antennas, and each of the D/A conversion units 2091, which correspond to one of the frequency channels of one of the two transmit antennas, perform the same operations as in the transmitter 2000, which is conventional and illustrated in FIG. 54.

Each of the frequency conversion units 2096, which each corresponds to the frequency channel A of one of the two transmit antennas, performs frequency conversion to a frequency channel A and outputs an analog RF transmission signal from a corresponding one of the transmit antennas (not illustrated), the same as in the transmitter 2000, which is conventional and illustrated in FIG. 54. On the other hand, each of the frequency conversion units 196, which each corresponds to the frequency channel B of one of the two transmit antennas, performs frequency conversion to a frequency channel B and outputs an analog RF transmission signal from a corresponding one of the transmit antennas (not illustrated).

Figure 2:
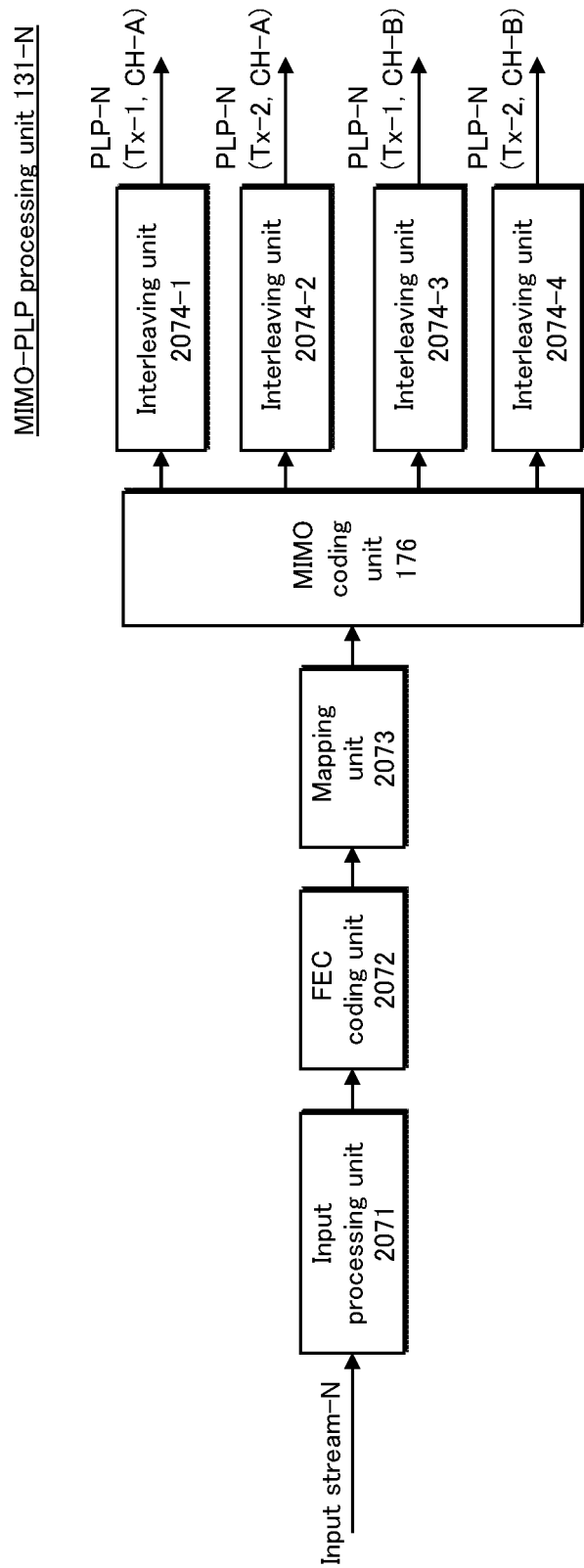
FIG. 2 illustrates a configuration of a MIMO physical layer pipe (MIMO-PLP) processing unit 131 in embodiment 1.

FIG. 2 illustrates a configuration of a MIMO-PLP processing unit 131. Compared to the MIMO-PLP processing unit 2031, which is conventional and illustrated in FIG. 55, the MIMO-PLP processing unit 131 is configured such that the MIMO coding unit 2076 is replaced by a MIMO coding unit 176. Further, in the MIMO-PLP processing unit 131, the interleaving units 2074 are provided on a one-for-one basis for each combination of frequency channel and transmit antenna.

In the MIMO-PLP processing unit 131 illustrated in FIG. 2, the MIMO coding unit 176 performs pre-coding using mapping data (cells) four by four from the start of each FEC block, and outputs MIMO coded data for the two frequency channels (CH-A, CH-B) of each of the two transmit antennas (Tx-1, Tx-2). When the mapping data (cells) of each FEC block is expressed from the start as s1, s2, ..., sNcells (Ncells=the number of cells in an FEC block), with respect to an input vector $s=(s4k+1, s4k+2, s4k+3, s4k+4)^T$ (k=0, 1, ..., (Ncells/4)−1), an output vector $z=(z1A\_k, z2A\_k, z1B\_k, z2B\_k)^T$ is expressed as in Formula 1.

[Math 1]

$$z = Fs \quad \text{(Formula 1)}$$

Note that zPQ_k is outputted data (MIMO coded data) with respect to frequency channel Q, and transmit antenna P. F is a fixed pre-coding matrix expressed by Formula 2.

[Math 2]

$$F = \begin{pmatrix} w11 & w12 & w13 & w14 \\ w21 & w22 & w23 & w24 \\ w31 & w32 & w33 & w34 \\ w41 & w42 & w43 & w44 \end{pmatrix} \quad \text{(Formula 2)}$$

In Formula 2, each component wMN (M=1, 2, 3, 4, N=1, 2, 3, 4) of the fixed pre-coding matrix is a complex number. However, wMN need not all be complex numbers, and real number components may be included.

As shown in Formula 3 and Formula 4, pre-coding may be performed by further multiplying by a phase change matrix X(k) that regularly changes Formula 1.

[Math 3]

$$z = X(k)Fs \quad \text{(Formula 3)}$$

[Math 4]

$$X(k) = \begin{pmatrix} 1 & 0 & 0 & 0 \\ 0 & e^{j\frac{2\pi}{9}k} & 0 & 0 \\ 0 & 0 & 1 & 0 \\ 0 & 0 & 0 & e^{j\frac{2\pi}{9}k} \end{pmatrix} \quad \text{(Formula 4)}$$

According to this phase change matrix X(k), with respect to a series of MIMO coded data for a transmit antenna 2 (Tx-2), a phase change of period 9 is performed that changes with respect to each of the two frequency channels (CH-A, CH-B) by $2\pi/9$ radian steps. Accordingly, by causing a regular change in a MIMO channel, an effect is obtained by which reception quality of data is improved for a receiver in a line of sight (LOS) environment in which direct waves are dominant. Note that this phase change is only one example, and the phase change is not limited to a period of 9. When the number of this period becomes greater, the reception performance of the receiver (more precisely, the error correction performance) may increase proportionately (although a larger period is not always better, the possibility is high that a small value such as 2 is better avoided).

Further, although the phase change shown in Formula 3 and Formula 4 indicates rotation of the phase that is sequential and predefined (in the above formulas, $2\pi/9$ radian steps), rotation is not limited to the same phase amount and the phase may be changed by a random amount. The importance of regularly changing the phase is that the phase of a modulated signal is changed regularly. A degree by which the phase is changed is preferably uniform, for example, with respect to $-\pi$ radians to $\pi$ radians, uniform distribution is preferable. However, random distribution is also possible.

According to the above-described operations performed by the MIMO coding unit 176, each component of the output vector z is expressed as in Formulas 5-8.

[Math 5]

$$z1A\_k = f1A(s4k+1, s4k+2, s4k+3, s4k+4) \quad \text{(Formula 5)}$$

[Math 6]

$$z2A\_k = f2A(s4k+1, s4k+2, s4k+3, s4k+4) \quad \text{(Formula 6)}$$

[Math 7]

$$z1B\_k = f1B(s4k+1, s4k+2, s4k+3, s4k+4) \quad \text{(Formula 7)}$$

[Math 8]

$$z2B\_k = f2B(s4k+1, s4k+2, s4k+3, s4k+4) \quad \text{(Formula 8)}$$

Here, f1A, f2A, f1B, and f2B express functions.

The interleaving units 2074 for each frequency channel of each of the two transmit antennas perform the same operations as the transmitter 2000, which is conventional and illustrated in FIG. 54. Accordingly, each component of the mapping data (cells) in an FEC block is transmitted via all of the two channels (CH-A, CH-B) from each of the two transmit antennas (Tx-1, Tx-2).

Figure 3:
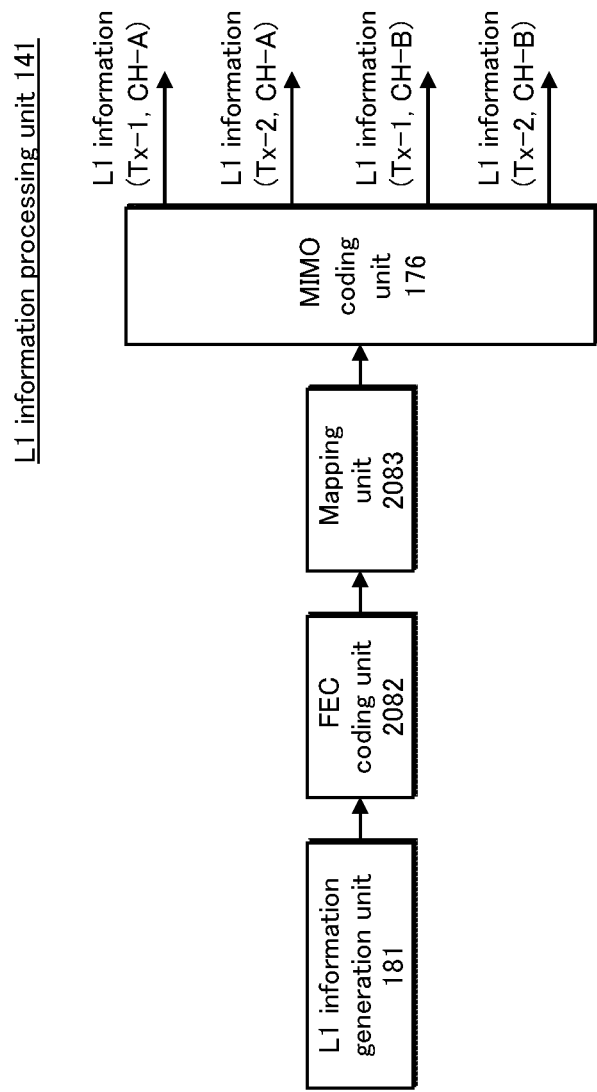
FIG. 3 illustrates a configuration of an L1 information processing unit 141 in embodiment 1.

FIG. 3 illustrates a configuration of an L1 information processing unit 141. Compared to the L1 information processing unit 2041 that is conventional and illustrated in FIG. 56, the L1 information processing unit 141 is configured such that the L1 information generation unit 2081 and the MIMO coding unit 2076 are replaced by an L1 information generation unit 181 and the MIMO coding unit 176, respectively.

In the L1 information processing unit 141 illustrated in FIG. 3, the L1 information generation unit 181 generates transmissions parameters related to the two frequency channels (CH-A, CH-B). The MIMO coding unit 176 performs the same operations as the MIMO coding unit 176 illustrated in FIG. 2, mentioned above. Accordingly, each component of the mapping data (cells) in an FEC block of L1 information is transmitted via all of the two frequency channels (CH-A, CH-B) from each of the two transmit antennas (Tx-1, Tx-2).

According to the above configuration, with regard to MIMO using a plurality of fundamental bands, a transmitter, transmission method, and program are provided that sufficiently exhibit a frequency diversity effect with respect to the plurality of fundamental bands, by transmitting each component of the mapping data (cells) in an FEC block via all of the frequency channels from each of all of the transmit antennas. In particular, outputting MIMO pre-coding processing results across a plurality of fundamental bands is a feature of the transmitter 100.

Note that the fundamental bands here indicate the frequency channels described above, and correspond to CH-A and CH-B in FIG. 1. In other words, "fundamental band" indicates a bandwidth of the modulated RF transmission signal. Hereafter, the same definition is used for "fundamental band".

Further, transmission using a plurality of fundamental bands means generation of an RF transmission signal that includes content of a common service and transmission thereof in each of the plurality of fundamental bands at the same time. Here, the plurality of fundamental bands may be adjacent to one another, or may include therebetween frequency channels or frequency bands used by another service, and not be adjacent to each other.

Note that in a transmission using the plurality of fundamental bands, the RF transmission signal of the plurality of fundamental bands need not always be transmitted at the same time. For example, a scheme is applicable where the number of fundamental bands used can be switched, such that in a certain part of a time-divided period, transmission is performed using only one fundamental band.

<Receiver and Reception Method>

Figure 4:
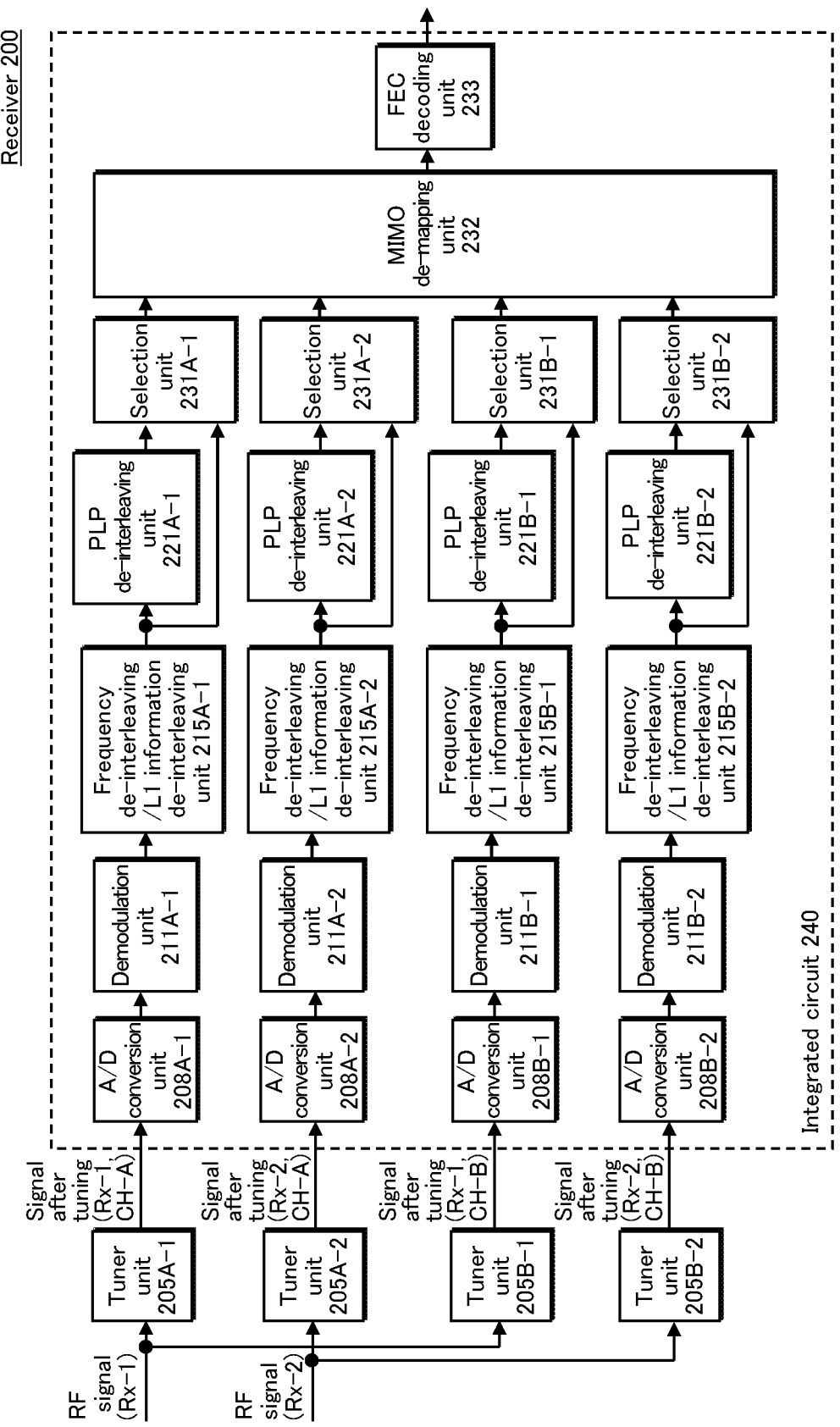
FIG. 4 illustrates a configuration of a receiver 200 in embodiment 1.

FIG. 4 illustrates a configuration of a receiver 200 in embodiment 1. The receiver 200 illustrated in FIG. 4 corresponds to the transmitter 100 illustrated in FIG. 1, and reflects functions of the transmitter 100.

The receiver 200 has, on a one-for-one basis for each receive antenna (Rx-1, Rx-2), a tuner unit 205A, an analogue/digital (A/D) conversion unit 208A, a demodulation unit 211A, a frequency de-interleaving/L1 information de-interleaving unit 215A, a PLP de-interleaving unit 221A, and a selection unit 231A, all for one frequency channel (CH-A). Further, the receiver 200 has, on a one-for-one basis for each receive antenna (Rx-1, Rx-2), a tuner unit 205B, an A/D conversion unit 208B, a demodulation unit 211B, a frequency de-interleaving/L1 information de-interleaving unit 215B, a PLP de-interleaving unit 221B, and a selection unit 231B, all for the other frequency channel (CH-B). The receiver 200 further includes a MIMO de-mapping unit 232 and an FEC decoding unit 233.

The following describes operations of the receiver 200.

When an analog RF transmission signal is inputted via the one receive antenna Rx-1, the tuner unit 205A-1 selectively receives a signal of one frequency channel (CH-A), and down-converts the signal to a predefined band. The A/D conversion unit 208A-1 performs analogue to digital conversion, and outputs a digital reception signal. The demodulation unit 211A-1 performs OFDM demodulation, and outputs cell data of I/Q coordinates and a transmission channel estimate value. The frequency de-interleaving/L1 information de-interleaving unit 215A-1 performs frequency de-interleaving on cell data and the transmission channel estimate value of a PLP including selected program data, and performs de-interleaving on cell data and the transmission channel estimate value of L1 information. The cell data and transmission channel estimate value of L1 information that is de-interleaved is selected by the selection unit 231A-1.

When an analog RF transmission signal is inputted via the other receive antenna Rx-2, the tuner unit 205A-2, the A/D conversion unit 208A-2, the demodulation unit 211A-2, the frequency de-interleaving/L1 information de-interleaving unit 215A-2, the PLP de-interleaving unit 221A-2, and the selection unit 231A-2 perform operations in the same way as described above in connection with Rx-1 (selective reception of CH-A).

Further, when an analog RF transmission signal is inputted via the one receive antenna Rx-1, the tuner unit 205B-1 selectively receives the signal of the other frequency channel (CH-B), and down-converts the signal to a predefined band. The A/D conversion unit 208B-1, the demodulation unit 211B-1, the frequency de-interleaving/L1 information de-interleaving unit 215B-1, the PLP de-interleaving unit 221B-1, and the selection unit 231-B perform operations in the same way as described above in connection with Rx-1 (selective reception of CH-A).

Further, when the analog RF transmission signal is inputted via the other receive antenna Rx-2, the tuner unit 205B-2, the A/D conversion unit 208B-2, the demodulation unit 211B-2, the frequency de-interleaving/L1 information de-interleaving unit 215B-2, the PLP de-interleaving unit 221B-2, and the selection unit 231-B2 perform operations in the same way as described above in connection with Rx-1 (selective reception of CH-A).

With respect to the cell data and a transmission channel estimate value of the L1 information outputted from the four selection units (231A-1, 231A-2, 231B-1, 231-B2), the MIMO de-mapping unit 232 performs MIMO de-mapping processing, and the FEC decoding unit 233 performs LDPC decoding processing and BCH decoding processing. Thus, the L1 information is decoded.

The four PLP de-interleaving units 221 (221A-1, 221A-2, 221B-1, and 221B-2), based on scheduling information included in the L1 information, which is decoded, extract cell data and a transmission channel estimate value of a PLP (for example, the PLP-1 illustrated in FIG. 1) including a program selected by a user, and perform de-interleaving that is the inverse of the interleaving processing of the transmission side.

The four selection units (231A-1, 231A-2, 231B-1, and 231B-2) each select an output of a corresponding one of the four PLP de-interleaving units (221A-1, 221A-2, 221B-1, 221B-2).

With respect to the cell data and the transmission channel estimate value of the PLP outputted from the four selection units (231A-1, 231A-2, 231B-1, and 231B-2), the MIMO de-mapping unit 232 performs a MIMO de-mapping process, and the FEC decoding unit 233 performs LDPC decoding processing and BCH decoding processing. Thus, the PLP data is decoded.

Further, the components of the receiver 200 illustrated in FIG. 4, aside from the tuner unit 205A and 205B, may be included in an integrated circuit 240.

The following describes operations of the MIMO de-mapping unit 232. With respect to each FEC block inputted to the MIMO de-mapping unit 232, an input vector $y=(y1A\_k, y2A\_k, y1B\_k, y2B\_k)^T$ ($k=0, 1, \ldots, $ (Ncells/4)$-1$) is expressed as shown in Formula 9.

[Math 9]

$$y = Hz + n \qquad \text{(Formula 9)}$$

yPQ_k is input data with respect to a receive antenna P and a frequency channel Q. H is a transmission channel matrix expressed in Formula 10. n=(n1A_k, n2A_k, n1B_k, n2B_k)$^T$ is a noise vector. nPQ_k is an independent and identically distributed (i.i.d.) complex Gaussian noise of variance $\sigma^2$ that has an average value 0.

[Math 10]

$$H = \begin{pmatrix} h11\_k & h12\_k & 0 & 0 \\ h21\_k & h22\_k & 0 & 0 \\ 0 & 0 & h33\_k & h34\_k \\ 0 & 0 & h43\_k & h44\_k \end{pmatrix} \quad \text{(Formula 10)}$$

Using Formula 9 and Formula 10, the MIMO de-mapping unit 232 performs maximum-likelihood decoding (MLD), calculates a vector estimated value s'=(s'4k+1, s'4k+2, s'4k+3, s'4k+4)$^T$ (k=0, 1, . . . , (Ncells/4)−1) of each FEC block, and outputs the vector estimated value s'. Note that processing of the MIMO de-mapping unit 232 is not limited to MLD, and other methods such as zero forcing (ZF) may be used.

Here, in Formula 10, each component hMN_k (M=1, 2, 3, 4, N=1, 2, 3, 4) of the transmission channel matrix H is a complex number. A point worth noting is that components of the transmission channel matrix H with respect to (M=1, 2, N=3, 4) and (M=3, 4, N=1, 2) are 0. Components multiplying by 0 output 0, in order to differentiate between the two different frequency channels (CH-A, CH-B). Accordingly, Formula 9 and Formula 10 include the transmission channel matrix H that has 4 rows and 4 columns, but compared with a transmission channel matrix H in which all components are non-zero, the amount of computation with regard to the MIMO de-mapping unit 232 is less.

The FEC decoding unit 233 performs LDPC decoding and BCH decoding with respect to the vector estimate value s' of each FEC block outputted from the MIMO de-mapping unit 232, and outputs a decoding result.

According to the above configuration, with respect to MIMO using a plurality of fundamental bands, a receiver, reception method, and program are provided that receive each component of the mapping data (cells) in an FEC block transmitted from all of the frequency channels of each of all of the transmit antennas.

<Modification of Transmitter and Transmission Method>

Figure 5:
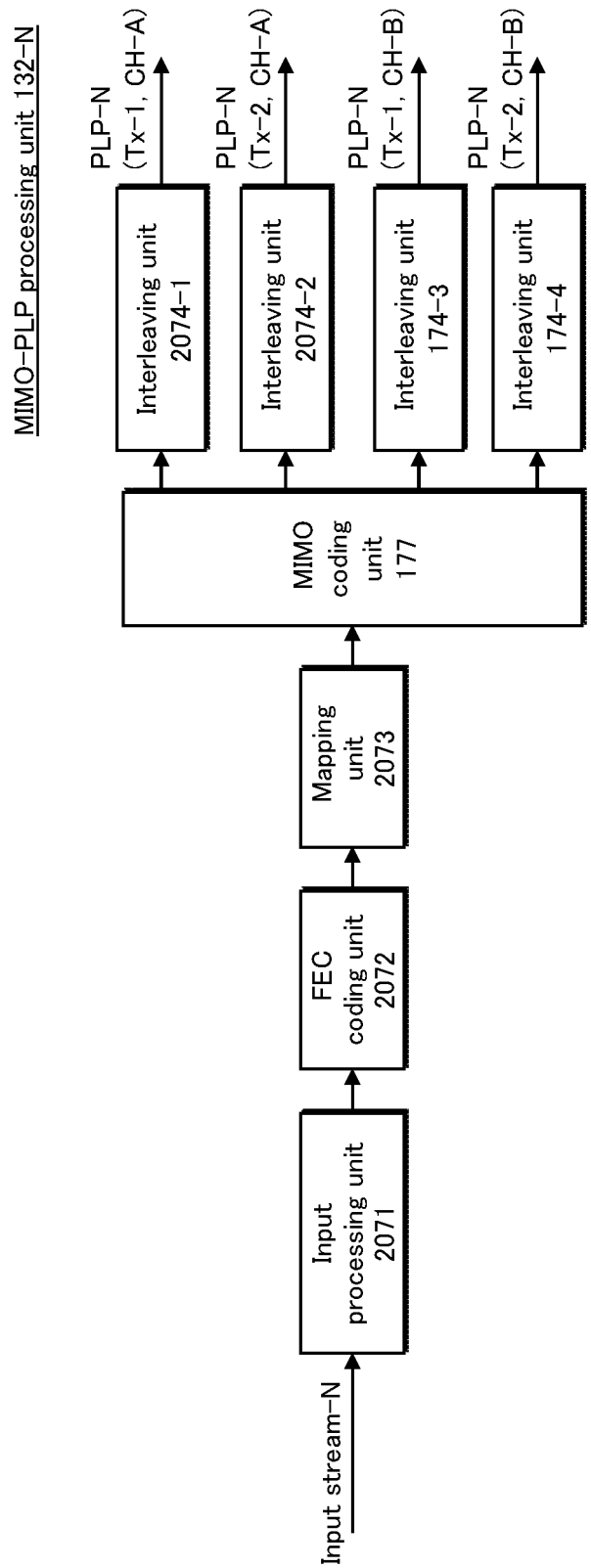
FIG. 5 illustrates a configuration of a MIMO-PLP processing unit 132 in embodiment 1.

The MIMO-PLP processing unit 131 illustrated in FIG. 2 may be replaced by a MIMO-PLP processing unit 132 illustrated in FIG. 5. In the MIMO-PLP processing unit 132 illustrated in FIG. 5, when compared to the MIMO-PLP processing unit 131 illustrated in FIG. 2, the MIMO coding unit 176 is replaced by a MIMO coding unit 177. Further, the two interleaving units 2074-3 and 2074-4 corresponding to the frequency channel B (CH-B) are replaced by interleaving units 174-3 and 174-4, respectively.

The MIMO coding unit 177 illustrated in FIG. 5 may perform pre-coding by multiplying by the phase change matrix X(k) shown in Formula 11.

[Math 11]

$$X(k) = \begin{pmatrix} 1 & 0 & 0 & 0 \\ 0 & e^{j\frac{2\pi}{9}k} & 0 & 0 \\ 0 & 0 & 1 & 0 \\ 0 & 0 & 0 & e^{j\frac{2\pi}{9}k+\theta} \end{pmatrix} \quad \text{(Formula 11)}$$

π/9 is given as an example of the value of θ in Formula 11, but the value of θ is not limited in this way. According to the phase change matrix X(k) shown in Formula 11, with respect to a series of MIMO coded data for the transmit antenna 2 (Tx-2), a phase change of period 9 is performed that changes an initial value of 0 radians in 2π/9 radian steps for one frequency channel (CH-A). For the other frequency channel (CH-B), a phase change of period 9 is performed that changes an initial value of π/9 radians in 2π/9 radian steps. When the two frequency channels (CH-A, CH-B) are transmitted from the same transmit antenna group (Tx-1, Tx-2) and received by the same receive antenna group (Rx-1, Rx-2), especially in an LOS environment in which direct waves dominate, the transmission channel characteristics of the two frequency channels (CH-A, CH-B) are likely to have a high correlation. The phase change matrix X(k) shown in Formula 11 makes it possible to obtain an effect of increasing reception quality of data by a receiver, by differentiating the phase change pattern of the two frequency channels (CH-A, CH-B) and thereby reducing correlation therebetween. Note that the method of differentiating the phase change pattern is not limited to the above method. For example, a different period of phase change may be used.

The two interleaving units 174-3 and 174-4 illustrated in FIG. 5 that correspond to the frequency channel B (CH-B) may perform interleaving of a different pattern to the two interleaving units 2074-1 and 2074-2 illustrated in FIG. 5 that correspond to the frequency channel A (CH-A). The number of frames that are interleaved is given as an example of a different pattern, but different patterns are not limited to this example. A point worth noting here is that the two interleaving units 2074-1 and 2074-2 that correspond to the frequency channel A (CH-A) perform interleaving of the same pattern, and the two interleaving units 174-1 and 174-2 that correspond to the frequency channel B (CH-B) perform interleaving of the same pattern. Accordingly, the amount of computation for MIMO demapping is not increased, while making it possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of phase change patterns of the phase change matrix X(k); and differentiation of interleaving patterns may be used.

Figure 6:
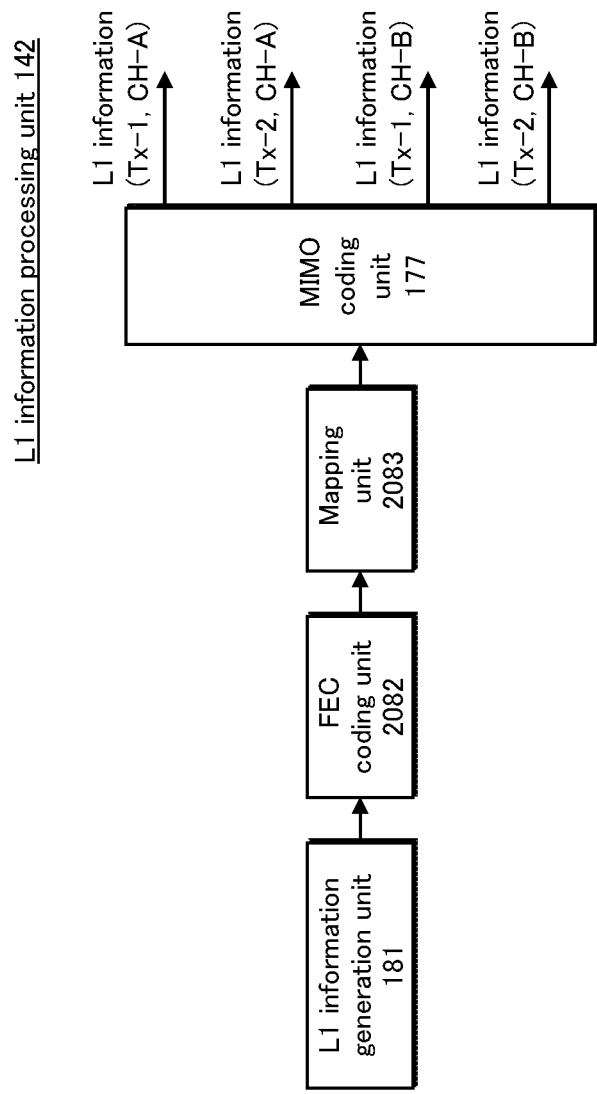
FIG. 6 illustrates a configuration of an L1 information processing unit 142 in embodiment 1.

Further, the L1 information processing unit 141 illustrated in FIG. 3 may be replaced by the L1 information processing unit 142 illustrated in FIG. 6. The L1 information processing unit 142 illustrated in FIG. 6, compared to the L1 information processing unit 141 illustrated in FIG. 3, is configured such that the MIMO coding unit 176 is replaced by the MIMO coding unit 177. The MIMO coding unit 177 performs the same operations as the MIMO coding unit 177 illustrated in FIG. 5. Accordingly, the phase change matrix X(k) shown in Formula 11 makes it possible to obtain an effect of increasing reception quality of data by a receiver, by differentiating the phase change pattern of the two frequency channels (CH-A, CH-B) and thereby reducing correlation therebetween.

<Modification of Receiver and Reception Method>

Figure 7:
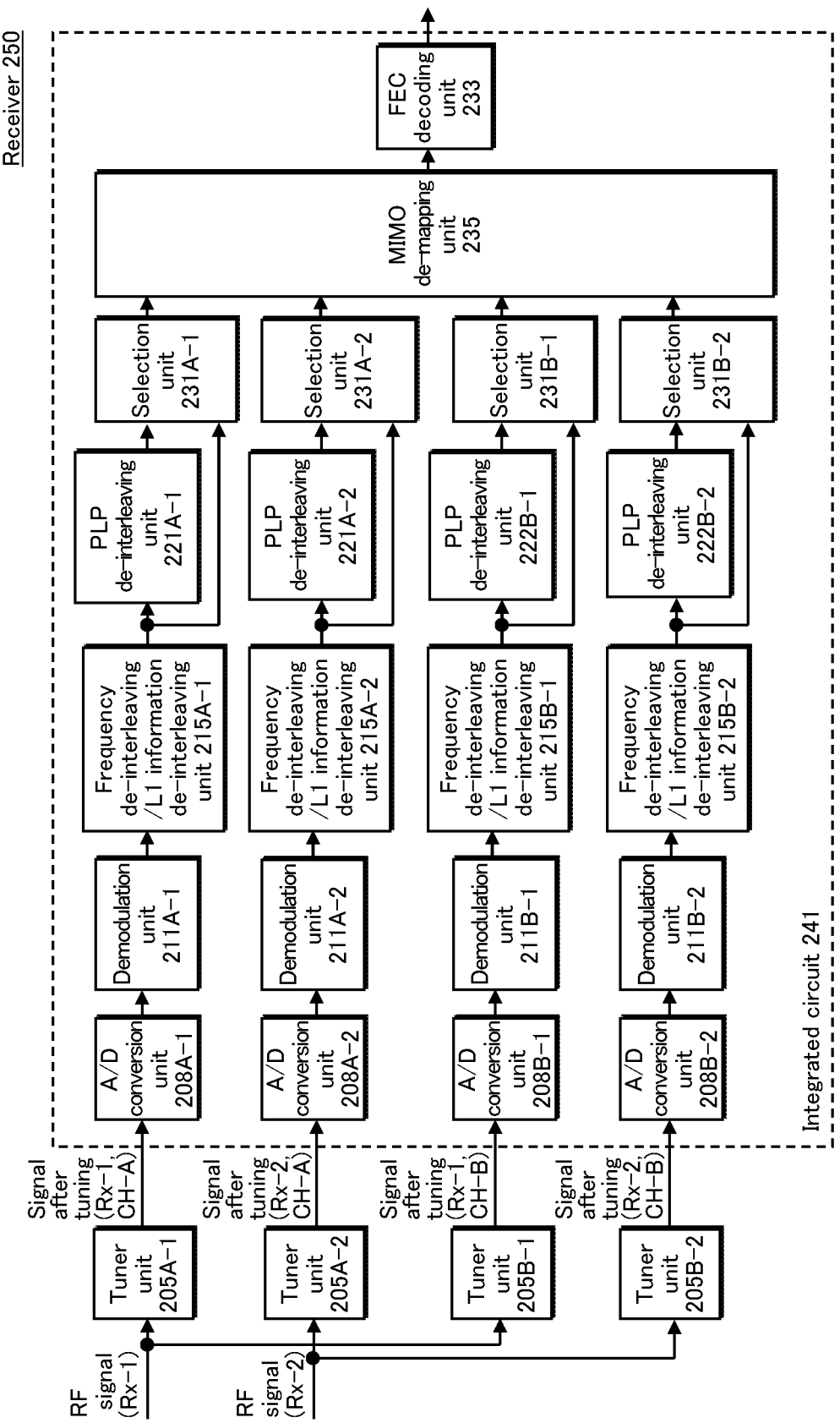
FIG. 7 illustrates a configuration of a receiver 250 in embodiment 1.

FIG. 7 illustrates a configuration of a receiver 250 corresponding to a case in which the MIMO-PLP processing unit 132 illustrated in FIG. 5 and the L1 information processing unit 142 illustrated in FIG. 6 are used. The receiver 250 illustrated in FIG. 7, compared to the receiver 200 illustrated in FIG. 4, is configured such that the PLP de-interleaving units 221B for the frequency channel B (CH-B) are replaced by PLP de-interleaving units 222B, and the MIMO demapping unit 232 is replaced by a MIMO demapping unit 235. The PLP de-interleaving units 222B for the frequency channel B (CH-B) perform de-interleaving that is the inverse of the interleaving performed by the interleaving unit 174 illustrated in FIG. 5. Further, the MIMO de-mapping unit 235 performs MLD by using Formula 9 and Formula 10, taking into consideration the phase change matrix X(k) shown in Formula 11 instead of the phase change matrix X(k) shown in Formula 4.

Further, the components of the receiver 250, illustrated in FIG. 7, aside from the tuner unit 205A and 205B, may be included in an integrated circuit 241.

Embodiment 2

<Transmitter and Transmission Method>

Figure 8:
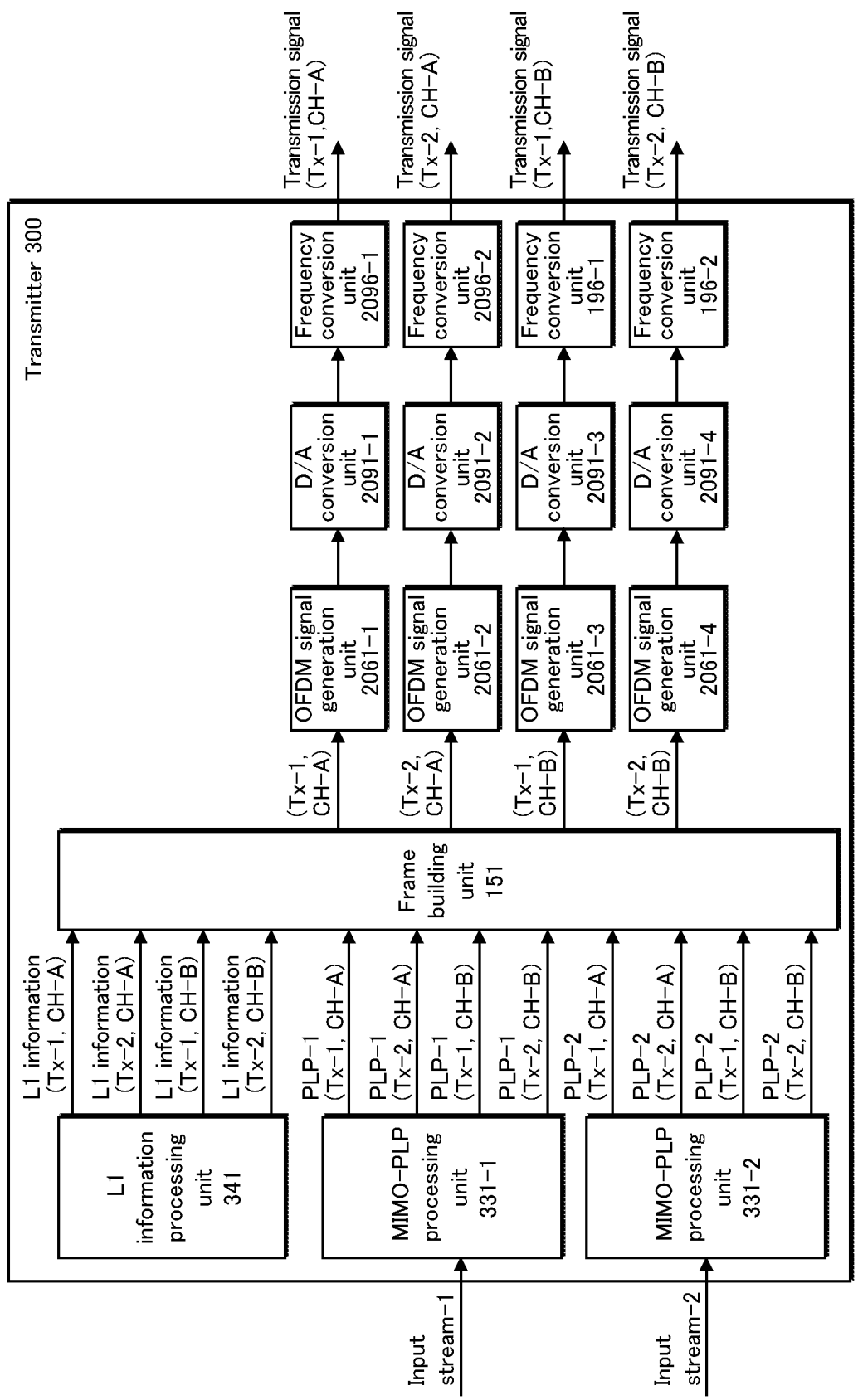
FIG. 8 illustrates a configuration of a transmitter 300 in embodiment 2.

FIG. 8 illustrates a configuration of a transmitter 300 in embodiment 2. Components that are the same as in the conventional transmitter or the transmitter in embodiment 1 have the same reference signs, and description thereof is omitted here.

The transmitter 300 illustrated in FIG. 8, compared to the transmitter 100 in embodiment 1 and illustrated in FIG. 1, is configured such that the MIMO-PLP processing units 131 are replaced by MIMO-PLP processing units 331 and the L1 information processing unit 141 is replaced by an L1 information processing unit 341.

Figure 9:
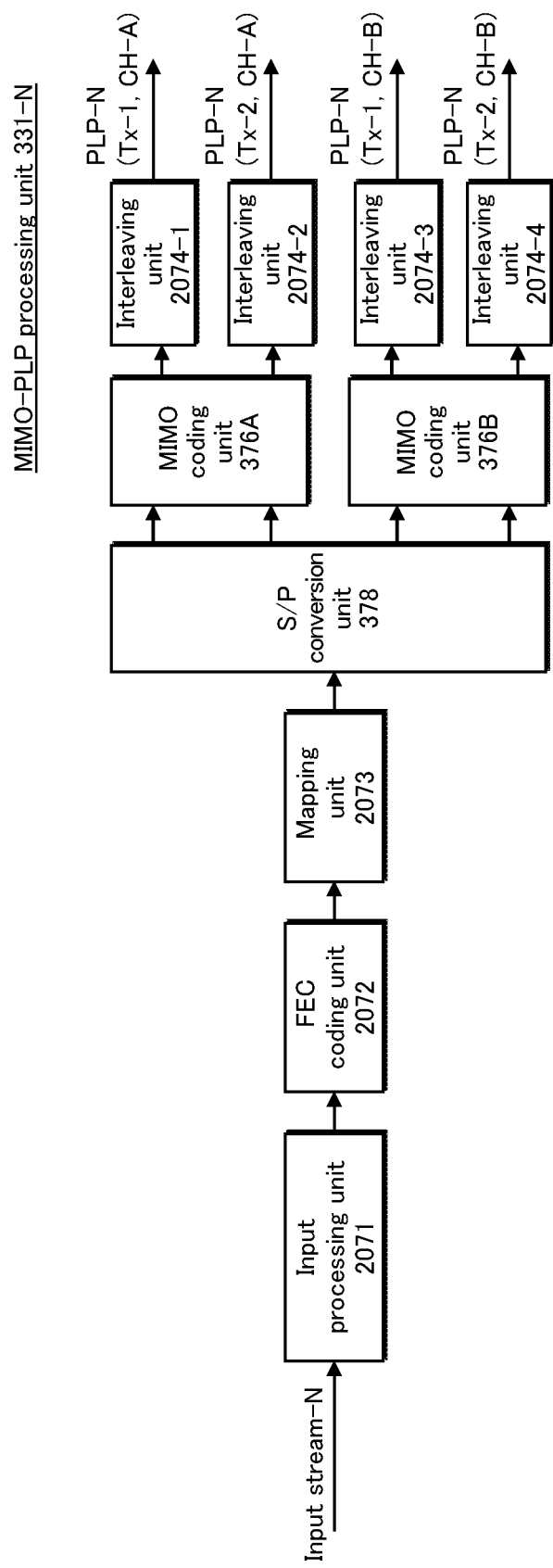
FIG. 9 illustrates a configuration of a MIMO-PLP processing unit 331 in embodiment 2.

FIG. 9 illustrates a configuration of the MIMO-PLP processing unit 331. Compared with the MIMO-PLP processing unit 131 in embodiment 1, illustrated in FIG. 2, the MIMO-PLP processing unit 331 is configured such that a serial to parallel (S/P) conversion unit 378 is added. Further, the MIMO-PLP processing unit 331 is configured such that the MIMO coding unit 176 is replaced by two MIMO coding units 376A and 376B.

In the MIMO-PLP processing unit 331 illustrated in FIG. 9, the S/P conversion unit 378 allocates mapping data (cells) two by two from the start of each FEC block inputted thereto in turn to the MIMO coding unit 376A, the MIMO coding unit 376B, the MIMO coding unit 376A, the MIMO coding unit 376B, .... Accordingly, the mapping data (cells) of each FEC block are allocated half and half to the MIMO coding units 376A and 376B.

The MIMO coding unit 376A performs pre-coding using mapping data (cells) two by two from the start of the half portion of each FEC block inputted thereto, and outputs MIMO coded data with respect to the two transmit antennas (Tx-1, Tx-2). When the mapping data (cells) of each FEC block is expressed from the start as s1, s2, . . . , sNcells (Ncells=the number of cells in an FEC block), with respect to an input vector $s\_A=(s4k+1, s4k+2)^T$ (k=0, 1, ..., (Ncells/4)−1) inputted to the MIMO coding unit 376A, an output vector $z\_A=(z1A\_k, z2A\_k)^T$ is expressed as in Formula 12.

[Math 12]

$$z\_A = F\_A s\_A \qquad \text{(Formula 12)}$$

Note that zPQ_k is outputted data (MIMO coded data) with respect to frequency channel Q and transmit antenna P. F_A is a fixed pre-coding matrix expressed by Formula 13.

[Math 13]

$$F\_A = \begin{pmatrix} w11\_A & w12\_A \\ w21\_A & w22\_A \end{pmatrix} \qquad \text{(Formula 13)}$$

In Formula 13, each component wMN A (M=1, 2, N=1, 2) of the fixed pre-coding matrix is a complex number. However, wMN A need not all be complex numbers, and real number components may be included.

As shown in Formula 14 and Formula 15, pre-coding may be performed by further multiplying by a phase change matrix X_A(k) that regularly changes Formula 12.

[Math 14]

$$z\_A = X\_A(k) F\_A s\_A \qquad \text{(Formula 14)}$$

[Math 15]

$$X\_A(k) = \begin{pmatrix} 1 & 0 \\ 0 & e^{j\frac{2\pi}{9}k} \end{pmatrix} \qquad \text{(Formula 15)}$$

According to this phase change matrix X_A(k), with respect to a series of MIMO coded data for the transmit antenna 2 (Tx-2), a phase change of period 9 is performed that changes in 2π/9 radian steps. Accordingly, by causing a regular change in a MIMO channel, an effect is obtained by which reception quality of data is improved for a receiver in a line of sight (LOS) environment in which direct waves are dominant. Note that this phase change is only one example, and the phase change is not limited to a period of 9. When the number of this period becomes greater, the reception performance of the receiver (more precisely, the error correction performance) may increase proportionately (although a larger period is not always better, the possibility is high that a small value such as 2 is better avoided).

Further, although the phase change shown in Formula 14 and Formula 15 indicates rotation of the phase that is sequential and predefined (in the above formulas, 2π/9 radian steps), rotation is not limited to the same phase amount and the phase may be changed by a random amount. The importance of regularly changing the phase is that the phase of a modulated signal is changed regularly. A degree by which the phase is changed is preferably uniform, for example, with respect to −π radians to π radians, uniform distribution is preferable. However, random distribution is also possible.

The MIMO coding unit 376B outputs MIMO coded data with respect to the two transmit antennas (Tx-1, Tx-2), in the same way as the MIMO coding unit 376A. With respect to an input vector $s\_B=(s4k+3, s4k+4)^T$ (k=0, 1, ..., (Ncells/4)−1) inputted to the MIMO coding unit 376B, an output vector $z\_B=(z1B\_k, z2B\_k)^T$ is expressed as in Formula 16.

[Math 16]

$$z\_B = F\_B s\_B \qquad \text{(Formula 16)}$$

F_B is the fixed pre-coding matrix expressed in Formula 17.

[Math 17]

$$F\_B = F\_A \quad \text{(Formula 17)}$$

As shown in Formula 18 and Formula 19, pre-coding may be performed by further multiplying by a phase change matrix X_B(k) that regularly changes Formula 16.

[Math 18]

$$z\_B = X\_B(k) F\_B s\_B \quad \text{(Formula 18)}$$

[Math 19]

$$X\_B(k) = X\_A(k) \quad \text{(Formula 19)}$$

According to the above-described operations performed by the MIMO coding units 376A and 376B, each component of the output vector z_A and z_B is expressed as in Formulas 20-23.

[Math 20]

$$z1A\_k = f1(s4k+1, s4k+2) \quad \text{(Formula 20)}$$

[Math 21]

$$z2A\_k = f2(s4k+1, s4k+2) \quad \text{(Formula 21)}$$

[Math 22]

$$z1B\_k = f1(s4k+3, s4k+4) \quad \text{(Formula 22)}$$

[Math 23]

$$z2B\_k = f2(s4k+3, s4k+4) \quad \text{(Formula 23)}$$

Here, f1 and f2 express functions.

The interleaving units 2074 for each frequency channel of each of the two transmit antennas performs operations in the same way as the interleaving units 2074 illustrated in FIG. 55. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

Figure 10:
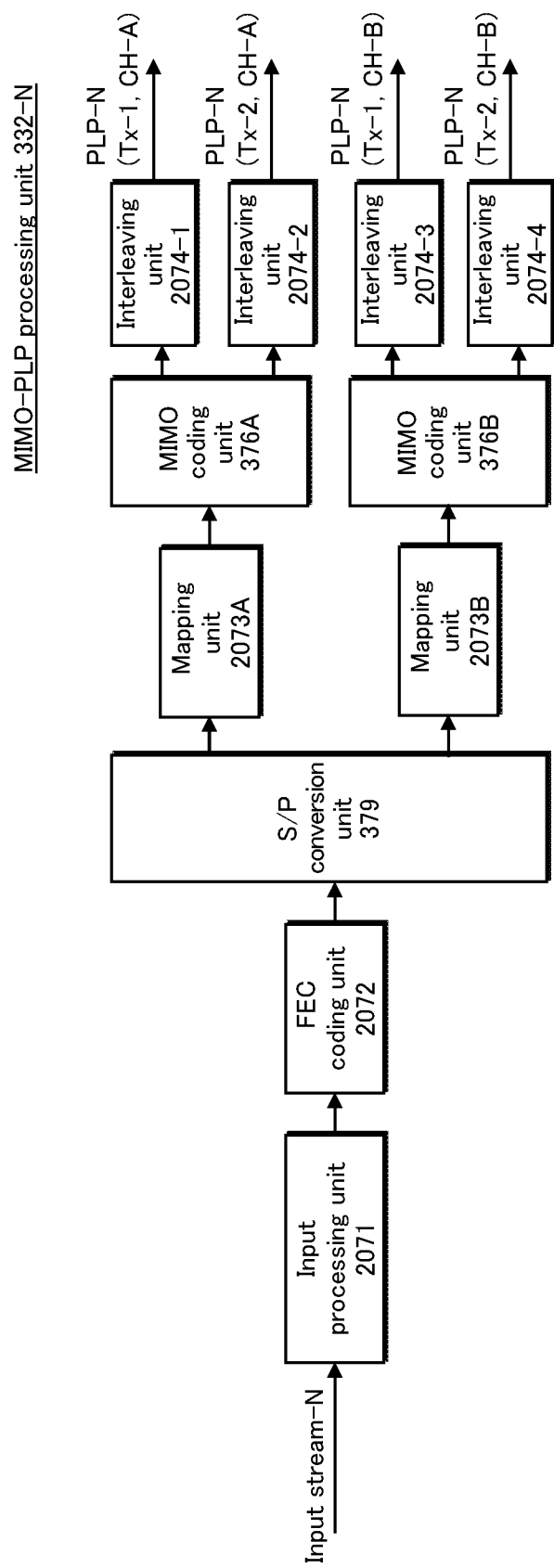
FIG. 10 illustrates a configuration of a MIMO-PLP processing unit 332 in embodiment 2.

The MIMO-PLP processing unit 331 illustrated in FIG. 9 may be replaced by a MIMO-PLP processing unit 332 illustrated in FIG. 10. The MIMO-PLP processing unit 332 illustrated in FIG. 10, when compared to the MIMO-PLP processing unit 331 illustrated in FIG. 9, is configured such that the S/P conversion unit 378 subsequent to the mapping unit 2073 is replaced by an S/P conversion unit 379 preceding the mapping units 2073. Further, two mapping units 2073 are provided.

With respect to each FEC frame outputted from the FEC coding unit 2072, the S/P conversion unit 379 illustrated in FIG. 10 allocates a bit group composed of mapping data (cells) two by two from the start of the FEC block in turn to the mapping unit 2073A, the mapping unit 2073B, the mapping unit 2073A, the mapping unit 2073B, . . . . The mapping unit 2073A and the mapping unit 2073B perform operations in the same way as the mapping unit 2073 illustrated in FIG. 9. Accordingly, the mapping data (cells) of each FEC block are allocated half and half to the MIMO coding units 376A and 376B, in the same way as the allocation in the MIMO-PLP processing unit 331 illustrated in FIG. 9. Other operations of the MIMO-PLP processing unit 332 are the same as that of the MIMO-PLP processing unit 331 illustrated in FIG. 9.

Figure 11:
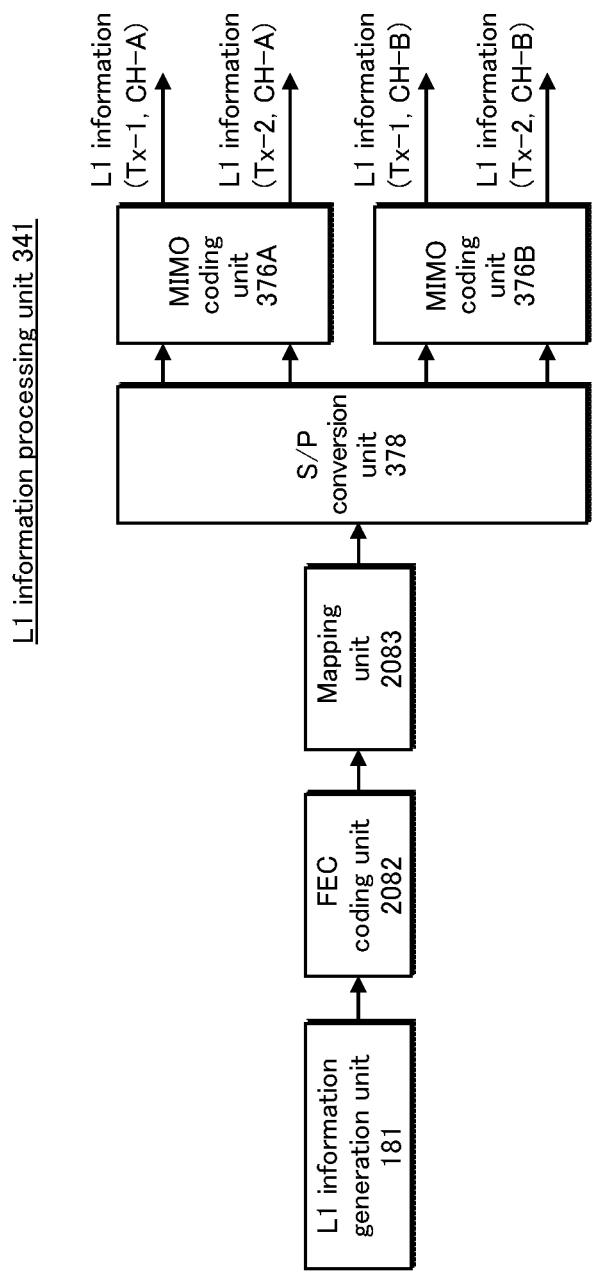
FIG. 11 illustrates a configuration of an L1 information processing unit 341 in embodiment 2.

FIG. 11 illustrates a configuration of the L1 information processing unit 341. When compared to the L1 information processing unit 141 in embodiment 1, illustrated in FIG. 3, the L1 information processing unit 341 is configured such that the S/P conversion unit 378 is added. Further, the L1 information processing unit 341 is configured such that the MIMO coding unit 176 is replaced by the two MIMO coding units 376A and 376B.

In the L1 information processing unit 341 illustrated in FIG. 11, the S/P conversion unit 378, in the same way as the operation by the S/P conversion unit 378 illustrated in FIG. 9, allocates mapping data (cells) two by two from the start of each FEC block inputted thereto in turn to the MIMO coding unit 376A, the MIMO coding unit 376B, the MIMO coding unit 376A, the MIMO coding unit 376B, . . . . Accordingly, the mapping data (cells) of each FEC block are allocated half and half to the MIMO coding units 376A and 376B.

The MIMO coding unit 376A and the MIMO coding unit 376B, in the same way as the operations of the MIMO coding units 376A and 376B illustrated in FIG. 9, perform pre-coding using the mapping data (cells) two by two from the start of each half portion of an FEC block inputted thereto, and output MIMO coded data with respect to the two transmit antennas (Tx-1, Tx-2). Accordingly, half of the components of the mapping data (cells) in an FEC block of L1 information are transmitted via one frequency channel (CH-A) from each of the two transmit antennas (Tx-1, Tx-2). Further, the remaining half of the components are transmitted via the other frequency channel (CH-B) from each of two transmit antennas (Tx-1, Tx-2).

Figure 12:
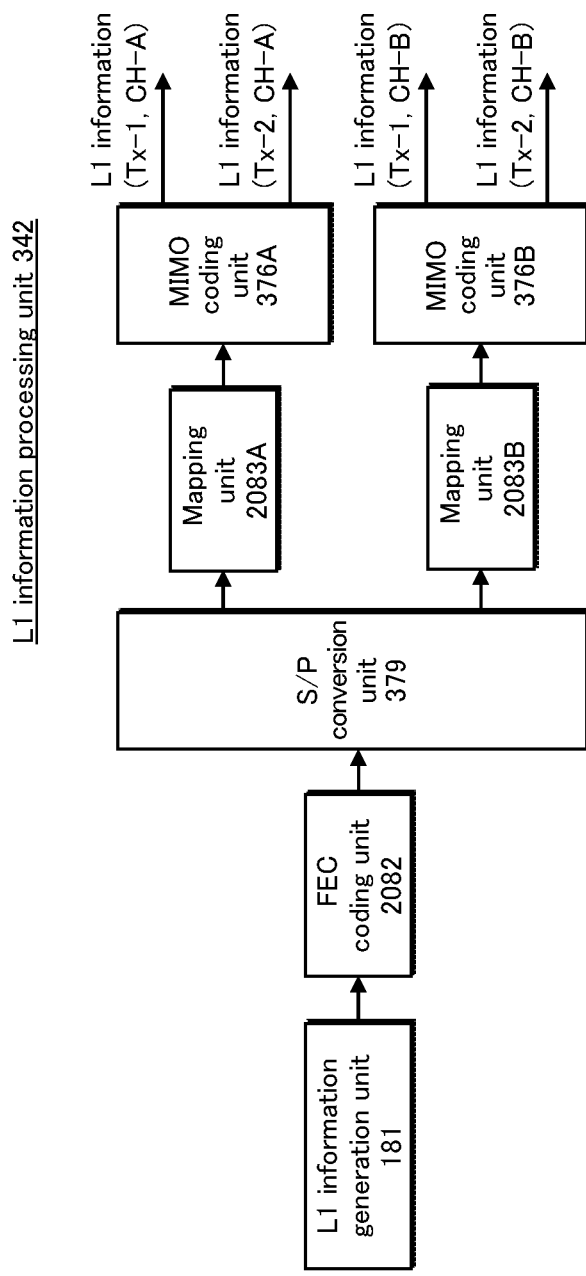
FIG. 12 illustrates a configuration of an L1 information processing unit 342 in embodiment 2.

Note that the L1 information processing unit 341 illustrated in FIG. 11 may be replaced by an L1 information processing unit 342 illustrated in FIG. 12. The L1 information processing unit 342 illustrated in FIG. 12, when compared with the L1 information processing unit 341 illustrated in FIG. 11, is configured such that the S/P conversion unit 378 subsequent to the mapping unit 2083 is replaced by the S/P conversion unit 379 preceding the mapping units 2083. Further, two mapping units 2083 are provided.

The S/P conversion unit 379 illustrated in FIG. 12, in the same way as the S/P conversion unit 379 illustrated in FIG. 10 and with respect to each FEC frame outputted from the FEC coding unit 2082, allocates a bit group composed of mapping data (cells) two by two from the start of the FEC block in turn to the mapping unit 2083A, the mapping unit 2083B, the mapping unit 2083A, the mapping unit 2083B, . . . . The mapping unit 2083A and the mapping unit 2083B perform operations in the same way as the mapping unit 2083 illustrated in FIG. 11. Accordingly, the mapping data (cells) of an FEC block of L1 information are allocated half and half to the MIMO coding units 376A and 376B, in the same way as the allocation in the L1 information processing unit 341 illustrated in FIG. 11. Other operations of the L1 information processing unit 342 are the same as that of the L1 information processing unit 341 illustrated in FIG. 11.

According to the above configuration, with regard to MIMO using a plurality of fundamental bands, a transmitter, transmission method, and program are provided that sufficiently exhibit a frequency diversity effect with respect to the plurality of fundamental bands, by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, mapping data (cells) being allocated two by two from the start of each FEC block in turn to the MIMO coding unit 376A, the MIMO coding unit 376B, the MIMO coding unit 376A, the MIMO coding unit 376B, . . . , is a feature of the transmitter 300.

<Receiver and Reception Method>

Figure 13:
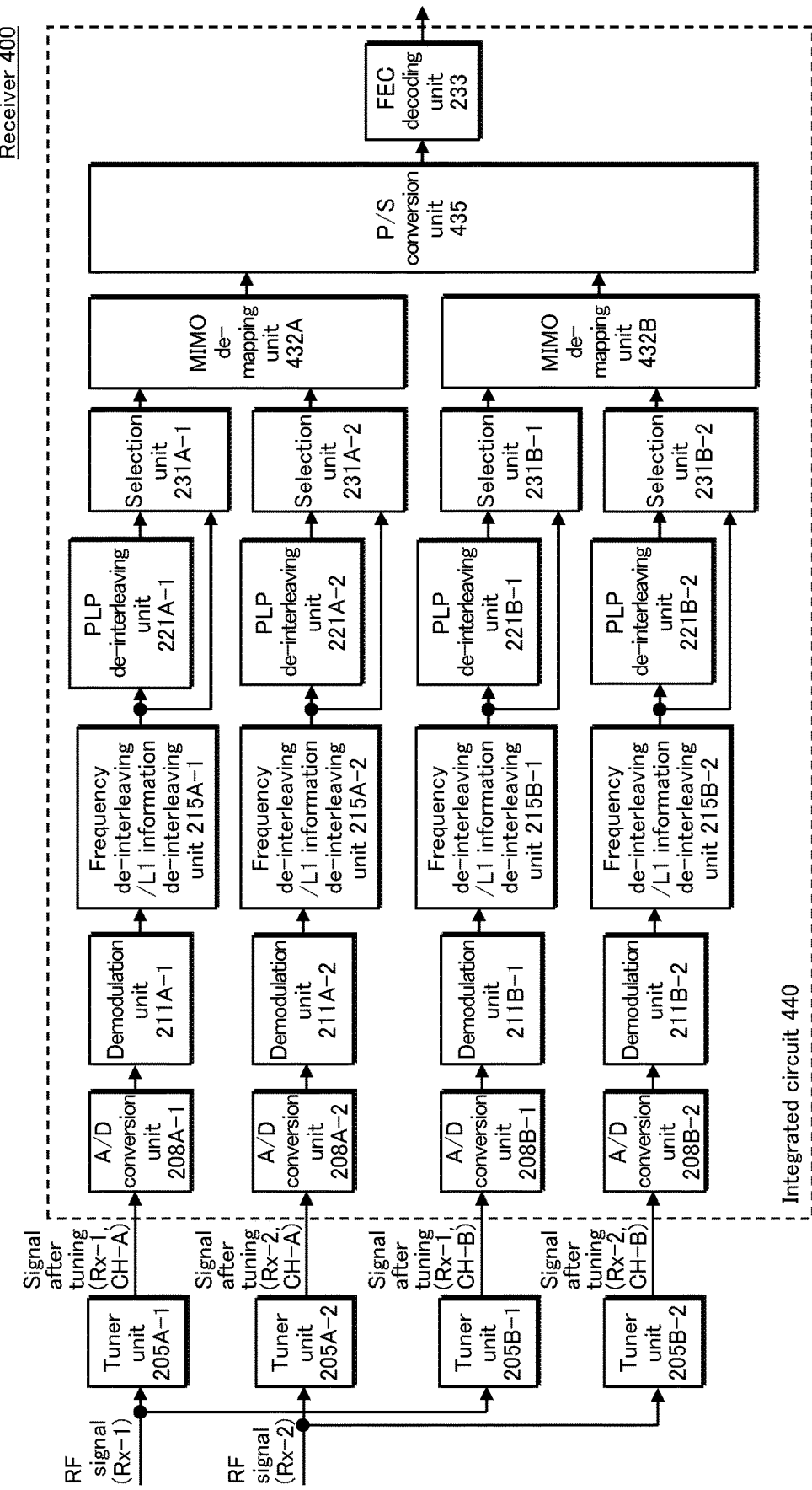
FIG. 13 illustrates a configuration of a receiver 400 in embodiment 2.

FIG. 13 illustrates a configuration of a receiver 400 in embodiment 2. The receiver 400 illustrated in FIG. 13 corresponds to the transmitter 300 illustrated in FIG. 8, and reflects functions of the transmitter 300. Components that are the same as in the conventional receiver or the receiver in embodiment 1 have the same reference signs, and description thereof is omitted here.

The receiver 400 illustrated in FIG. 13, compared to the receiver 200 in embodiment 1, illustrated in FIG. 4, is configured such that the MIMO de-mapping unit 232 is replaced by two MIMO de-mapping units 432. Further, a parallel to serial (P/S) conversion unit 435 is added.

The following describes operations of the transmitter 400 illustrated in FIG. 13. With respect to the mapping data (cells) of each half portion of an FEC block inputted to the MIMO de-mapping unit 432A, an input vector y_A= (y1A_k, y2A_k)$^T$ (k=0, 1, . . . , (Ncells/4)−1) is expressed as shown in Formula 24.

[Math 24]

$$y\_A = H\_A z\_A + n\_A \quad \text{(Formula 24)}$$

yPQ_k is input data with respect to a receive antenna P and a frequency channel Q. H_A is a transmission channel matrix expressed in Formula 25. n_A=(n1A_k, n2A_k)$^T$ is a noise vector. nPQ_k is an i.i.d. complex Gaussian noise of variance $\sigma^2$ that has an average value 0.

[Math 25]

$$H\_A = \begin{pmatrix} h11\_k & h12\_k \\ h21\_k & h22\_k \end{pmatrix} \quad \text{(Formula 25)}$$

Using Formula 24 and Formula 25, the MIMO de-mapping unit 432A performs MLD, calculates a vector estimated value s'=(s'4k+1, s'4k+2)$^T$ (k=0, 1, . . . , (Ncells/4)−1) of half of the FEC blocks, and outputs the vector estimated value s'. Note that processing of the MIMO de-mapping unit 432A is not limited to MLD, and other methods such as ZF may be used.

On the other hand, with respect to mapping data (cells) of a remaining half of the FEC blocks inputted to the MIMO de-mapping unit 432B, an input vector y_B=(y1B_k, y2B_k)$^T$ (k=0, 1, . . . , (Ncells/4)−1) is expressed as in Formula 26.

[Math 26]

$$y\_B = H\_B z\_B + n\_B \quad \text{(Formula 26)}$$

Note that H_B is a transmission channel matrix expressed by Formula 27, and n_B=(n1B_k, n2B_k)$^T$ is a noise vector.

[Math 27]

$$H\_B = \begin{pmatrix} h33\_k & h34\_k \\ h43\_k & h44\_k \end{pmatrix} \quad \text{(Formula 27)}$$

Using Formula 26 and Formula 27, the MIMO de-mapping unit 432B performs MLD, calculates a vector estimated value s'=(s'4k+3, s'4k+4)$^T$ (k=0, 1, . . . , (Ncells/4)−1) of a remaining half of the FEC blocks, and outputs the vector estimated value s'. Note that processing of the MIMO de-mapping unit 432B is not limited to MLD, and other methods such as zero forcing (ZF) may be used.

The P/S conversion unit 435 multiplexes the vector estimated value s'=(s'4k+1, s'4k+2)$^T$ (k=0, 1, . . . , (Ncells/4)−1) of half of the FEC blocks, which is outputted from the MIMO de-mapping unit 432A, and the vector estimated value s'=(s'4k+3, s'4k+4)$^T$ of the remaining half of the FEC blocks, which is outputted from the MIMO de-mapping unit 432B, and outputs a vector estimated value s'=(s'4k+1, s'4k+2, s'4k+3, s'4k+4)$^T$ of each FEC block.

Here, in Formula 25 and Formula 27, each component hMN_k (M=1, 2, N=1, 2) (M=3, 4, N=3, 4) of the transmission channel matrices H_A and H_B is a complex number. A point worth noting is that Formula 25 and Formula 27 include a transmission channel matrix H, which has two rows by two columns, and not four rows by four columns. Accordingly, compared to the MIMO de-mapping unit 232 in embodiment 1, the amount of computation with respect to the MIMO de-mapping units 432A and 432B is less.

According to the above configuration, with regard to MIMO using a plurality of fundamental bands, a receiver, reception method, and program are provided that receive a signal transmitted by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2).

Further, the components of the receiver 400 illustrated in FIG. 13, aside from the tuner units 205A and 205B, may be included in an integrated circuit 440.

<Modification of Transmitter and Transmission Method>

Figure 14:
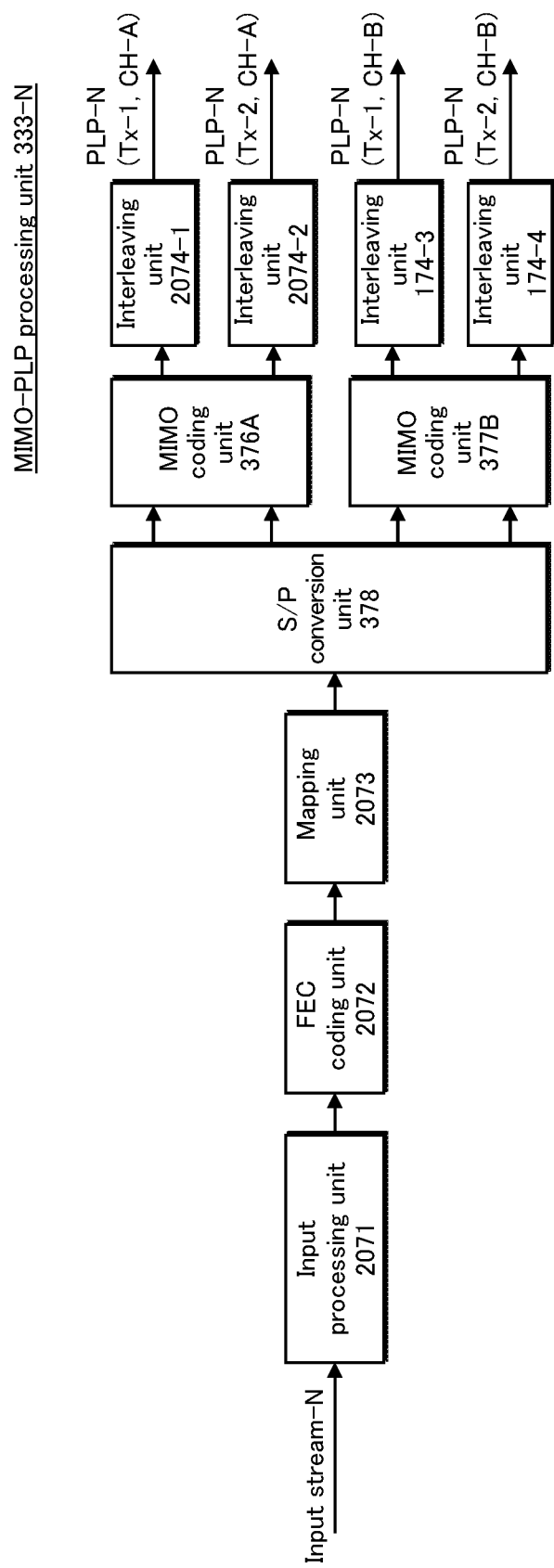
FIG. 14 illustrates a configuration of a MIMO-PLP processing unit 333 in embodiment 2.

The MIMO-PLP processing unit 331 illustrated in FIG. 9 may be replaced by a MIMO-PLP processing unit 333 illustrated in FIG. 14. In the MIMO-PLP processing unit 333 illustrated in FIG. 14, compared to the MIMO-PLP processing unit 331 illustrated in FIG. 9, the MIMO coding unit 376B is replaced by a MIMO coding unit 377B. Further, the two interleaving units 2074-3 and 2074-4 corresponding to the frequency channel B (CH-B) are replaced by the interleaving units 174-3 and 174-4, respectively.

The MIMO coding unit 377B illustrated in FIG. 14 may perform pre-coding using the fixed pre-coding matrix F_B shown in Formula 28.

[Math 28]

$$F\_B = \begin{pmatrix} w11\_B & w12\_B \\ w21\_B & w22\_B \end{pmatrix} \quad \text{(Formula 28)}$$

Accordingly, it is possible to obtain an effect of increasing reception quality of data by a receiver, by reducing correlation between the two frequency channels (CH-A, CH-B) with respect to transmission channel characteristics.

Further, the MIMO coding unit 377B illustrated in FIG. 14 may perform pre-coding by multiplying by the phase change matrix X_B(k) shown in Formula 29.

[Math 29]

$$X\_B(k) = \begin{pmatrix} 1 & 0 \\ 0 & e^{j\frac{2\pi}{9}k+\theta} \end{pmatrix}$$ (Formula 29)

π/9 is given as an example of the value of θ in Formula 29, but the value of θ is not limited in this way. According to the phase change matrix X_B(k) shown in Formula 29, with respect to a series of MIMO coded data for the transmit antenna 2 (Tx-2), a phase change of period 9 is performed that changes an initial value of 0 radians in 2π/9 radian steps for one frequency channel (CH-A). For the other frequency channel (CH-B), a phase change of period 9 is performed that changes an initial value of π/9 radians in 2π/9 radian steps. When the two frequency channels (CH-A, CH-B) are transmitted from the same transmit antenna group (Tx-1, Tx-2) and received by the same receive antenna group (Rx-1, Rx-2), especially in an LOS environment in which direct waves dominate, the transmission channel characteristics of the two frequency channels (CH-A, CH-B) are likely to have a high correlation. The phase change matrices X_A(k) and X_B(k) shown in Formula 15 and Formula 29 make it possible to obtain an effect of increasing reception quality of data by a receiver, by differentiating the phase change pattern of the two frequency channels (CH-A, CH-B) and thereby reducing correlation therebetween.

The two interleaving units 174-3 and 174-4 illustrated in FIG. 14 that correspond to the frequency channel B (CH-B) may perform interleaving of a different pattern to the two interleaving units 2074-1 and 2074-2 that correspond to the frequency channel A (CH-A), in the same way as in the <Modification of Transmitter and Transmission Method> in embodiment 1. Accordingly, the amount of computation for MIMO demapping is not increased, while making it possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of the fixed pre-coding matrices F_A and F_B; differentiation of phase change patterns of the phase change matrices X_A(k) and X_B(k); and differentiation of interleaving patterns may be used.

Figure 15:
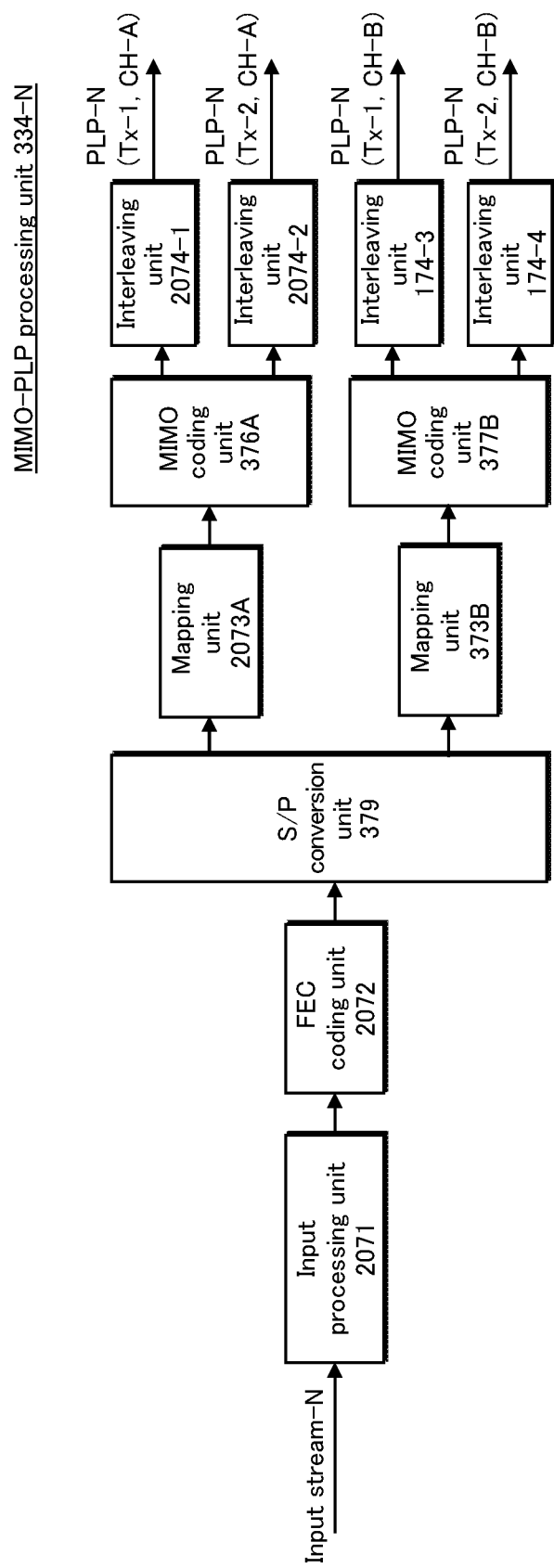
FIG. 15 illustrates a configuration of a MIMO-PLP processing unit 334 in embodiment 2.

Further, the MIMO-PLP processing unit 332 illustrated in FIG. 10 may be replaced by a MIMO-PLP processing unit 334 illustrated in FIG. 15. The MIMO-PLP processing unit 334 illustrated in FIG. 15, compared to the MIMO-PLP processing unit 332 illustrated in FIG. 10, is configured such that the mapping unit 2073B and the MIMO coding unit 376B are replaced by a mapping unit 373B and the MIMO coding unit 377B, respectively. Further, the two interleaving units 2074-3 and 2074-4 corresponding to the frequency channel B (CH-B) are replaced by the interleaving units 174-3 and 174-4, respectively.

The mapping unit 373B illustrated in FIG. 15 that corresponds to the frequency channel B (CH-B) may perform mapping of a different pattern to the mapping unit 2073A illustrated in FIG. 15 that corresponds to the frequency channel A (CH-A). Use of uniform mapping by one of the mapping units 2073A and 373B, and non-uniform mapping by the other one of the mapping units 2073A and 373B is given as an example of use of different patterns, but the present invention is not limited in this way. 64-quadrature amplitude modulation (QAM) and non-uniform (NU) 64-QAM, which are described in Non-Patent Literature 3, are given as examples of uniform mapping and non-uniform mapping, respectively, but the present invention is not limited in this way. In this way, it is possible to obtain an effect of increasing reception quality of data by a receiver, by reducing correlation between the two frequency channels (CH-A, CH-B) with respect to transmission channel characteristics.

The MIMO coding unit 377B, the interleaving unit 174-3, and the interleaving unit 174-4 perform the same operations as described with reference to FIG. 14.

As described above, with respect to the two frequency channels (CH-A, CH-B), one or more of: differentiation of the mapping pattern; differentiation of the fixed pre-coding matrices F_A and F_B; differentiation of phase change patterns of the phase change matrices X_A(k) and X_B(k); and differentiation of interleaving patterns may be used.

Figure 16:
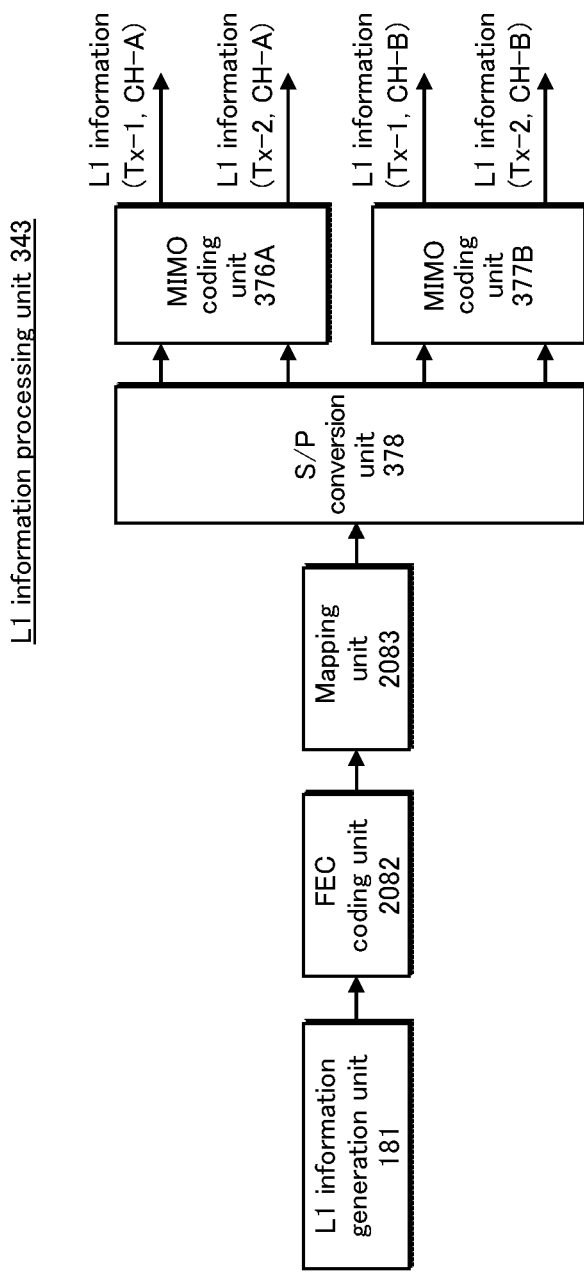
FIG. 16 illustrates a configuration of an L1 information processing unit 343 in embodiment 2.

Further, the L1 information processing unit 341 illustrated in FIG. 11 may be replaced by an L1 information processing unit 343 illustrated in FIG. 16. The L1 information processing unit 343 illustrated in FIG. 16, compared to the L1 information processing unit 341 illustrated in FIG. 11, is configured such that the MIMO coding unit 376B is replaced by the MIMO coding unit 377B. The MIMO coding unit 377B performs the same operations as the MIMO coding unit 377B illustrated in FIG. 14. In this way, it is possible to obtain an effect of increasing reception quality of data by a receiver, by reducing correlation between the two frequency channels (CH-A, CH-B) with respect to transmission channel characteristics.

Figure 17:
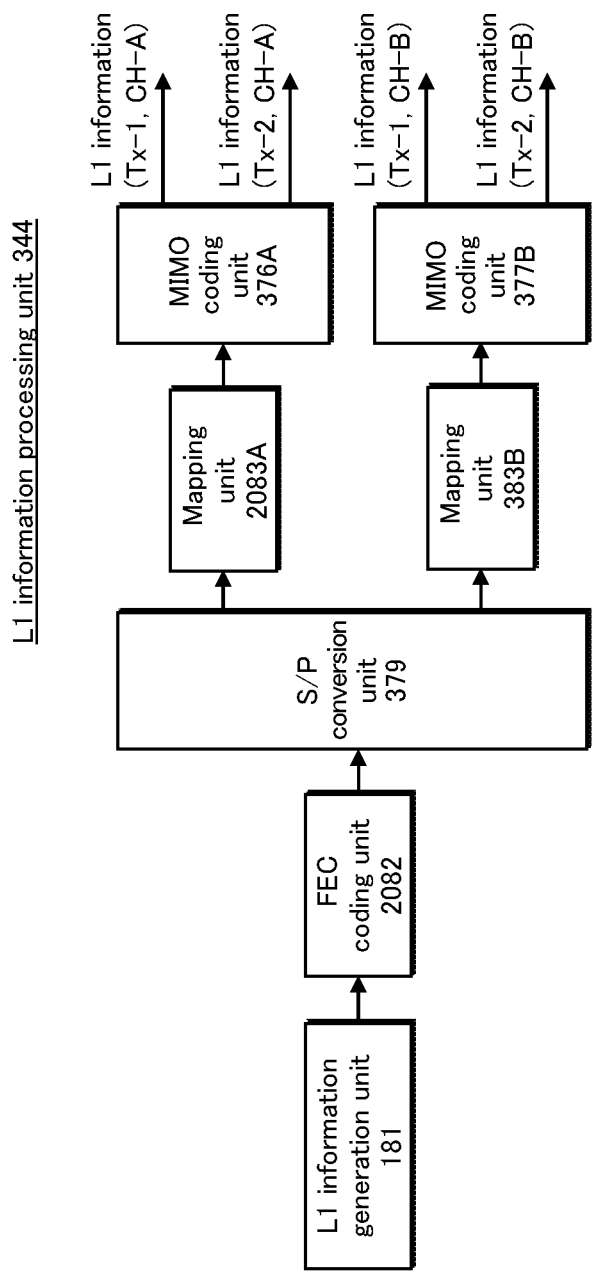
FIG. 17 illustrates a configuration of an L1 information processing unit 344 in embodiment 2.

Further, the L1 information processing unit 342 illustrated in FIG. 12 may be replaced by an L1 information processing unit 344 illustrated in FIG. 17. The L1 information processing unit 344 illustrated in FIG. 17, compared to the L1 information processing unit 342 illustrated in FIG. 12, is configured such that the mapping unit 2083B and the MIMO coding unit 376B are replaced by a mapping unit 383B and the MIMO coding unit 377B, respectively.

The mapping unit 383B illustrated in FIG. 17 that corresponds to the frequency channel B (CH-B) may, similar to the mapping unit 373B illustrated in FIG. 15, perform mapping of a different pattern to the mapping unit 2083A illustrated in FIG. 17 that corresponds to the frequency channel A (CH-A). Use of uniform mapping by one of the mapping units 2083A and 383B, and non-uniform mapping by the other one of the mapping units 2083A and 383B is given as an example of use of different patterns, but the present invention is not limited in this way. 64-QAM and NU 64-QAM, which are described in Non-Patent Literature 3, are given as examples of uniform mapping and non-uniform mapping, respectively, but the present invention is not limited in this way. In this way, it is possible to obtain an effect of increasing reception quality of data by a receiver, by reducing correlation between the two frequency channels (CH-A, CH-B) with respect to transmission channel characteristics.

Further, the MIMO coding unit 377B performs the same operations as the MIMO coding unit 377B illustrated in FIG. 14. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of mapping patterns; differentiation of the fixed pre-coding matrices F_A and F_B; and differentiation of phase change patterns of the phase change matrices X_A(k) and X_B(k) may be used.

<Modification of Receiver and Reception Method>

Figure 18:
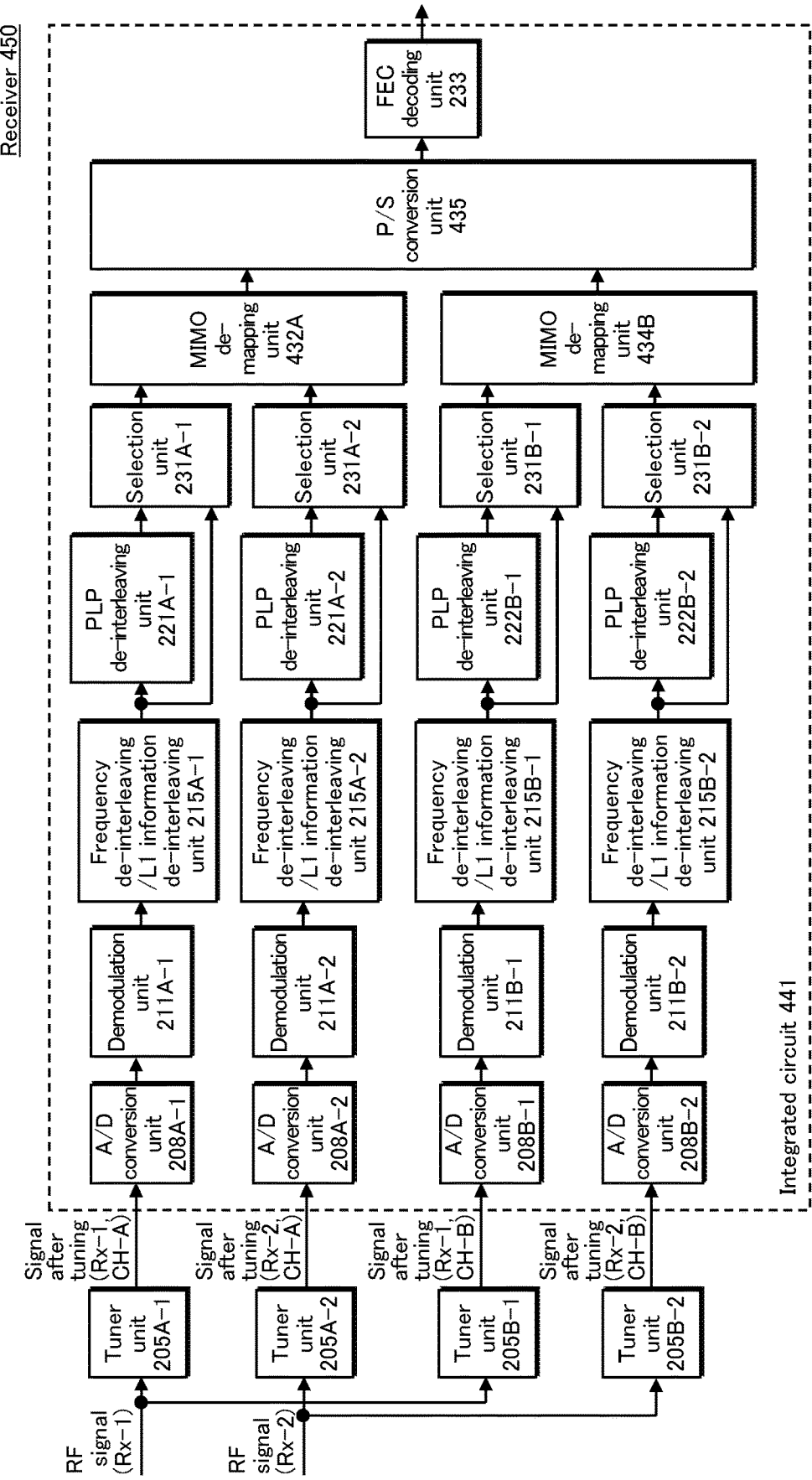
FIG. 18 illustrates a configuration of a receiver 450 in embodiment 2.

FIG. 18 illustrates a configuration of a receiver 450 corresponding to a case in which the MIMO-PLP processing unit 333 illustrated in FIG. 14 or the MIMO-PLP processing unit 334 illustrated in FIG. 15, and the L1 information processing unit 343 illustrated in FIG. 16 or the L1 information processing unit 344 illustrated in FIG. 17 are used. The receiver 450 illustrated in FIG. 18, compared to the receiver 400 illustrated in FIG. 13, is configured such that the PLP de-interleaving unit 221B and the MIMO de-mapping unit 432B that correspond to the frequency channel B (CH-B) are replaced by the PLP de-interleaving unit 222B and the MIMO de-mapping unit 434B, respectively. The PLP de-interleaving unit 222B illustrated in FIG. 18 that corresponds to the frequency channel B (CH-B) performs the same operations as the PLP de-interleaving unit illustrated in FIG. 7. Further, the MIMO de-mapping unit 434B that corresponds to the frequency channel B (CH-B) performs MLD using Formula 26 and Formula 27, taking into consideration the pre-coding matrix F_B shown in Formula 28 instead of the pre-coding matrix F_B shown in Formula 17. Further, the MIMO de-mapping unit 434B that corresponds to the frequency channel B (CH-B) performs MLD using Formula 26 and Formula 27 taking into consideration the phase change matrix X_B(k) shown in Formula 29 instead of the phase change matrix X_B(k) shown in Formula 19. Furthermore, as with the MIMO-PLP processing unit 334 illustrated in FIG. 15 and the L1 information processing unit 344, in a case in which mapping of different patterns is performed with respect to the frequency channel B (CH-B) and the frequency channel A (CH-A), MLD is performed with this under consideration.

Further, the components of the receiver 450 illustrated in FIG. 18, aside from the tuner unit 205A and 205B, may be included in an integrated circuit 441.

Embodiment 3

<Transmitter and Transmission Method>

Figure 19:
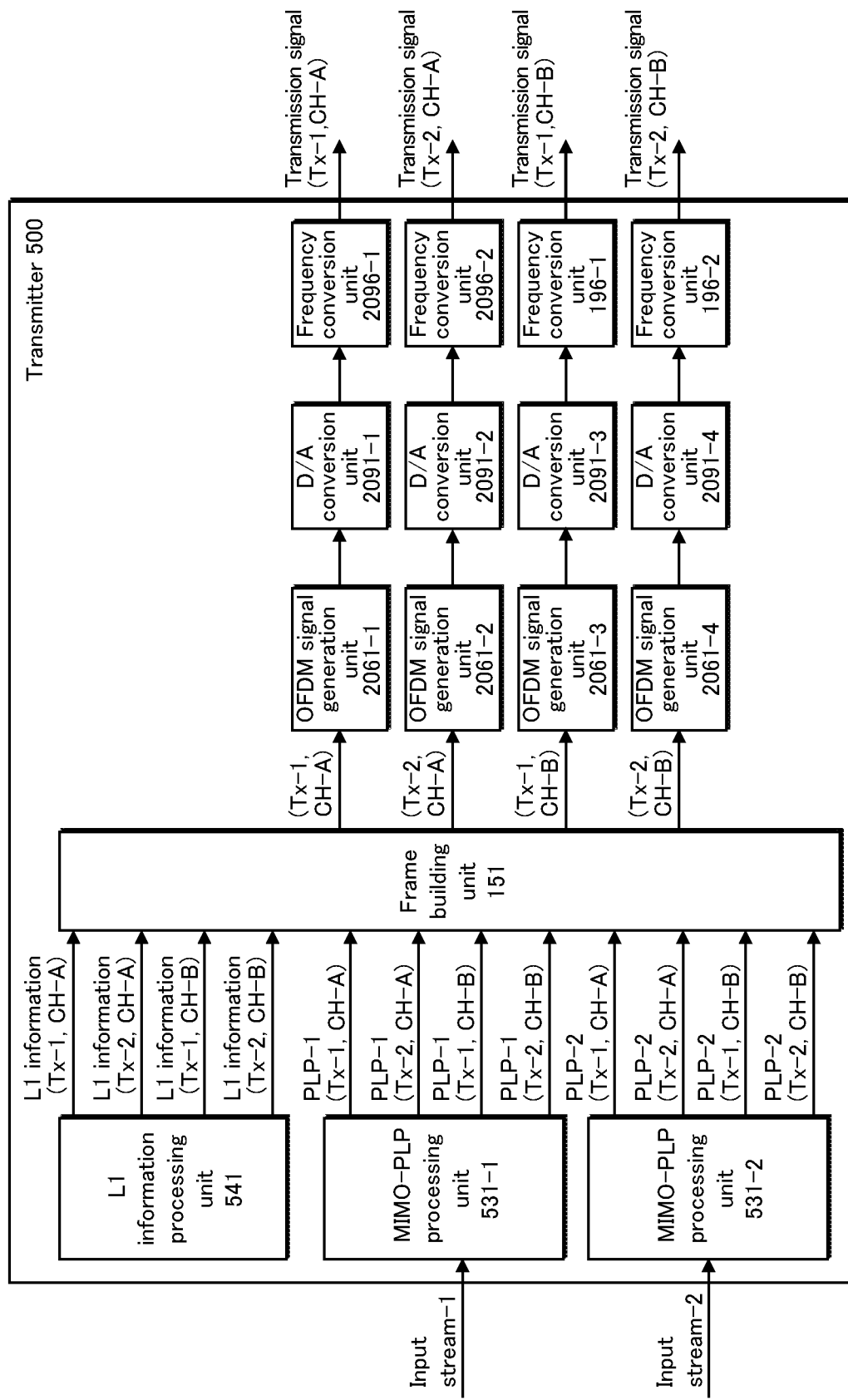
FIG. 19 illustrates a configuration of a transmitter 500 in embodiment 3.

FIG. 19 illustrates a configuration of a transmitter 500 in embodiment 3. Components that are the same as in the conventional transmitter or the transmitter in embodiments 1-2 have the same reference signs, and description thereof is omitted here.

The transmitter 500 illustrated in FIG. 19, compared to the transmitter 100 in embodiment 1, is configured such that the MIMO-PLP processing unit 131 and the L1 information processing unit 141 are replaced by a MIMO-PLP processing unit 531 and an L1 information processing unit 541, respectively.

Figure 20:
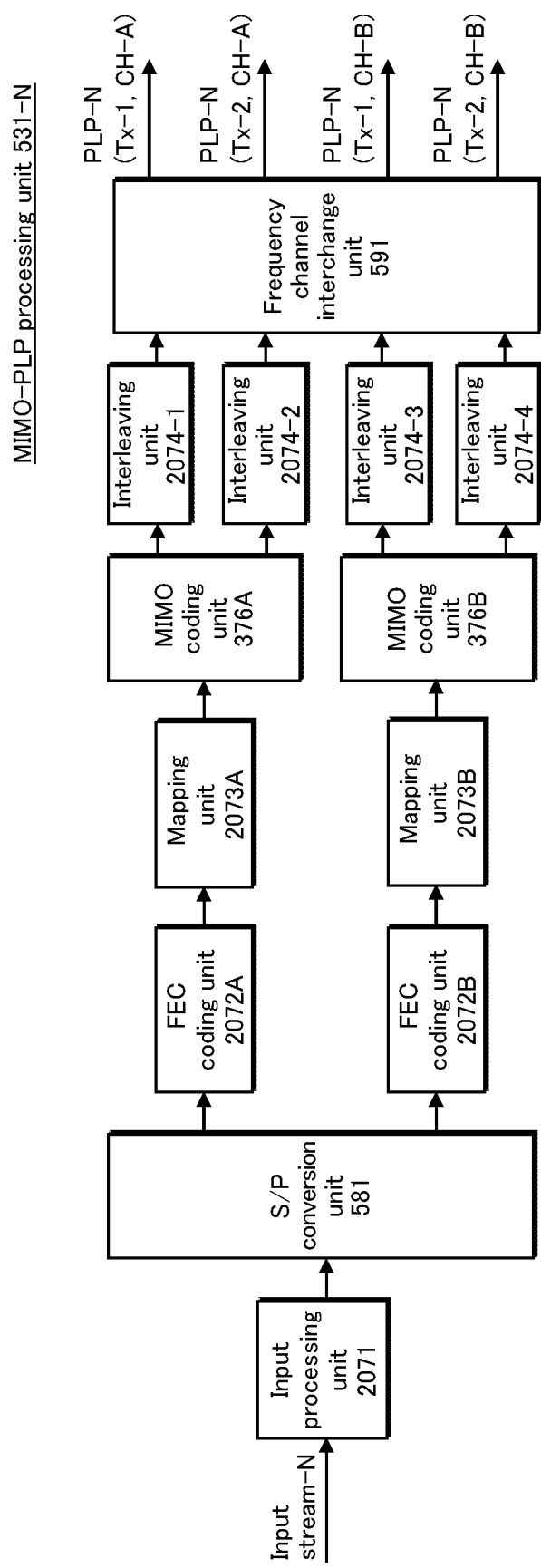
FIG. 20 illustrates a configuration of a MIMO-PLP processing unit 531 in embodiment 3.

FIG. 20 illustrates a configuration of the MIMO-PLP processing unit 531. Compared to the MIMO-PLP processing unit 332 in embodiment 2, illustrated in FIG. 10, the MIMO-PLP processing unit 531 is configured such that a frequency channel interchange unit 591 is added. Further, the S/P conversion unit 379 subsequent to the FEC coding unit 2072 is replaced by an S/P conversion unit 581 preceding two FEC coding units 2072.

The S/P conversion unit 581 illustrated in FIG. 20, with respect to baseband frames outputted from the input processing unit 2071, allocates baseband frames one by one from the start of each frame in turn to the FEC coding unit 2072A, the FEC coding unit 2072B, the FEC coding unit 2072A, the FEC coding unit 2072B, . . . .

Operations of the FEC coding unit 2072, the mapping unit 2073, the MIMO coding unit 376, and the interleaving unit 2074 are the same as the operations described with reference to FIG. 10. Accordingly, when the FEC blocks of each frame are expressed from the start as FB-1, FB-2, FB-3, FB-4, . . . , FB-Nblocks (where Nblocks equals the number of FEC blocks in the frame), for each frame, components of all cell mapping data (cells) of FB-(2N−1) (N=1, 2, . . . , (Nblocks/2)) are outputted from the interleaving units 2074-1 and 2074-2, which correspond to the frequency channel A (CH-A). On the other hand, for each frame, components of all mapping data (cells) of FB-2N are outputted from the interleaving units 2074-3 and 2074-4, which correspond to the frequency channel B (CH-B).

Figure 21:
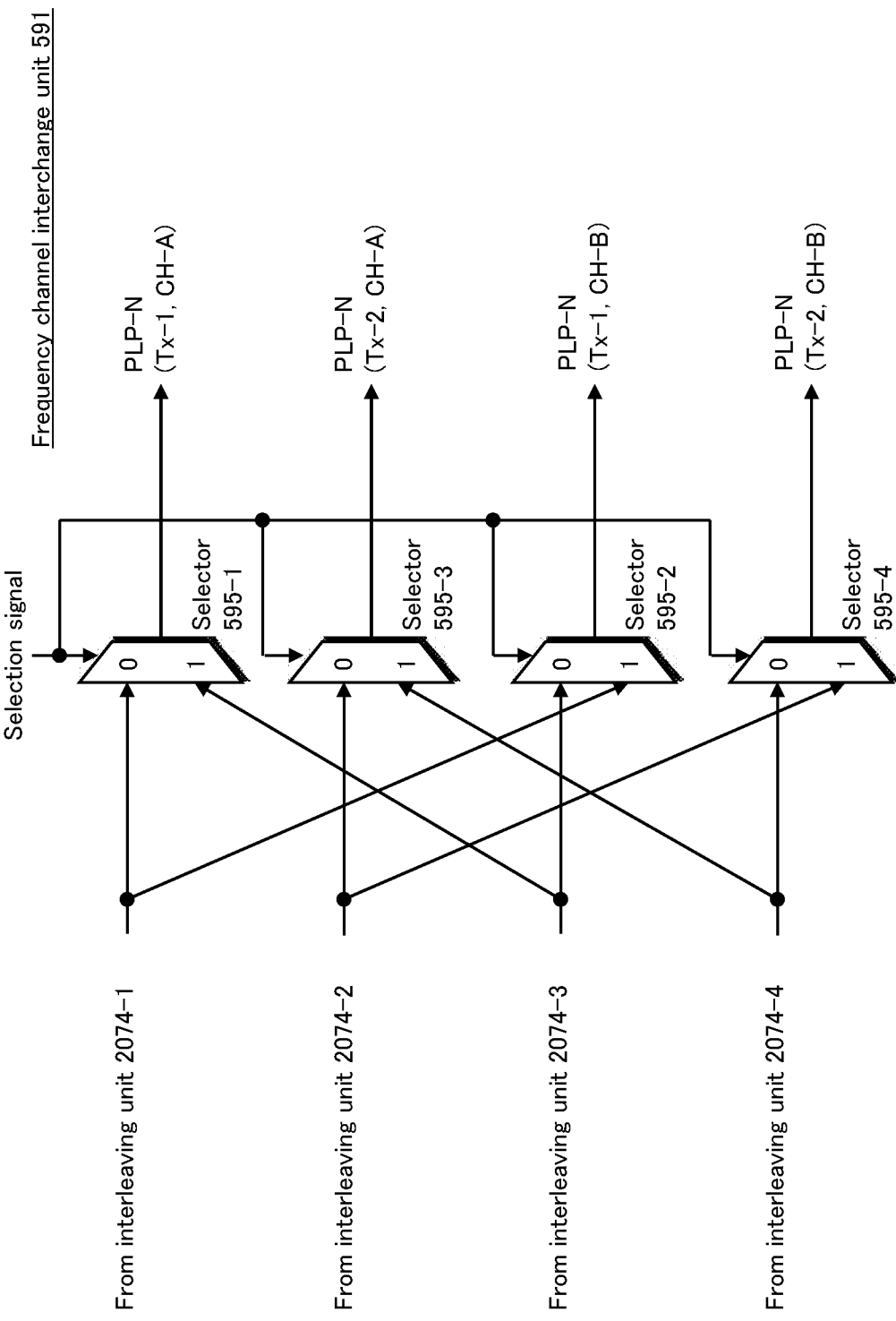
FIG. 21 illustrates a configuration of a frequency channel interchange unit 591 in embodiment 3.

FIG. 21 illustrates a configuration of the frequency channel interchange unit 591. The frequency channel interchange unit 591 has four selectors 595. The frequency channel interchange unit 591 generates a selection signal, and inputs the selection signal to the four selectors 595. When the selection signal is "0", a selector selects and outputs data that is inputted to "0". When the selection signal is "1", a selector selects and outputs data that is inputted to "1". As an example, in a case in which a selection signal that is generated alternates "0", "1", "0", "1", . . . , in cell units from the start of each FEC block, an output data series of the frequency channel interchange unit 591 is expressed as below.

$$Tx\text{-}1, CH\text{-}A{:}u1\_2k+1(FB-(2N-1)), u3\_2k+2(FB-2N)$$

$$Tx\text{-}2, CH\text{-}A{:}u2\_2k+1(FB-(2N-1)), u4\_2k+2(FB-2N)$$

$$Tx\text{-}1, CH\text{-}B{:}u3\_2k+1(FB-2N), u1\_2k+2(FB-2N-1)$$

$$Tx\text{-}2, CH\text{-}B{:}u4\_2k+1(FB-2N), u4\_2k+2(FB-2N-1)$$

$$(k=0,1, \ldots, (Ncells/2)-1)$$

uR_T (FB-L) is a component of mapping data (cell) (T)th from the start of FB-L, which is outputted from the interleaving unit 2074-R, and Ncells is the number of cells in an FEC block. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

Note that the selection signal is not limited to having an alternation of "0", "1", "0", "1", . . . , in cell units from the start of each FEC block. The number of "0"s and "1"s are preferably close to being equal.

Figure 22:
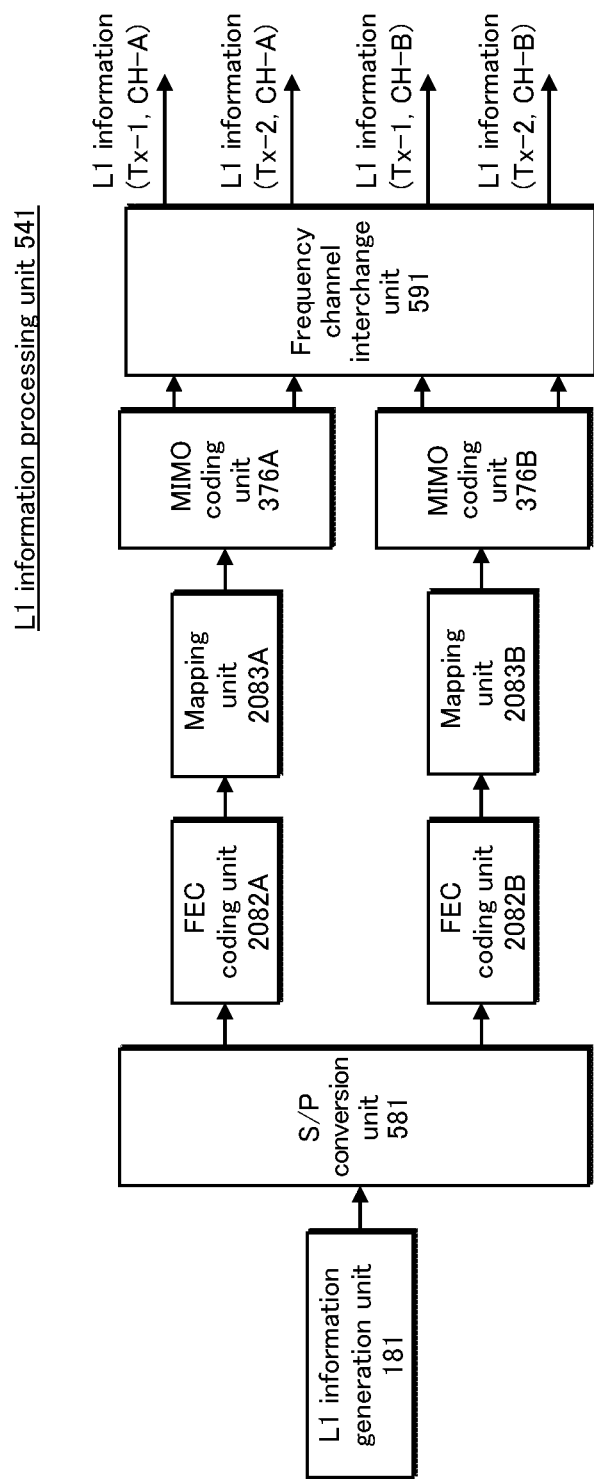
FIG. 22 illustrates a configuration of an L1 information processing unit 541 in embodiment 3.

FIG. 22 illustrates a configuration of the L1 information processing unit 541. Compared to the L1 information processing unit 342 in embodiment 2, illustrated in FIG. 12, the L1 information processing unit 541 is configured such that a frequency channel interchange unit 591 is added. Further, the S/P conversion unit 379 subsequent to the FEC coding unit 2082 is replaced by an S/P conversion unit 581 preceding two FEC coding units 2082. The S/P conversion unit 581, in the same way as the operation by the S/P conversion unit 581 illustrated in FIG. 20, with respect to baseband frames of L1-pre information and L1-post information outputted from the L1 information generation unit 181, allocates baseband frames one by one from the start of each frame in turn to the FEC coding unit 2082A, the FEC coding unit 2082B, the FEC coding unit 2082A, the FEC coding unit 2082B, . . . . Operations of the FEC coding unit 2082, the mapping unit 2083, and the MIMO coding unit 376 are the same as the operations described with reference to FIG. 12. Operations of the frequency channel interchange unit 591 are the same as the operations described with reference to FIG. 21. However, the operations are performed according to the configuration illustrated in FIG. 21, using MIMO coded data outputted from the MIMO coding unit 376 as input, and outputting to the frame building unit 151. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

According to the above configuration, with regard to MIMO using a plurality of fundamental bands, a transmitter, transmission method, and program are provided that sufficiently exhibit a frequency diversity effect with respect to the plurality of fundamental bands, by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, providing an FEC coding unit for each frequency channel using MIMO, and performing data interchange between frequency channels after interleaving are features of the transmitter 500.

<Receiver and Reception Method>

Figure 23:
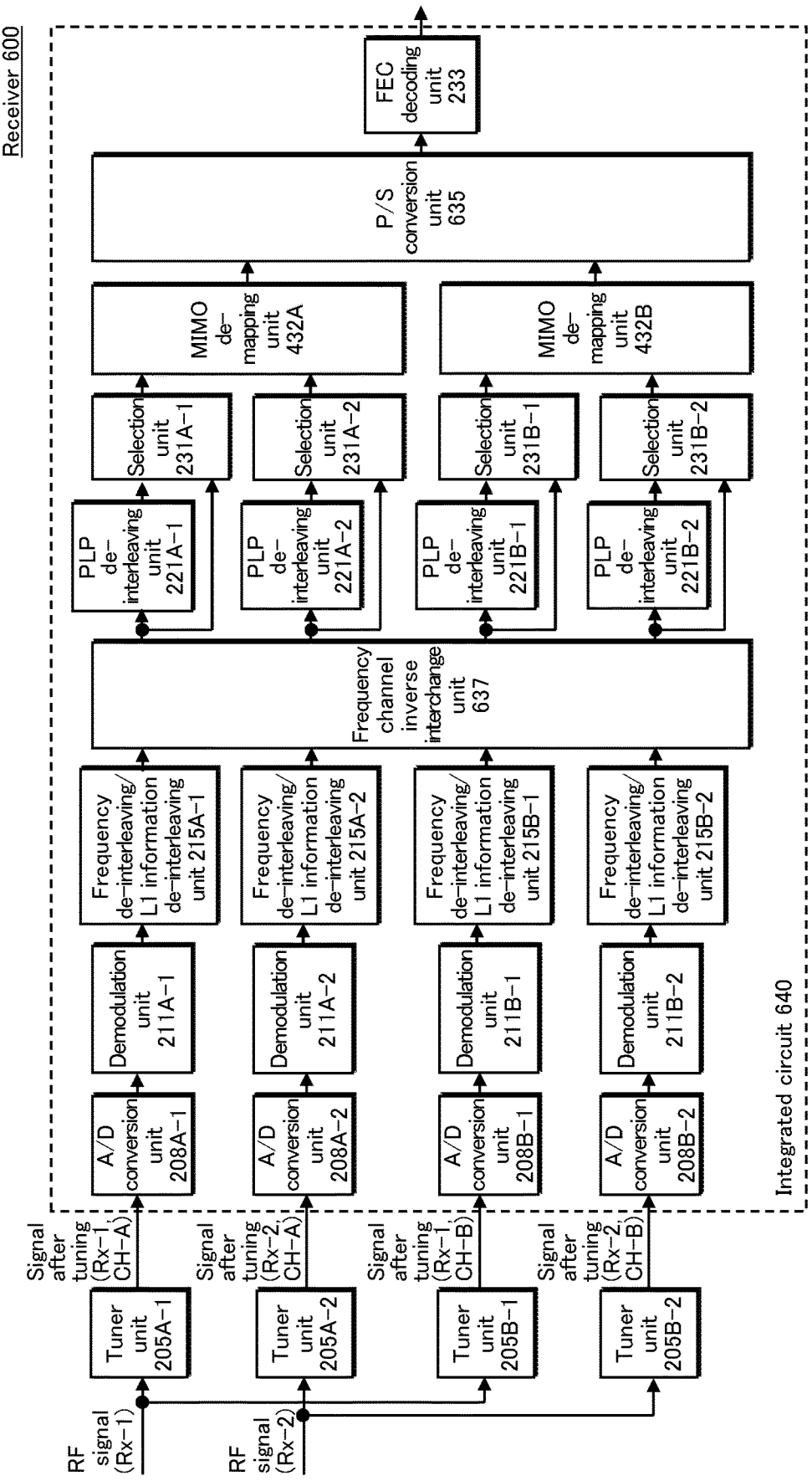
FIG. 23 illustrates a configuration of a receiver 600 in embodiment 3.

FIG. 23 illustrates a configuration of a receiver 600 in embodiment 3. The receiver 600 illustrated in FIG. 23 corresponds to the transmitter 500, illustrated in FIG. 19, and reflects functions of the transmitter 500. Components that are the same as in the conventional receiver or the receiver in embodiments 1-2 have the same reference signs, and description thereof is omitted here.

The receiver 600 illustrated in FIG. 23, compared to the receiver 400 in embodiment 2, illustrated in FIG. 13, is configured such that the P/S conversion unit 435 is replaced by a P/S conversion unit 635. Further, a frequency channel inverse interchange unit 637 is added.

The following describes operations of the receiver 600 illustrated in FIG. 23. The frequency channel inverse interchange unit 637 performs a data interchange that is the inverse of the data interchange performed by the frequency channel interchange unit 591 that is illustrated in FIG. 21. The P/S conversion unit 635 multiplexes and outputs, FEC block by FEC block, vector estimated values of FEC blocks FB−(2N−1) (N=1, 2, . . . , (Nblocks/2)) of each frame outputted from the MIMO demapping unit 432A and vector estimated values of FEC blocks FB−2N of each frame outputted from the MIMO demapping unit 432B. Other operations of the receiver 600 are the same as that of the receiver 400 in embodiment 2, illustrated in FIG. 13.

According to the above configuration, with regard to MIMO using a plurality of fundamental bands, a receiver, reception method, and program are provided that receive a signal transmitted by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, the P/S conversion unit 635 multiplexing and outputting input data FEC block by FEC block is a feature of the receiver 600. In this way, at the stage of MIMO de-mapping, in cases in which a time of decoding (such as sphere decoding) changes depending on such factors as carrier to noise power ratio (C/N) reception of transmission channels, the receiver 600 has the effect of making the process of the P/S conversion unit 635 easy.

Further, the components of the receiver 600 illustrated in FIG. 23, aside from the tuner unit 205A and 205B, may be included in an integrated circuit 640.

<Modification of Transmitter and Transmission Method>

Figure 24:
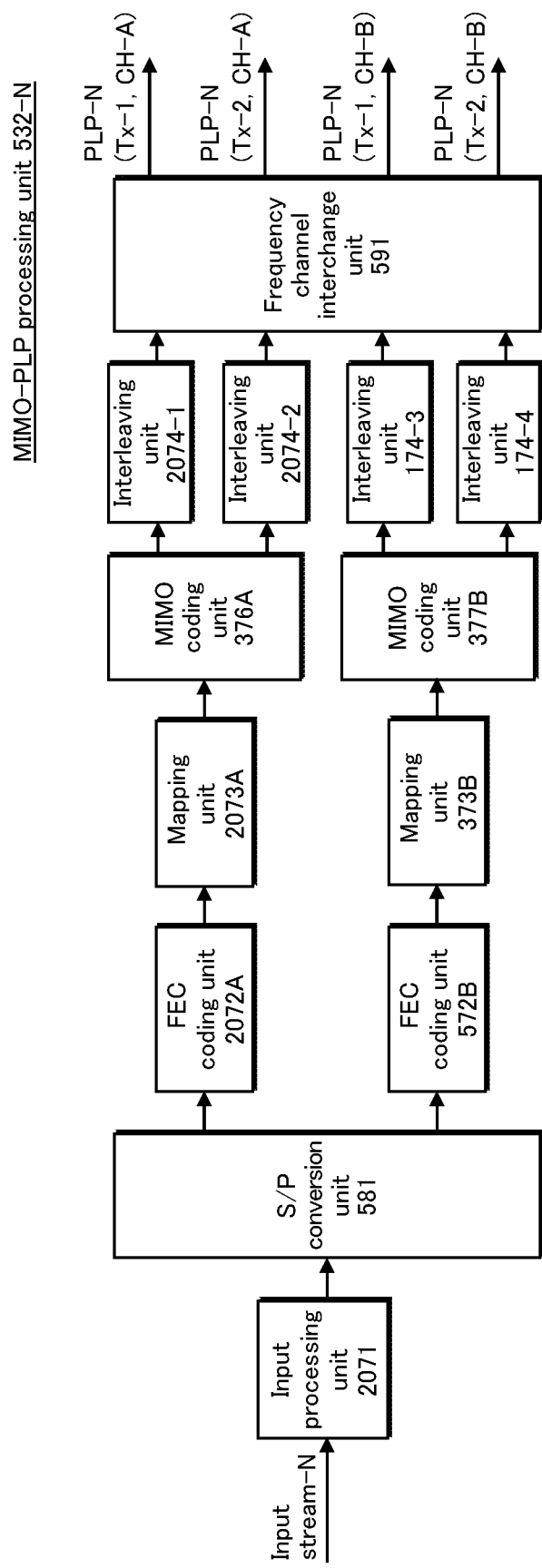
FIG. 24 illustrates a configuration of a MIMO-PLP processing unit 532 in embodiment 3.

The MIMO-PLP processing unit 531 illustrated in FIG. 20 may be replaced by a MIMO-PLP processing unit 532, illustrated in FIG. 24. The MIMO-PLP processing unit 532 illustrated in FIG. 24, compared to the MIMO-PLP processing unit 531 illustrated in FIG. 20, is configured such that the FEC coding unit 2072B, the mapping unit 2073B, and the MIMO coding unit 376B are replaced by an FEC coding unit 572B, a mapping unit 373B, and a MIMO coding unit 377B, respectively. Further, the two interleaving units 2074-3 and 2074-4 are replaced by the interleaving units 174-3 and 174-4, respectively.

The FEC coding unit 572B illustrated in FIG. 24 may perform LDPC coding of a different pattern to the FEC coding unit 2072A illustrated in FIG. 24. Using a parity check matrix for coding is given as an example of a different pattern, but the present invention is not limited in this way. For example, a different coding rate may be used. In this way, it is possible to obtain an effect of increasing reception quality of data by a receiver, by reducing correlation between the two frequency channels (CH-A, CH-B) with respect to transmission channel characteristics.

Operations of the mapping unit 373B, the MIMO coding unit 377B, and the interleaving units 174-3 and 174-4 are the same as the operations described with reference to FIG. 15. Other operations of the MIMO-PLP processing unit 532 are the same as that of the MIMO-PLP processing unit 531 illustrated in FIG. 20.

As described above, with respect to the two frequency channels (CH-A, CH-B), one or more of: differentiation of LDPC coding patterns; differentiation of mapping patterns; differentiation of the fixed pre-coding matrices F_A and F_B; differentiation of phase change patterns of the phase change matrices X_A(k) and X_B(k); and differentiation of interleaving patterns may be used.

Figure 25:
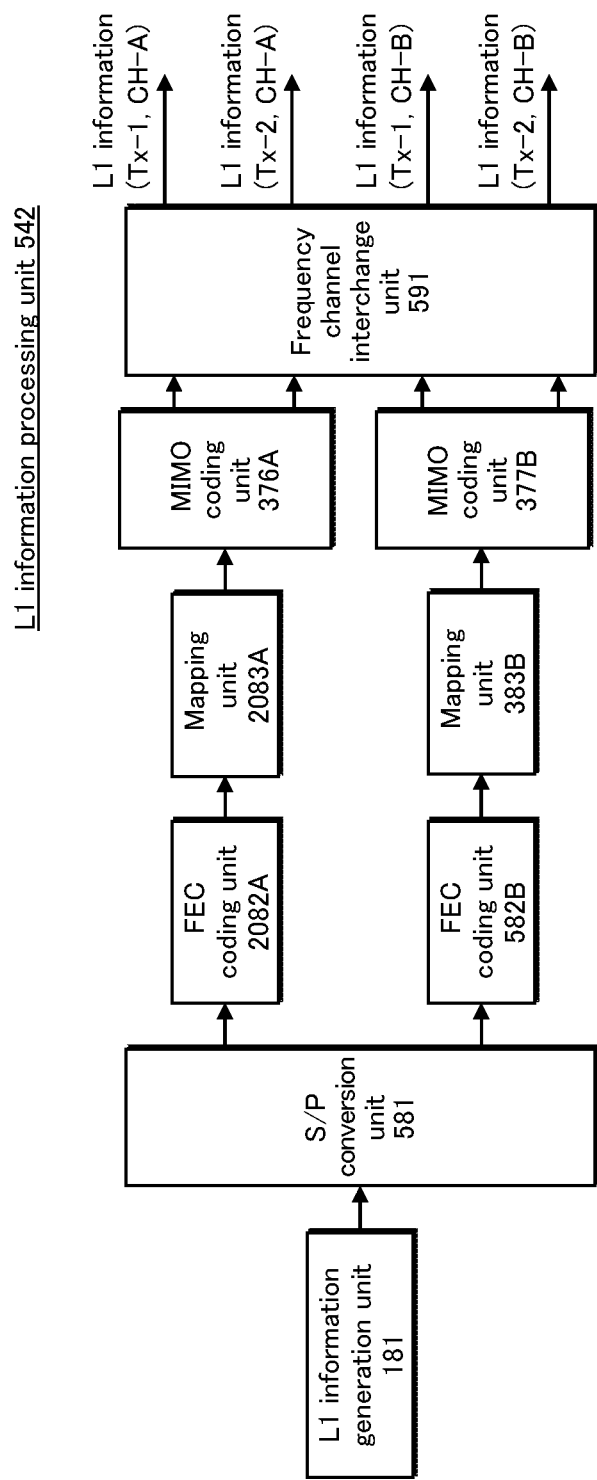
FIG. 25 illustrates a configuration of an L1 information processing unit 542 in embodiment 3.

Further, the L1 information processing unit 541 illustrated in FIG. 22 may be replaced by an L1 information processing unit 542, illustrated in FIG. 25. The L1 information processing unit 542 illustrated in FIG. 25, compared to the L1 information processing unit 541 illustrated in FIG. 22, is configured such that the FEC coding unit 2082B, the mapping unit 2083B, and the MIMO coding unit 376B are replaced by an FEC coding unit 582B, a mapping unit 383B, and a MIMO coding unit 377B, respectively.

The FEC coding unit 582B illustrated in FIG. 25 may perform LDPC coding of a different pattern to the FEC coding unit 2082A, in the same way as the FEC coding unit 572B illustrated in FIG. 24. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of LDPC coding patterns; differentiation of mapping patterns; differentiation of the fixed pre-coding matrices F_A and F_B; differentiation of phase change patterns of the phase change matrices X_A(k) and X_B(k); may be used.

<Modification of Receiver and Reception Method>

Figure 26:
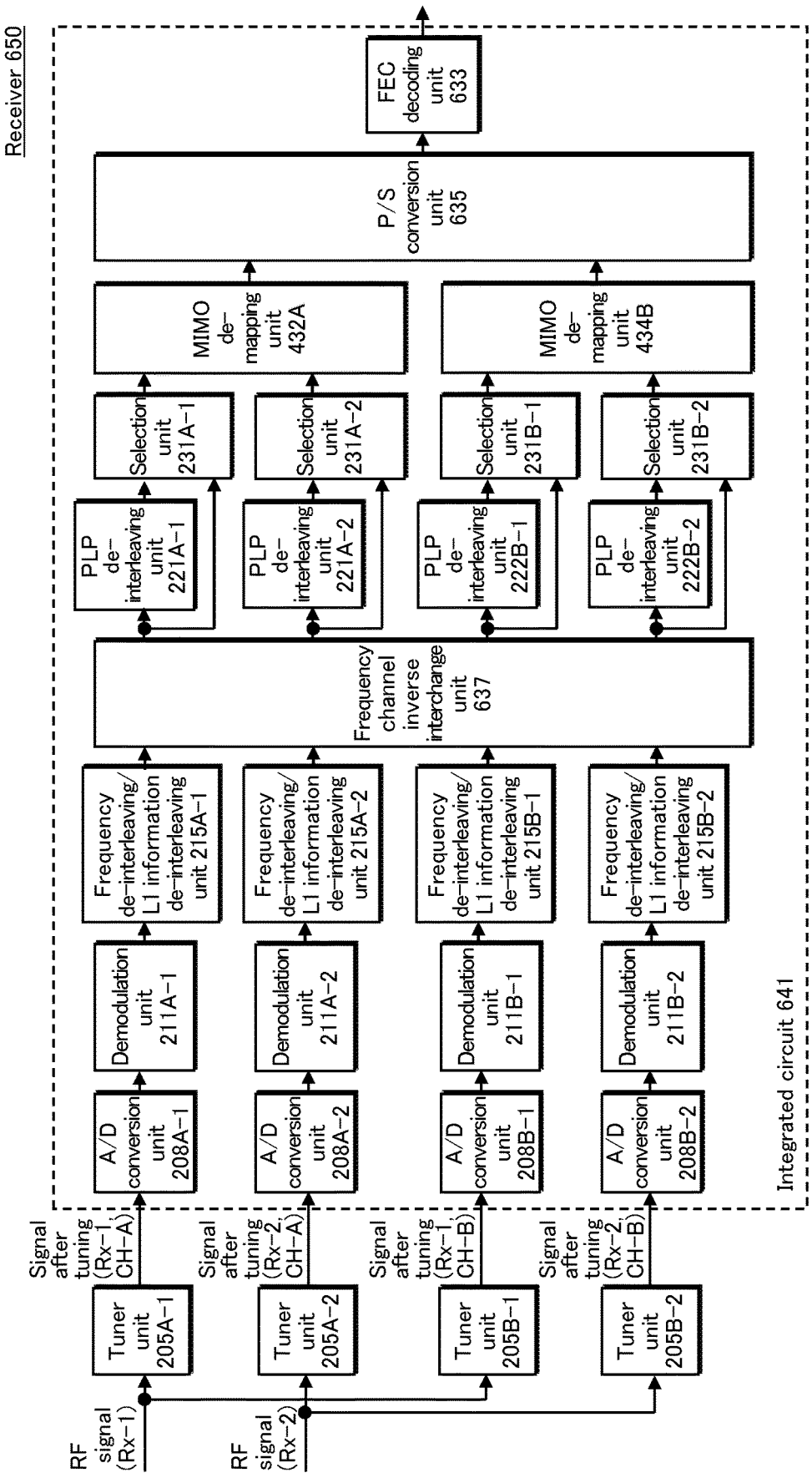
FIG. 26 illustrates a configuration of a receiver 650 in embodiment 3.

FIG. 26 illustrates a configuration of a receiver 650 corresponding to a case in which the MIMO-PLP processing unit 532 illustrated in FIG. 24 and the L1 information processing unit 542 illustrated in FIG. 25 are used. The receiver 650 illustrated in FIG. 26, compared to the receiver 600 illustrated in FIG. 23, is configured such that the PLP de-interleaving unit 221B, the MIMO de-mapping unit 432B, and the FEC decoding unit 233 are replaced by a PLP de-interleaving unit 222B, a MIMO de-mapping unit 434B, and an FEC decoding unit 633. Operations of the PLP de-interleaving unit 222B and the MIMO de-mapping unit 434B illustrated in FIG. 26 are the same as the operations described with reference to FIG. 18. The FEC decoding unit 633 performs LDPC decoding using different parity check polynomials with respect to FEC blocks FB–2N (N=1, 2, . . . , (Nblocks/2)) of each frame outputted from the MIMO de-mapping unit 434B and FEC blocks FB–(2N–1) of each frame outputted from the MIMO de-mapping unit 432A. Other operations of the receiver 650 are the same as that of the receiver 600 illustrated in FIG. 23.

Further, the components of the receiver 650 illustrated in FIG. 26, aside from the tuner unit 205A and 205B, may be included in an integrated circuit 641.

Embodiment 4

<Transmitter and Transmission Method>

Figure 27:
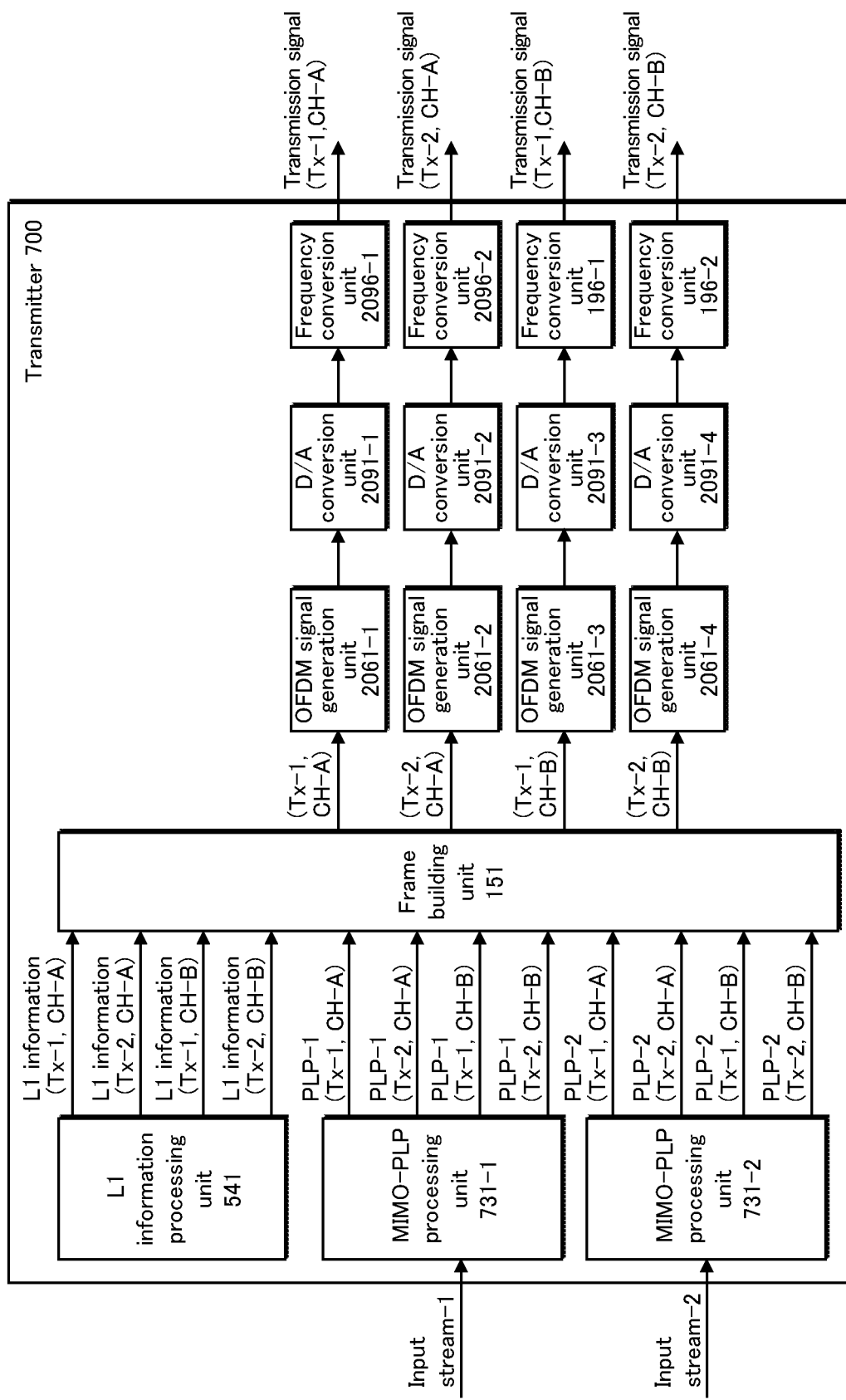
FIG. 27 illustrates a configuration of a transmitter 700 in embodiment 4.

FIG. 27 illustrates a configuration of a transmitter 700 in embodiment 4. Components that are the same as in the conventional transmitter or the transmitter in embodiments 1-3 have the same reference signs, and description thereof is omitted here.

The transmitter illustrated in FIG. 27, compared to the transmitter 500 in embodiment 3, illustrated in FIG. 19, is configured such that the MIMO-PLP processing unit 531 is replaced by a MIMO-PLP processing unit 731.

Figure 28:
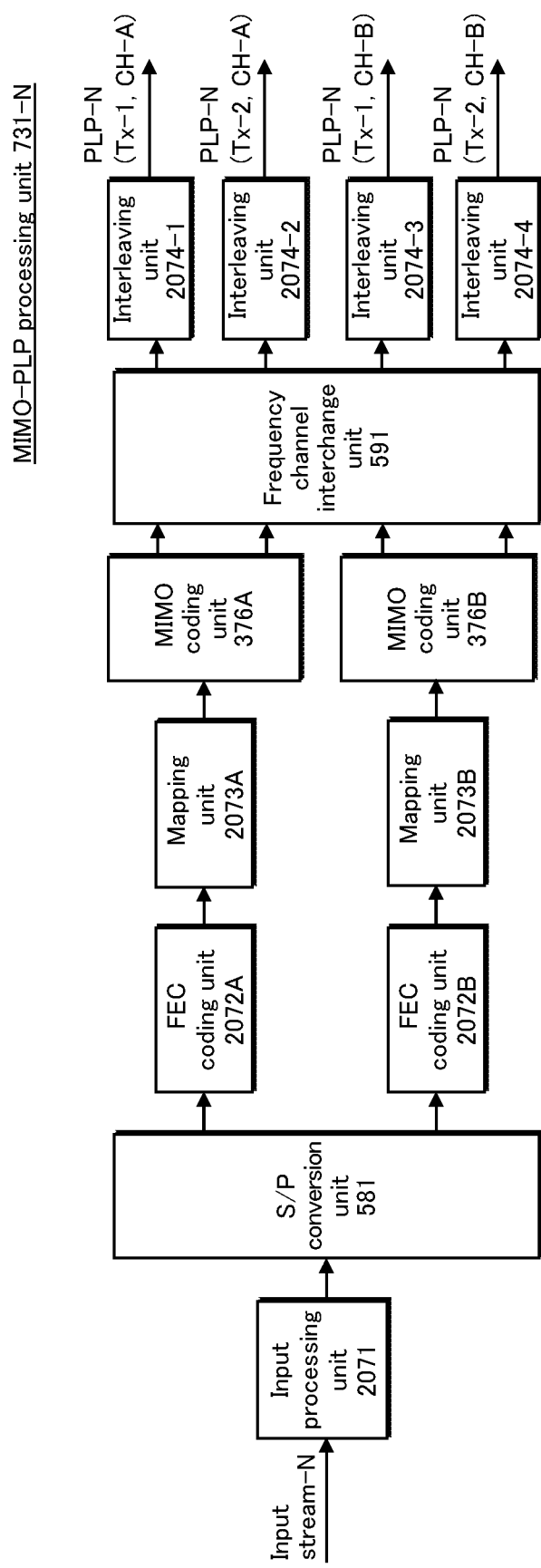
FIG. 28 illustrates a configuration of a MIMO-PLP processing unit 731 in embodiment 4.

FIG. 28 illustrates a configuration of the MIMO-PLP processing unit 731. Compared to the MIMO-PLP processing unit 531 in embodiment 3 illustrated in FIG. 20, the MIMO-PLP processing unit 731 is configured such that the position of the frequency channel interchange unit 591 is changed from being subsequent to the interleaving units 2074 to preceding the interleaving units 2074.

The frequency channel interchange unit 591 illustrated in FIG. 28 performs the same operations as described in embodiment 3. The frequency channel interchange unit 591 operates according to the configuration illustrated in FIG. 21, using MIMO coded data outputted from the MIMO coding units 376 as input, and outputting to the interleaving units 2074. Other operations of the MIMO-PLP processing unit 731 are the same as that of the MIMO-PLP processing unit 531 illustrated in FIG. 20. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

According to the above configuration, with regard to MIMO using a plurality of fundamental bands, a transmitter, transmission method, and program are provided that sufficiently exhibit a frequency diversity effect with respect to the plurality of fundamental bands, by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, providing an FEC coding units for each frequency channel using MIMO and performing data interchange between frequency channels after MIMO coding are features of the transmitter 700.

<Receiver and Reception Method>

Figure 29:
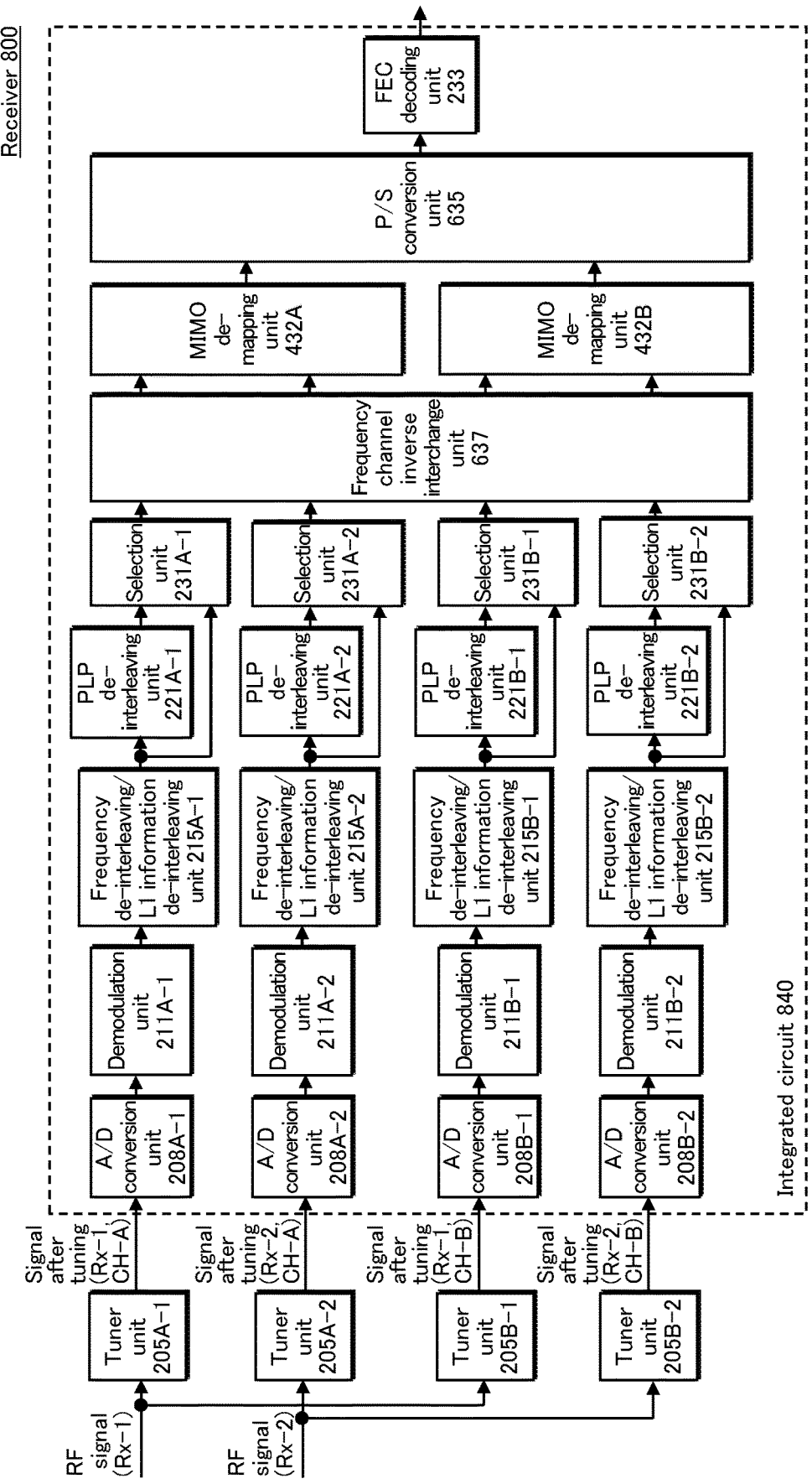
FIG. 29 illustrates a configuration of a receiver 800 in embodiment 4.

FIG. 29 illustrates a configuration of a receiver 800 in embodiment 4. The receiver 800 illustrated in FIG. 29 corresponds to the transmitter 700, illustrated in FIG. 27, and reflects functions of the transmitter 700. Components that are the same as in the conventional receiver or the receiver in embodiments 1-3 have the same reference signs, and description thereof is omitted here. The receiver 800 illustrated in FIG. 29, compared to the receiver 600 in embodiment 3, illustrated in FIG. 23, is configured such that a position of the frequency channel inverse interchange unit 637 is changed from preceding the PLP de-interleaving units 221 to preceding the MIMO de-mapping units 432.

The frequency channel inverse interchange unit 637 illustrated in FIG. 29 performs the same operations as in embodiment 3, performing data interchange that is the inverse of that performed by the frequency channel interchange unit 591, illustrated in FIG. 28. Other operations of the receiver 800 are the same as that of the receiver 600 in embodiment 3, illustrated in FIG. 23.

According to the above configuration, with regard to MIMO using a plurality of fundamental bands, a receiver, reception method, and program are provided that receive a signal transmitted by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, the P/S conversion unit 635 multiplexing and outputting input data FEC block by FEC block is a feature of the receiver 800. In this way, at the stage of MIMO de-mapping, in cases in which a time of decoding (such as sphere decoding) changes depending on such factors as carrier to noise power ratio (C/N) reception of transmission channels, the receiver 600 has the effect of making the process of the P/S conversion unit 635 easy.

Further, the components of the receiver 800 illustrated in FIG. 29, aside from the tuner unit 205A and 205B, may be included in an integrated circuit 840.

<Modification of Transmitter and Transmission Method>

Figure 30:
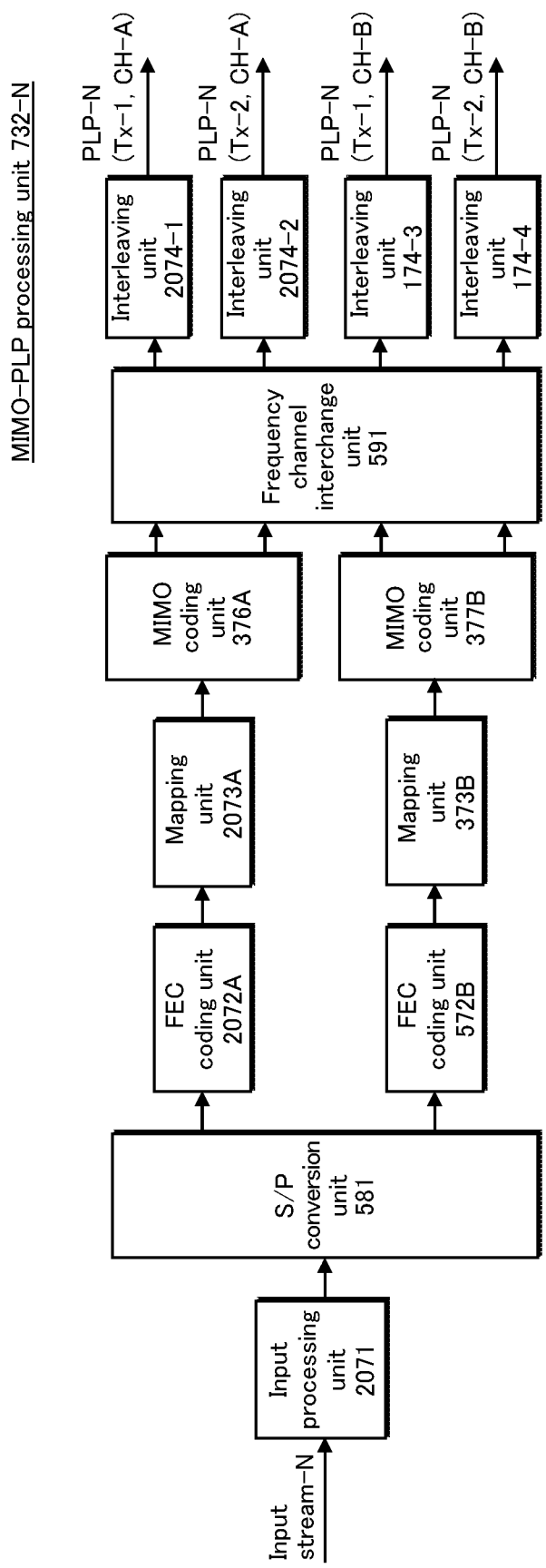
FIG. 30 illustrates a configuration of a MIMO-PLP processing unit 732 in embodiment 4.

The MIMO-PLP processing unit 731 illustrated in FIG. 28 may be replaced by a MIMO-PLP processing unit 732, illustrated in FIG. 30. The MIMO-PLP processing unit 732 illustrated in FIG. 30, compared to the MIMO-PLP processing unit 731 illustrated in FIG. 28, is configured such that the FEC coding unit 2072B, the mapping unit 2073B, and the MIMO coding unit 376B are replaced by the FEC coding unit 572B, the mapping unit 373B, and the MIMO coding unit 377B. Further, the two interleaving units 2074-3 and 2074-4 are replaced by the interleaving units 174-3 and 174-4, respectively.

Operations of the FEC coding unit 572B, the mapping unit 373B, the MIMO coding unit 377B, and the interleaving units 174-3 and 174-4 illustrated in FIG. 30 are the same as the operations described with reference to FIG. 24. Other operations of the MIMO-PLP processing unit 732 are the same as that of the MIMO-PLP processing unit 731 illustrated in FIG. 28. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of the LDPC coding patterns; differentiation of the mapping patterns; differentiation of the fixed pre-coding matrices F_A and F_B; differentiation of phase change patterns of the phase change matrices X_A(k) and X_B(k); and differentiation of interleaving patterns may be used.

<Modification of Receiver and Reception Method>

Figure 31:
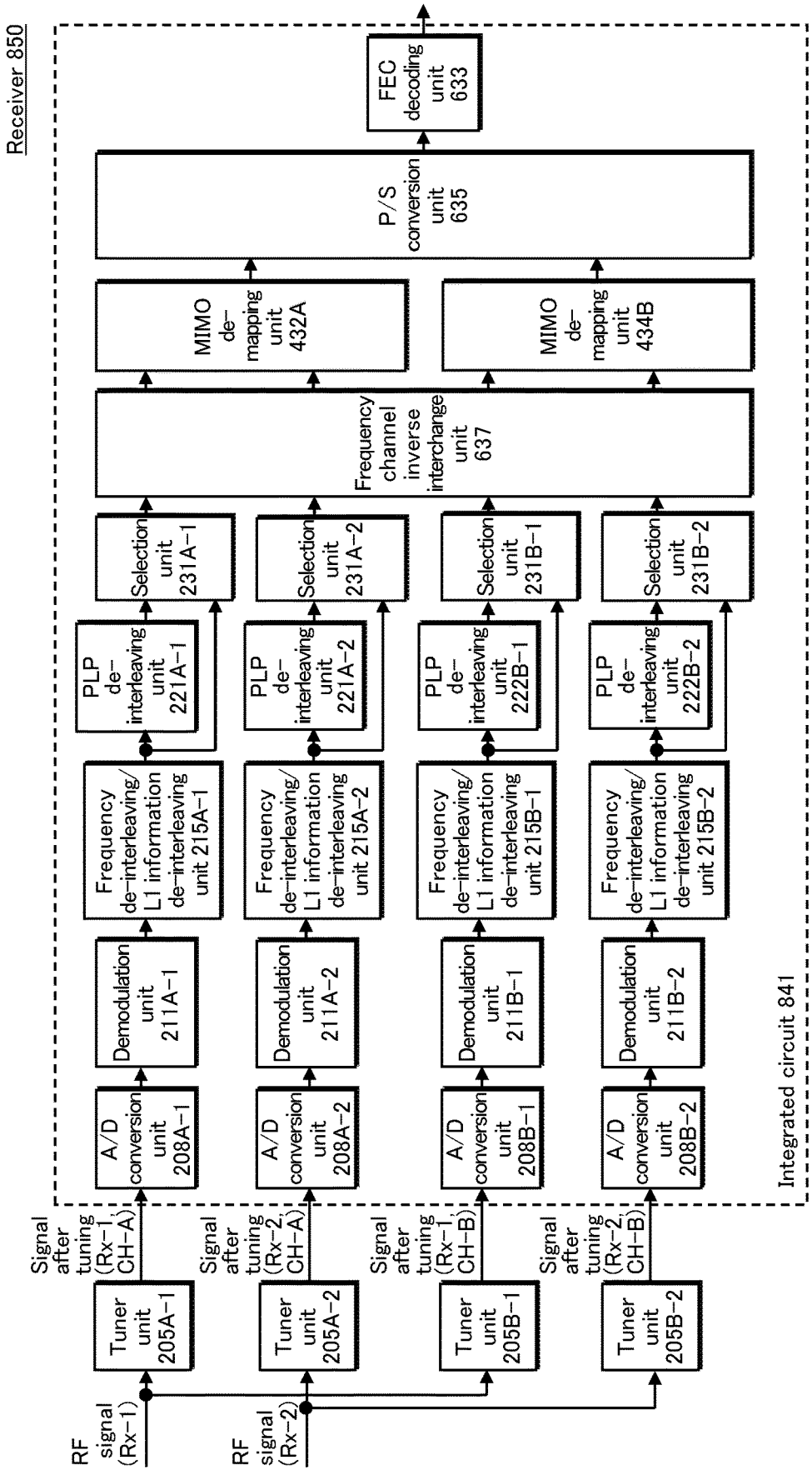
FIG. 31 illustrates a configuration of a receiver 850 in embodiment 4.

FIG. 31 illustrates a configuration of a receiver 850 corresponding to a case in which the MIMO-PLP processing unit 732 illustrated in FIG. 30 is used. The receiver 850 illustrated in FIG. 31, compared to the receiver 800 illustrated in FIG. 29, is configured such that the PLP de-interleaving unit 221B, the MIMO de-mapping unit 432B, and the FEC decoding unit 233 are replaced by the PLP de-interleaving unit 222B, the MIMO de-mapping unit 434B, and the FEC decoding unit 633, respectively. Operations of the PLP de-interleaving unit 222B, the MIMO de-mapping unit 434B, and the FEC decoding unit 633 illustrated in FIG. 31 are the same as the operations described with reference to FIG. 26. Other operations of the receiver 850 are the same as that of the receiver 800 illustrated in FIG. 29.

Further, the components of the receiver 850 illustrated in FIG. 31, aside from the tuner unit 205A and 205B, may be included in an integrated circuit 841.

Embodiment 5

<Transmitter and Transmission Method>

Figure 32:
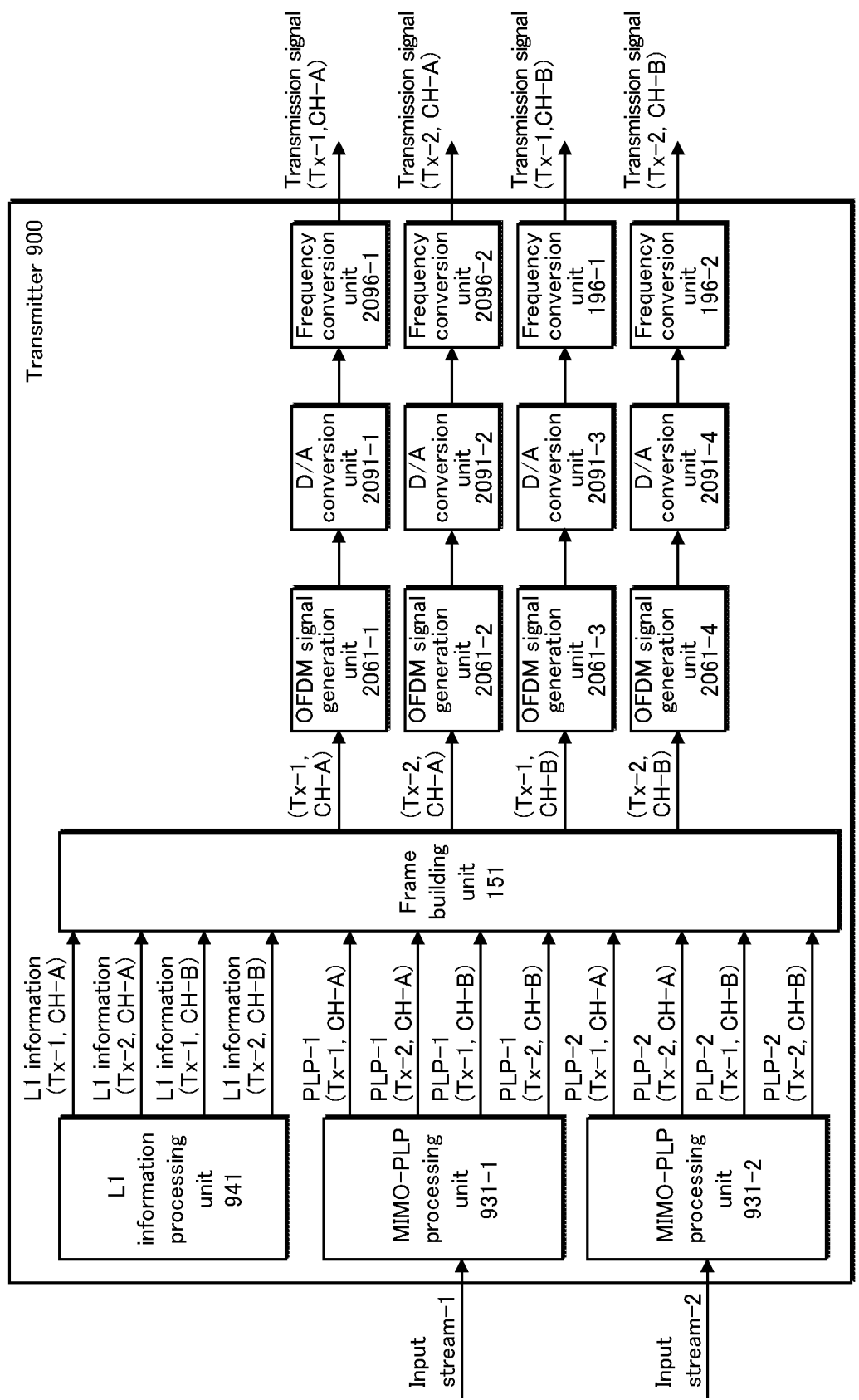
FIG. 32 illustrates a configuration of a transmitter 900 in embodiment 5.

FIG. 32 illustrates a configuration of a transmitter 900 in embodiment 5. Components that are the same as in the conventional transmitter or the transmitter in embodiments 1-4 have the same reference signs, and description thereof is omitted here.

The transmitter 900 illustrated in FIG. 32, compared to the transmitter 100 in embodiment 1, is configured such that the MIMO-PLP processing unit 131 and the L1 information processing unit 141 are replaced by a MIMO-PLP processing unit 931 and an L1 information processing unit 941, respectively.

Figure 33:
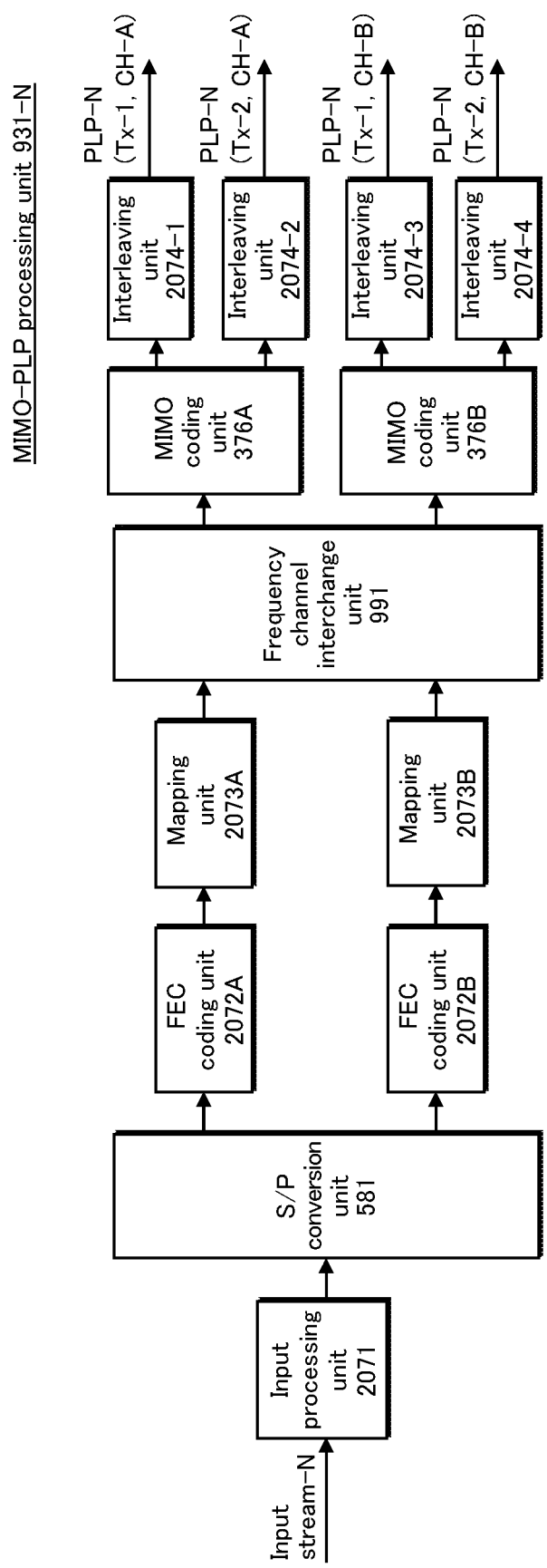
FIG. 33 illustrates a configuration of a MIMO-PLP processing unit 931 in embodiment 5.

FIG. 33 illustrates a configuration of the MIMO-PLP processing unit 931. Compared to the MIMO-PLP processing unit 731 in embodiment 4, illustrated in FIG. 28, the MIMO-PLP processing unit 931 is configured such that the frequency channel interchange unit 591 preceding the interleaving units 2074 is replaced by a frequency channel interchange unit 991 preceding the MIMO coding units 376.

Figure 34:
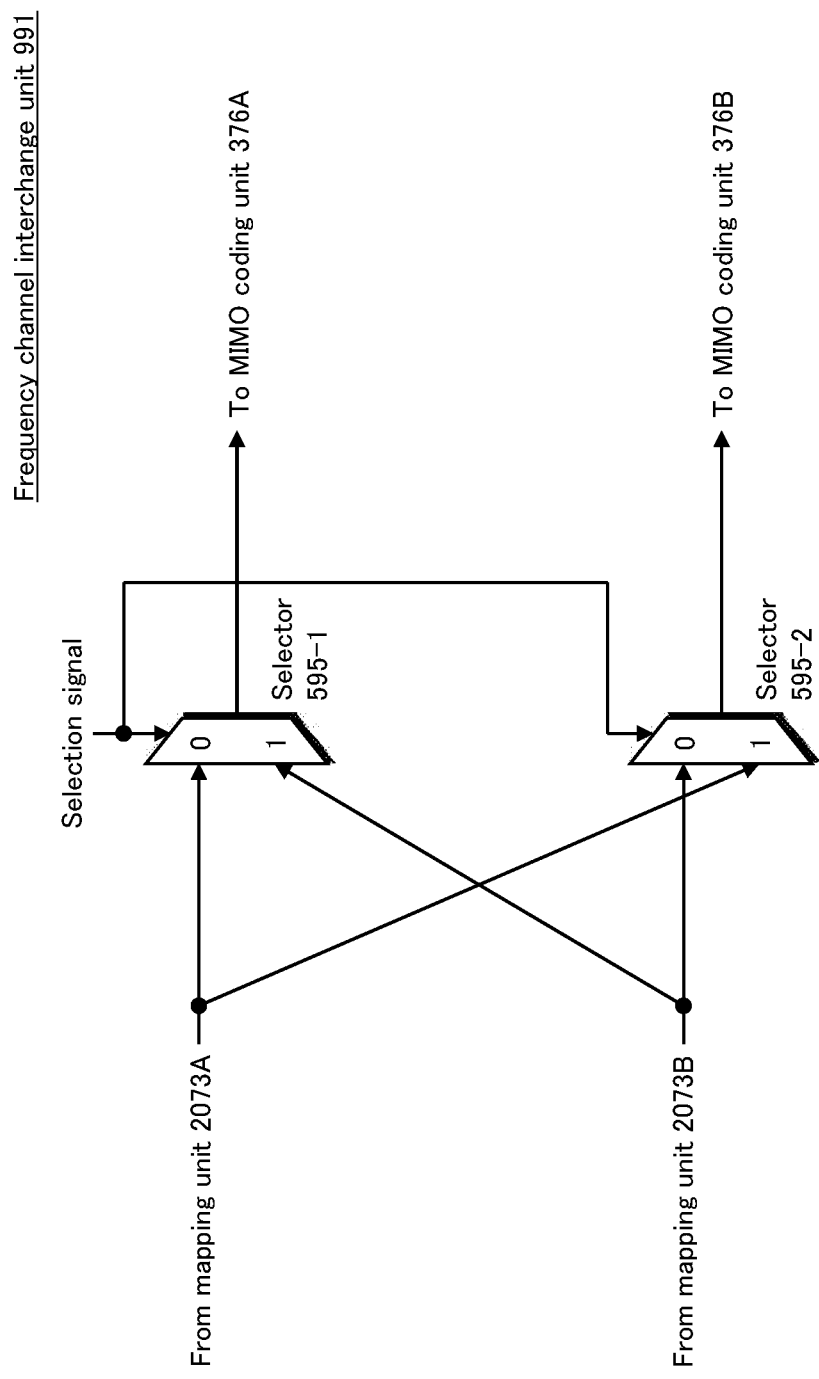
FIG. 34 illustrates a configuration of a frequency channel interchange unit 991 in embodiment 5.

FIG. 34 illustrates a configuration of the frequency channel interchange unit 991. The frequency channel interchange unit 991 has two selectors 595. The frequency channel interchange unit 991 generates a selection signal, and inputs the selection signal to the two selectors 595. When the selection signal is "0", a selector selects and outputs data that is inputted to "0". When the selection signal is "1", a selector selects and outputs data that is inputted to "1". As an example, in a case in which a selection signal that is generated alternates "0", "0", "1", "1", "0", "0", "1", "1", ..., in units of two cells from the start of each FEC block, an output data series of the frequency channel interchange unit 991 is expressed as below.

Output to the MIMO coding unit 376A:vA_2k+1
(FB−(2N−1)),vA_2k+2(FB−(2N−1)),vB_2k+3
(FB−2N),vB_2k+4(FB−2N)

Output to the MIMO coding unit 376B:vB_2k+1
(FB−2N),vB_2k+2(FB−2N),vA_2k+3(FB−(2N−
1)),vA_2k+4(FB−(2N−1))

(k=0,1, ..., (Ncells/2)−1)(N=1,2, ..., (Nblocks/2))

vA_T (FB-L) is mapping data (cells) (T)th from the start of FB-L that is outputted from the mapping unit 2073A, vB_T (FB-L) is mapping data (cells) (T)th from the start of FB-L that is outputted from the mapping unit 2073B, Ncells is the number of cells in an FEC block, and Nblocks is the number of FEC blocks in a frame. Note that the selection signal is not limited to having an alternation of "0", "0", "1", "1", "0", "0", "1", "1", ..., in units of two cells from the start of each FEC block. The number of "0"s and "1"s are preferably close to being equal.

Accordingly, mapping data (cells) of FB−(2N−1) and FB−2N are alternately inputted in units of two cells to the MIMO coding units 376A and 376B that are illustrated in FIG. 33. The MIMO coding units 376A and 376B, as in the operations described with reference to FIG. 9, each perform pre-coding in units of two cells, and output each cell to the two transmit antennas (Tx-1, Tx-2).

Other operations of the MIMO-PLP processing unit 931 illustrated in FIG. 33 are the same as that of the MIMO-PLP processing unit 731 illustrated in FIG. 28. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

Figure 35:
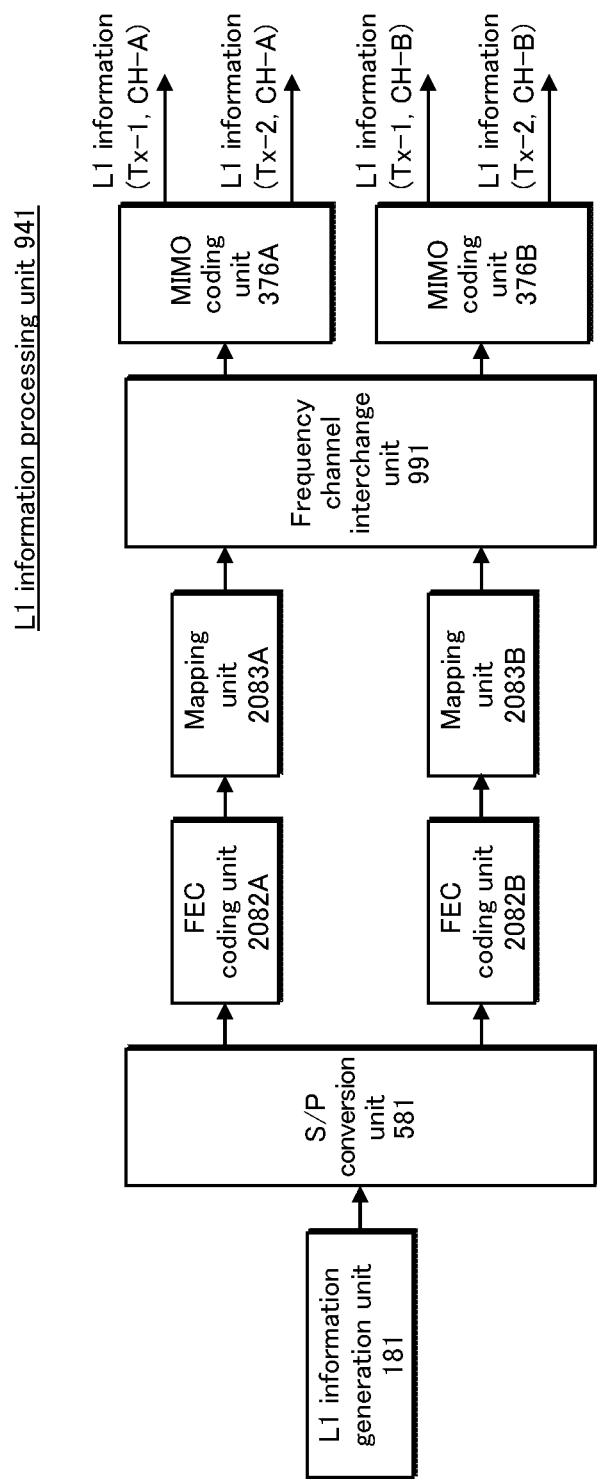
FIG. 35 illustrates a configuration of an L1 information processing unit 941 in embodiment 5.

FIG. 35 illustrates a configuration of the L1 information processing unit 941. Compared to the L1 information processing unit 541 in embodiment 3, illustrated in FIG. 22, the L1 information processing unit 941 is configured such that the frequency channel interchange unit 591 subsequent to the MIMO coding units 376 is replaced by the frequency channel interchange unit 991 preceding the MIMO coding units 376. Operations of the frequency channel interchange unit 991 are the same as the operations described with reference to FIG. 34. However, operations are performed according to the configuration illustrated in FIG. 34, using mapping data (cells) outputted from the mapping units 2083, and outputting to the MIMO coding units 376. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

According to the above configuration, with regard to MIMO using a plurality of fundamental bands, a transmitter, transmission method, and program are provided that sufficiently exhibit a frequency diversity effect with respect to the plurality of fundamental bands, by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, providing an FEC coding unit for each frequency channel using MIMO, and performing data interchange between frequency channels after mapping are features of the transmitter 900.

<Receiver and Reception Method>

Figure 36:
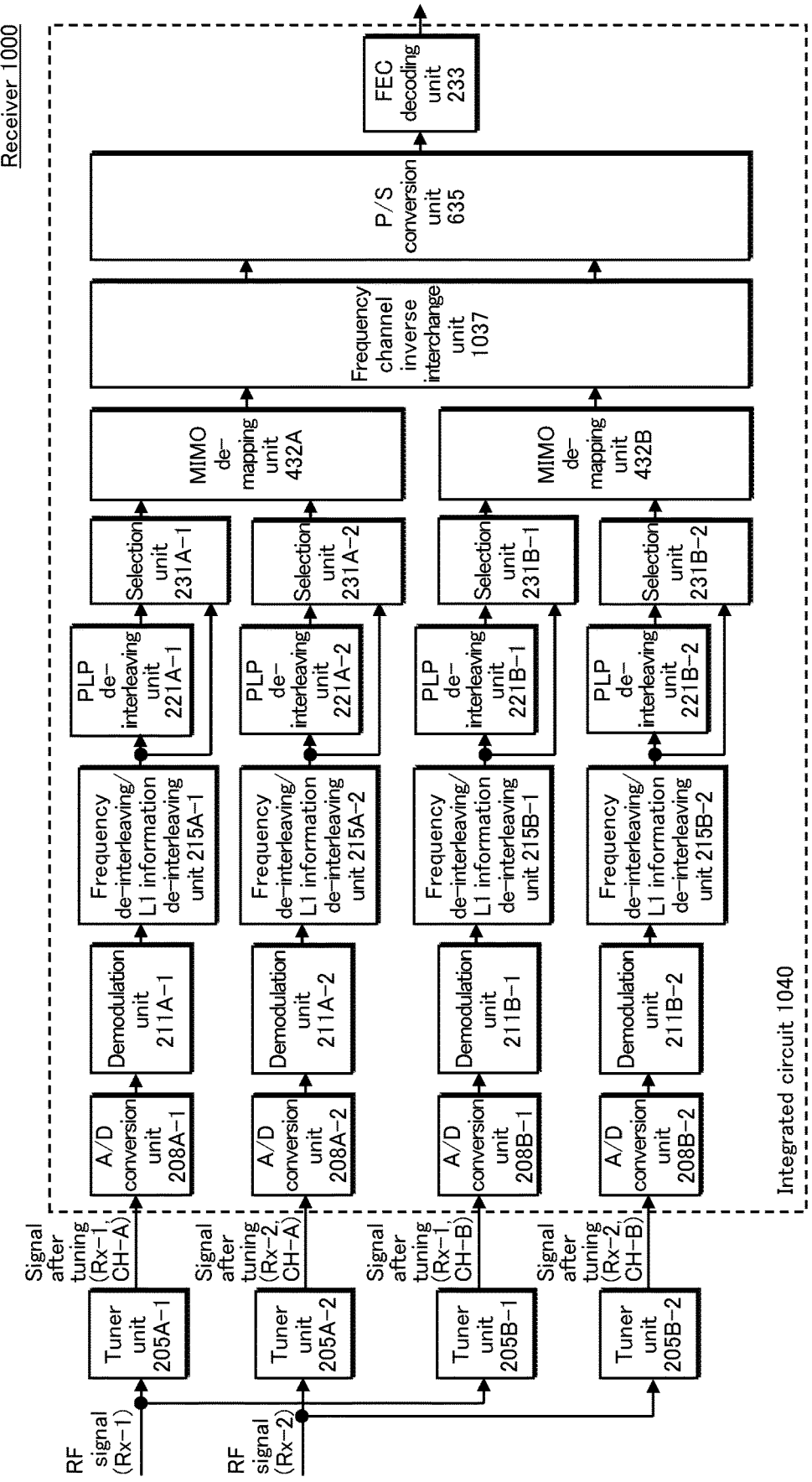
FIG. 36 illustrates a configuration of a receiver 1000 in embodiment 5.

FIG. 36 illustrates a configuration of a receiver 1000 in embodiment 5. The receiver 1000 illustrated in FIG. 36 corresponds to the transmitter 900, illustrated in FIG. 32, and reflects functions of the transmitter 900. Components that are the same as in the conventional receiver or the receiver in embodiments 1-4 have the same reference signs, and description thereof is omitted here. The receiver 1000 illustrated in FIG. 36, compared to the receiver 800 in embodiment 4, illustrated in FIG. 29, is configured such that the frequency channel inverse interchange unit 637 preceding the MIMO de-mapping unit 432 is replaced by a frequency channel inverse interchange unit 1037 preceding the P/S conversion unit 635.

The frequency channel inverse interchange unit 1037 illustrated in FIG. 36 performs data interchange that is the inverse of that performed by the frequency channel interchange unit 991, illustrated in FIG. 34. Other operations of the receiver 1000 are the same as that of the receiver 800 in embodiment 4, illustrated in FIG. 29.

According to the above configuration, with regard to MIMO using a plurality of fundamental bands, a receiver, reception method, and program are provided that receive a signal transmitted by transmitting half of the components of mapping data (cells) of an FEC block via one frequency channel (CH-A) from the two transmit antennas (Tx-1, Tx-2), and the remaining half of the components via another frequency channel (CH-B) from the two transmit antennas (Tx-1, Tx-2). In particular, the P/S conversion unit 635 multiplexing and outputting input data FEC block by FEC block is a feature of the receiver 1000. In this way, at the stage of MIMO de-mapping, in cases in which a time of decoding (such as sphere decoding) changes depending on such factors as carrier to noise power ratio (C/N) reception of transmission channels, the receiver 600 has the effect of making the process of the P/S conversion unit 635 easy.

Further, the components of the receiver 1000 illustrated in FIG. 36, aside from the tuner unit 205A and 205B, may be included in an integrated circuit 1040.

<Modification of Transmitter and Transmission Method>

Figure 37:
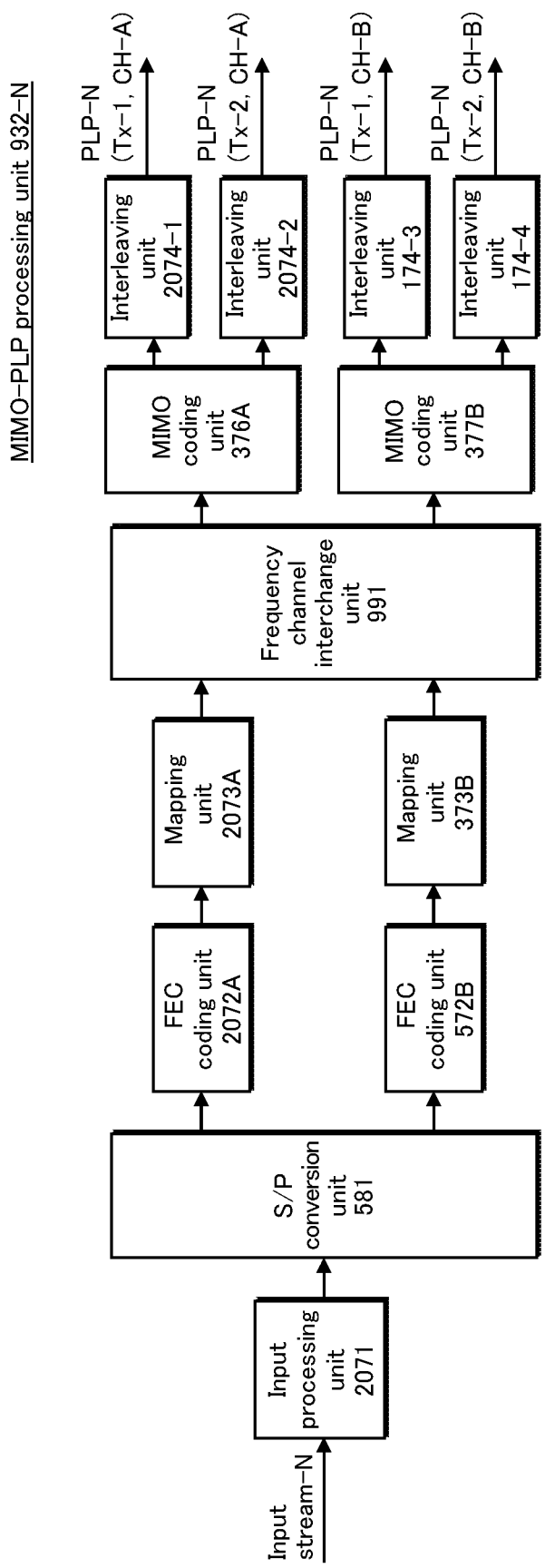
FIG. 37 illustrates a configuration of a MIMO-PLP processing unit 932 in embodiment 5.

The MIMO-PLP processing unit 931 illustrated in FIG. 33 may be replaced by a MIMO-PLP processing unit 932, illustrated in FIG. 37. The MIMO-PLP processing unit 932 illustrated in FIG. 37, compared to the MIMO-PLP processing unit 931 illustrated in FIG. 33, is configured such that the FEC coding unit 2072B, the mapping unit 2073B, and the MIMO coding unit 376B are replaced by the FEC coding unit 572B, the mapping unit 373B, and the MIMO coding unit 377B, respectively. Further, the two interleaving units 2074-3 and 2074-4 are replaced by the interleaving units 174-3 and 174-4, respectively. Operations of the FEC coding unit 572B, the mapping unit 373B, the MIMO coding unit 377B, and the interleaving units 174-3 and 174-4 illustrated in FIG. 37 are the same as the operations described with reference to FIG. 24. Other operations of the MIMO-PLP processing unit 932 are the same as that of the MIMO-PLP processing unit 931 illustrated in FIG. 33. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of LDPC coding patterns; differentiation of mapping patterns; differentiation of the fixed pre-coding matrices F_A and F_B; differentiation of phase change patterns of the phase change matrices X_A(k) and X_B(k); and differentiation of interleaving patterns may be used.

Figure 38:
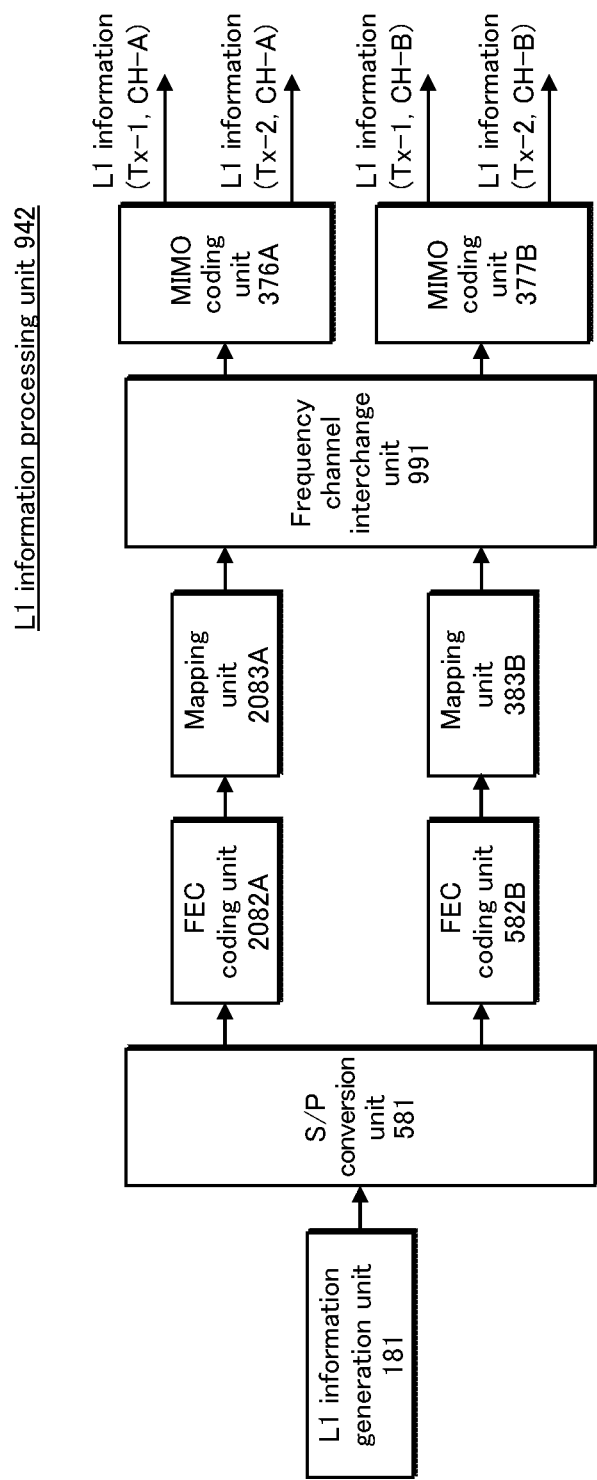
FIG. 38 illustrates a configuration of an L1 information processing unit 942 in embodiment 5.

Further, the L1 information processing unit 941 illustrated in FIG. 35 may be replaced by an L1 information processing unit 942, illustrated in FIG. 38. The L1 information processing unit 942 illustrated in FIG. 38, compared to the L1 information processing unit 941 illustrated in FIG. 35, is configured such that the FEC coding unit 2082B, the mapping unit 2083B, and the MIMO coding unit 376B are replaced by the FEC coding unit 582B, the mapping unit 383B, and the MIMO coding unit 377B, respectively. Operations of the FEC coding unit 582B, the mapping unit 383B, and the MIMO coding unit 377B illustrated in FIG. 38 are the same as the operations described with reference to FIG. 25. Other operations of the L1 information processing unit 942 are the same as that of the L1 information processing unit 941 illustrated in FIG. 35. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of LDPC coding patterns; differentiation of mapping patterns; differentiation of the fixed pre-coding matrices F_A and F_B; and differentiation of phase change patterns of the phase change matrices X_A(k) and X_B(k) may be used.

<Modification of Receiver and Reception Method>

Figure 39:
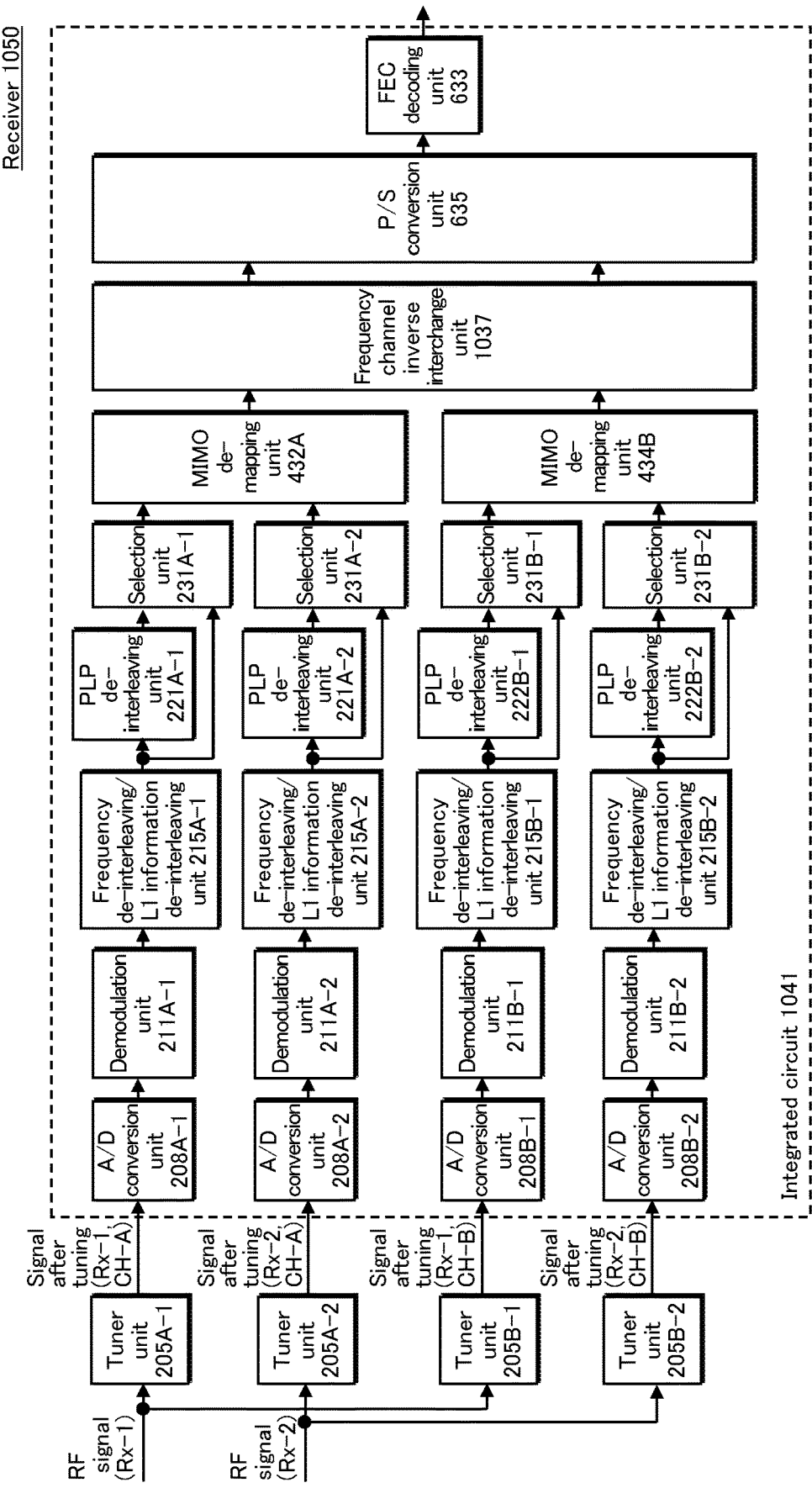
FIG. 39 illustrates a configuration of a receiver 1050 in embodiment 5.

FIG. 39 illustrates a configuration of a receiver 1050 corresponding to a case in which the MIMO-PLP processing unit 932 illustrated in FIG. 37 and the L1 information processing unit 942 illustrated in FIG. 38 are used. The receiver 1050 illustrated in FIG. 39, compared to the receiver 1000 illustrated in FIG. 36, is configured such that the PLP de-interleaving unit 221B, the MIMO de-mapping unit 432B, and the FEC decoding unit 233 are replaced by the PLP de-interleaving unit 222B, the MIMO de-mapping unit 434B, and the FEC decoding unit 633. Operations of the PLP de-interleaving unit 222B, the MIMO de-mapping unit 434B, and the FEC decoding unit 633 illustrated in FIG. 39 are the same as the operations described with reference to FIG. 26. Other operations of the receiver 1050 are the same as that of the receiver 1000 illustrated in FIG. 36.

However, in the MIMO-PLP processing unit 932 illustrated in FIG. 37 and the L1 information processing unit 942 illustrated in FIG. 38, in a case in which a mapping unit performs cell mapping of different patterns for frequency channel A (CH-A) and frequency channel B (CH-B), the MIMO de-mapping units 432A and 434B each perform processing taking into account the cell mapping of different patterns.

Further, the components of the receiver 1050 illustrated in FIG. 39, aside from the tuner unit 205A and 205B, may be included in an integrated circuit 1041.

Embodiment 6

<Transmitter and Transmission Method>

Figure 40:
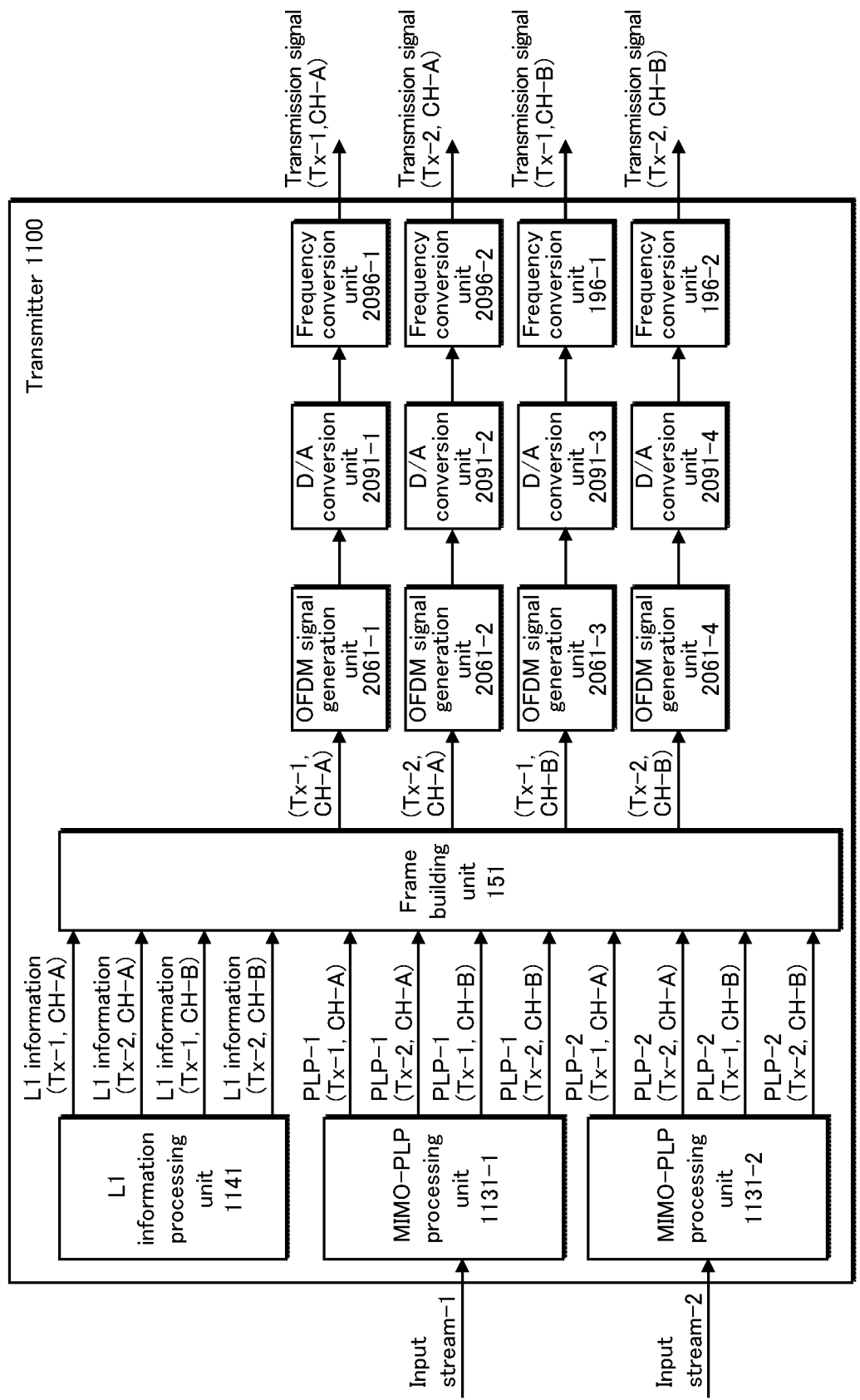
FIG. 40 illustrates a configuration of a transmitter 1100 in embodiment 6.

FIG. 40 illustrates a configuration of a transmitter 1100 in embodiment 6. Components that are the same as in the conventional transmitter or the transmitter in embodiments 1-5 have the same reference signs, and description thereof is omitted here.

The transmitter 1100 illustrated in FIG. 40, compared to the transmitter 100 in embodiment 1, illustrated in FIG. 1, is configured such that the MIMO-PLP processing unit 131 and the L1 information processing unit 141 are replaced by a MIMO-PLP processing unit 1131 and an L1 information processing unit 1141, respectively.

Figure 41:
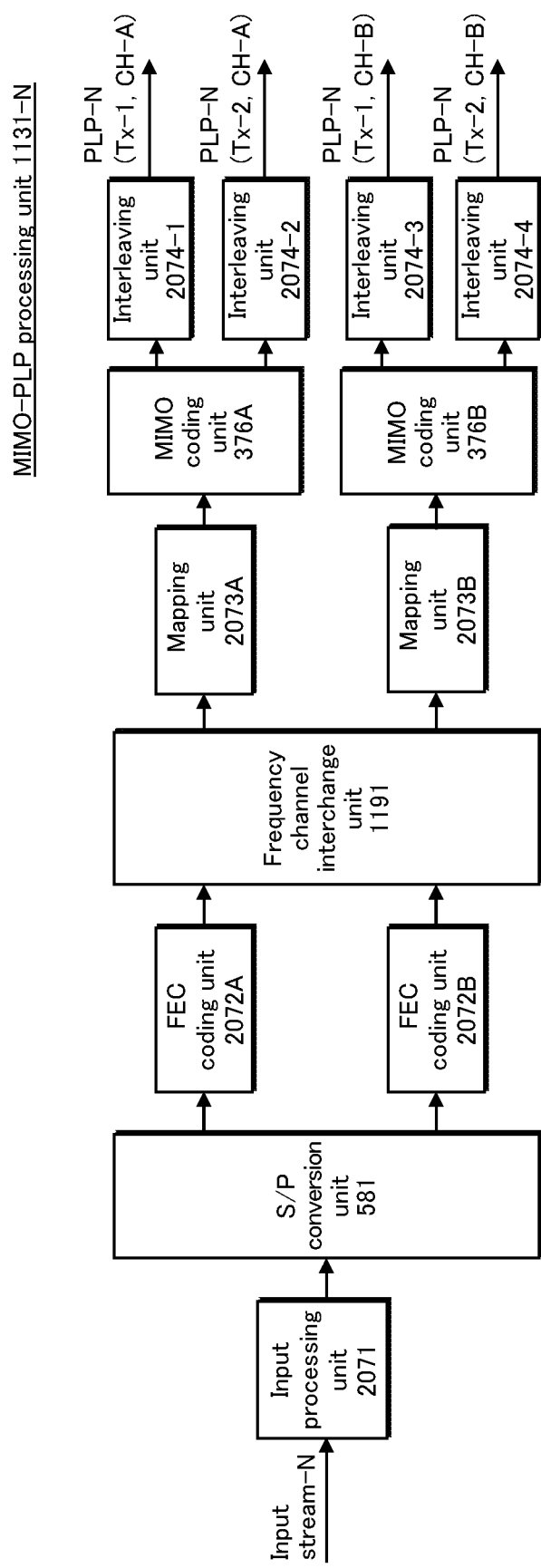
FIG. 41 illustrates a configuration of a MIMO-PLP processing unit 1131 in embodiment 6.

FIG. 41 illustrates a configuration of the MIMO-PLP processing unit 1131. Compared to the MIMO-PLP processing unit 931 in embodiment 5 illustrated in FIG. 33, the MIMO-PLP processing unit 1131 is configured such that the frequency channel interchange unit 991 preceding the MIMO coding units 376 is replaced by a frequency channel interchange unit 1191 preceding the mapping units 2073.

Figure 42:
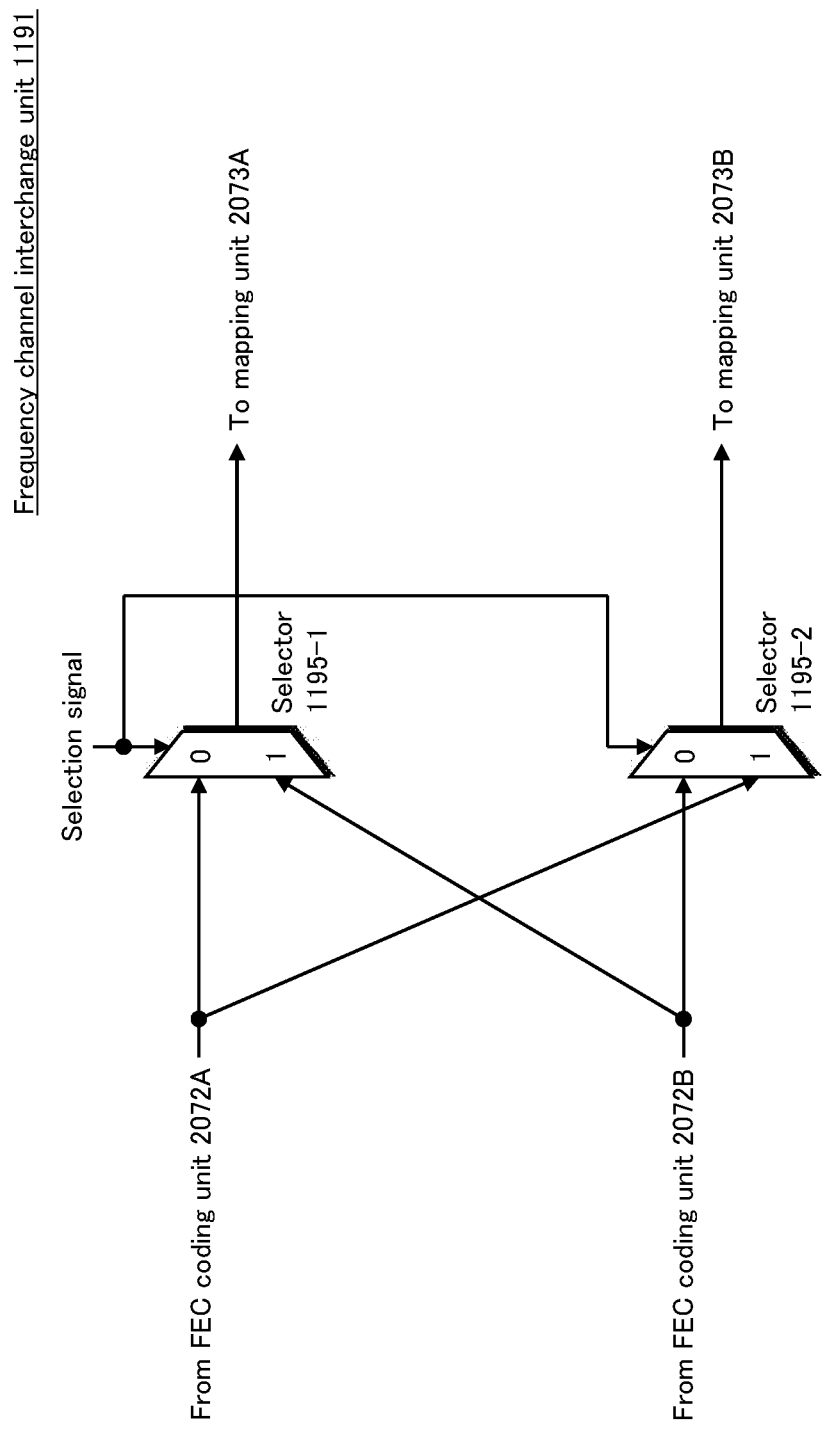
FIG. 42 illustrates a configuration of a frequency channel interchange unit 1191 in embodiment 6.

FIG. 42 illustrates a configuration of the frequency channel interchange unit 1191. The frequency channel interchange unit 1191 has two selectors 1195.

The frequency channel interchange unit 1191 generates a selection signal, and inputs the selection signal to the two selectors 1195. When the selection signal is "0", a selector selects data (FEC frames outputted from the FEC coding units 2072) that is inputted to "0" and outputs such data to the mapping unit 2073. When the selection signal is "1", a selector selects and outputs data that is inputted to "1". As an example, in a case in which the modulation scheme is 16-QAM and a selection signal that is generated alternates "0", "0", "0", "0", "0", "0", "0", "0", "1", "1", "1", "1", "1", "1", . . . , corresponding to bit groups in this example, groups of 8 bits) in mapping data (cells) two by two from the start of each FEC block, an output data series of the mapping units 2073, which are subsequent to the frequency channel interchange unit 1191, is the same as that of the MIMO-PLP processing unit 931 in embodiment 5.

Accordingly, mapping data (cells) of FB–(2N–1) and FB–2N are alternately inputted in units of two cells to the MIMO coding units 376A and 376B that are illustrated in FIG. 41.

Other operations of the MIMO-PLP processing unit 1131 illustrated in FIG. 41 are the same as that of the MIMO-PLP processing unit 931 illustrated in FIG. 33. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

Figure 43:
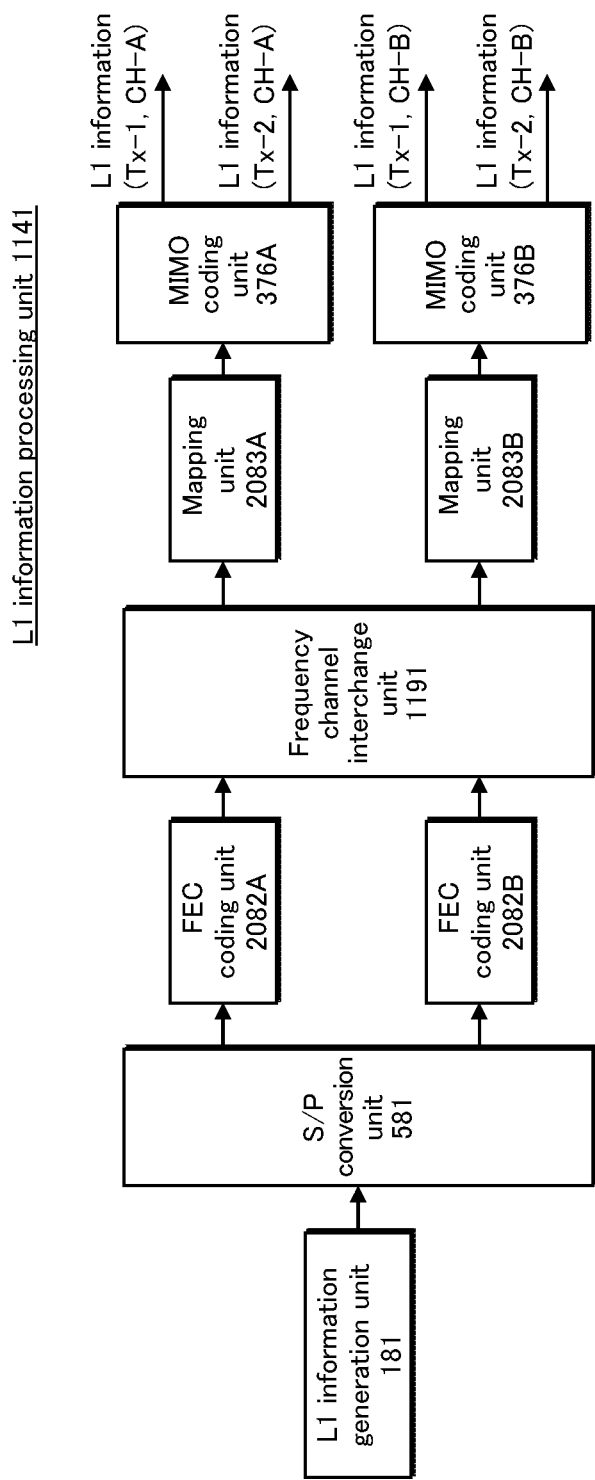
FIG. 43 illustrates a configuration of an L1 information processing unit 1141 in embodiment 6.

FIG. 43 illustrates a configuration of the L1 information processing unit 1141. Compared to the L1 information processing unit 941 in embodiment 5, illustrated in FIG. 35, the L1 information processing unit 1141 is configured such that the frequency channel interchange unit 991 preceding the MIMO coding units 376 is replaced by the frequency channel interchange unit 1191 preceding the mapping units 2083. Operations of the frequency channel interchange unit 1191 are the same as the operations described with reference to FIG. 42. However, the operations described with reference to FIG. 42 are performed using FEC frames outputted from the FEC coding units 2082 as input, and output is to the mapping units 2083. In this way, of the mapping data (cells) in an FEC block, half of the components thereof are transmitted via one frequency channel (CH-A) from each of the two transmit antennas (Tx-1, Tx-2). Further, the remaining half of the components are transmitted via the other frequency channel (CH-B) from each of the two transmit antennas (Tx-1, Tx-2).

According to the above configuration, with regard to MIMO using a plurality of fundamental bands, a transmitter, transmission method, and program are provided that sufficiently exhibit a frequency diversity effect with respect to the plurality of fundamental bands, by transmitting half of the components of mapping data (cells) of an FEC block via one frequency channel (CH-A) from the two transmit antennas (Tx-1, Tx-2), and the remaining half of the components via another frequency channel (CH-B) of the two transmit antennas (Tx-1, Tx-2). In particular, providing an FEC coding unit for each frequency channel using MIMO, and performing data interchange between frequency channels before mapping are features of the transmitter 1100.

<Receiver and Reception Method>

The receiver in embodiment 6, pertaining to an aspect of the present invention, uses the same configuration as the receiver 1000 in embodiment 5, illustrated in FIG. 36.

<Modification of Transmitter and Transmission Method>

Figure 44:
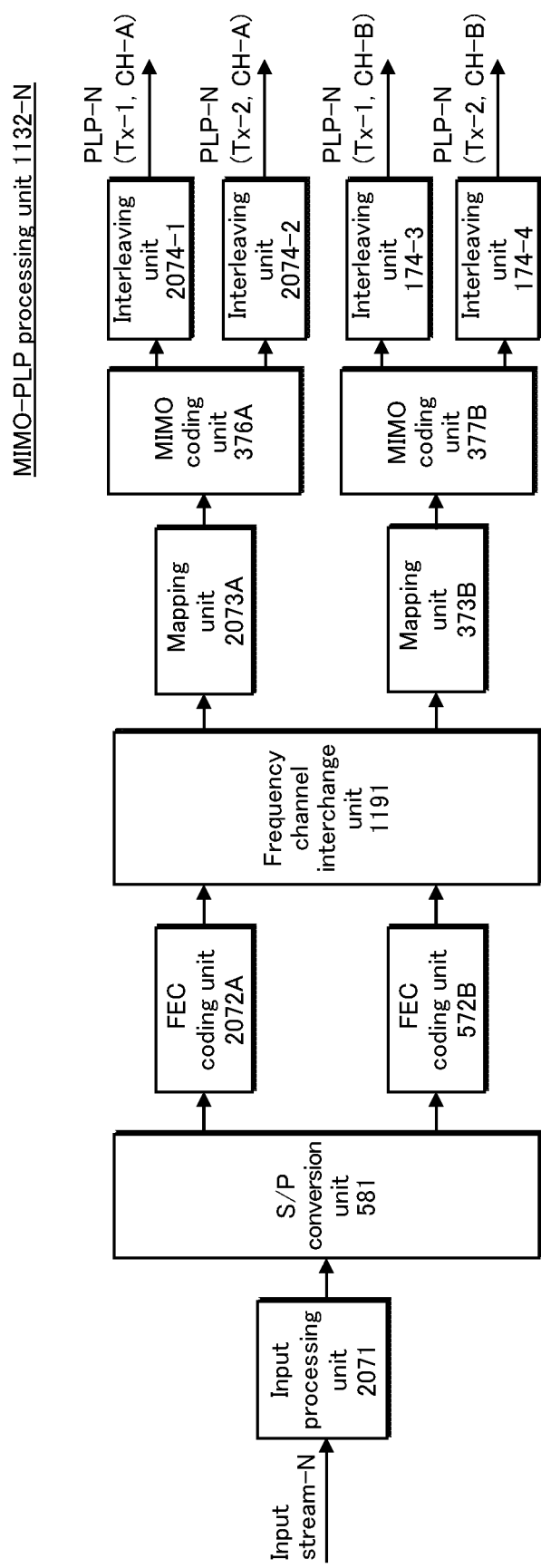
FIG. 44 illustrates a configuration of a MIMO-PLP processing unit 1132 in embodiment 6.

The MIMO-PLP processing unit 1131 illustrated in FIG. 41 may be replaced by a MIMO-PLP processing unit 1132 illustrated in FIG. 44. The MIMO-PLP processing unit 1132 illustrated in FIG. 44, compared to the MIMO-PLP processing unit 1131 illustrated in FIG. 41, is configured such that the FEC coding unit 2072B, the mapping unit 2073B, and the MIMO coding unit 376B are replaced by the FEC coding unit 572B, the mapping unit 373B, and the MIMO coding unit 377B. Further, the two interleaving units 2074-3 and 2074-4 are replaced by the interleaving units 174-3 and 174-4, respectively.

Operations of the FEC coding unit 572B, the mapping unit 373B, the MIMO coding unit 377B, and the interleaving units 174-3 and 174-4 illustrated in FIG. 44 are the same as the operations described with reference to FIG. 24. Other operations of the MIMO-PLP processing unit 1132 are the same as that of the MIMO-PLP processing unit 1131 illustrated in FIG. 41. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of LDPC coding patterns; differentiation of mapping patterns; differentiation of the fixed pre-coding matrices F_A and F_B; differentiation of phase change patterns of the phase change matrices X_A(k) and X_B(k); and differentiation of interleaving patterns may be used.

Figure 45:
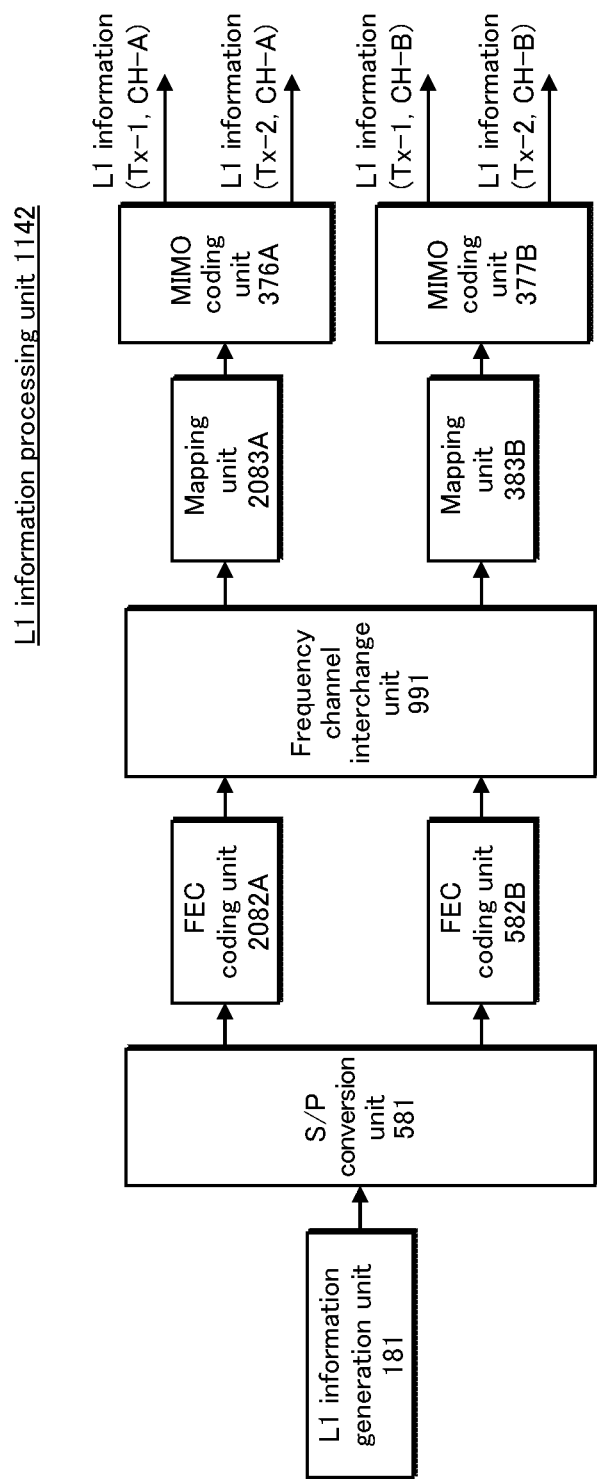
FIG. 45 illustrates a configuration of an L1 information processing unit 1142 in embodiment 6.

Further, the L1 information processing unit 1141 illustrated in FIG. 43 may be replaced by an L1 information processing unit 1142 illustrated in FIG. 45. The L1 information processing unit 1142 illustrated in FIG. 45, compared to the L1 information processing unit 1141 illustrated in FIG. 43, is configured such that the FEC coding unit 2082B, the mapping unit 2083B, and the MIMO coding unit 376B are replaced by the FEC coding unit 582B, the mapping unit 383B, and the MIMO coding unit 377B. Operations of the FEC coding unit 582B, the mapping unit 383B, and the MIMO coding unit 377B illustrated in FIG. 45 are the same as the operations described with reference to FIG. 25. Other operations of the L1 information processing unit 1142 are the same as that of the L1 information processing unit 1141 illustrated in FIG. 43. In this way, it is possible to obtain an effect of increasing reception quality of data by a receiver, by reducing correlation between the two frequency channels (CH-A, CH-B) with respect to transmission channel characteristics.

As described above, with respect to the two frequency channels (CH-A, CH-B), one or more of: differentiation of LDPC coding patterns; differentiation of mapping patterns; differentiation of the fixed pre-coding matrices F_A and F_B; and differentiation of phase change patterns of the phase change matrices X_A(k) and X_B(k) may be used.

<Modification of Receiver and Reception Method>

A receiver corresponding to a case in which the MIMO-PLP processing unit 1132 illustrated in FIG. 44 and the L1 information processing unit 1142 illustrated in FIG. 45 are used may use the same configuration as the receiver 1050 in embodiment 5, illustrated in FIG. 39.

Embodiment 7

<Transmitter and Transmission Method>

Figure 46:
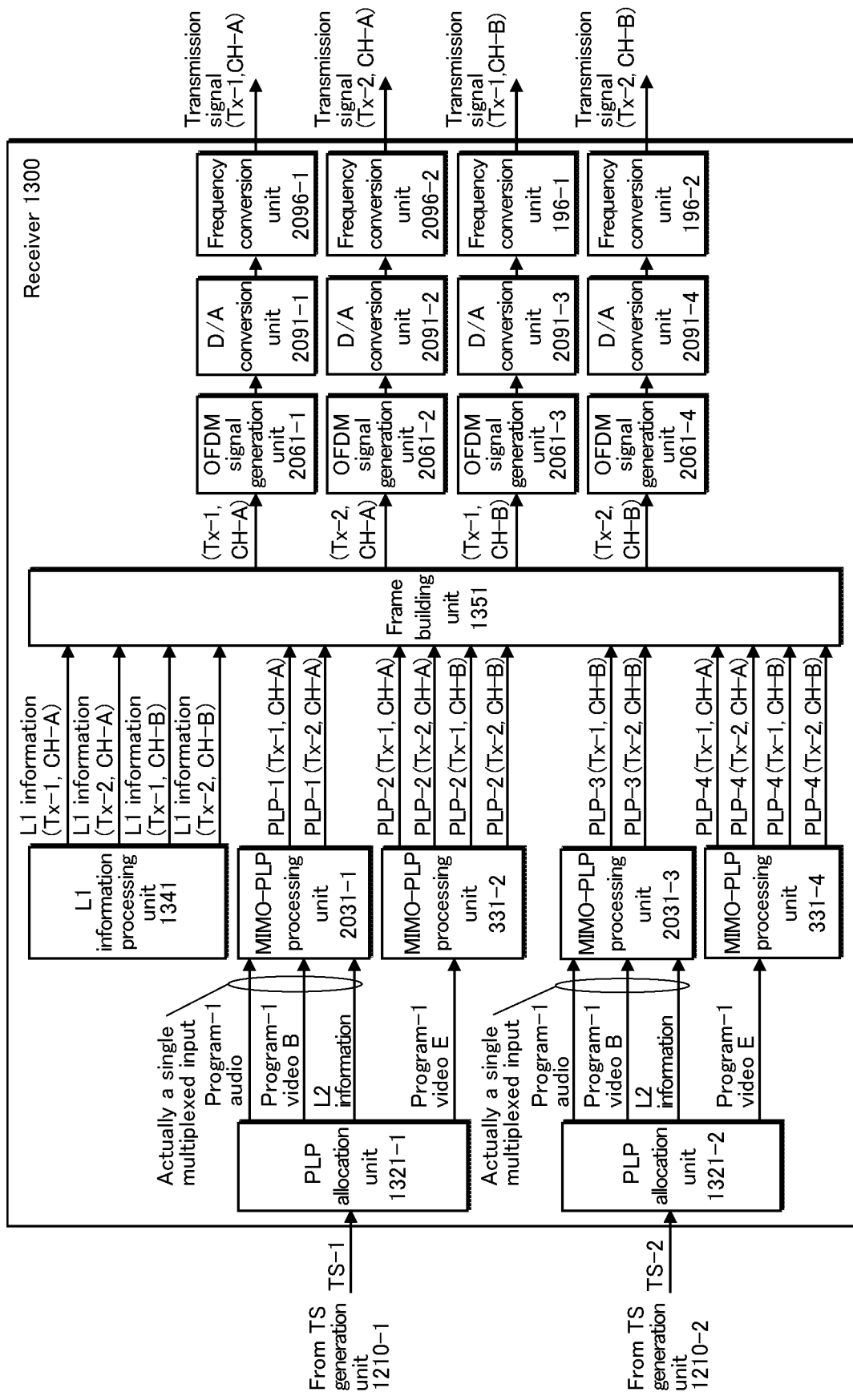
FIG. 46 illustrates a configuration of a transmitter 1300 in embodiment 7.

FIG. 46 illustrates a configuration of a transmitter 1300 in embodiment 7. Components that are the same as in the conventional transmitter or the transmitter in embodiments 1-6 have the same reference signs, and description thereof is omitted here. In embodiment 7, at a transport stream (TS) generation unit 1210, a video base layer (video B) and a video enhancement layer (video E) are generated as video components using scalable video coding (SVC). In this way, audio, video B, and video E are allocated to PLPs component by component, and, for each PLP, MIMO using a plurality of fundamental bands and MIMO using a single fundamental band may be selected.

The transmitter 1300 illustrated in FIG. 46, compared to the transmitter 300 in embodiment 2, illustrated in FIG. 8, is configured such that the L1 information processing unit 341 and the frame building unit 151 are replaced by an L1 information processing unit 1341 and a frame building unit 1351. Further, two PLP allocation units 1321 and two MIMO-PLP processing units 2031 are added.

Figure 47:
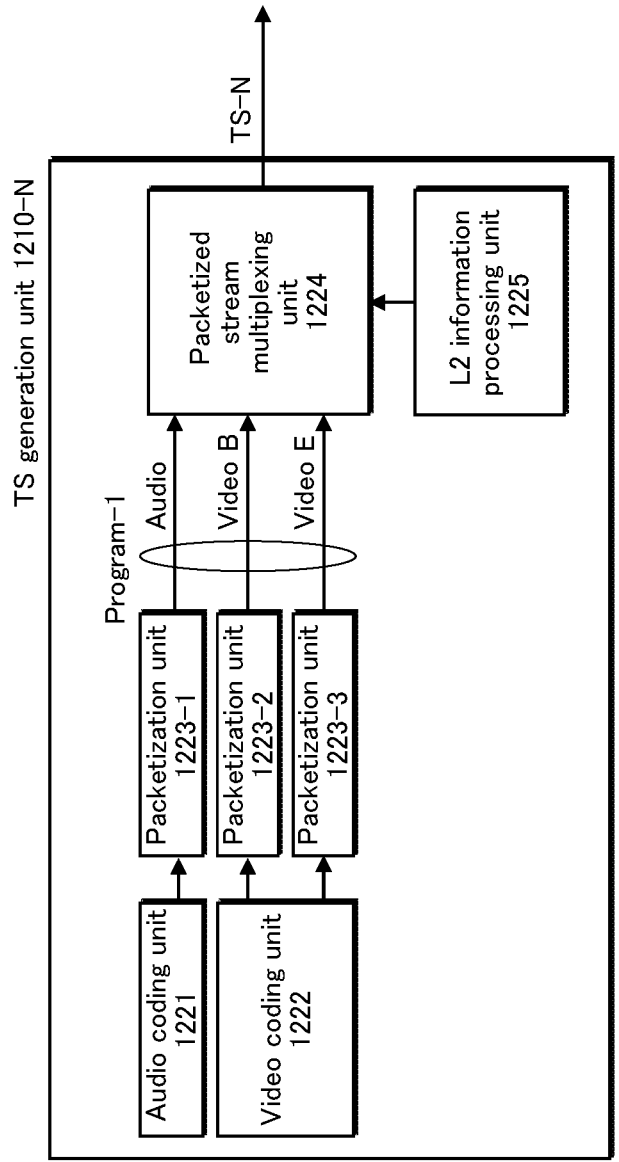
FIG. 47 illustrates a configuration of a transport stream (TS) generation unit 1210 in embodiment 7.

FIG. 47 illustrates a configuration of a TS generation unit 1210. The TS generation unit 1210 illustrated in FIG. 47 shows an example in which a single program is generated in a TS, and has one each of an audio coding unit 1221 and a video coding unit 1222. Further, the TS generation unit 1210 has packetization units 1223 on a one-for-one basis for the service components (audio, video B, and video E) in programs. Further, the TS generation unit 1210 has a packetized stream multiplexing unit 1224 and a layer 2 (L2) information processing unit 1225.

In the TS generation unit 1210, the audio coding unit 1221 performs information source coding of audio. The video coding unit 1222 performs information source coding of video using SVC, and generates the two components, video B and video E. H.264, HEVC (H.265), etc., are examples of information source coding.

Each packetization unit 1223 packetizes output of the audio coding unit 1221 or the video coding unit 1222. The L2 information processing unit 1225 generates L2 information such as program-specific information (PSI), system information (SI), etc. The packetized stream multiplexing unit 1224 generates a TS by multiplexing output of the packetization unit 1223 and output of the L2 information processing unit 1225, and outputs the TS to the transmitter 1300 illustrated in FIG. 46.

In the transmitter 1300 illustrated in FIG. 46, the PLP allocation units 1321 allocates to PLPs the service components (audio, video B, and video E) included in each program and L2 information of TSs outputted from the TS generation units 1210. In FIG. 46, as one example, the PLP allocation units 1321 allocate as follows:

PLP-1: Audio, video B, and L2 information of program-1 of TS-1

PLP-2: Video E of program-1 of TS-1

PLP-3: Audio, video B, and L2 information of program-1 of TS-2

PLP-4: Video E of program-1 of TS-2

In the example illustrated in FIG. 46, the packets of audio, video B, and L2 information that are to be inputted to one of the MIMO-PLP processing units 2031 are actually multiplexed into a single input. Operations of each of the MIMO-PLP processing units 2031 are the same as the operations described with reference to FIG. 55. Further, when packets of video E are inputted, operations of each of the MIMO-PLP processing units 331 are the same as the operations described with reference to FIG. 9.

Figure 48:
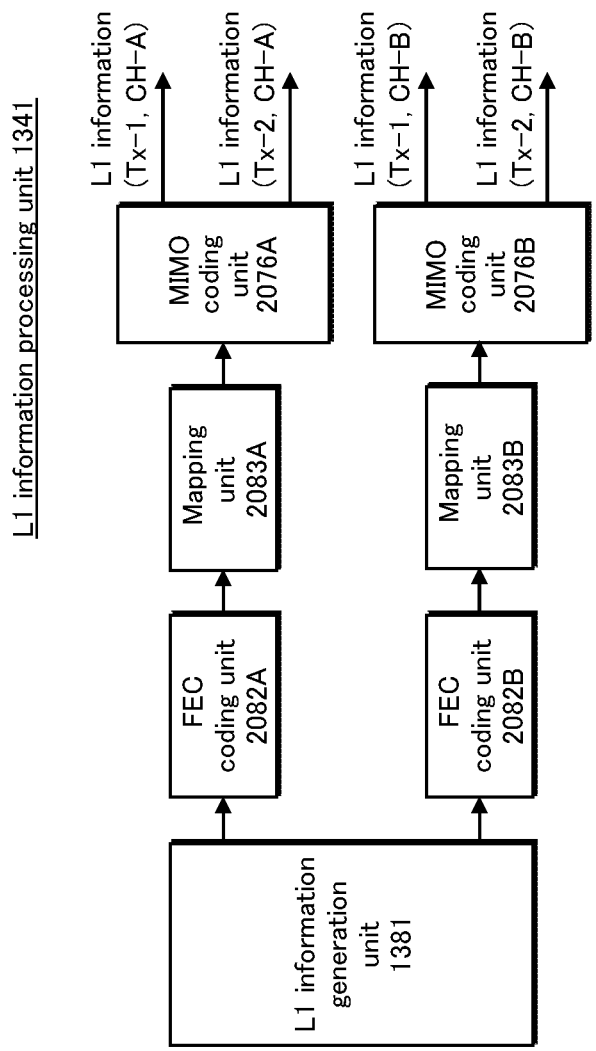
FIG. 48 illustrates a configuration of an L1 information processing unit 1341 in embodiment 7.

FIG. 48 illustrates a configuration of the L1 information processing unit 1341. The L1 information processing unit 1341, compared to the L1 information processing unit 2041, which is conventional technology illustrated in FIG. 56, is configured such that the L1 information generation unit 2081 is replaced by an L1 information generation unit 1381. Further, the L1 information processing unit 1341 has, on a one-for-one basis for each frequency channel, the FEC coding units 2082, the mapping units 2083, and the MIMO coding units 2076.

The L1 information generation unit 1381 illustrated in FIG. 48 generates transmission parameters related to the two frequency channels (CH-A, CH-B). Operations of the FEC coding units 2082, the mapping units 2083, and the MIMO coding units 2076 are the same as the operations described with reference to FIG. 56.

The frame building unit 1351 illustrated in FIG. 46 generates and outputs transmission frames, by using (i) mapping data of PLP-1 outputted from the MIMO-PLP processing unit 2031-1 with respect to one frequency channel (CH-A) of the two transmit antennas (Tx-1, Tx-2), (ii) mapping data of PLP-3 outputted from the MIMO-PLP processing unit 2031-3 with respect to the other frequency channel (CH-B) of the two transmit antennas (Tx-1, Tx-2), (iii) mapping data of each PLP (PLP-2, PLP-4) outputted from the MIMO-PLP processing units 331 with respect to each of the two frequency channels (CH-A, CH-B) of the two transmit antennas (Tx-1, Tx-2), and (iv) mapping data of L1 information outputted from the L1 information processing unit 1341 with respect to each of the two frequency channels (CH-A, CH-B) of the two transmit antennas (Tx-1, Tx-2). Differences between the transmitter 1300 and the transmitter 300 in embodiment 2, illustrated in FIG. 8, are that the PLPs (PLP-2, PLP-4) of MIMO using the two frequency channels (CH-A, CH-B), the PLP (PLP-1) of MIMO using one frequency channel (CH-A), and the PLP (PLP-3) of MIMO using the other frequency channel (CH-B) are mixed in a transmission frame.

Operations of the OFDM signal generation units 2061, the D/A conversion units 2091, the frequency conversion units 2096, and the frequency conversion units 196 are the same as the operations described with reference to FIG. 8.

According to the above configuration, audio, video B, and video E are allocated to PLPs component by component, and, for each PLP, MIMO using a plurality of fundamental bands and MIMO using a single fundamental band may be selected. In particular, by performing MIMO transmission using a single fundamental band for audio, video B, and L1 information, a MIMO receiver that only supports a single fundamental band may receive PLPs of basic information, and basic information portions of a program, for example the program in standard definition, can thereby be enjoyed.

Note that the MIMO-PLP processing units 331 illustrated in FIG. 45 may be replaced by any one of the MIMO-PLP processing units 131, 132, 332, 333, 334, 531, 532, 731, 732, 931, 932, 1131, 1132 illustrated in FIGS. 2, 5, 10, 14, 15, 20, 24, 28, 30, 33, 37, 41, 44, respectively.

<Receiver and Reception Method>

Figure 49:
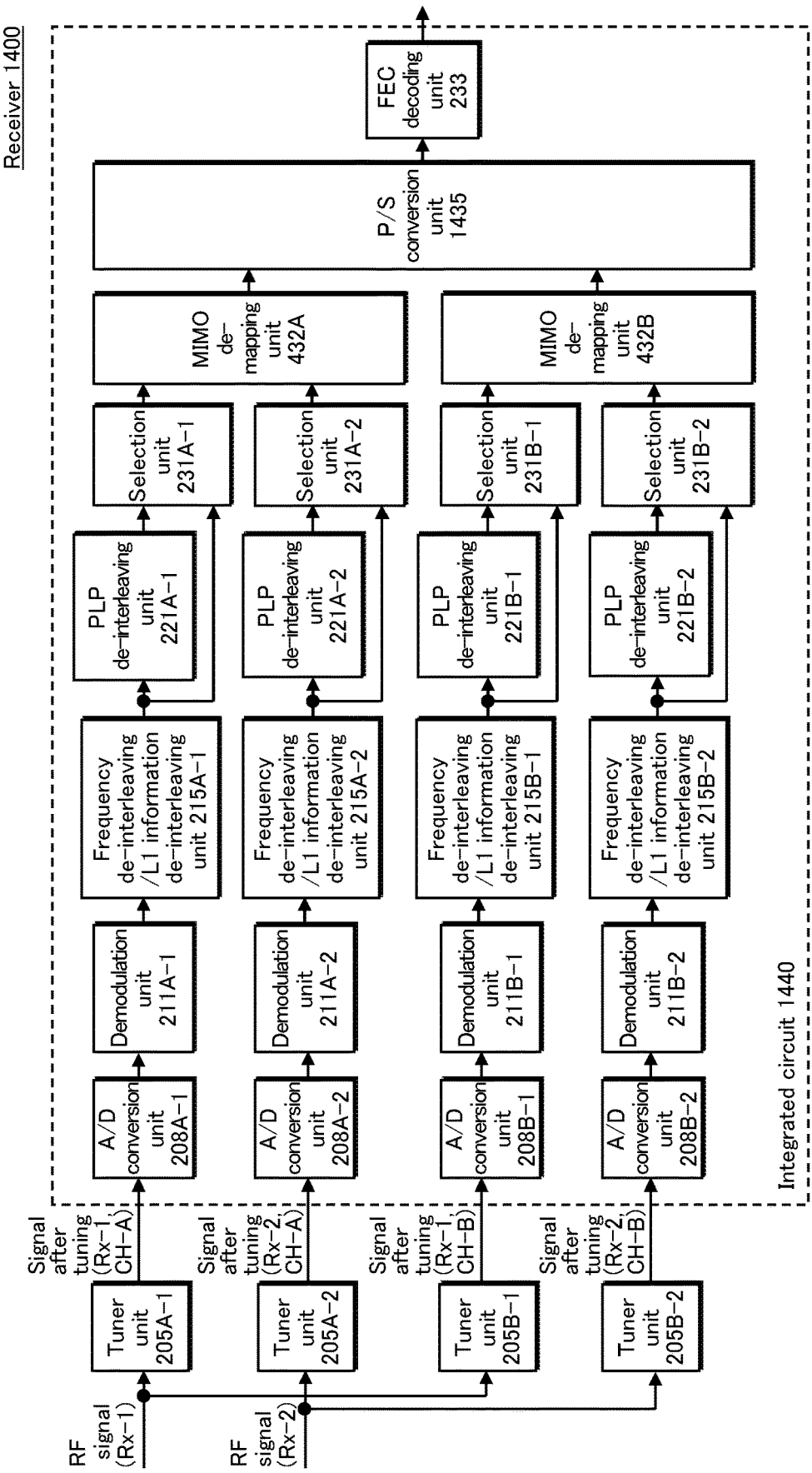
FIG. 49 illustrates a configuration of a receiver 1400 in embodiment 7.

FIG. 49 illustrates a configuration of a receiver 1400 in embodiment 7. The receiver 1400 illustrated in FIG. 49 corresponds to the transmitter 1300, illustrated in FIG. 46, and reflects functions of the transmitter 1300. Components that are the same as in the conventional receiver or the receiver in embodiments 1-6 have the same reference signs, and description thereof is omitted here. The receiver 1400 illustrated in FIG. 49, compared to the receiver 400 in embodiment 2, illustrated in FIG. 13, is configured such that the P/S conversion unit 435 is replaced by a P/S conversion unit 1435.

With respect to L1 information, the P/S conversion unit 1435 illustrated in FIG. 49 multiplexes output from the MIMO de-mapping units 432A and 432B FEC block by FEC block, and outputs to the FEC decoding unit 233. Specifically, the P/S conversion unit 1435, with respect to PLPs (PLP-2, PLP-4 in FIG. 46) of MIMO using the two frequency channels (CH-A, CH-B), performs the same operations as the P/S conversion unit 435 illustrated in FIG. 13. Further, the P/S conversion unit 1435, with respect to PLPs (PLP-1 in FIG. 46) of MIMO using one frequency channel (CH-A), selects output from the MIMO de-mapping unit 432A and outputs to the FEC decoding unit 233. Further, the P/S conversion unit 1435, with respect to PLPs (PLP-3 in FIG. 46) of MIMO using the other frequency channel (CH-B), selects output from the MIMO de-mapping unit 432B and outputs to the FEC decoding unit 233. Other operations of the receiver 1400 are the same as that of the receiver 400 in embodiment 2, illustrated in FIG. 13.

According to the above configuration, audio, video B, and video E are allocated to PLPs component by component, and a receiver, reception method, and program are provided that receive a signal transmitted by selecting, for each PLP, MIMO using a plurality of fundamental bands and MIMO using a single fundamental band. In particular, portions of extended information of a program are also received, and for example the program in high definition can thereby be enjoyed.

Further, the components of the receiver 1400 illustrated in FIG. 49, aside from the tuner unit 205A and 245B, may be included in an integrated circuit 1440.

Figure 50:
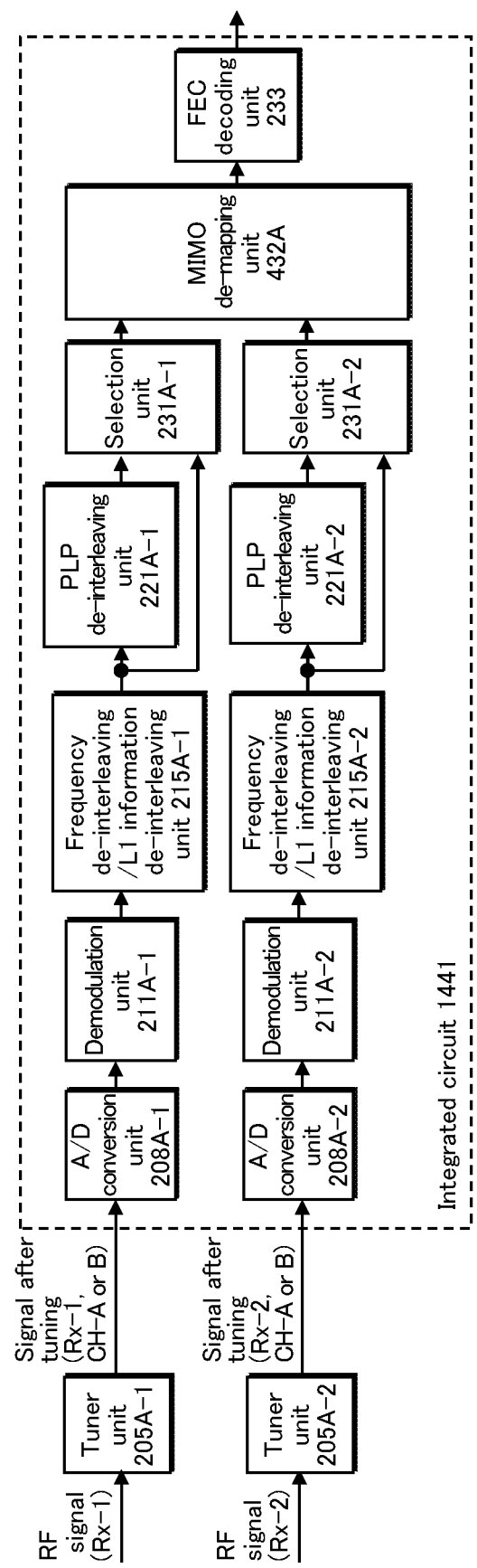
FIG. 50 illustrates a configuration of a receiver 1450 in embodiment 7.

Further, as shown in FIG. 50, a receiver 1450 may be configured. The receiver 1450 illustrated in FIG. 50, compared to the receiver 1400 illustrated in FIG. 49, is configured such that the tuner units 205B, the A/D conversion units 208B, the demodulation units 211B, the frequency de-interleaving/L1 information de-interleaving units 215B, the PLP de-interleaving units 221B, the selection units 231B, the MIMO de-mapping units 432B, and the P/S conversion unit 1435 are not included.

The receiver 1450 illustrated in FIG. 50 is a MIMO receiver that only supports a single fundamental band. The two tuner units 205A selectively receive signals of one frequency channel (CH-A) or the other frequency channel (CH-B), and down-converts the received signals to a predefined band. Operations of the A/D conversion units 208A, the demodulation units 211A, the frequency de-interleaving/L1 information de-interleaving units 215A, the PLP de-interleaving units 221A, the selection units 231A, and the MIMO de-mapping units 432A are the same as operations described with reference to FIG. 49. The FEC decoding unit 233 performs LDPC decoding and BCH decoding with respect to a vector estimate value of each FEC block outputted from the MIMO de-mapping unit 432A, and outputs a decoding result.

According to the above configuration, audio, video B, and video E are allocated to PLPs component by component, and a receiver, reception method, and program are provided that receive a signal transmitted by selecting, for each PLP, MIMO using a plurality of fundamental bands and MIMO using a single fundamental band. In particular, reception of PLPs of basic information is possible, and basic information portions of a program, for example the program in standard definition, can thereby be enjoyed. Compared to the receiver illustrated in FIG. 49, the receiver 1450, as illustrated in FIG. 50, has an effect of reducing circuit scale by half.

Further, the components of the receiver 1450 illustrated in FIG. 50, aside from the tuner unit 205A, may be included in an integrated circuit 1441.

Embodiment 8

<Transmitter and Transmission Method>

Figure 51:
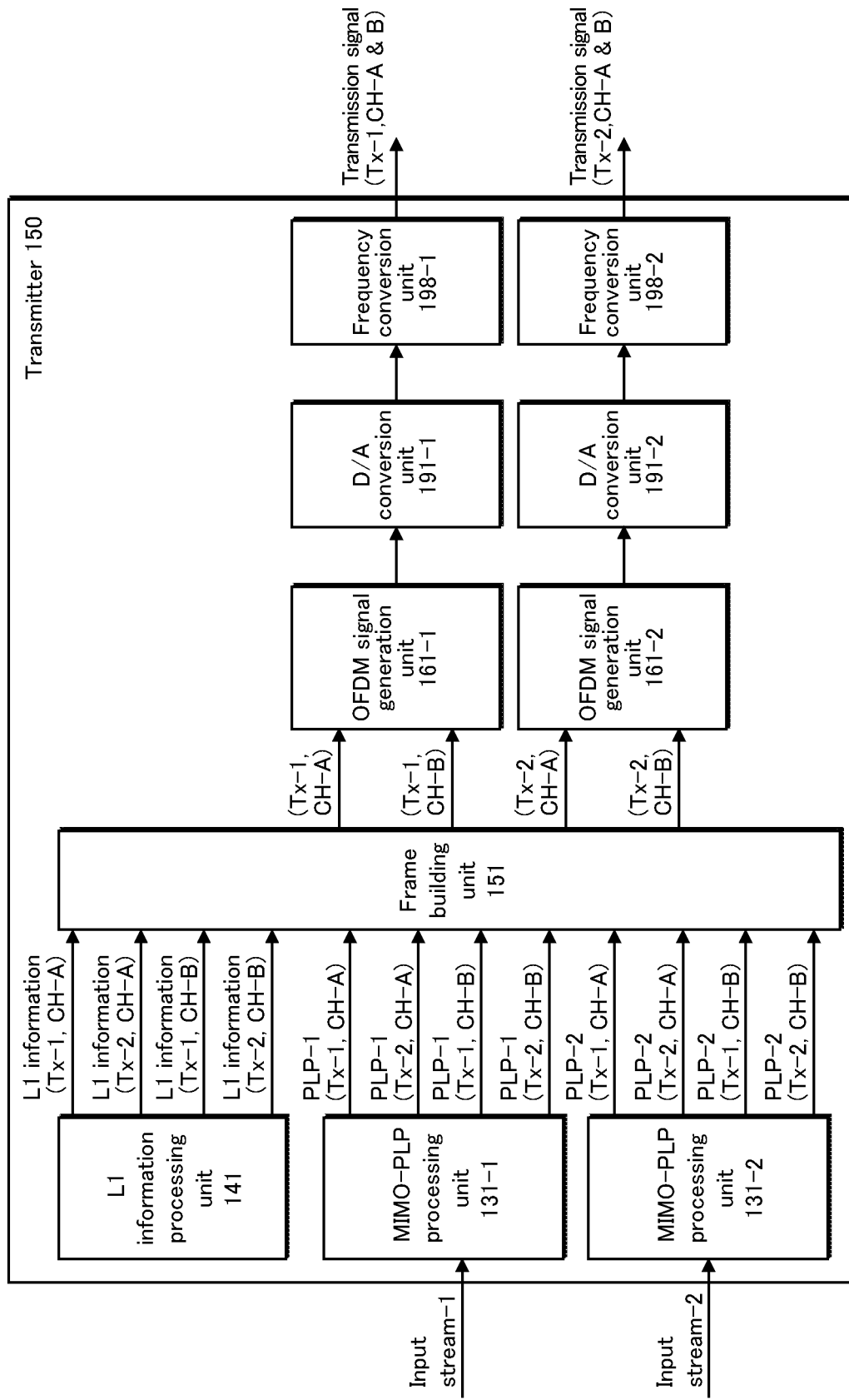
FIG. 51 illustrates a configuration of a transmitter 150 in embodiment 8.

FIG. 51 illustrates a configuration of a transmitter 150 in embodiment 8. Components that are the same as in the conventional transmitter or the transmitter in embodiments 1-7 have the same reference signs, and description thereof is omitted here. In embodiment 8, in a case in which the two frequency channels (CH-A, CH-B) are adjacent, processing subsequent to the frame building unit treats the two frequency channels as one.

The transmitter 150 illustrated in FIG. 51, compared to the transmitter 100 in embodiment 1 illustrated in FIG. 1, is configured such that four of the OFDM signal generation units 2061, four of the D/A conversion units 2091, and two each of the frequency conversion units 2096 and 196 are replaced by two OFDM signal generation units 161, two D/A conversion units 191, and two frequency conversion units 198, respectively.

In the transmitter 150 illustrated in FIG. 51, with respect to transmission frames outputted from the frame building unit 151 that are related to the two frequency channels (CH-A, CH-B) of one transmit antenna (Tx-1), the OFDM signal generation unit 161-1 for Tx-1 adds pilot signals, performs IFFT, inserts GIs, and inserts the P1 symbol and the aP1 symbol, treating the two frequency channels (CH-A, CH-B) as one, and outputs a digital baseband transmission signal. The D/A conversion unit 191-1 for Tx-1 performs D/A conversion on the digital baseband transmission signal for Tx-1 that is outputted from the OFDM signal generation unit 161-1, and outputs an analog baseband transmission signal. The frequency conversion unit 196-1 for Tx-1 performs frequency conversion on the frequency channels A and B with respect to the analog baseband transmission signal outputted from the D/A conversion unit 191-1, and outputs an analog RF transmission signal to a transmit antenna that is not illustrated. In this way, the analog RF transmission signal related to the two frequency channels (CH-A, CH-B) of Tx-1 is transmitted.

With respect to transmission frames outputted from the frame building unit 151 that are related to the two frequency channels (CH-A, CH-B) of the other transmit antenna (Tx-2), operations of the OFDM signal generation unit 161-2, the D/A conversion unit 191-2, and the frequency conversion unit 196-2, all for Tx-2, are the same as the operations for Tx-1. In this way, the analog RF transmission signal related to the two frequency channels (CH-A, CH-B) of Tx-2 is transmitted.

Other operations of the transmitter 150 are the same as that of the transmitter 100 in embodiment 1, illustrated in FIG. 1.

According to the above configuration, with regard to MIMO using a plurality of fundamental bands, a transmitter, transmission method, and program are provided that sufficiently exhibit a frequency diversity effect with respect to the plurality of fundamental bands. In particular, with respect to transmission frames outputted from a frame building unit, performing processing treating two frequency channels (CH-A, CH-B) as one, for each transmit antenna, is a feature of the transmitter 150.

Note that with respect to transmission frames outputted from a frame building unit, performing processing treating two frequency channels (CH-A, CH-B) as one, for each transmit antenna, may also be applied with respect to the transmitter in embodiments 2-7.

<Receiver and Reception Method>

Figure 52:
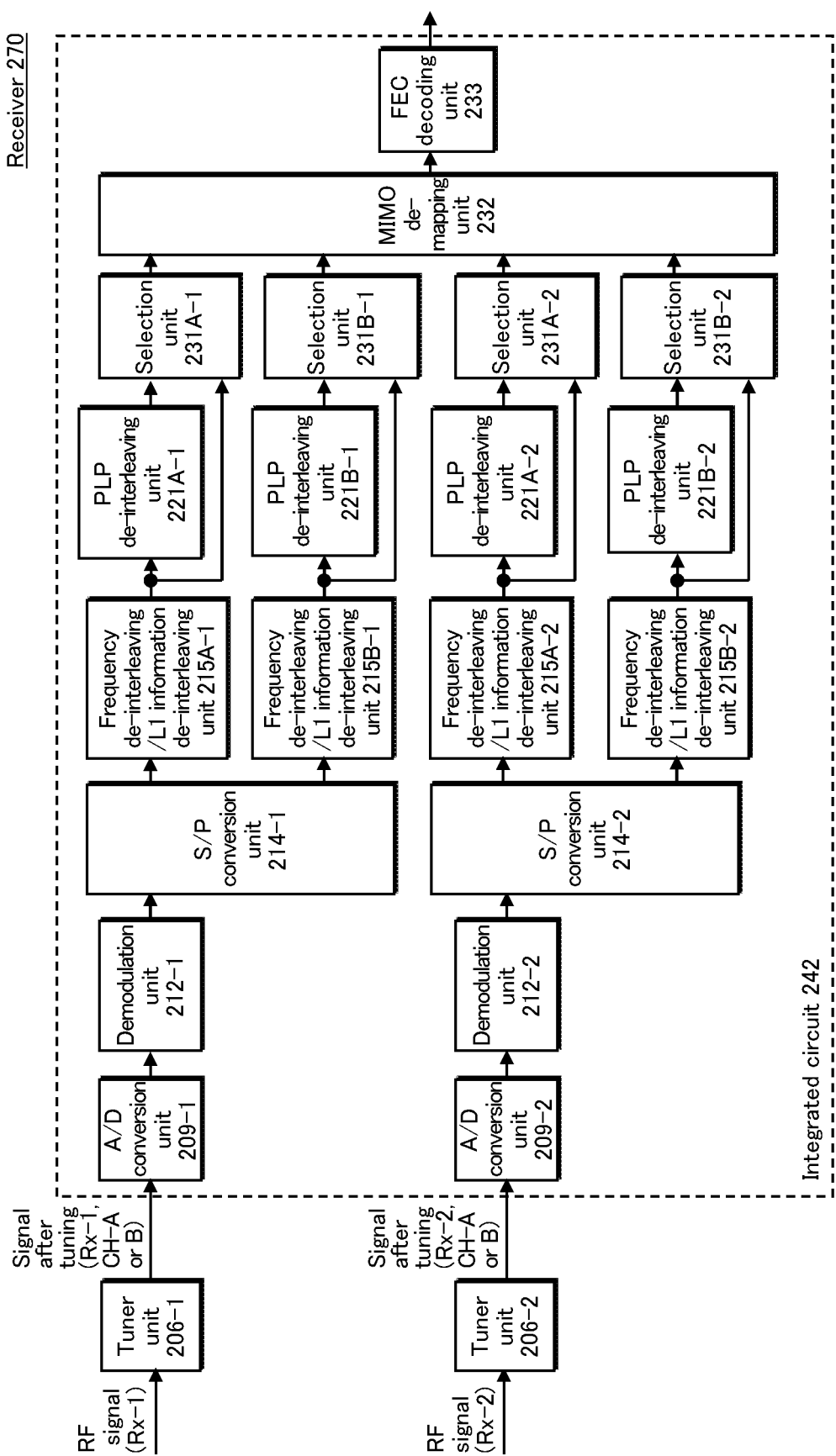
FIG. 52 illustrates a configuration of a receiver 270 in embodiment 8.

FIG. 52 illustrates a configuration of a receiver 270 in embodiment 8. The receiver 270 illustrated in FIG. 52 corresponds to the transmitter 150 illustrated in FIG. 51 and the transmitter 100 illustrated in FIG. 1 in a case in which the two frequency channels (CH-A, CH-B) are adjacent, and reflects functions of the transmitter 150 and the transmitter 100. Components that are the same as in the conventional receiver or the receiver in embodiments 1-7 have the same reference signs, and description thereof is omitted here. The receiver 270 illustrated in FIG. 52, compared to the receiver 200 in embodiment 1, illustrated in FIG. 4, is configured such that the four tuner units 205, the four A/D conversion units 208, and the four demodulation units 211 are replaced by two tuner units 206, two A/D conversion units 209, and two demodulation units 212, respectively. Further, two S/P conversion units 214 are added.

In the receiver 270 illustrated in FIG. 52, the tuner unit 206-1 for one receive antenna (Rx-1) selectively receives a signal of the two frequency channels (CH-A, CH-B) together, and down-converts the signal to a predefined band. The A/D conversion unit 209-1 for Rx-1 performs A/D conversion on a signal outputted from the tuner unit 206-1 for Rx-1, and outputs a digital reception signal. The demodulation unit 212-1 performs OFDM demodulation, and outputs cell data of I/Q coordinates and a transmission channel estimate value. In this way, cell data of I/Q coordinates and a channel estimate value related to the two frequency channels (CH-A, CH-B) of Rx-1 are outputted. The S/P conversion unit 214-1, with respect to output of the demodulation unit 212-1, outputs data related to the one frequency channel (CH-A) to the frequency de-interleaving/L1 information de-interleaving unit 215A-1 and outputs data related to the other frequency channel (CH-B) to the frequency de-interleaving/L1 information de-interleaving unit 215B-1.

Operations of the tuner unit 206-2, the A/D conversion unit 209-2, and the demodulation unit 212-2 for the other receive antenna (Rx-2) are the same as the operations for Rx-1. In this way, cell data of I/Q coordinates and a transmission channel estimate value related to the two frequency channels (CH-A, CH-B) of Rx-2 are outputted. The S/P conversion unit 214-2, with respect to output of the demodulation unit 212-2, outputs data related to the one frequency channel (CH-A) to the frequency de-interleaving/L1 information de-interleaving unit 215A-2 and outputs data related to the other frequency channel (CH-B) to the frequency de-interleaving/L1 information de-interleaving unit 215B-2.

Other operations of the receiver 270 are the same as that of the receiver 200 in embodiment 1, illustrated in FIG. 4.

According to the above configuration, with regard to MIMO using a plurality of fundamental bands, a receiver, reception method, and program are provided that receive a transmitted signal that is caused to sufficiently exhibit a frequency diversity effect with respect to the plurality of fundamental bands. In particular, the tuner units, A/D conversion units, and demodulation units performing processing treating two frequency channels (CH-A, CH-B) as one, for each receive antenna, is a feature of the receiver 270.

Note that performing processing treating two frequency channels (CH-A, CH-B) as one, for each receive antenna, may also be applied with respect to the receiver in embodiments 2-7.

Further, the components of the receiver 270 illustrated in FIG. 52, aside from the tuner units 206-1 and 206-2, may be included in an integrated circuit 242.

(Supplement)

The present invention is not limited to the content described in the above embodiments. Any form of implementation is possible in order to achieve aims of the present invention and related or associated aims. For example, the following implementations are possible.

(1) Embodiments 1-8 are described using the DVB-NGH scheme as a starting point. However, the present invention is not limited in this way, and transmission schemes other than DVB-NGH may be applied to the present invention.

(2) In embodiments 1-8, the number of transmit antennas is illustrated as two. However, the present invention is not limited in this way, and there may be three or more transmit antennas. Further, the number of transmit antennas and receive antennas may differ from one another.

(3) In embodiments 1-8, the number of frequency channels (fundamental bands) is illustrated as two. However, the present invention is not limited in this way, and there may be three or more frequency channels.

(4) In embodiments 1-8, in a case in which there are three or more fundamental bands, allocation of data components included in each coding block may be performed with respect to all of the fundamental bands, or two or more of the fundamental bands.

(5) In embodiments 1-8, different polarization may be applied with respect to each of the two transmit antennas (Tx-1, Tx-2). Vertical (V) polarity and horizontal (H) polarity are an example of different polarities. In this way, the diversity effect can be further increased. Further, with respect to the two frequency channels (CH-A, CH-B), the polarity allocated to the transmit antenna 1 (Tx-1) and the transmit antenna 2 (Tx-2) may be the same, and may be different.

(6) In embodiments 1-8, phase change is applied with respect to the transmit antenna 2 (Tx-2). However, the present invention is not limited in this way, and phase change may be applied with respect to the transmit antenna 1 (Tx-1). Further a different transmit antenna (transmit antenna 1 (Tx-1), transmit antenna 2 (Tx-2)) may apply a phase change with respect to a different one of the two frequency channels (CH-A, CH-B).

(7) In embodiment 7, the number of TSs is two, but the present inventon is not limited in this way. Further, the number of programs is described as one in TS-1 and TS-2, but the present invention is not limited in this way.

(8) In embodiment 7, the service components are described as audio and video, but the present invention is not limited in this way. Data components, etc., may be included. Further, in embodiment 7, a configuration that performs scalable coding with respect to video is described. However, the present invention is not limited in this way, and scalable coding may be performed with respect to audio, data components, etc.

(9) In embodiment 7, description is given of video B and video E being generated by SVC. However, the present invention is not limited in this way. For example, a base view (MVC_B) and a dependent view (MVC_D) may be generated by multi-view video coding (MVC). In such a case, if MVC_B is allocated to a PLP and corresponds to MIMO using a single fundamental band, and MVC_D is allocated to a different PLP and corresponds to MIMO using a plurality of fundamental bands, a MIMO receiver that only supports a single fundamental band could receive a PLP of basic information, and basic information portions of a program, for example the program in 2D, can thereby be enjoyed. Further, a MIMO receiver that supports a plurality of fundamental bands could receive PLPs of basic information and extended information such that, for example, a program can thereby be enjoyed in 3D.

(10) In embodiment 7, audio, video B, and L2 information is described as corresponding to MIMO using a single fundamental band, and video E is described as corresponding to MIMO using a plurality of fundamental bands. However, the present invention is not limited in this way. For example, audio and L2 information may correspond to multiple-input single-output (MISO) using a single fundamental band, video B may correspond to MIMO using a single fundamental band, and video E may correspond to MIMO using a plurality of fundamental bands. As another example, audio and L2 information may correspond to single-input single-output (SISO) using a single fundamental band, video B may correspond to MISO using a single fundamental band, and video E may correspond to MIMO using a plurality of fundamental bands. As described above, MISO and SISO may be further used and combined.

(11) Embodiments 1-8 may be implemented by using hardware and software. The above-described embodiments may be implemented or executed by using a computing device (processor). The computing device or processor may be, for example, a main processor/general purpose processor, a digital signal processor (DSP), an application specific integrated circuit (ASIC), a field programmable gate array (FPGA), other programmable logic device, etc. The above-described embodiments may be executed or implemented by a combination of such devices.

(12) Embodiments 1-8 may be implemented by an arrangement of software modules that are executed by a processor or directly-connected hardware. Further, a combination of a software module and hardware is possible. A software module may be stored on any of a variety of computer-readable storage media, for example, RAM, EPROM, EEPROM, flash memory, a register, hard disk, CD-ROM, DVD, etc.

Embodiments and Consideration by Inventors (Part 2)

Japanese terrestrial television broadcasting completely changed to digital broadcasting in July, 2011 and HDTV services are being provided using the Integrated Services Digital Broadcasting for Terrestrial Television Broadcasting (ISDB-T) scheme as a broadcasting standard. The ISDB-T scheme uses the orthogonal frequency division multiplexing (OFDM) scheme (Non-Patent Literature 4).

Figure 75:
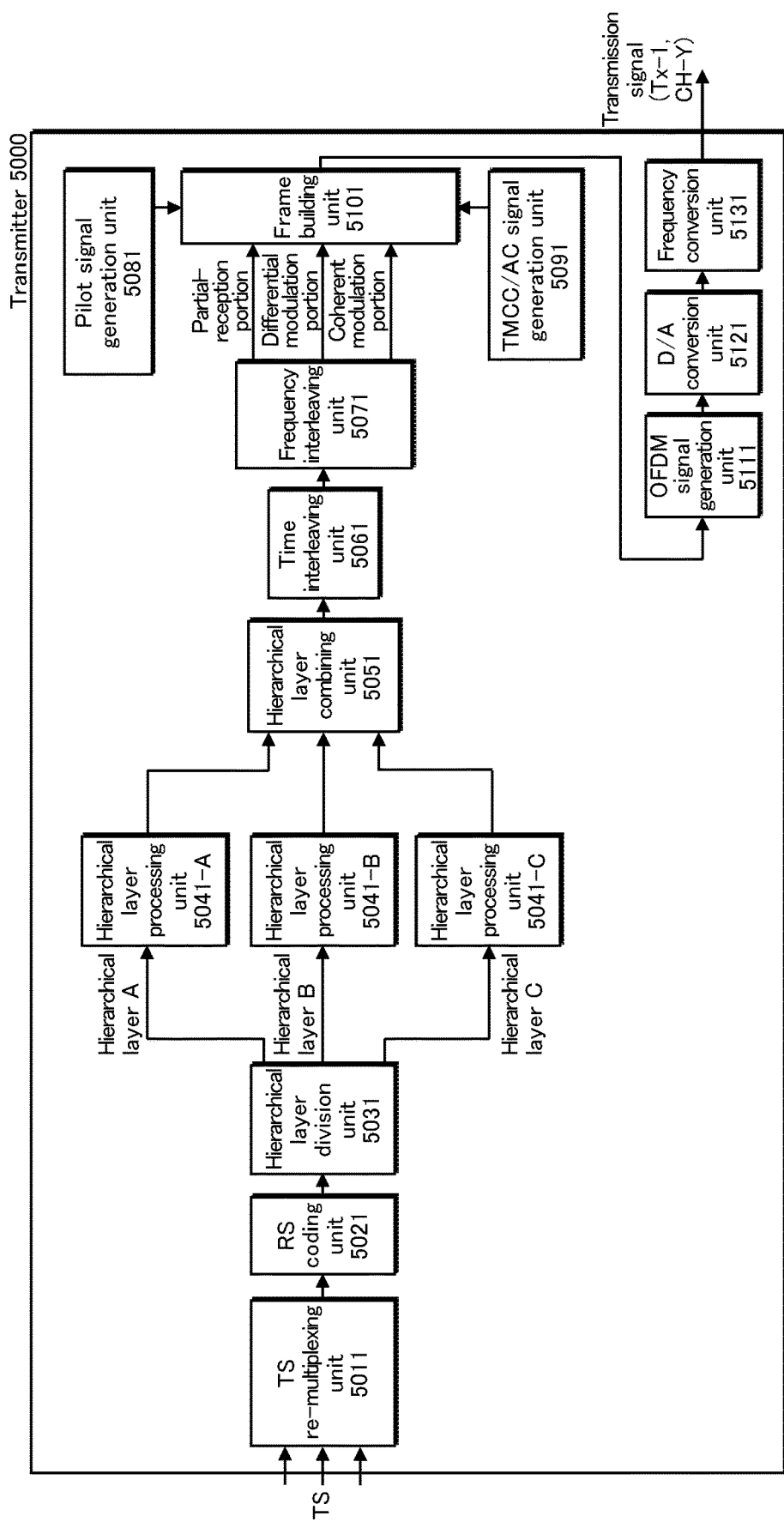
FIG. 75 illustrates a configuration of a transmitter 5000 in an ISDB-T scheme.

FIG. 75 illustrates a configuration of a transmitter 5000 in the ISDB-T scheme. The transmitter 5000 includes a transport stream (TS) re-multiplexing unit 5011, a Reed-Solomon (RS) coding unit 5021, a hierarchical layer division unit 5031, hierarchical layer processing units 5041-A, 5041-B, 5041-C, a hierarchical layer combining unit 5051, a time interleaving unit 5061, a frequency interleaving unit 5071, a pilot signal generation unit 5081, a transmission multiplexing configuration control (TMCC)/auxiliary channel (AC) signal generation unit 5091, a frame building unit 5101, an OFDM signal generation unit 5111, a D/A conversion unit 5121, and a frequency conversion unit 5131.

The following describes operations of the transmitter 5000. A plurality of TSs outputted from an MPEG-2 multiplexing unit (not illustrated) are inputted to the TS re-multiplexing unit 5011. The TS re-multiplexing unit 5011 is for arranging TS packets in an arrangement suitable for signal processing of data segment units. The TS re-multiplexing unit 5011 converts the plurality of TSs to a burst signal format of 188 byte units and to a single TS, by a clock rate four times that of a fast Fourier transform (FFT) sample clock rate. The RS coding unit 5021 performs RS coding, and adds parity of 16 bytes to information of 188 byte units. The hierarchical layer division unit 5031, when hierarchical layer transmission is performed, performs hierarchical layer division of at most three lines (hierarchical layer A, hierarchical layer B, hierarchical layer C) according to a specification made in hierarchical information.

Figure 76:
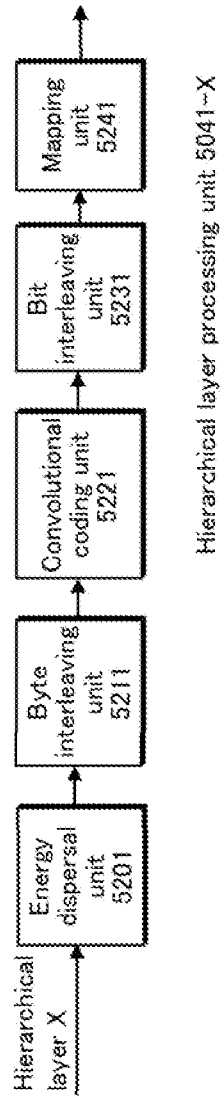
FIG. 76 illustrates a configuration of a hierarchical layer processing unit 5041 in the ISDB-T scheme.

FIG. 76 illustrates a configuration of one of the hierarchical layer processing units 5041. The hierarchical layer processing unit 5041 includes an energy dispersal unit 5201, a byte interleaving unit 5211, a convolutional coding unit 5221, a bit interleaving unit 5231, and a mapping unit 5241. The hierarchical layer processing unit 5041 performs, with respect to data of a hierarchical layer inputted thereto, digital data processing that is primarily error correction coding, interleaving, etc., and carrier modulation. Error correction, interleaving length, and carrier modulation scheme are set independently for each hierarchical layer.

The hierarchical layer combining unit 5051 combines hierarchical layers of data of at most three lines (hierarchical layer A, hierarchical layer B, hierarchical layer C) outputted from the hierarchical layer processing units 5041-A, 5041-B, 5041-C, respectively.

Figure 77:
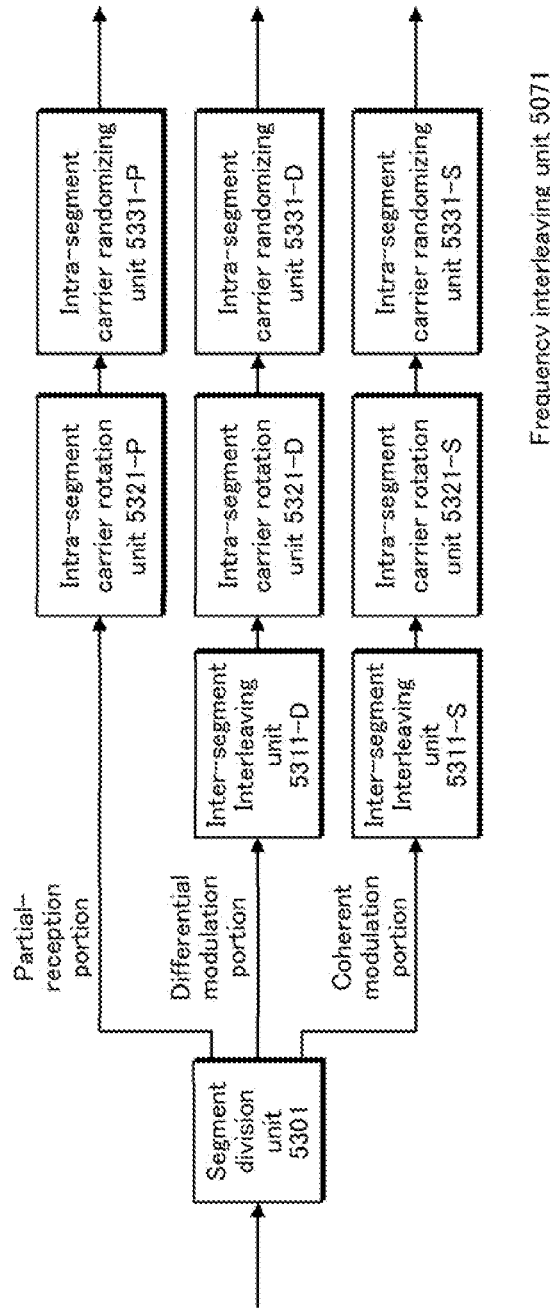
FIG. 77 illustrates a configuration of a frequency interleaving unit 5071 in the ISDB-T scheme.

FIG. 77 illustrates a configuration of the frequency interleaving unit 5071. The frequency interleaving unit 5071 includes a segment division unit 5301, inter-segment interleaving units 5311-D and 5311-S, intra-segment carrier rotation units 5321-P, 5321-D, and 5321-S, and intra-segment carrier randomizing units 5331-P, 5331-D, and 5331-S. To effectively exhibit error correction coding with respect to electric field fluctuations and multipath interference that occurs in mobile reception, with respect to output from the hierarchical layer combining unit 5051 the time interleaving unit 5061 performs intra-segment convolutional interleaving, and the frequency interleaving unit 5071 performs inter-segment and intra-segment interleaving. In the frequency interleaving unit 5071, the segment division unit 5301 allocates data segment numbers 0 to 12 sequentially to a partial reception portion, a differential modulation portion (segments for which DQPSK is specified for carrier modulation), and a coherent modulation portion (segments for which QPSK, 16-QAM, or 64-QAM is specified for carrier modulation). Note that between the hierarchical layer configuration and data segments, data segments of the same hierarchical layer are successively arranged, and hierarchical layers are named hierarchical layer A, B, and C, in ascending order of data segment number. Inter-segment interleaving is performed on data segments that belong to the same type of modulation portion, even if the hierarchical layers of the data segments are different.

The pilot signal generation unit 5081 generates pilot signals for synchronization and recovery. With respect to transmission of a hierarchical layer that includes a plurality of transmission parameters, in order to support demodulation/decoding by a receiver, the TMCC/AC signal generation unit 5091 generates a TMCC signal that is control information and an AC signal that is auxiliary information. The frame building unit 5101 builds a transmission frame of the ISDB-T scheme from information data outputted from the frequency interleaving unit 5071, the pilot signals for synchronization and recovery outputted from the pilot signal generation unit 5081, and the TMCC signal outputted from the TMCC/AC signal generation unit 5091.

Figure 78:
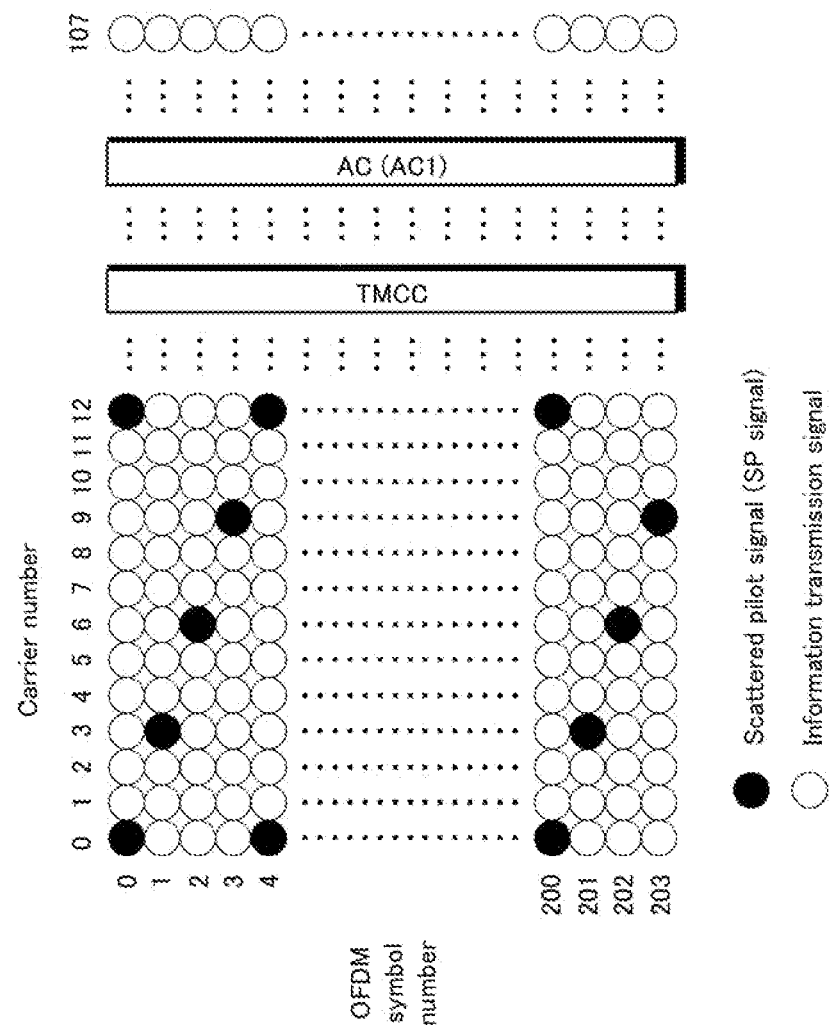
FIG. 78 illustrates a configuration of a segment in the ISDB-T scheme.

FIG. 78 illustrates a segment of the ISDB-T scheme, using a coherent modulation portion (QPSK, 16-QAM, 64-QAM) of mode 1 as an example. As pilot signals for synchronization and recovery, scattered pilot (SP) signals are not transmitted for each sub-carrier, but are transmitted by carrier positions in a frequency (sub-carrier) direction and time (symbol) direction, such that with respect to a symbol of symbol number n, carrier number k satisfies k=3(n mod 4)+12p (where mod indicates a modulo operation and p is an integer). In other words, as illustrated in FIG. 78, SP signals are arranged so as to be repeated in periods of four symbols and shifted three carriers with respect to each symbol. SP signals arranged in this way are modulated to two values in a specific pattern that is determined by the carrier position. Further, carriers of the TMCC signal and the AC signal are arranged randomly in a frequency direction, in order to reduce the effect of periodic dips of transmission channel characteristics due to multipath interference. According to the ISDB-T scheme, an information transmission signal is modulated by QPSK, 16-QAM, 64-QAM, etc., and transmitted using carriers in which the SP signals, the TMCC signal, and the AC signal are not placed.

The OFDM signal generation unit 5111, with respect to a transmission frame structure of the ISDB-T scheme outputted from the frame building unit 5101, performs inverse FFT (IFFT) and guard interval (GI) insertion, and outputs a digital baseband transmission signal of the ISDB-T scheme. The D/A conversion unit 5121 performs D/A conversion with respect to the digital baseband transmission signal of the ISDB-T scheme outputted from the OFDM signal generation unit 5111, and outputs an analog baseband transmission signal of the ISDB-T scheme. The frequency conversion unit 5131 performs frequency conversion to frequency channel Y with respect to the analog baseband transmission signal of the ISDB-T scheme outputted from the D/A conversion unit 5121, and outputs an analog RF transmission signal of the ISDB-T scheme from a transmit antenna (Tx-1, not illustrated).

Note that UHDTV (ultra HDTV) service, which surpasses the resolution of HDTV service, is widely being considered. To implement UHDTV service, which has a high bit rate, consideration of a transmission scheme capable of large-capacity transmission with higher frequency-usage efficiency than the ISDB-T scheme is important. For this purpose, introduction of multiple-input multiple-output (MIMO) technology using a plurality of antennas for both transmission and reception is important.

In fixed reception of a receive antenna on a roof, a line of sight (LOS) environment is the typical transmission channel. In such a case, degradation of reception quality is a problem that occurs depending on the MIMO scheme (Non-Patent Literature 5).

To mitigate this problem, polarization MIMO composed of a plurality of antennas having different polarization directions (for example, vertical (V) polarization and horizontal (H) polarization) is being considered. In a broadcast system that uses polarization MIMO, a transmitter, for example, allocates different data signals of multiple lines provided to a broadcasting station to each of a plurality of transmit antennas, and transmits an OFDM signal by a broadcast wave in the same frequency or a broadcast wave that overlaps frequency bands. The OFDM signal is transmitted via propagation channels of multiple lines, and a receiver, by using a plurality of receive antennas, receives the OFDM signal of multiple lines. The receiver, from each OFDM signal of multiple lines, estimates and separates a transfer function of each propagation channel passed through, and thereby demodulates different data signals of multiple lines transmitted from the transmitter.

In polarization MIMO, increasing polarization diversity effect by dispersing forward error correction (FEC) coded data to polarization antennas is important. Further, in a case in which polarization MIMO is introduced to national terrestrial television broadcasting, high compatibility with the existing ISDB-T scheme is important. Further, within the same frequency channel, making it easy to introduce a new scheme by allowing co-existence of the existing ISDB-T scheme and the new scheme using polarization MIMO is important.

Embodiments 9-12, described below, aim to solve the technical problems mentioned above, and aim to provide a transmitter, transmission method, receiver, reception method, integrated circuit, and program that use MIMO.

The following is a detailed description of each embodiment, with reference to the drawings.

Embodiment 9

<Transmitter and Transmission Method>

Figure 57:
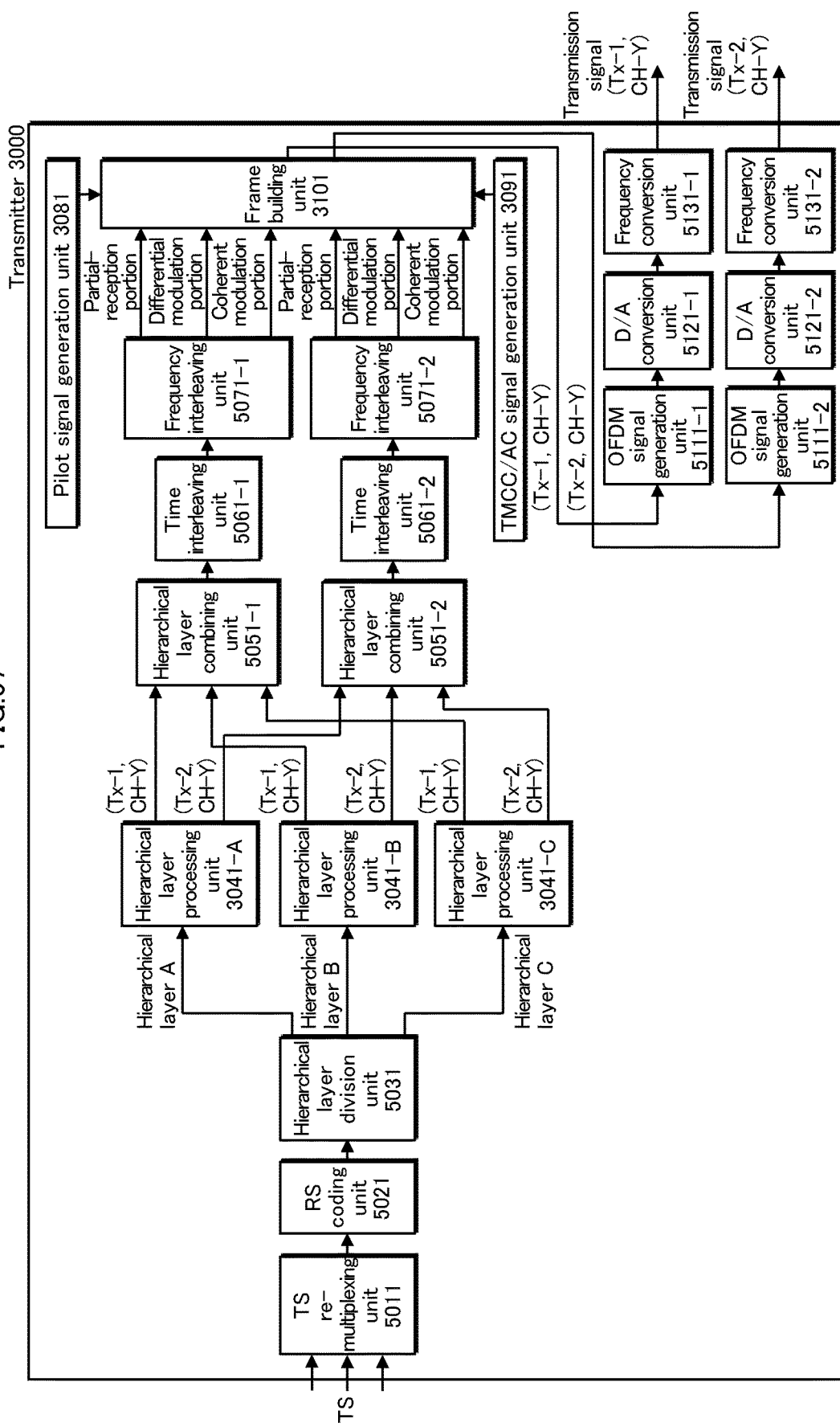
FIG. 57 illustrates a configuration of a transmitter 3000 in embodiment 9.

FIG. 57 illustrates a configuration of a transmitter 3000 in embodiment 9. Components that are the same as in the conventional transmitter have the same reference signs, and description thereof is omitted here.

The transmitter 3000 illustrated in FIG. 57, compared to the transmitter 5000 that is conventional and illustrated in FIG. 75, is configured such that the hierarchical layer processing units 5041-A, 5041-B, 5041-C, the pilot signal generation unit 5081, the TMCC/AC signal generation unit 5091, and the frame building unit 5101 are replaced by hierarchical layer processing units 3041-A, 3041-B, 3041-C, a pilot signal generation unit 3081, a TMCC/AC signal generation unit 3091, and a frame building unit 3101, respectively. Further, in the transmitter 3000, the hierarchical layer combining unit 5051, the time interleaving unit 5061, the frequency interleaving unit 5071, the OFDM signal generation unit 5111, the D/A conversion unit 5121, and the frequency conversion unit 5131 are provided in a plurality, such that each one of the hierarchical layer combining unit 5051, the time interleaving unit 5061, the frequency interleaving unit 5071, the OFDM signal generation unit 5111, the D/A conversion unit 5121, and the frequency conversion unit 5131 corresponds to one transmit antenna (Tx-1, Tx-2). Note that Tx-1 and Tx-2 each use H polarization and V polarization, but Tx-1 and Tx-2 may use other combinations of different polarization.

Figure 58:
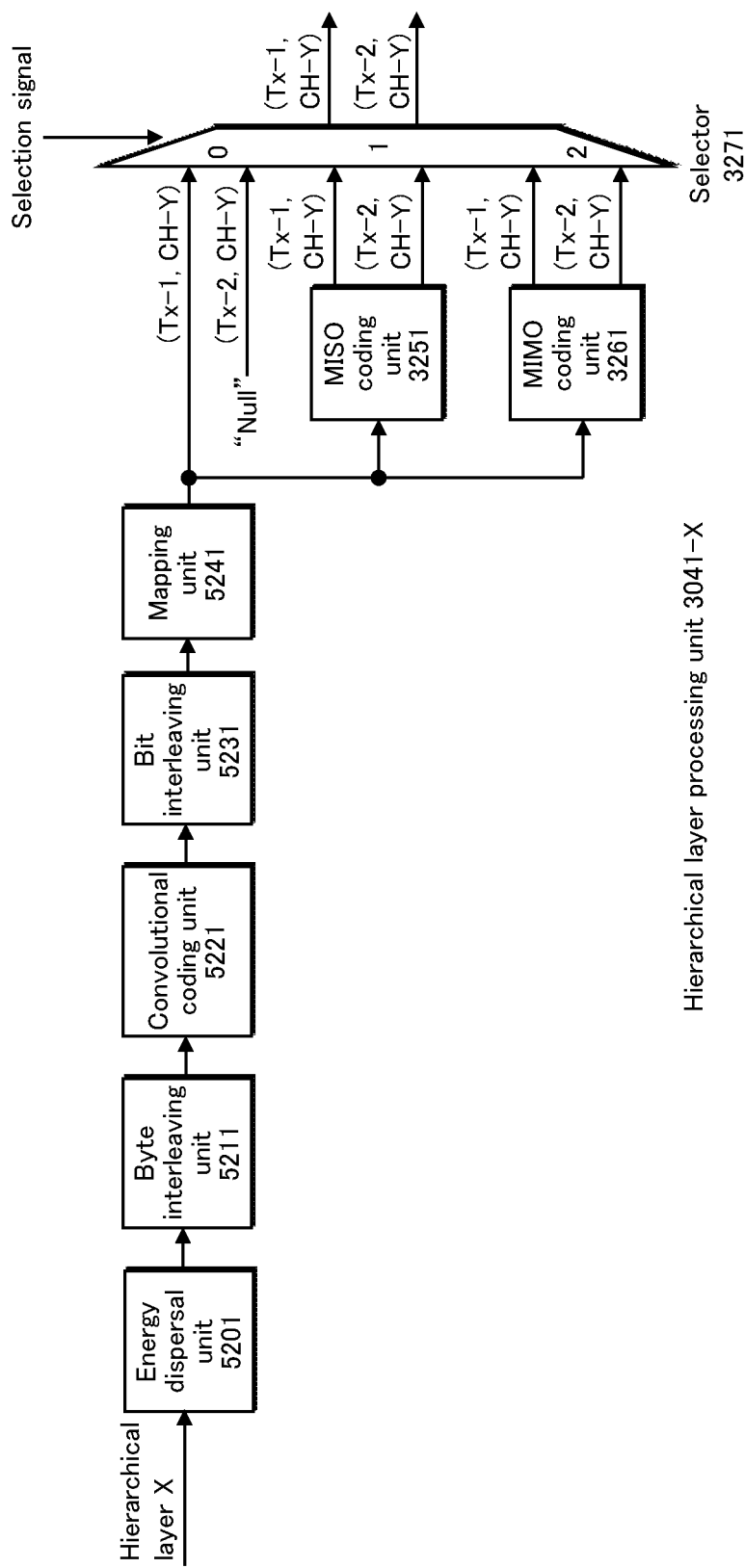
FIG. 58 illustrates a configuration of a hierarchical layer processing unit 3041 in embodiment 9.

The following describes operations of the transmitter 3000. FIG. 58 illustrates a configuration of one of the hierarchical layer processing units 3041. Compared to the hierarchical layer processing unit 5041, which is conventional and illustrated in FIG. 76, the hierarchical layer processing unit 3041 is configured such that a multiple-input single-output (MISO) coding unit 3251, a MIMO coding unit 3261, and a selector 3271 are added. In the hierarchical layer processing unit 3041 illustrated in FIG. 58, the MISO coding unit 3251 performs MISO coding with respect to output from the mapping unit 5241 and outputs MISO coded data with respect to the two transmit antennas (Tx-1, Tx-2). Alamouti coding is an example of MISO coding, but the present invention is not limited in this way.

Further, the MIMO coding unit 3261 performs MIMO coding with respect to output from the mapping unit 5241 and outputs MIMO coded data with respect to the two transmit antennas (Tx-1, Tx-2). Specifically, the MIMO coding unit 3261 performs pre-coding using mapping data two-by-two, and outputs MIMO coded data with respect to the two transmit antennas (Tx-1, Tx-2). When mapping data pairs are expressed as s2k+1, s2k+2, ..., with respect to an input vector s=(s2k+1, s2k+2)$^T$, (k=0, 1, ...), an output vector z=(z1_k, z2_k)$^T$ is expressed as shown in Formula 30.

[Math 30]

$$z=Fs \qquad \text{(Formula 30)}$$

Note that zP_k is outputted data (MIMO coded data) with respect transmit antenna P. F is a fixed pre-coding matrix expressed by Formula 31.

[Math 31]

$$F = \begin{pmatrix} w11 & w12 \\ w21 & w22 \end{pmatrix} \qquad \text{(Formula 31)}$$

In Formula 31, each component wMN (M=1, 2, N=1, 2) of the fixed pre-coding matrix is a complex number. However, wMN need not all be complex numbers, and real number components may be included.

As shown in Formula 32 and Formula 33, pre-coding may be performed by further multiplying by a phase change matrix X(k) that regularly changes Formula 30.

[Math 32]

$$z = X(k)Fs \qquad \text{(Formula 32)}$$

[Math 33]

$$X(k) = \begin{pmatrix} 1 & 0 \\ 0 & e^{j\frac{2\pi}{9}k} \end{pmatrix} \qquad \text{(Formula 33)}$$

According to this phase change matrix X(k), with respect to a series of MIMO coded data for the transmit antenna 2 (Tx-2), a phase change of period 9 is performed that changes in 2π/9 radian steps. Accordingly, by causing a regular change in a MIMO channel, an effect is obtained by which reception quality of data is improved for a receiver in a line of sight (LOS) environment in which direct waves are dominant. Note that this phase change is only one example, and the phase change is not limited to a period of 9. When the number of this period becomes greater, the reception performance of the receiver (more precisely, the error correction performance) may increase proportionately (although a larger period is not always better, the possibility is high that a small value such as 2 is better avoided).

Further, although the phase change shown in Formula 32 and Formula 33 indicates rotation of the phase that is sequential and predefined (in the above formulas, 2π/9 radian steps), rotation is not limited to the same phase amount and the phase may be changed by a random amount. The importance of regularly changing the phase is that the phase of a modulated signal is changed regularly. A degree by which the phase is changed is preferably uniform, for example, with respect to −π radians to π radians, uniform distribution is preferable. However, random distribution is also possible.

According to the above-described operations performed by the MIMO coding unit 3261, each component of the output vector z is expressed as in Formulas 34-35.

[Math 34]

$$z1\_k=f1(s2k+1,s2k+2) \qquad \text{(Formula 34)}$$

[Math 35]

$$z2\_k=f2(s2k+1,s2k+2) \qquad \text{(Formula 35)}$$

Here, f1 and f2 express functions. Accordingly, with respect to polarization MIMO, a transmitter, a transmission method, and a program are provided that each sufficiently exhibits a polarization diversity effect, by transmitting each component of mapping data from every transmit antenna.

Further, a fixed pre-coding matrix F shown in Formula 36 may be used.

[Math 36]

$$F = \begin{pmatrix} 1 & 0 \\ 0 & 1 \end{pmatrix} \qquad \text{(Formula 36)}$$

As shown in Formula 32 and Formula 33, pre-coding may be performed by further multiplying by a phase change matrix X(k) that regularly changes Formula 36. According to the above-described operations performed by the MIMO coding unit 3261, each component of the output vector z is expressed as in Formulas 37-38.

[Math 37]

$$z1\_k=f1(s2k+1) \qquad \text{(Formula 37)}$$

[Math 38]

$$z2\_k=f2(s2k+2) \qquad \text{(Formula 38)}$$

Here, f1 and f2 express functions. Accordingly, with respect to polarization MIMO, a transmitter, a transmission method, and a program are provided that each sufficiently exhibits a polarization diversity effect, by transmitting half of all mapping data from one transmit antenna (Tx-1) and transmitting the remaining half of all mapping data from another transmit antenna (Tx-2).

In the hierarchical layer processing unit 3041 illustrated in FIG. 58, the selector 3271 selects and outputs data inputted to "0", "1", "2" when a selection signal is "0", "1", "2". In other words, if the hierarchical layers correspond to the existing ISDB-T scheme, MISO and MIMO, the selection signal is "0", "1", and "2", respectively. However, when the selection signal is "0", a null signal is outputted to Tx-2.

According to the above configuration, the hierarchical layer processing unit 3041 outputs data of at most three lines (hierarchical layer A, hierarchical layer B, hierarchical layer C), and for each hierarchical layer one of the ISDB-T scheme, MISO, and MIMO can be selected.

In the transmitter 3000 illustrated in FIG. 57, the hierarchical layer combining unit 5051, the time interleaving unit 5061, and the frequency interleaving unit 5071 of each transmit antenna perform the same operations as in the transmitter 5000, which is conventional and illustrated in FIG. 75. In other words, operations are the same with respect to both transmit antennas. However, as described later using FIG. 60 (a portion of definitions of the TMCC signal), in the frequency interleaving unit 5071 illustrated in FIG. 77, the segment division unit 5301 allocates MISO/MIMO coherent modulation portions to a coherent modulation portion or a differential modulation portion (whichever is not already used) when the ISDB-T scheme is not already using the coherent modulation portion or the differential modulation portion. In this way, frequency interleaving is independently performed with respect to the ISDB-T scheme and the MISO/MIMO scheme, and the ISDB-T scheme and the MISO/MIMO scheme are not mixed within each segment after frequency interleaving. However, a hierarchical layer of MISO and a hierarchical layer of MIMO may be mixed within each segment after frequency interleaving.

The pilot signal generation unit 3081 generates pilot signals for synchronization and recovery. With respect to segments belonging to hierarchical layers of MIMO or MISO, pilot signals for synchronization and recovery for MIMO/MISO are generated. The TMCC/AC signal generation unit 3091 generates a TMCC signal that is control information and an AC signal that is auxiliary information. With respect to segments belonging to hierarchical layers of MIMO and MISO, a TMCC signal for MIMO and a TMCC signal for MISO are generated.

Figure 59:
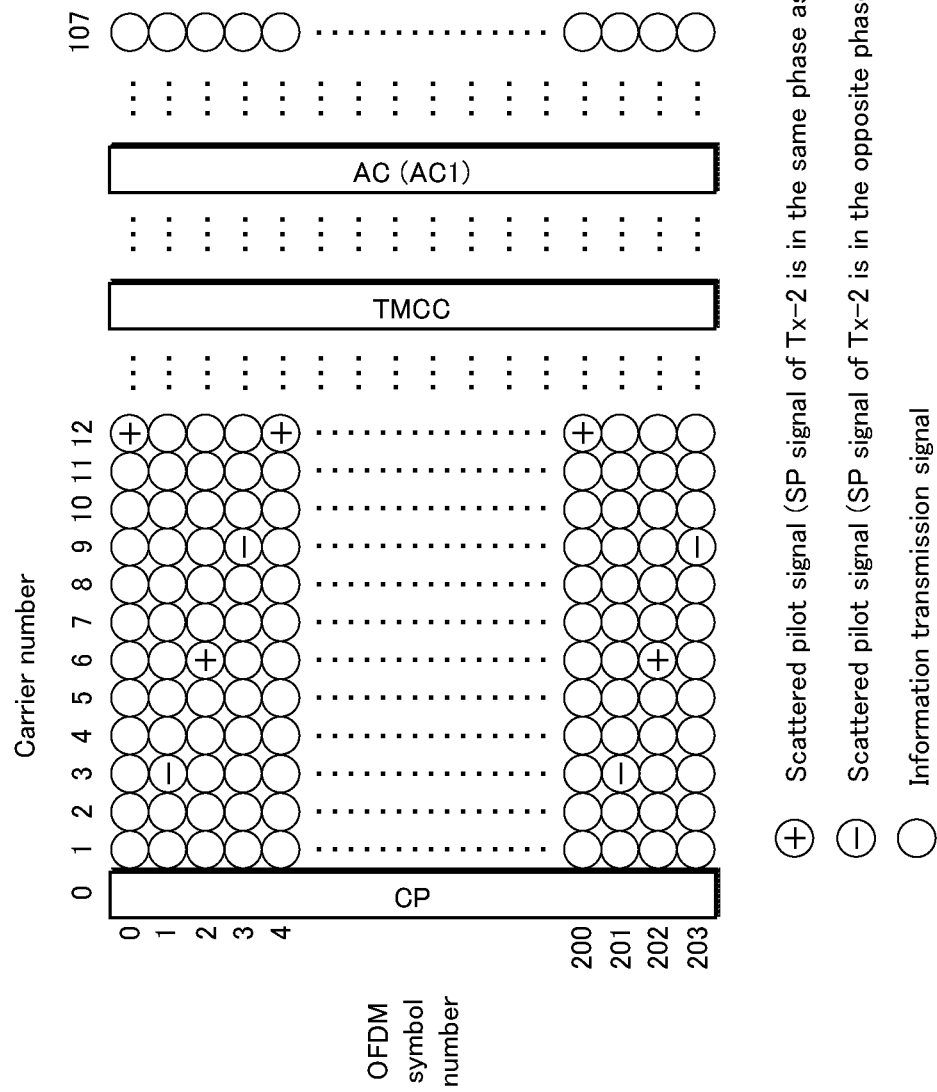
FIG. 59 illustrates a configuration of a segment of MIMO and multiple-input single-output (MISO) transmission in embodiment 9.

As an example of a coherent modulation portion of mode 1 illustrated in FIG. 59, a segment configuration of MIMO and MISO is described. As shown in FIG. 59, when OFDM symbol numbers are even, SP signals of both transmit antennas have the same phase, and when OFDM symbol numbers are odd, SP signals of Tx-2 have an opposite phase to SP signals of Tx-1. Further, by placing a continual pilot (CP) signal of the ISDB-T scheme (Tx-1: CP, Tx-2: null) at carrier number 0, when a coherent modulation portion segment of the ISDB-T scheme is adjacent to a lower frequency, the CP functions instead of SPs of the coherent modulation portion of the ISDB-T scheme. However, when the segment adjacent to a lower frequency is a segment of MIMO or MISO, the CP signal is transmitted from both transmit antennas. In such a case, when OFDM symbol numbers are even, CP signals of both transmit antennas have the same phase, and when OFDM symbol numbers are odd, CP signals of Tx-2 have an opposite phase to CP signals of Tx-1.

Further, MIMO/MISO coding is not performed with respect to the TMCC signal and the AC signal, and the same signal is transmitted from both transmit antennas (Tx-1, Tx-2). Further, by making the frequency direction placement the same as in the ISDB-T scheme, existing ISDB-T receivers can also receive the TMCC signal and the AC signal of MIMO/MISO segments.

FIG. 60 illustrates a portion of definitions of the TMCC signal. Portion (a) and portion (b) of FIG. 60 each illustrate a carrier modulation mapping scheme of the ISDB-T scheme and embodiment 9, respectively. As shown in portion (b) of FIG. 60, in embodiment 9, "100" and "101" that are undefined in the ISDB-T scheme are allocated to MISO and MIMO, respectively. In this way, segments of MISO or MIMO can be recognized as "unreceivable" by existing ISDB-T receivers, and receivers that support MISO and MIMO can recognize segments of MISO or MIMO.

Portions (c) and (d) of FIG. 60 illustrate definitions of B110-B121 in the ISDB-T scheme and embodiment 9. As shown in portion (d) of FIG. 60, in embodiment 9, "000", "001", and "010" of B110-B112 that are undefined in the ISDB-T scheme are allocated to QPSK (MISO/MIMO), 16-QAM (MISO/MIMO), and 64-QAM (MISO/MIMO), respectively. In this way, without adversely affecting existing ISDB-T receivers, a receiver supporting MISO and MIMO can recognize a carrier modulation mapping scheme of segments of MISO or MIMO.

Portions (e) and (f) of FIG. 60 illustrate definitions of segment identification in the ISDB-T scheme and embodiment 9. As shown in portion (f) of FIG. 60, in embodiment 9, "000" identifies a coherent modulation portion or a MISO/MIMO coherent modulation portion, and "001" identifies a differential modulation portion or a MISO/MIMO coherent modulation portion. In the ISDB-T scheme, when a coherent modulation portion or a differential modulation portion is unused, the "000" or "111" can be defined as a MISO/MIMO coherent modulation portion. Whether or not "000" and "111" are MISO/MIMO coherent modulation portions can be recognized according to the definition of carrier modulation mapping scheme illustrated in portion (b) of FIG. 60. An existing ISDB-T receiver interprets "000" and "111" as a coherent modulation portion and a differential modulation portion, respectively, but when the definition of carrier modulation mapping scheme illustrated in portion (b) of FIG. 60 is "100" and "101" (a segment of MISO and MIMO, respectively), which are undefined in the ISDB-T scheme, "000" and "111" can be recognized as "unreceivable". In contrast, a receiver supporting MISO and MIMO, according to the definition of carrier modulation mapping scheme illustrated in portion (b) of FIG. 60, recognizes segments of MISO or MIMO, and can recognize a MISO/MIMO coherent modulation portion. In this way, without adversely affecting existing ISDB-T receivers, a receiver supporting MISO and MIMO can recognize a carrier modulation mapping scheme of segments of MISO or MIMO.

The frame building unit 3101 builds a transmission frame from information data outputted from the frequency interleaving units 5071 corresponding to each transmit antenna, the pilot signals for synchronization and recovery outputted from the pilot signal generation unit 3081, and the TMCC signal and AC signal outputted from the TMCC/AC signal generation unit 3091. Here, points of difference from the frame building unit 5101, which is conventional and illustrated in FIG. 75, are that a transmission frame is built for each of the two transmit antennas (Tx-1, Tx-2), and segments of MIMO or MISO may be included.

In the transmitter 3000 illustrated in FIG. 57, the OFDM signal generation units 5111, the D/A conversion units 5121, and the frequency conversion units 5131 perform the same operations as in the transmitter 5000, which is conventional and illustrated in FIG. 75. In other words, operations are the same with respect to both transmit antennas.

According to the above configuration, in polarization MIMO, the existing ISDB-T scheme and a new scheme using polarization MIMO can co-exist, and a transmitter, transmission method, and program are provided that make introduction of the new scheme easy. Further, in the new scheme using polarization MIMO, sufficient exhibition of polarization diversity effect is achieved, and a particular feature is implementation using a processing method having high compatibility with the existing ISDB-T scheme (the same time interleaving, frequency interleaving, etc., as in the ISDB-T scheme).

<Existing ISDB-T Receiver and Reception Method>

Figure 61:
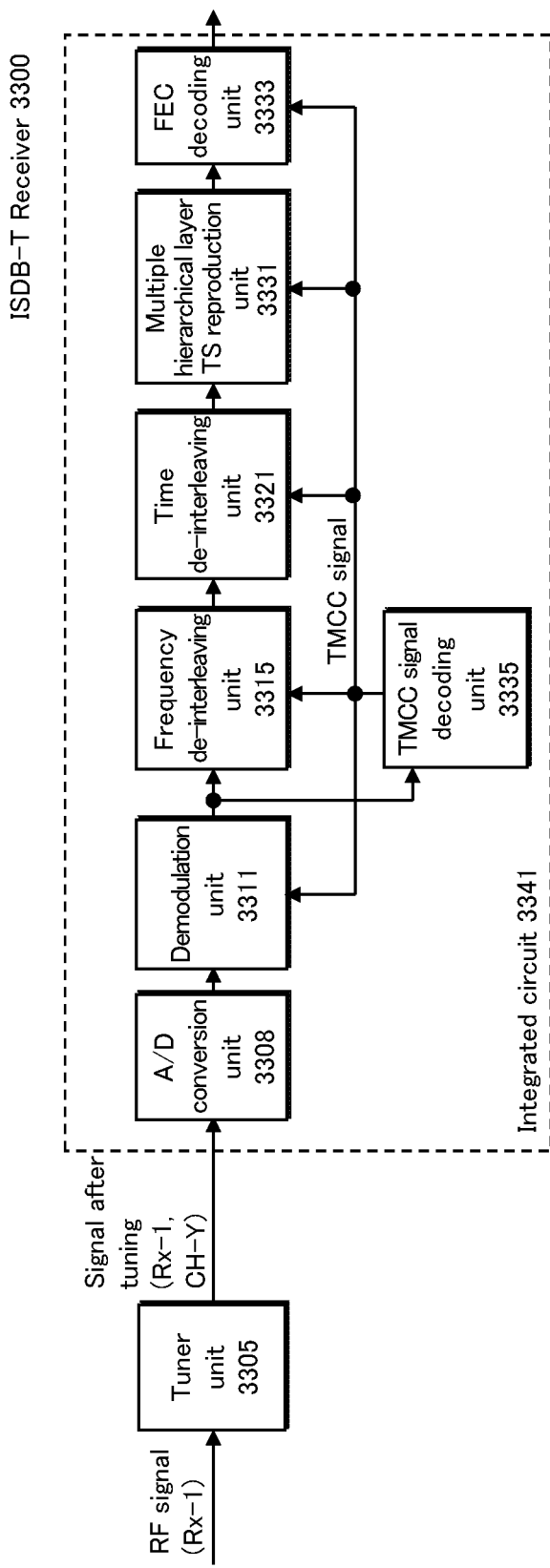
FIG. 61 illustrates a configuration of an existing Integrated Services Digital Broadcasting for Terrestrial Television Broadcasting (ISDB-T) receiver 3300 in embodiment 9.

FIG. 61 illustrates a configuration of an existing ISDB-T receiver 3300. The ISDB-T receiver 3300 illustrated in FIG. 61 corresponds to the transmitter 5000, illustrated in FIG. 75, and reflects functions of the transmitter 5000.

The ISDB-T receiver 3300 includes a tuner unit 3305, an A/D conversion unit 3308, a demodulation unit 3311, a frequency de-interleaving unit 3315, a time de-interleaving unit 3321, a multiple hierarchical layer TS reproduction unit 3331, an FEC decoding unit 3333, and a TMCC signal decoding unit 3335.

The following describes operations of the ISDB-T receiver 3300. With respect to a signal transmitted from the transmitter 5000 illustrated in FIG. 75, upon input of an analog RF transmission signal from a receive antenna Rx-1, the tuner unit 3305 selectively receives a signal of a selected frequency channel (CH-Y), and down-converts the signal to a predefined band. The A/D conversion unit 3308 performs analogue to digital conversion, and outputs a digital reception signal. The demodulation unit 3311 performs OFDM demodulation, outputs mapping data (cells) of I/Q coordinates after equalization and a transmission channel estimate value to the frequency de-interleaving unit 3315 and outputs FFT output before equalization to the TMCC signal decoding unit 3335.

The TMCC signal decoding unit 3335, with respect to the FFT output before equalization outputted from the demodulation unit 3311, performs differential BPSK demodulation with respect to each carrier with respect to which the TMCC signal illustrated in FIG. 59 is placed, and decodes the TMCC signal by performing majority decoding of demodulation results accumulated for each segment. The decoded TMCC signal is outputted to the demodulation unit 3311, the frequency de-interleaving unit 3315, the time de-interleaving unit 3321, the multiple hierarchical layer TS reproduction unit 3331, and the FEC decoding unit 3333, and operations are performed in each unit based on the decoded TMCC signal.

The frequency de-interleaving unit 3315, with respect to the mapping data of I/Q coordinates after equalization and the transmission channel estimate value outputted from the demodulation unit 3311, performs frequency de-interleaving with respect to each of a partial reception portion, a differential modulation portion, and a coherent modulation portion. The time de-interleaving unit 3321, with respect to output from the frequency de-interleaving unit 3315, performs time de-interleaving.

Figure 62:
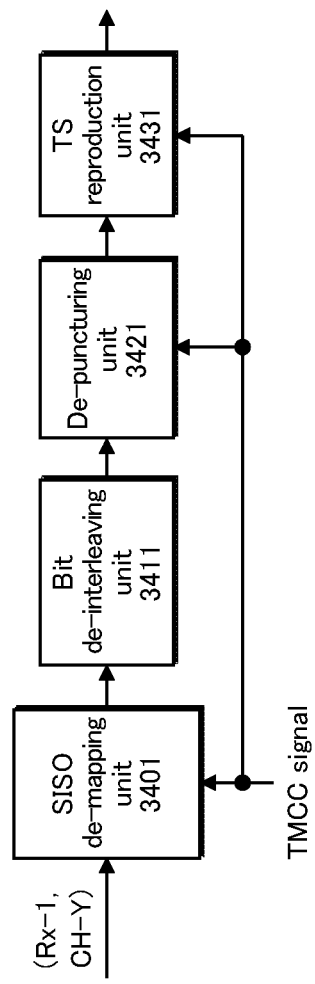
FIG. 62 illustrates a configuration of a multiple hierarchical layer TS reproduction unit 3331 in embodiment 9.

FIG. 62 illustrates a configuration of the multiple hierarchical layer TS reproduction unit 3331. The multiple hierarchical layer TS reproduction unit 3331 includes a single-input single-output (SISO) de-mapping unit 3401, a bit de-interleaving unit 3411, a de-puncture unit 3421, and a TS reproduction unit 3431. The SISO de-mapping unit 3401 performs de-mapping processing based on mapping data of I/Q coordinates after equalization and the transmission channel estimate value that have undergone de-interleaving by the frequency de-interleaving unit 3315 and the time de-interleaving unit 3321. The bit de-interleaving unit 3411 performs bit de-interleaving, and the de-puncture unit 3421 performs de-puncture processing. The TS reproduction unit 3431 performs TS reproduction of each hierarchical layer with respect to output of the de-puncture unit 3421.

Figure 63:
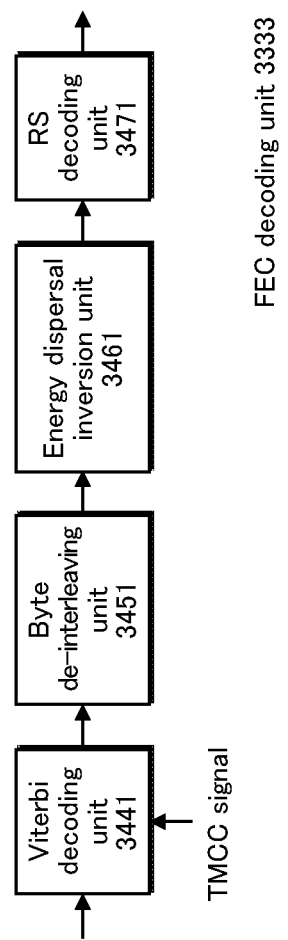
FIG. 63 illustrates a configuration of a forward error coding (FEC) decoding unit 3333 in embodiment 9.

FIG. 63 illustrates a configuration of the FEC decoding unit 3333. The FEC decoding unit 3333 includes a Viterbi decoding unit 3441, a byte de-interleaving unit 3451, an energy dispersal inversion unit 3461, and an RS decoding unit 3471. With respect to output from the multiple hierarchical layer TS reproduction unit 3331, the Viterbi decoding unit 3441 performs Viterbi decoding, the byte de-interleaving unit 3451 performs byte de-interleaving, the energy dispersal inversion unit 3461 performs energy dispersal inversion, and the RS decoding unit 3471 performs RS decoding.

According to the above operations, the ISDB-T receiver 3300 illustrated in FIG. 61, with respect to a signal transmitted from the transmitter 5000 illustrated in FIG. 75, outputs a TS of each hierarchical layer that has undergone error correction decoding. Note that the components of the ISDB-T receiver 3300 illustrated in FIG. 61, aside from the tuner unit 3305, may be included in an integrated circuit 3341.

Next, only points of difference are described regarding operations of the ISDB-T receiver 3300 with respect to a signal transmitted from the transmitter 3000 illustrated in FIG. 57 and the previously described operations of the ISDB-T receiver 3300 with respect to a signal transmitted from the transmitter 5000 illustrated in FIG. 75.

With respect to a signal transmitted from the transmitter 3000 illustrated in FIG. 57, upon input of an analog RF transmission signal from the receive antenna Rx-1, the tuner unit 3305 and the A/D conversion unit 3308 perform the same operations as described previously.

The TMCC signal decoding unit 3335, the same as previously described, performs decoding of a TMCC signal by performing majority decoding with respect to demodulation results accumulated for each segment. Note that in a segment to which a hierarchical layer of MISO or MIMO is allocated, the transmitter 3000 illustrated in FIG. 57, with respect to a TMCC signal, transmits the same signal from both transmit antennas (Tx-1, Tx-2) without performing MIMO/MISO coding. Accordingly, the TMCC signal decoding unit 3335 can decode a TMCC signal of a segment to which a hierarchical layer of MISO or MIMO is allocated, and according to the TMCC signal definition illustrated in FIG. 60, determine such segments as being unreceivable.

Such a determination result is outputted to the demodulation unit 3311, the frequency de-interleaving unit 3315, the time de-interleaving unit 3321, the multiple hierarchical layer TS reproduction unit 3331, and the FEC decoding unit 3333, and each unit performs processing of only a segment to which a hierarchical layer of the ISDB-T scheme is allocated.

According to the above operations, the ISDB-T receiver 3300 illustrated in FIG. 61, with respect to a signal transmitted from the transmitter 3000 illustrated in FIG. 57, outputs a TS of a hierarchical layer of the ISDB-T scheme that has undergone error correction decoding.

<Receiver and Reception Method>

Figure 64:
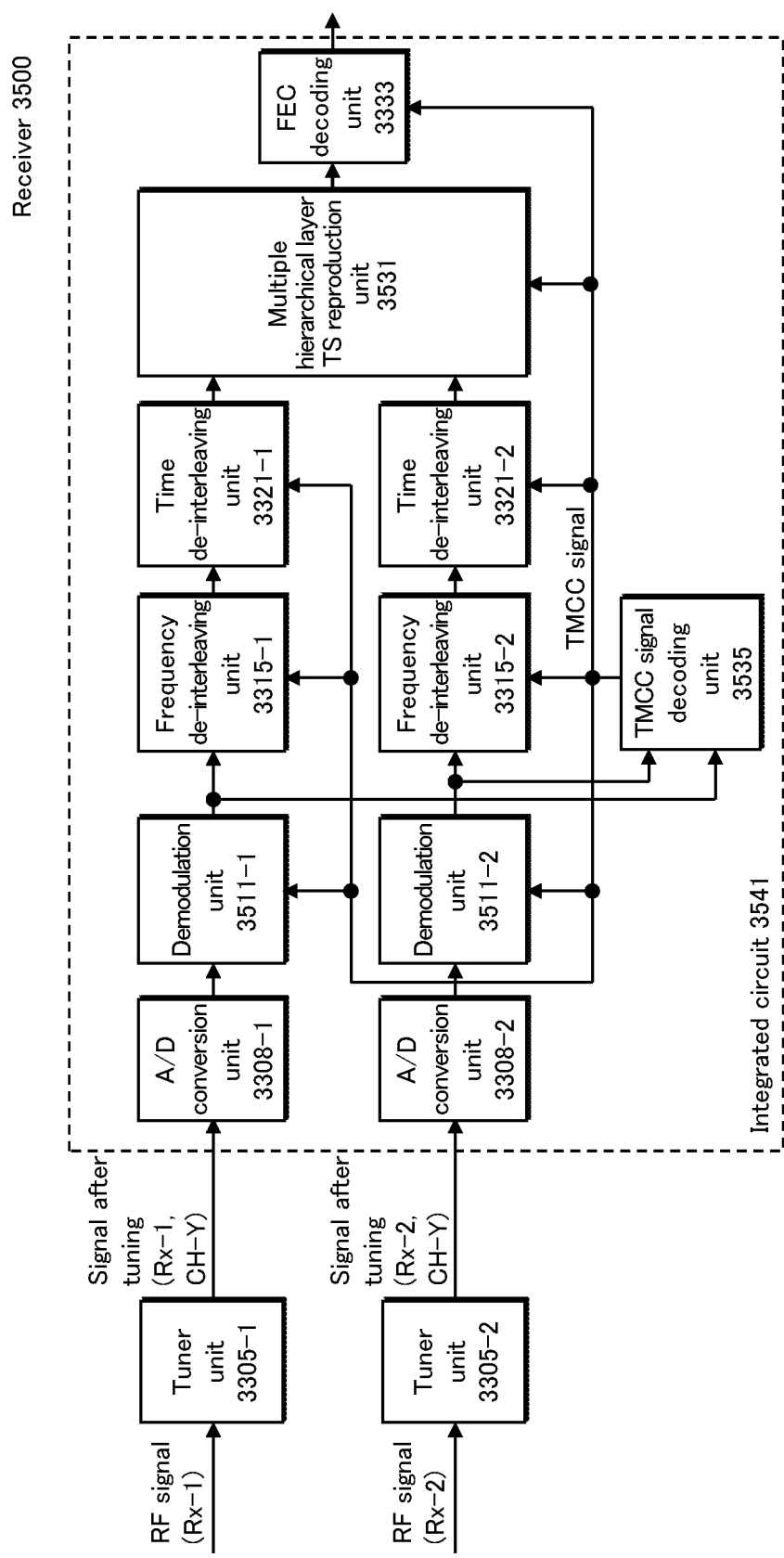
FIG. 64 illustrates a configuration of a receiver 3500 in embodiment 9.

FIG. 64 illustrates a configuration of a receiver 3500 in embodiment 9. The receiver 3500 illustrated in FIG. 64 corresponds to the transmitter 3000, illustrated in FIG. 57, and reflects functions of the transmitter 3000. Components that are the same as in the existing ISDB-T receiver have the same reference signs, and description thereof is omitted here.

The receiver 3500, compared to the ISDB-T receiver 3300 illustrated in FIG. 61, is configured such that the multiple hierarchical layer TS reproduction unit 3331 and the TMCC signal decoding unit 3335 are replaced by a multiple hierarchical layer TS reproduction unit 3531 and a TMCC signal decoding unit 3535. Further, the demodulation unit 3311 is replaced by demodulation units 3511 that each correspond to a respective transmit antenna. Further, in the receiver 3500, the tuner unit 3305, the A/D conversion unit 3308, the frequency de-interleaving unit 3315, and the time de-interleaving unit 3321 are each provided in a plurality, and each unit corresponds to a respective transmit antenna.

The following describes operations of the receiver 3500. With respect to a signal transmitted from the transmitter 3000 illustrated in FIG. 57, when an analog RF transmission signal is inputted from both receive antennas (Rx-1, Rx-2), the tuner unit 3305 of each receive antenna and the A/D conversion unit 3308 of each receive antenna perform the same operations as those of the ISDB-T receiver 3300 illustrated in FIG. 61.

The demodulation unit 3511 of each receive antenna performs OFDM demodulation. However, with respect to a segment to which a hierarchical layer of MISO or MIMO is allocated, without performing equalization, transmission channel estimation for MISO/MIMO is performed based on the SP signals illustrated in FIG. 59. Accordingly, the demodulation unit 3511 of each receive antenna, with respect to a segment to which a hierarchical layer of MISO or MIMO is allocated, outputs FFT output before equalization to the frequency de-interleaving units 3315 and the TMCC signal decoding unit 3535, and outputs a transmission channel estimate value to the frequency de-interleaving units 3315.

The TMCC signal decoding unit 3535, with respect to the FFT output before equalization outputted from the demodulation units 3511, performs decoding of the TMCC signal by performing differential BPSK demodulation and majority decoding in the same way as the TMCC signal decoding unit 3335 illustrated in FIG. 61. However, by performing majority decoding using output from the demodulation unit 3511 of both receive antennas (Rx-1, Rx-2), decoding performance is further increased. Further, the TMCC signal decoding unit 3535 recognises the definitions of TMCC signal illustrated in FIG. 60, and even with respect to a segment to which a hierarchical layer of MISO or MIMO is allocated, detects whether or not MISO or MIMO is specified, and detects the carrier modulation mapping scheme (QPSK, 16-QAM, 64-QAM).

Such detection results are outputted to the demodulation unit 3511 of each receive antenna, the frequency de-interleaving unit 3315 of each receive antenna, the time de-interleaving unit 3321 of each receive antenna, the multiple hierarchical layer TS reproduction unit 3531, and the FEC decoding unit 3333, and each unit performs processing of a segment to which a hierarchical layer of the ISDB-T scheme is allocated and a segment to which a hierarchical layer of MISO or MIMO is allocated.

Operations of the frequency de-interleaving unit 3315 of each receive antenna and the time de-interleaving unit 3321 of each antenna are the same as the operations described with reference to FIG. 61. However, the frequency de-interleaving unit 3315, as indicated in portion (f) of FIG. 60, performs frequency de-interleaving using frequency de-interleaving functions corresponding each receive antenna of an ISDB-T coherent modulation portion or an ISDB-T differential modulation portion to which a MISO/MIMO coherent modulation portion is allocated. Further, with respect to a segment to which a hierarchical layer of the ISDB-T scheme is allocated, operation of the frequency de-interleaving unit 3315 and the time de-interleaving unit 3321 of one receive antenna (Rx-1 or Rx-2) can be suspended. Alternatively operations of the frequency de-interleaving unit 3315 and the time de-interleaving unit 3321 of both receive antennas (Rx-1, Rx-2) can be performed, further increasing reception performance by execution of diversity reception.

Figure 65:
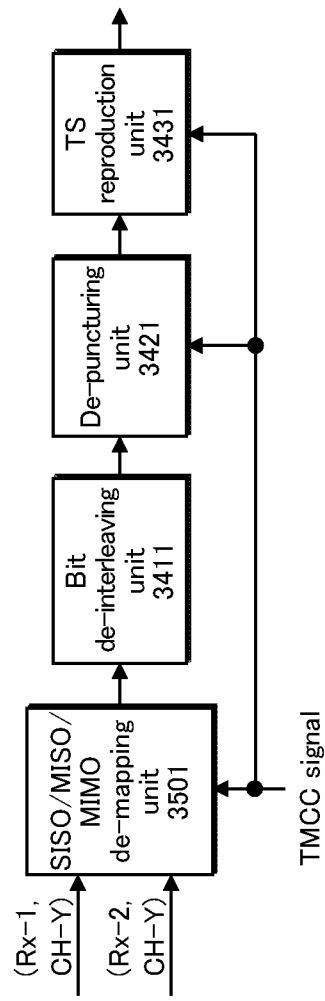
FIG. 65 illustrates a configuration of a multiple hierarchical layer TS reproduction unit 3531 in embodiment 9.

FIG. 65 illustrates a configuration of the multiple hierarchical layer TS reproduction unit 3531. The multiple hierarchical layer TS reproduction unit 3531, compared to the multiple hierarchical layer TS reproduction unit 3331 illustrated in FIG. 62, is configured such that the SISO de-mapping unit 3401 is replaced by a SISO/MISO/MIMO de-mapping unit 3501. The SISO/MISO/MIMO de-mapping unit 3501, based on an inputted TMCC signal, performs the same operations as the SISO de-mapping unit 3401 with respect to a segment to which a hierarchical layer of the ISDB-T scheme is allocated, and performs MISO or MIMO de-mapping processing with respect to a segment to which a hierarchical layer of MISO or MIMO is allocated. Other operations of the multiple hierarchical layer TS reproduction unit 3531 illustrated in FIG. 65 are the same as operations of the multiple hierarchical layer TS reproduction unit 3331 illustrated in FIG. 62.

The FEC decoding unit 3333 illustrated in FIG. 64 performs the same operations as the FEC decoding unit 3333 illustrated in FIG. 61.

In the following, MIMO de-mapping processing performed by the SISO/MISO/MIMO de-mapping unit 3501 is described. An input vector $y=(y1\_k, y2\_k)^T$ to the SISO/MISO/MIMO de-mapping unit 3501 is expressed as shown in Formula 39.

[Math 39]

$$y = Hz + n \quad \text{(Formula 39)}$$

yP_k is input data with respect to a receive antenna P. H is a transmission channel matrix expressed in Formula 40. $n=(n1\_k, n2\_k)^T$ is a noise vector. nP_k is an i.i.d. complex Gaussian noise of variance $\sigma^2$ that has an average value 0.

[Math 40]

$$H = \begin{pmatrix} h11\_k & h12\_k \\ h21\_k & h22\_k \end{pmatrix} \quad \text{(Formula 40)}$$

Using Formula 39 and Formula 40, the SISO/MISO/MIMO de-mapping unit 3501 performs maximum-likelihood decoding (MLD), calculates a vector estimated value $s'=(s'2k+1, s'2k+2)^T$, and outputs the vector estimated value s'. Note that processing of the SISO/MISO/MIMO de-mapping unit 3501 is not limited to MLD, and other methods such as zero forcing (ZF) may be used.

According to the above configuration, in polarization MIMO, a receiver, reception method, and program are provided that receive a signal transmitted by dispersing mapping data to each polarization antenna.

Further, the components of the receiver 3500 illustrated in FIG. 64, aside from the tuner unit 3305, may be included in an integrated circuit 3541.

Embodiment 10

<Transmitter and Transmission Method>

Figure 66:
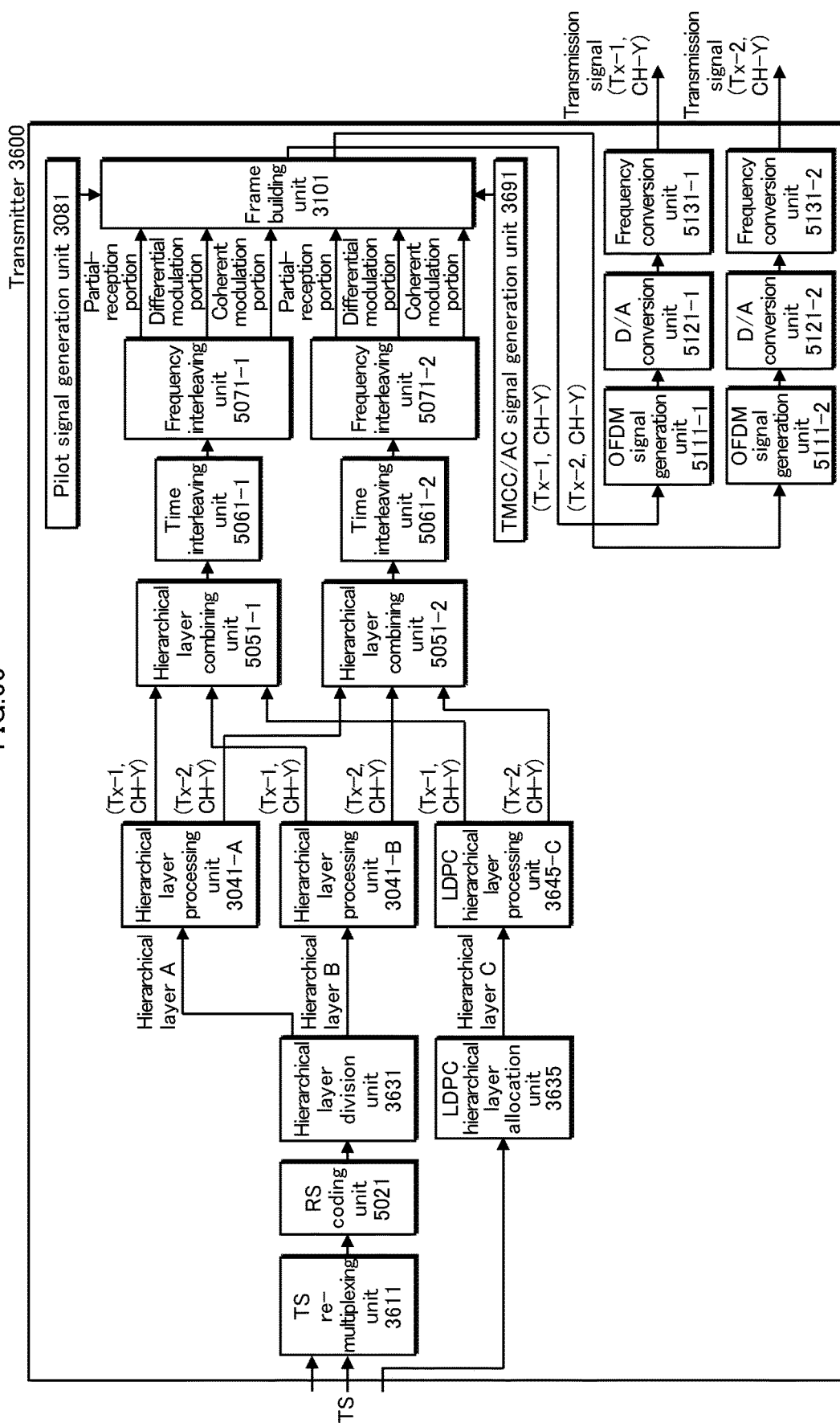
FIG. 66 illustrates a configuration of a transmitter 3600 in embodiment 10.

FIG. 66 illustrates a configuration of a transmitter 3600 in embodiment 10. Components that are the same as in the conventional transmitter or the transmitter in embodiment 9 have the same reference signs, and description thereof is omitted here.

The transmitter 3600 illustrated in FIG. 66, compared to the transmitter 3000 in embodiment 9 illustrated in FIG. 57, is configured such that the TS re-multiplexing unit 5011, the hierarchical layer division unit 5031, and the TMCC/AC signal generation unit 3091 are replaced by a TS re-multiplexing unit 3611, a hierarchical layer division unit 3631, and a TMCC/AC signal generation unit 3691, respectively. Further, an LDPC hierarchical layer allocation unit 3635 and an LDPC hierarchical layer processing unit 3645 are added. In embodiment 10, LDPC coding is only performed with respect to hierarchical layer C. However, the present invention is not limited in this way, and LDPC coding may be performed with respect to another hierarchical layer, or may be performed with respect to a plurality of hierarchical layers.

The following describes operations of the transmitter 3600. The TS re-multiplexing unit 3611 receives as input two out of three TSs outputted from an MPEG-2 multiplexing unit (not illustrated), and converts the two TSs into a single TS. With respect to vacant time due to the remaining TS not being inputted, the TS re-multiplexing unit 3611 inserts a null packet. The hierarchical layer division unit 3631 performs hierarchical layer division of at most two lines (hierarchical layer A, hierarchical layer B) according to a specification made in hierarchical information.

On the other hand, the LDPC hierarchical layer allocation unit 3635 inputs the remaining one TS, allocates the one TS to hierarchical layer C, which is to be LDPC coded, generates timing information of each TS packet, and outputs the timing information, along with each TS packet, to the LDPC hierarchical layer processing unit 3645.

Figure 67:
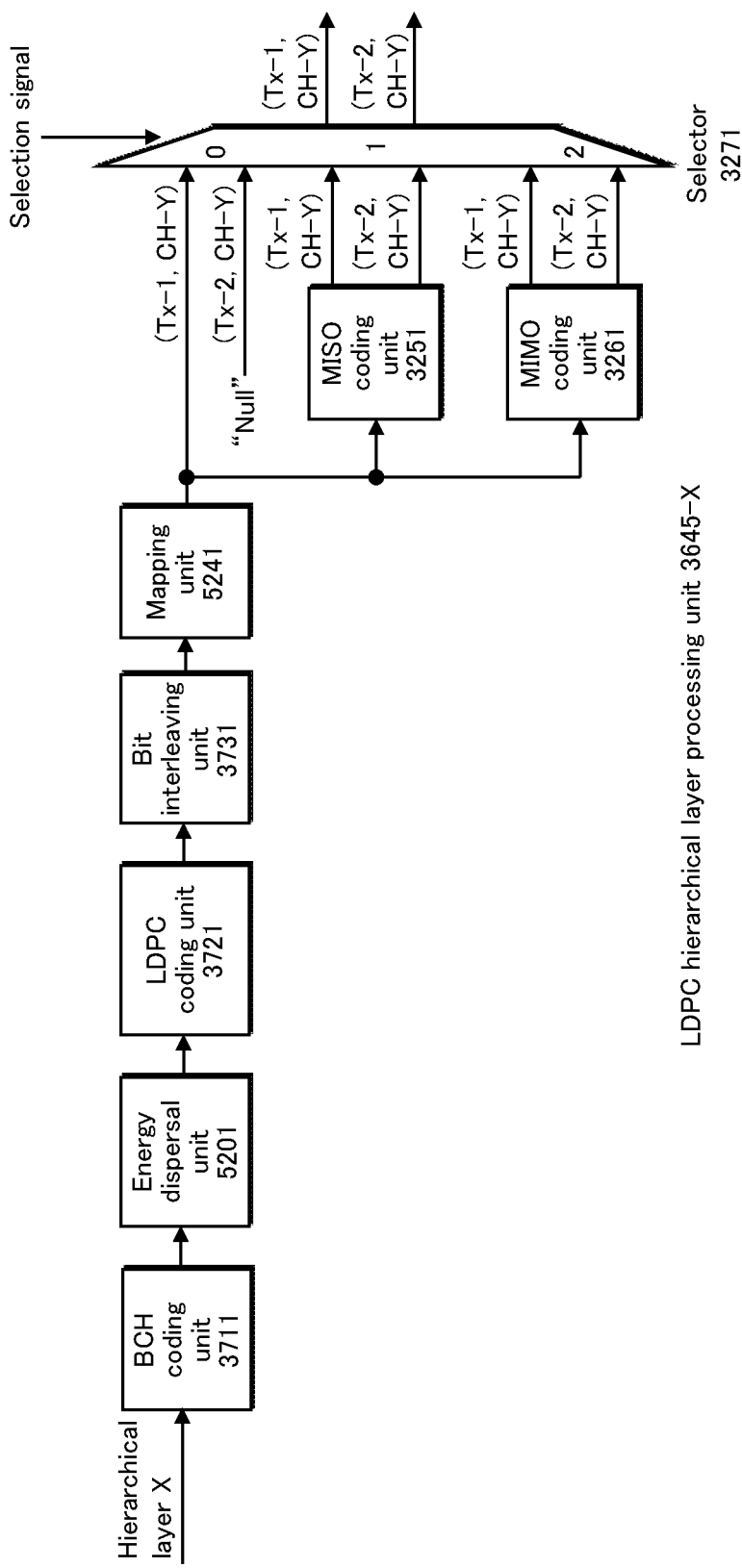
FIG. 67 illustrates a configuration of a low-density parity-check code (LDPC) hierarchical layer processing unit 3645 in embodiment 10.

FIG. 67 illustrates a configuration of the LDPC hierarchical layer processing unit 3645. The LDPC hierarchical layer processing unit 3645, compared to the hierarchical layer processing unit 3041 in embodiment 10 illustrated in FIG. 58, is configured such that the byte interleaving unit 5211 and the convolutional coding unit 5221 are not included, and a BCH coding unit 3711 and an LDPC coding unit 3721 are added. Further, the LDPC hierarchical layer processing unit 3645 is configured such that the bit interleaving unit 5231 is replaced by a bit interleaving unit 3731.

In the LDPC hierarchical layer processing unit 3645, the BCH coding unit 3711 accumulates data included in one or more TS packets outputted from the LDPC hierarchical layer allocation unit 3635, stores timing information in a header as information bits, and performs BCH coding. The energy dispersal unit 5201 performs the same operations described with reference to FIG. 76. The LDPC coding unit 3721 performs LDPC coding, and in order to draw out LDPC coding capabilities the bit interleaving unit 3731 typically performs bit interleaving that is different from the bit interleaving of the bit interleaving unit 5231 of the ISDB-T scheme, which is illustrated in FIG. 58. Operations from the mapping unit 5241 onwards are the same as the operations of the hierarchical layer processing unit 3041 illustrated in FIG. 58.

In the transmitter 3600 illustrated in FIG. 66, the hierarchical layer combining units 5051, with respect to output data from the hierarchical layer processing units 3041-A, 3041-B, and the LDPC hierarchical layer processing unit 3645-C, perform the same operations as the hierarchical combining units 5051 illustrated in FIG. 57.

The TMCC/AC signal generation unit 3691 generates a TMCC signal that is control information and an AC signal that is auxiliary information. With respect to segments belonging to hierarchical layers of MIMO and MISO, a TMCC signal for MIMO and a TMCC signal for MISO are generated, and with respect to segments belonging to an LDPC hierarchical layer, a TMCC signal related to LDPC coding is generated.

FIG. 68 illustrates definitions of TMCC signals with respect to LDPC coding. Portion (a) and portion (b) of FIG. 68 each illustrate convolutional coding rates of the ISDB-T scheme and embodiment 10, respectively. As illustrated in portion (b) of FIG. 68, in embodiment 10, LDPC coding is allocated to "101", which is undefined in the ISDB-T scheme. In this way, an LDPC coded segment can be recognized as "unreceivable" by an existing ISDB-T receiver, and can be recognized as an LDPC coded segment by a receiver that supports LDPC coding.

Portion (c) of FIG. 68 illustrates definitions of B110-B121 in embodiment 10. As illustrated in portion (c) of FIG. 60, in embodiment 10, ½ (LDPC coding rate), ⅔ (LDPC coding rate), ¾ (LDPC coding rate), ⅚ (LDPC coding rate), and ⅞ (LDPC coding rate) are respectively allocated to "000"-"100" of B113-B115, which are undefined in the ISDB-T scheme. In this way, without adversely affecting existing ISDB-T receivers, a receiver supporting LDPC coding can recognize LDPC coding rates.

Other operations of the transmitter 3600 are the same as those of the transmitter 3000 in embodiment 9, illustrated in FIG. 57.

According to the above configuration, in polarization MIMO, the existing ISDB-T scheme and a new scheme using polarization MIMO can co-exist, and a transmitter, transmission method, and program are provided that make introduction of the new scheme easy. Further, by using BCH coding and LDPC coding as error correction coding schemes in the new scheme, error correction performance is increased. Further, in the new scheme using polarization MIMO, sufficient exhibition of polarization diversity effect is achieved, and a particular feature is implementation using a processing method having high compatibility with the existing ISDB-T scheme (the same time interleaving, frequency interleaving, etc., as in the ISDB-T scheme).

<Existing ISDB-T Receiver and Reception Method>

Here, only points of difference are described regarding operations of the ISDB-T receiver 3300 illustrated in FIG. 61 with respect to a signal transmitted from the transmitter 3600 illustrated in FIG. 66 and operations of the ISDB-T receiver 3300 previously described with respect to a signal transmitted from the transmitter 3000 in embodiment 9, illustrated in FIG. 57.

The TMCC signal decoding unit 3335, the same as the operations described in embodiment 9, performs decoding of a TMCC signal by performing majority decoding with respect to demodulation results accumulated for each segment. Accordingly, the TMCC signal decoding unit 3335 can also decode a TMCC signal of an LDPC coded segment, and according to the TMCC signal definition illustrated in FIG. 68, determine such segments as being unreceivable.

Such a determination result is outputted to the demodulation unit 3311, the frequency de-interleaving unit 3315, the time de-interleaving unit 3321, the multiple hierarchical layer TS reproduction unit 3331, and the FEC decoding unit 3333. Each unit performs processing of only a segment to which a hierarchical layer of the ISDB-T scheme is allocated.

According to the above operations, the ISDB-T receiver 3300 illustrated in FIG. 61, with respect to a signal transmitted from the transmitter 3600 illustrated in FIG. 66, outputs a TS of a hierarchical layer of the ISDB-T scheme that has undergone error correction decoding.

<Receiver and Reception Method>

Figure 69:
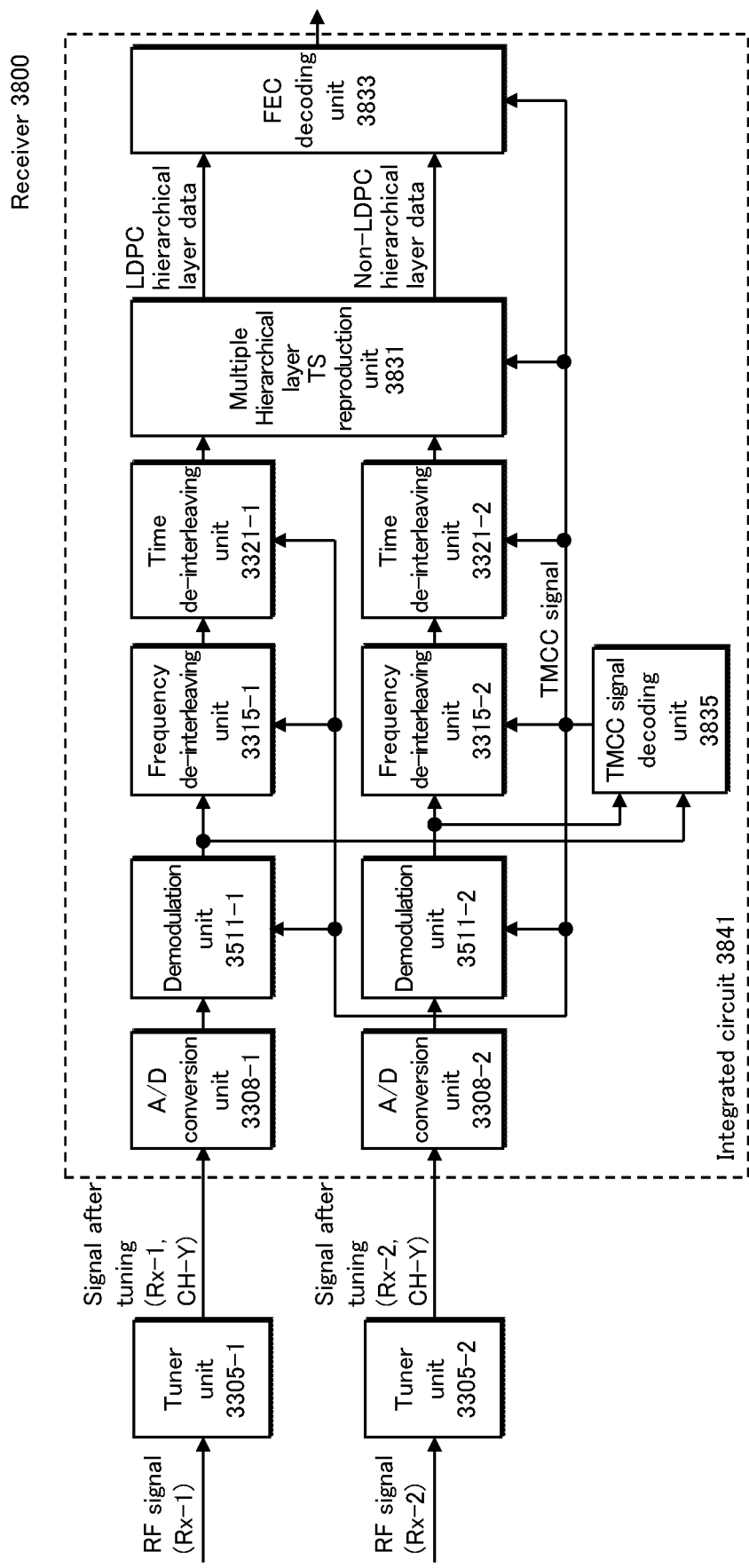
FIG. 69 illustrates a configuration of a receiver 3800 in embodiment 10.

FIG. 69 illustrates a configuration of a receiver 3800 in embodiment 10. The receiver 3800 illustrated in FIG. 69 corresponds to the transmitter 3600, illustrated in FIG. 66, and reflects functions of the transmitter 3600. Components that are the same as in the existing ISDB-T receiver or the receiver in embodiment 9 have the same reference signs, and description thereof is omitted here.

The receiver 3800, compared to the receiver 3500 in embodiment 9 illustrated in FIG. 64, is configured such that the multiple hierarchical layer TS reproduction unit 3531, the FEC decoding unit 3333, and the TMCC signal decoding unit 3535 are replaced by a multiple hierarchical layer TS reproduction unit 3831, an FEC decoding unit 3833, and a TMCC signal decoding unit 3835, respectively.

The following describes operations of the receiver 3800. The TMCC signal decoding unit 3835 recognizes definitions of TMCC signals illustrated in FIG. 68, and even with respect to LDPC coded segments, detects LDPC coding and also detects LDPC coding rate.

In a TMCC signal, a detection result related to LDPC coding in particular is outputted to the multiple hierarchical layer TS reproduction unit 3831 and the FEC decoding unit 3833.

Figure 70:
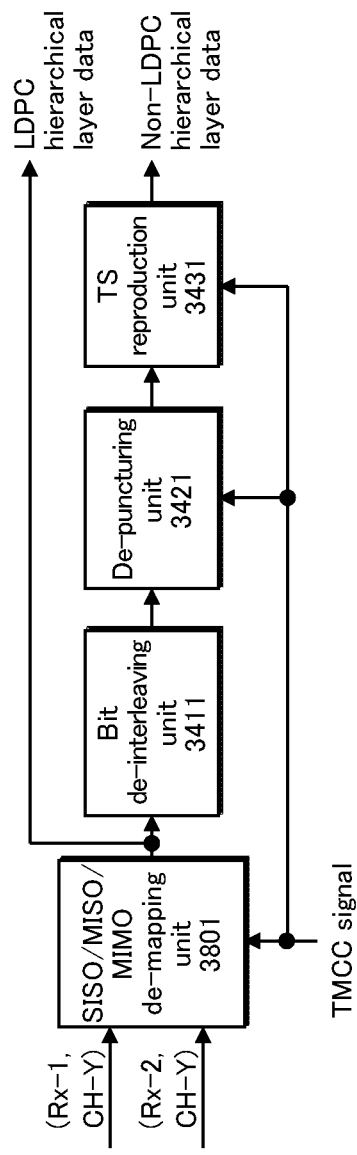
FIG. 70 illustrates a configuration of a multiple hierarchical layer TS reproduction unit 3831 in embodiment 10.

FIG. 70 illustrates a configuration of the multiple hierarchical layer TS reproduction unit 3831. The multiple hierarchical layer TS reproduction unit 3831, compared to the multiple hierarchical layer TS reproduction unit 3531 illustrated in FIG. 65, is configured such that the SISO/MISO/MIMO de-mapping unit 3501 is replaced by a SISO/MISO/MIMO de-mapping unit 3801. The SISO/MISO/MIMO de-mapping unit 3801, based on an inputted TMCC signal, with respect to data of an LDPC coded segment, outputs data after de-mapping processing as LDPC hierarchical layer data. With respect to data that is not LDPC coded, in the same way as the operations described with reference to FIG. 62, the SISO/MISO/MIMO de-mapping unit 3801 outputs data after de-mapping processing to the bit de-interleaving unit 3411, and operations from the bit de-interleaving unit 3411 onwards are the same as those described with reference to FIG. 62, outputting non-LDPC hierarchical layer data.

Figure 71:
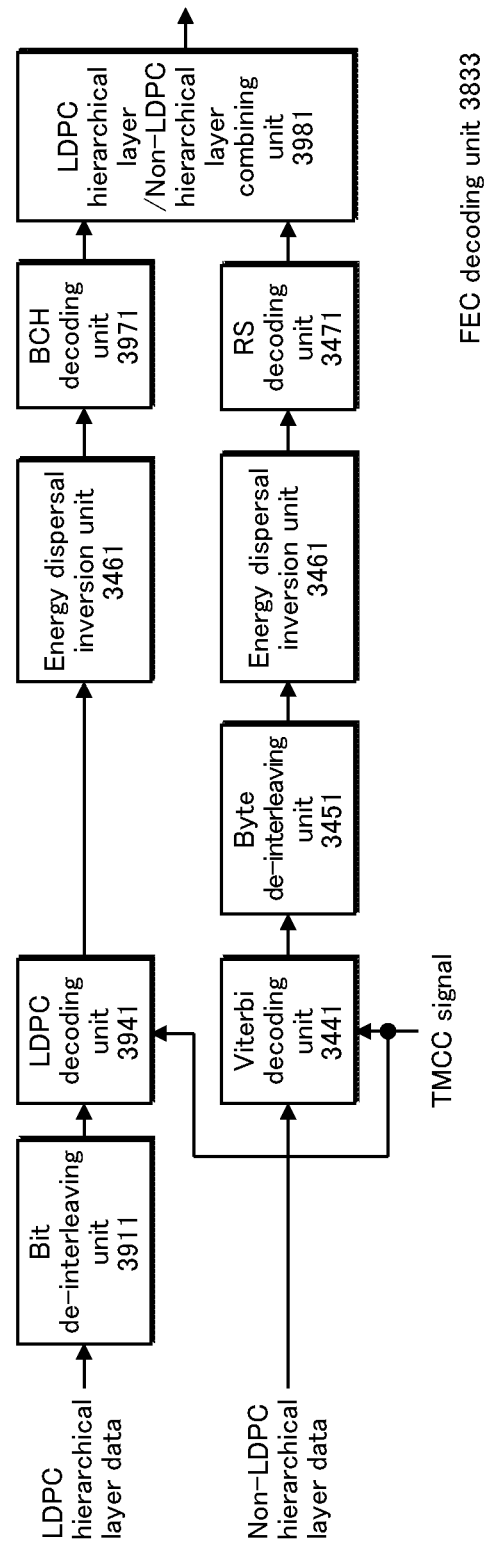
FIG. 71 illustrates a configuration of an FEC decoding unit 3833 in embodiment 10.

FIG. 71 illustrates a configuration of the FEC decoding unit 3833. The FEC decoding unit 3833, compared to the FEC decoding unit 3333 illustrated in FIG. 63, is configured such that a bit de-interleaving unit 3911, an LDPC decoding unit 3941, a BCH decoding unit 3971, and an LDPC hierarchical layer/non-LDPC hierarchical layer combining unit 3981 are added, and one more energy dispersal inversion unit 3461 is added.

The FEC decoding unit 3833 illustrated in FIG. 71, with respect to non-LDPC hierarchical layer data, performs the same operations described with reference to FIG. 63 from the Viterbi decoding unit 3441 to the RS decoding unit 3471. Further, with respect to LDPC hierarchical layer data, the FEC decoding unit 3833 performs bit de-interleaving at the bit de-interleaving unit 3911, LDPC decoding at the LDPC decoding unit 3941, energy dispersal inversion at the energy dispersal inversion unit 3461, and BCH decoding at the BCH decoding unit 3971.

The LDPC hierarchical layer/non-LDPC hierarchical layer combining unit 3981, based on timing information included in a header of LDPC hierarchical layer decoded data outputted from the BCH decoding unit 3971, combines decoded data of both hierarchical layers by inserting the LDPC hierarchical layer decoded data in non-LDPC hierarchical layer decoded data outputted from the RS decoding unit 3471, and thereby outputs a TS that has undergone error correction decoding.

According to the above configuration, in polarization MIMO, a receiver, reception method, and program are provided that receive a signal transmitted by dispersing mapping data to each polarization antenna. In particular, cases using BCH coding and LDPC coding as error correction coding schemes in a new scheme are also supported.

Further, the components of the receiver 3800 illustrated in FIG. 69, aside from the tuner unit 3305, may be included in an integrated circuit 3841.

Embodiment 11

<Transmitter and Transmission Method>

Figure 72:
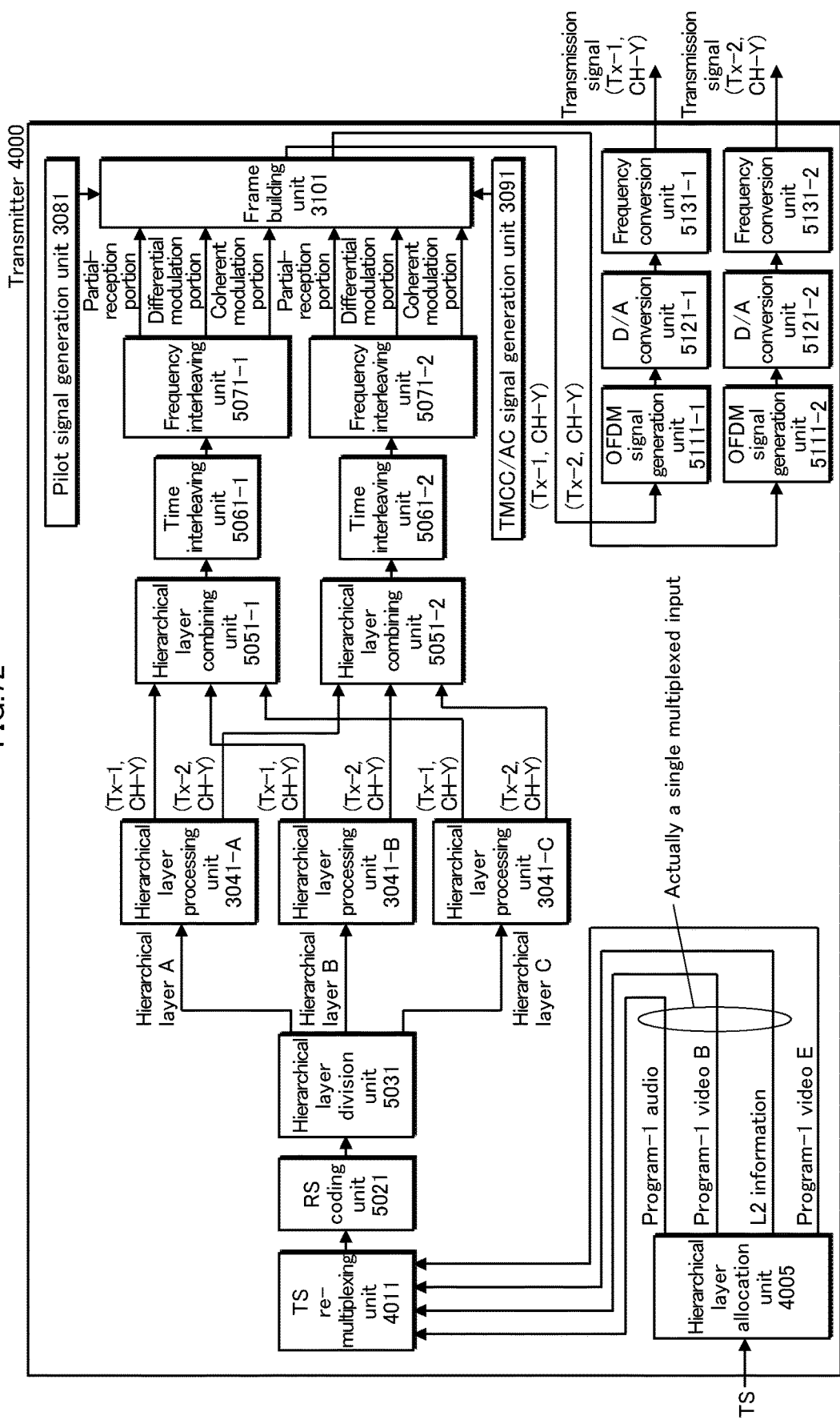
FIG. 72 illustrates a configuration of a transmitter 4000 in embodiment 11.

FIG. 72 illustrates a configuration of a transmitter 4000 in embodiment 11. Components that are the same as in the conventional transmitter or the transmitter in embodiment 9 have the same reference signs, and description thereof is omitted here. In embodiment 11, at a transport stream (TS) generation unit, a video base layer (video B) and a video enhancement layer (video E) are generated as video components using scalable video coding (SVC). In this way, audio, video B, and video E are allocated to hierarchical layers component by component, and, for each hierarchical layer, an existing ISDB-T scheme, MISO, and MIMO may be selected.

The transmitter 4000 illustrated in FIG. 72, compared to the transmitter 3000 in embodiment 9 illustrated in FIG. 57, is configured such that the TS re-multiplexing unit 5011 is replaced by a TS re-multiplexing unit 4011. Further, the transmitter 4000 illustrated in FIG. 72 is configured such that a hierarchical layer allocation unit 4005 is added.

Figure 73:
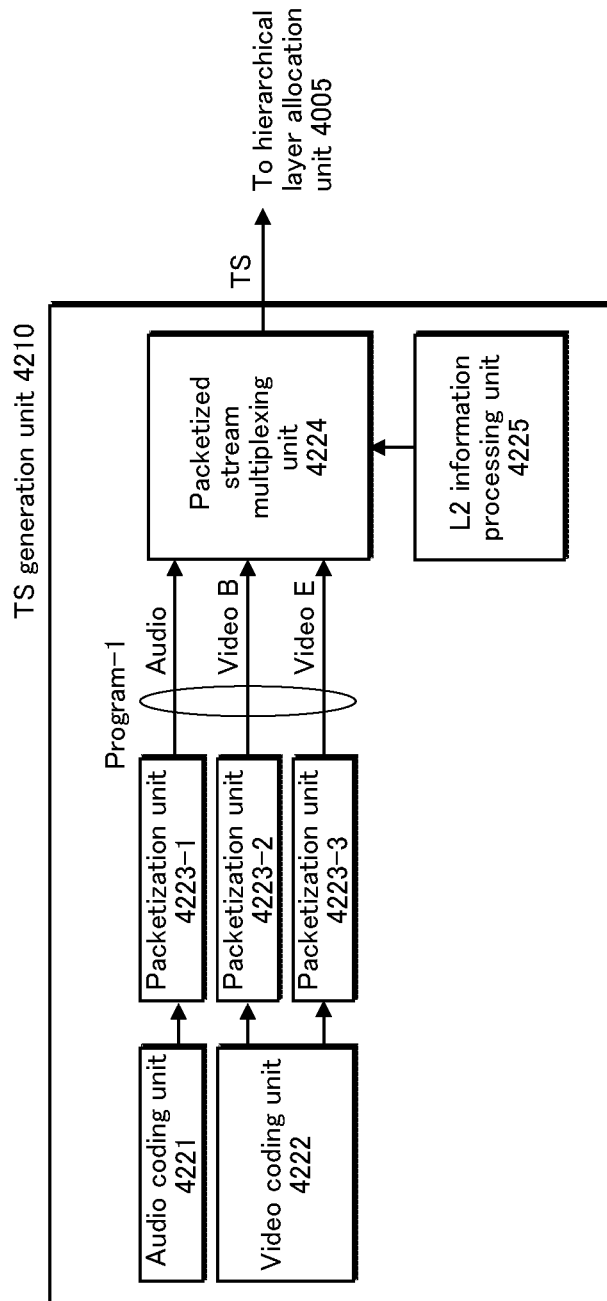
FIG. 73 illustrates a configuration of a TS generation unit 4210 in embodiment 11.

FIG. 73 illustrates a configuration of a TS generation unit 4210. The TS generation unit 4210 illustrated in FIG. 73 shows an example in which a single program is generated in a TS, and has one each of an audio coding unit 4221 and a video coding unit 4222. Further, the TS generation unit 4210 has packetization units 4223 on a one-for-one basis for the service components (audio, video B, and video E) in programs. Further, the TS generation unit 4210 has a packetized stream multiplexing unit 4224 and an L2 information processing unit 4225.

In the TS generation unit 4210, the audio coding unit 4221 performs information source coding of audio. The video coding unit 4222 performs information source coding of video using SVC, and generates the two components, video B and video E. H.264, HEVC (H.265), etc., are examples of information source coding.

Each packetization unit 4223 packetizes output of the audio coding unit 4221 or the video coding unit 4222. The L2 information processing unit 4225 generates L2 information such as program-specific information (PSI), system information (SI), etc. The packetized stream multiplexing unit 4224 generates a TS by multiplexing output of the packetization unit 4223 and output of the L2 information processing unit 4225, and outputs the TS to the transmitter 4000 illustrated in FIG. 72.

In the transmitter 4000 illustrated in FIG. 72, the hierarchical layer allocation unit 4005 allocates to hierarchical layers the service components (audio, video B, and video E) included in a program and L2 information of a TS outputted from the TS generation unit 4210. In FIG. 72, as one example, the hierarchical layer allocation unit 4005 allocates as follows:

Hierarchical layer A: audio, video B, and L2 information of program-1

Hierarchical layer B: video E of program-1

In the example illustrated in FIG. 72, the packets of audio, video B, and L2 information are actually multiplexed into a single input to the TS re-multiplexing unit 4011. Operations of the TS re-multiplexing unit 4011 are the same as the operations described with respect to FIG. 57, with the exception that a stream composed of multiplexed audio, video B, and L2 information packets and a stream composed of video E packets are each treated as a single TS.

The hierarchical layer division unit 5031 performs hierarchical layer division according to the allocation made by the hierarchical layer allocation unit 4005.

In the transmitter 4000 illustrated in FIG. 72, The hierarchical layer processing unit 3041-A operates as in the existing ISDB-T scheme, and the hierarchical layer processing unit 3041-B operates as for MISO or MIMO.

Other operations of the transmitter 4000 illustrated in FIG. 72 are the same as those of the transmitter 3000 in embodiment 9 illustrated in FIG. 57.

According to the above configuration, audio, video B, and video E are allocated to hierarchical layers component by component, and, for each hierarchical layer, an existing ISDB-T scheme, MISO, and MIMO may be selected. In particular, with respect to audio and video B, by selecting the existing ISDB-T scheme, the existing ISDB-T receiver can receive hierarchical layers of basic information, and basic information portions of a program, for example the program in standard definition, can thereby be enjoyed.

<Existing ISDB-T Receiver and Reception Method>

Here, only points of difference are described regarding operations of the ISDB-T receiver 3300 illustrated in FIG. 61 with respect to a signal transmitted from the transmitter 4000 illustrated in FIG. 72 and operations of the ISDB-T receiver 3300 previously described with respect to a signal transmitted from the transmitter 3000 in embodiment 9, illustrated in FIG. 57.

The TMCC signal decoding unit 3335, the same as in the operations described in embodiment 9, decodes the TMCC signal by performing majority decoding of demodulation results accumulated for each segment, and determines that a segment to which hierarchical layer B (video E of program-1) of MISO or MIMO is allocated is unreceivable.

Such a determination result is outputted to the demodulation unit 3311, the frequency de-interleaving unit 3315, the time de-interleaving unit 3321, the multiple hierarchical layer TS reproduction unit 3331, and the FEC decoding unit 3333, and each unit performs processing of only a segment to which hierarchical layer A (audio, video B, and L2 information of program-1) of the ISDB-T scheme is allocated.

According to the above operations, the ISDB-T receiver 3300 illustrated in FIG. 61, with respect to a signal transmitted from the transmitter 4000 illustrated in FIG. 72, outputs a TS of a hierarchical layer of the ISDB-T scheme that has undergone error correction decoding. In other words, the ISDB-T receiver 3300 outputs the audio, video B, and L2 information of program-1.

<Receiver and Reception Method>

Here, only points of difference are described regarding operations of the receiver 3500 illustrated in FIG. 64 with respect to a signal transmitted from the transmitter 4000 illustrated in FIG. 72 and operations of the receiver 3500 previously described with respect to a signal transmitted from the transmitter 3000 in embodiment 9, illustrated in FIG. 57.

The TMCC signal decoding unit 3535, the same as in the operations described in embodiment 9, with respect to a segment to which a hierarchical layer B (video E of program-1) of MISO or MIMO is allocated, detects whether or not MISO or MIMO is specified and detects the carrier modulation mapping scheme (QPSK, 16-QAM, 64-QAM).

Such detection results are outputted to the demodulation unit 3511 of each receive antenna, the frequency de-interleaving unit 3315 of each receive antenna, the time de-interleaving unit 3321 of each receive antenna, the multiple hierarchical layer TS reproduction unit 3531, and the FEC decoding unit 3333, and each unit performs processing of a segment to which a hierarchical layer A (audio, video B, and L2 information of program-1) of the ISDB-T scheme is allocated and a segment to which a hierarchical layer B (video E of program-1) of MISO or MIMO is allocated.

According to the above operations, the receiver 3500 illustrated in FIG. 64, with respect to a signal transmitted from the transmitter 4000 illustrated in FIG. 72, outputs a TS of a hierarchical layer A of the ISDB-T scheme that has undergone error correction decoding and a hierarchical layer B of MISO or MIMO that has undergone error correction decoding. In other words, the receiver 3500 outputs all components (audio, video B, video E, and L2 information) of program-1.

Embodiment 12

<Transmitter and Transmission Method>

Figure 74:
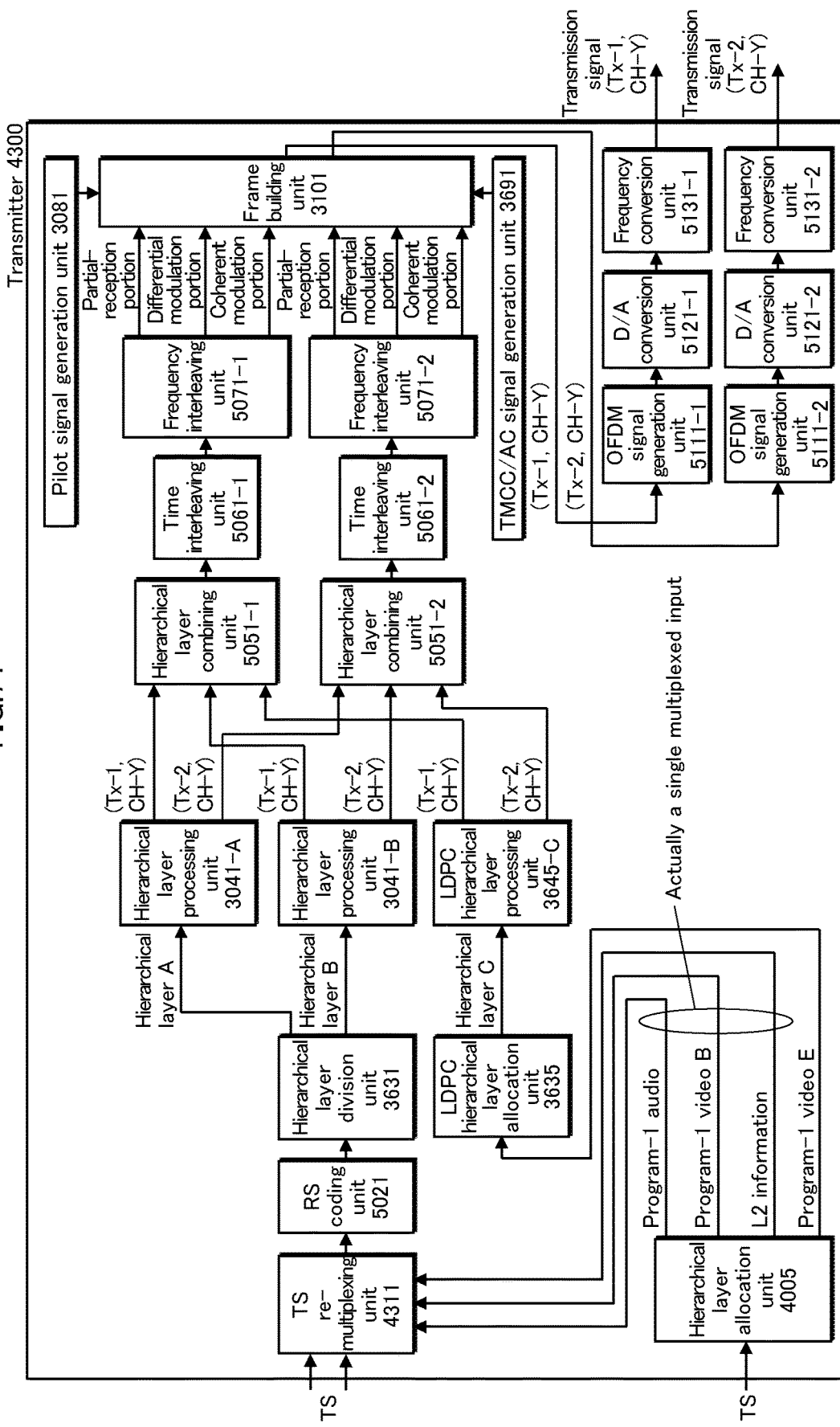
FIG. 74 illustrates a configuration of a transmitter 4300 in embodiment 12.

FIG. 74 illustrates a configuration of a transmitter 4300 in embodiment 12. Components that are the same as in the conventional transmitter or the transmitter in embodiments 9-11 have the same reference signs, and description thereof is omitted here. In embodiment 11, in a TS generation unit, SVC is used to generate both video B and video E as video components. In this way, audio, video B, and video E are allocated to hierarchical layers component by component, and, for each hierarchical layer, an existing ISDB-T scheme, MISO, and MIMO may be selected. Further, BCH coding and LDPC coding are used as error correction coding in MISO and MIMO, which are new schemes.

The transmitter 4300 illustrated in FIG. 74, compared to the transmitter 3600 in embodiment 10 illustrated in FIG. 66, is configured such that the TS re-multiplexing unit 3611 is replaced by a TS re-multiplexing unit 4311. Further, the transmitter 4300 illustrated in FIG. 74 is configured such that a hierarchical layer allocation unit 4005 is added.

In the transmitter 4300 illustrated in FIG. 74, the hierarchical layer allocation unit 4005, in the same way as in embodiment 11, allocates to hierarchical layers the service components (audio, video B, and video E) included in a program and L2 information of a TS outputted from the TS generation unit 4210. In FIG. 74, as one example, the hierarchical layer allocation unit 4005 allocates as follows:

Hierarchical layer A: audio, video B, and L2 information of program-1

Hierarchical layer C: video E of program-1

In the example illustrated in FIG. 74, the packets of audio, video B, and L2 information are actually multiplexed into a single input to the TS re-multiplexing unit 4311. Operations of the TS re-multiplexing unit 4311 are the same as operations described with respect to FIG. 66, except the TS re-multiplexing unit 4311 treats a stream composed of multiplexed audio, video B, and L2 information packets as a single TS, and inserts a null packet with respect to vacant time due to the remaining component (video E) not being inputted.

The hierarchical layer division unit 3631 performs hierarchical layer division of a stream composed of multiplexed audio, video B, and L2 information packets to a hierarchical layer A, as allocated by the hierarchical layer allocation unit 4005.

The LDPC hierarchical layer allocation unit 3635, as allocated by the hierarchical layer allocation unit 4005, inputs the stream composed of the remaining one component (video E), allocates the TS to hierarchical layer C, which is to be LDPC coded, generates timing information of each TS packet, and outputs the timing information, along with each TS packet, to the LDPC hierarchical layer processing unit 3645.

In the transmitter 4300 illustrated in FIG. 74, the hierarchical layer processing unit 3041-A operates as in the existing ISDB-T scheme, and the LDPC hierarchical layer processing unit 3645-C operates as for MISO or MIMO.

Other operations of the transmitter 4300 illustrated in FIG. 74 are the same as those of the transmitter 3600 in embodiment 10, illustrated in FIG. 66.

According to the above configuration, audio, video B, and video E are allocated to hierarchical layers component by component, and, for each hierarchical layer, an existing ISDB-T scheme, MISO, and MIMO may be selected. Further, BCH coding and LDPC coding are used as error correction coding in MISO and MIMO, which are new schemes. In particular, with respect to audio and video B, by selecting the existing ISDB-T scheme, the existing ISDB-T receiver can receive hierarchical layers of basic information, and basic information portions of a program, for example the program in standard definition, can thereby be enjoyed.

<Existing ISDB-T Receiver and Reception Method>

Here, only points of difference are described regarding operations of the ISDB-T receiver 3300 illustrated in FIG. 61 with respect to a signal transmitted from the transmitter 4300 illustrated in FIG. 74 and operations of the ISDB-T receiver 3300 previously described with respect to a signal transmitted from the transmitter 3000 in embodiment 9, illustrated in FIG. 57.

The TMCC signal decoding unit 3335, the same as in the operations described in embodiment 9, decodes the TMCC signal by performing majority decoding of demodulation results accumulated for each segment, and determines that a segment to which hierarchical layer C (video E of program-1) of MISO or MIMO is allocated is unreceivable.

Such a determination result is outputted to the demodulation unit 3311, the frequency de-interleaving unit 3315, the time de-interleaving unit 3321, the multiple hierarchical layer TS reproduction unit 3331, and the FEC decoding unit 3333, and each unit performs processing of only a segment to which a hierarchical layer A (audio, video B, L2 information) of the ISDB-T scheme is allocated.

According to the above operations, the ISDB-T receiver 3300 illustrated in FIG. 61, with respect to a signal transmitted from the transmitter 4300 illustrated in FIG. 74, outputs a TS of a hierarchical layer of the ISDB-T scheme that has undergone error correction decoding. In other words, the ISDB-T receiver 3300 outputs the audio, video B, and L2 information of program-1.

<Receiver and Reception Method>

Here, only points of difference are described regarding operations of the receiver 3800 illustrated in FIG. 69 with respect to a signal transmitted from the transmitter 4300 illustrated in FIG. 74 and operations of the receiver 3800 previously described with respect to a signal transmitted from the transmitter 3000 in embodiment 9, illustrated in FIG. 57.

The TMCC signal decoding unit 3835, the same as in the operations described in embodiment 10, but even with respect to a segment to which LDPC is performed, and to which a hierarchical layer C (video E of program-1) of MISO or MIMO is allocated, detects whether or not MISO or MIMO is specified, detects the carrier modulation mapping scheme (QPSK, 16-QAM, 64-QAM), and also detects LDPC coding and LDPC coding rate.

Such a detection result is outputted to the demodulation unit 3511 of each receive antenna, the frequency de-interleaving unit 3315 of each receive antenna, the time de-interleaving unit 3321 of each receive antenna, the multiple hierarchical layer TS reproduction unit 3831, and the FEC decoding unit 3833. Each unit performs processing of a segment to which a hierarchical layer A (audio, video B, L2 information of program-1) of the ISDB-T scheme is allocated and a segment to which LDPC is performed and to which a hierarchical layer C (video E of program-1) of MISO or MIMO is allocated.

According to the above operations, the receiver 3800 illustrated in FIG. 69, with respect to a signal transmitted from the transmitter 4300 illustrated in FIG. 74, outputs a TS of a hierarchical layer of the ISDB-T scheme that has undergone error correction decoding and of a hierarchical layer of MISO or MIMO that has undergone LDPC coding. In other words, the receiver 3800 outputs all components (audio, video B, video E, and L2 information) of program-1.

(Supplement)

The present invention is not limited to the content described in embodiments 9-12. Any form of implementation is possible in order to achieve aims of the present invention and related or associated aims. For example, the following implementations are possible.

(1) In embodiment 9-12, a TMCC signal and an AC signal are transmitted as the same signal from both transmit antennas (Tx-1, Tx-2) without performing MIMO/MISO coding thereon. However, the present invention is not limited in this way, and a TMCC signal and an AC signal may be transmitted from one transmit antenna without performing MIMO/MISO coding thereon.

(2) In embodiments 9-12, the ISDB-T scheme, MIMO, and MISO can be made to coexist. However, the present invention is not limited in this way, and two of the above may be made to coexist, or only MIMO or MISO may be transmittable and receivable.

(3) In embodiments 9-12, the ISDB-T scheme may be preferentially allocated to a middle segment (data segment number 0) of a frequency band. In particular, a partial-reception portion of the ISDB-T scheme may be preferentially allocated to the middle segment.

(4) In embodiments 9-12, the number of transmit antennas used for MISO and/or MIMO is illustrated as two. However, the present invention is not limited in this way, and there may be three or more transmit antennas used for MISO and/or MIMO. Further, the number of transmit antennas and receive antennas may differ from each other.

(5) In embodiments 9-12, a different polarization is applied with respect to the two transmit antennas (Tx-1, Tx-2) for MISO and/or MIMO, but the same polarization may be used.

(6) In embodiment 11-12, hierarchical layer A is transmitted by the ISDB-T scheme and hierarchical layers B and C are transmitted by MISO or MIMO. However, the present invention is not limited in this way and, for example, hierarchical layer A may be transmitted by MISO, and hierarchical layer B or C may be transmitted by MIMO.

(7) In embodiments 9-12, phase change is applied with respect to the transmit antenna 2 (Tx-2). However, the present invention is not limited in this way, and phase change may be applied with respect to the transmit antenna 1 (Tx-1).

(8) In embodiments 9-12, coherent modulation is applied with respect to MISO and/or MIMO, but differential modulation may be applied.

(9) In embodiments 11-12, the number of TSs is one, but the present invention is not limited in this way. Further, the number of programs in the TS is given as one, but the present invention is not limited in this way.

(10) In embodiments 11-12, the service components are described as audio and video, but the present invention is not limited in this way. Data components, etc., may be included. Further, in embodiments 11-12, a configuration that performs scalable coding with respect to video is described. However, the present invention is not limited in this way, and scalable coding may be performed with respect to audio, data components, etc.

(11) In embodiments 11-12, description is given of video B and video E being generated by SVC. However, the present invention is not limited in this way. For example, a base view (MVC_B) and a dependent view (MVC_D) may be generated by multi-view video coding (MVC). In such a case, if MVC_B is allocated to a hierarchical layer corresponding to the existing ISDB-T scheme, and MVC_D is allocated to a different hierarchical layer corresponding to MISO or MIMO, an existing ISDB-T receiver could receive a hierarchical layer of basic information, and basic information portions of a program, for example the program in 2D, can thereby be enjoyed. Further, a receiver that supports MISO and/or MIMO could receive hierarchical layers of basic information and extended information such that, for example, a program can thereby be enjoyed in 3D.

(12) In embodiments 11-12, audio, video B, and L2 information correspond to the existing ISDB-T scheme and video E corresponds to MISO or MIMO, but the present invention is not limited in this way. For example, audio and L2 information may correspond to the existing ISDB-T scheme, video B may correspond to MISO, and video E may correspond to MIMO.

(13) In embodiments 9-12, the time interleaving unit 5061 and the frequency interleaving unit 5071 perform the same operations as in the transmitter 5000, which is conventional and illustrated in FIG. 75. Further, in embodiments 9-12, a segment to which a hierarchical layer of MISO or MIMO is allocated has the segment structure of MIMO and MISO illustrated in FIG. 59. To match a number of data carriers of one symbol in a segment of MIMO and MISO with the number of data carriers of one symbol in the ISDB-T scheme, the number of AC carriers may be reduced, for example. Alternatively, when the number of data carriers differs from the ISDB-T scheme, the time interleaving unit 5061 and the frequency interleaving unit 5071 may operate using null carriers to make up the difference in the number of data carriers, and delete the null carriers when outputting. While the present invention is not limited to such a method, the time interleaving unit 5061 and the frequency interleaving unit 5071 can thereby maintain a high compatibility with a ISDB-T scheme. Further, with respect to the segment configuration of MIMO and MISO illustrated in FIG. 59, carrier direction density of pilot signals for synchronization and recovery for MIMO/MISO may, for example, be doubled. Even in such a case, the time interleaving unit 5061 and the frequency interleaving unit 5071 can maintain a high compatibility with a ISDB-T scheme.

(14) The above-described embodiments 9-12 may be implemented by using software and hardware. The above-described embodiments may be implemented or executed by using a computing device (processor). The computing device or processor may be, for example, a main processor/general purpose processor, a digital signal processor (DSP), an application-specific integrated circuit (ASIC), a field programmable gate array (FPGA), other programmable logic devices, etc. The above-described embodiments may be executed or implemented by a combination of such devices.

(15) Embodiments 9-12 may be implemented by an arrangement of software modules that are executed by a processor or directly executed by hardware. Further, a combination of a software module and hardware is possible. A software module may be stored on any of a variety of computer-readable storage media, for example, RAM, EPROM, EEPROM, flash memory, a register, hard disk, CD-ROM, DVD, etc.

SUMMARY

The following is a summary of the transmission device, transmission method, reception device, and reception method pertaining to embodiments of the present invention, and the effects thereof.

A transmission device (1) is a transmitter that performs multiple-input multiple-output (MIMO) transmission of transmit data using a plurality of fundamental bands, comprising: an error correction coding unit that, for each data block of predefined length, performs error correction coding and thereby generates an error correction coded frame; a mapping unit that maps each predefined number of bits in the error correction coded frame to a corresponding symbol and thereby generates an error correction coded block; and a MIMO coding unit that performs MIMO coding with respect to the error correction coded block, wherein components of data included in the error correction coded block are allocated to at least two of the fundamental bands and transmitted.

According to the transmission device (1), with respect to MIMO using a plurality of fundamental bands, a transmitter is provided that exhibits a frequency diversity effect related to the fundamental bands, due to the components of data included in the error correction coded block being allocated to at least two of the fundamental bands and transmitted.

A transmission device (2) is the transmission device (1), wherein basic information of the transmit data is transmitted by MIMO, using a plurality of fundamental bands, extended information of the transmit data is transmitted using a single fundamental band, the basic information is independently decodable, and the extended information is decodable when combined with the basic information.

According to the transmission device (2), a transmitter is provided that can select, for each PLP, MIMO using a plurality of fundamental bands or MIMO using a single fundamental band, due to transmission of the basic information of transmit data by MIMO using a plurality of fundamental bands and transmission of the extended information of transmit data using a single fundamental band.

A transmission device (3) is the transmission device (1), wherein the number of transmit antennas used for MIMO is two, and each of the transmit antennas has a different polarity.

According to the transmission device (3), with respect to MIMO using a plurality of fundamental bands, a transmitter is provided that exhibits a polarity diversity effect in addition to a frequency diversity effect related to the fundamental bands, due to the number of transmit antennas used for MIMO being two, and each of the transmit antennas having a different polarity.

A transmission device (4) is the transmission device (1), wherein components of data included in the error correction coded block are allocated to at least two antennas from among a plurality of antennas used for the MIMO transmission.

According to the transmission device (4), with respect to MIMO using a plurality of fundamental bands, a transmitter is provided that exhibits a spatial (antenna) diversity effect in addition to a frequency diversity effect related to the fundamental bands, due to the components of data included in the error correction coded block being allocated to at least two antennas from among the plurality of antennas used for MIMO transmission.

A transmission device (5) is the transmission device (1) or the transmission device (4), wherein the number of the fundamental bands is equal to K, where K is a natural number greater than 1, and the number of transmit antennas is equal to M, where M is a natural number greater than 1, the MIMO coding unit has K×M output ports, each output port corresponding to a respective one of the fundamental bands and a respective one of the transmit antennas, and the components of data included in the error correction coded block are outputted to all of the K×M output ports.

According to the transmission device (5), with respect to MIMO using a plurality of fundamental bands, a transmitter is provided that exhibits a frequency diversity effect related to the fundamental bands, due to the MIMO coding unit outputting the components of data included in the error correction coded block to the output ports that correspond to all the fundamental bands and all the antennas.

A transmission device (6) is the transmission device (5), wherein the MIMO coding unit performs MIMO coding using a pre-coding matrix having K×M rows and K×M columns.

According to the transmission device (6), with respect to MIMO using a plurality of fundamental bands, a transmitter is provided that exhibits a frequency diversity effect related to the fundamental bands, due to the MIMO coding unit using the pre-coding matrix to output the components of data included in the error correction coded block to the output ports that correspond to all the fundamental bands and all the antennas.

A transmission device (7) is the transmission device (1) or the transmission device (4), further comprising: a serial to parallel (S/P) conversion unit, wherein the number of the fundamental bands is equal to K, where K is a natural number greater than 1, and the number of transmit antennas is equal to M, where M is a natural number greater than 1, the S/P conversion unit has K output ports, each output port corresponding to a respective one of the fundamental bands, the S/P conversion unit allocates mapping data included in the error correction coded block to the K output ports, the MIMO coding unit is provided in a plurality such that each MIMO coding unit corresponds to a respective one of the fundamental bands, each of the MIMO coding units has M output ports, each output port corresponding to a respective one of the transmit antennas, and the MIMO coding units perform MIMO coding with respect to output data from the S/P conversion unit.

According to the transmission device (7), with respect to MIMO using a plurality of fundamental bands, a transmitter is provided that exhibits a frequency diversity effect related to the fundamental bands, due to the S/P conversion unit allocating mapping data included in the error correction coded block to the output ports corresponding to all the fundamental bands.

A transmission device (8) is the transmission device (1) or the transmission device (4), further comprising: a serial to parallel (S/P) conversion unit, wherein the number of the fundamental bands is equal to K, where K is a natural number greater than 1, and the number of transmit antennas is equal to M, where M is a natural number greater than 1, the S/P conversion unit has K output ports, each output port corresponding to a respective one of the fundamental bands, the S/P conversion unit allocates data included in the error correction coded frame to the K output ports, the mapping unit and the MIMO coding unit are each provided in a plurality such that each mapping unit and each MIMO coding unit corresponds to a respective one of the fundamental bands, with respect to output data from the S/P conversion unit, each of the mapping units maps each predefined number of bits to a corresponding symbol, each of the MIMO coding units has M output ports, each output port corresponding to a respective one of the transmit antennas, and the MIMO coding units perform MIMO coding with respect to output data from the mapping units.

According to the transmission device (8), with respect to MIMO using a plurality of fundamental bands, a transmitter is provided that exhibits a frequency diversity effect related to the fundamental bands, due to the S/P conversion unit allocating data included in the error correction coded frame to the output ports corresponding to all the fundamental bands.

A transmission device (9) is the transmission device (7) or the transmission device (8), wherein each one of the MIMO coding units performs MIMO coding using a pre-coding matrix, each pre-coding matrix having M rows and M columns.

According to the transmission device (9), with respect to MIMO using a plurality of fundamental bands, a transmitter is provided that exhibits a frequency diversity effect related to the fundamental bands, due to the S/P conversion unit allocating mapping data included in the error correction coded block or data included in the error correction coded frame to the output ports corresponding to all the fundamental bands, and due to the MIMO coding unit performing MIMO coding using the pre-coding matrix.

A transmission device (10) is the transmission device (1) or the transmission device (4), further comprising: a serial to parallel (S/P) conversion unit and a fundamental band interchange unit, wherein the number of the fundamental bands is equal to K, where K is a natural number greater than 1, and the number of transmit antennas is equal to M, where M is a natural number greater than 1, the S/P conversion unit has K output ports, each output port corresponding to a respective one of the fundamental bands, the S/P conversion unit allocates each of the data blocks of predefined length to one of the K fundamental bands, the error correction coding unit, the mapping unit, and the MIMO coding unit are each provided in a plurality such that each error correction coding unit, each mapping unit, and each MIMO coding unit corresponds to a respective one of the fundamental bands, each of the error correction coding units performs error correction coding on output data from the S/P conversion unit and thereby generates an error correction coded frame, and the fundamental band interchange unit, with respect to output data from one of the error correction coding units, the mapping units, and the MIMO coding units, interchanges each predefined unit length of the output data among the fundamental bands.

According to the transmission device (10), with respect to MIMO using a plurality of fundamental bands, a transmitter is provided that exhibits a frequency diversity effect related to the fundamental bands, due to the S/P conversion unit allocating each data block of a predefined length to the output ports corresponding to all of the fundamental bands, and interchange of each predefined unit length of output data from one of the error correction coding units, the mapping units, and the MIMO coding units among the fundamental bands.

A transmission device (11) is the transmission device (1) or the transmission device (4), further comprising: a serial to parallel (S/P) conversion unit; interleaving units; and a fundamental band interchange unit, wherein the number of the fundamental bands is equal to K, where K is a natural number greater than 1, and the number of transmit antennas is equal to M, where M is a natural number greater than 1, the S/P conversion unit has K output ports, each output port corresponding to a respective one of the fundamental bands, the S/P conversion unit allocates each of the data blocks of predefined length to one of the K fundamental bands, the error correction coding unit, the mapping unit, and the MIMO coding unit are each provided in a plurality such that each error correction coding unit, each mapping unit, and each MIMO coding unit corresponds to a respective one of the fundamental bands, each of the error correction coding units performs error correction coding on output data from the S/P conversion unit and thereby generates an error correction coded frame, each of the MIMO coding units has M output ports, and M corresponding interleaving units perform interleaving with respect to data outputted therefrom, and the fundamental band interchange unit, with respect to output data from one of the error correction coding units, the mapping units, and the interleaving units, interchanges each predefined unit length of the output data among the fundamental bands.

According to the transmission device (11), with respect to MIMO using a plurality of fundamental bands, a transmitter is provided that exhibits a frequency diversity effect related to the fundamental bands, due to the S/P conversion unit allocating each data block of a predefined length to the output ports corresponding to all of the fundamental bands, the interleaving units that correspond to the fundamental bands performing interleaving with respect to output data of the MIMO coding units, and interchange of each predefined unit length of output data from one of the error correction coding units, the mapping units, the MIMO coding units, and the interleaving units among the fundamental bands.

A transmission device (12) is the transmission device (10) or the transmission device (11), wherein each one of the MIMO coding units performs MIMO coding using a pre-coding matrix having M rows and M columns.

According to the transmission device (12), with respect to MIMO using a plurality of fundamental bands, a transmitter is provided that exhibits a frequency diversity effect related to the fundamental bands, due to the S/P conversion unit allocating each data block of a predefined length to the output ports corresponding to all of the fundamental bands, interchange of each predefined unit length of data of a fundamental band among the fundamental bands, and the MIMO coding units performing MIMO coding using the pre-coding matrix.

A transmission device (13) is the transmission device (1) or the transmission device (4), wherein the MIMO coding unit has a phase change unit that regularly changes a signal phase transmitted from at least one of the transmit antennas for each of the fundamental bands.

According to the transmission device (13), with respect to MIMO using a plurality of fundamental bands, a transmitter is provided that exhibits a reception quality improvement effect for data in a line of sight (LOS) environment in which direct waves are dominant in addition to a frequency diversity effect related to the fundamental bands, due to the MIMO coding unit regularly changing a signal phase transmitted from at least one of the antennas for each of the fundamental bands and due to the components of data included in the error correction coded block being allocated to at least two of the fundamental bands and transmitted.

A transmission device (14) is any one of the transmission device (7), the transmission device (8), or the transmission device (10), wherein at least one of the following is performed: in the MIMO coding units, different MIMO coding for each of the fundamental bands; in the MIMO coding units, MIMO coding using a different pre-coding matrix for each of the fundamental bands, the pre-coding matrices each having M rows and M columns; in the MIMO coding units, a signal phase is regularly changed for each of the fundamental bands; in the mapping units, mapping of a different pattern for each of the fundamental bands; and in the error correction coding units, error correction coding of a different pattern for each of the fundamental bands.

According to the transmission device (14), with respect to MIMO using a plurality of fundamental bands, a transmitter is provided that exhibits a reception quality improvement effect in addition to a frequency diversity effect related to the fundamental bands, due to correlation reduction related to transmission channel characteristics of the fundamental bands.

A transmission device (15) is the transmission device (11), wherein at least one of the following is performed: in the interleaving units, interleaving of a different pattern for each of the fundamental bands; in the MIMO coding units, different MIMO coding for each of the fundamental bands; in the MIMO coding units, MIMO coding using a different pre-coding matrix for each of the fundamental bands, the pre-coding matrices each having M rows and M columns; in the MIMO coding units, a signal phase is regularly changed for each of the fundamental bands, a signal phase pattern being different for each of the fundamental bands; in the mapping units, mapping of a different pattern for each of the fundamental bands; and in the error correction coding units, error correction coding of a different pattern for each of the fundamental bands.

According to the transmission device (15), with respect to MIMO using a plurality of fundamental bands, a transmitter is provided that exhibits a reception quality improvement effect in addition to a frequency diversity effect related to the fundamental bands, due to correlation reduction related to transmission channel characteristics of the fundamental bands.

A transmission device (16) is the transmission device (11), wherein the interleaving units perform interleaving of a different pattern for each of the fundamental bands, and M interleaving units corresponding to one fundamental band perform interleaving of the same pattern.

According to the transmission device (16), a transmitter is provided that, without increasing an amount of computation for MIMO de-mapping and in addition to a frequency diversity effect related to fundamental bands, exhibits a reception quality improvement effect due to correlation reduction related to transmission channel characteristics of the fundamental bands, due to the interleaving units performing interleaving of a different pattern for each of the fundamental bands and performing interleaving of the same pattern for each of the transmit antennas within a fundamental band.

A reception device (17) is a receiver that receives a signal transmitted by multiple-input multiple-output (MIMO) using a plurality of fundamental bands, components of data included in an error correction coded block in the signal being allocated to at least two of the fundamental bands, the receiver comprising: a demodulation unit for each of the fundamental bands, the demodulation unit performing demodulating; a MIMO de-mapping unit that performs MIMO de-mapping with respect to demodulated data; and an error correction decoding unit that performs error correction decoding with respect to output of the MIMO de-mapping unit.

According to the reception device (17) or a reception method (19) that is described below, a receiver (reception method) is provided such that a signal transmitted via MIMO using a plurality of fundamental bands is received, due to (i) the demodulation units (demodulation step) wherein demodulation for each of the fundamental bands is performed, (ii) the MIMO de-mapping units (MIMO de-mapping step) wherein MIMO de-mapping is performed with respect to data that is demodulated, and (iii) the error correction decoding unit (error correction decoding step) wherein error correction coding is performed with respect to the output of the MIMO de-mapping.

A transmission method (18) is a transmission method of performing multiple-input multiple-output (MIMO) transmission using a plurality of fundamental bands, comprising: performing error correction coding for each data block of predefined length, thereby generating an error correction coded frame; mapping each predefined number of bits in the error correction coded frame to a corresponding symbol and thereby generating an error correction coded block; and performing MIMO coding with respect to the error correction coded block, wherein components of data included in the error correction coded block are allocated to at least two of the fundamental bands and transmitted.

According to the transmission method (18), with respect to MIMO using a plurality of fundamental bands, a transmission method is provided that exhibits a frequency diversity effect related to the fundamental bands, due to the components of data included in the error correction coded block being allocated to at least two of the fundamental bands and transmitted.

A reception method (19) is a reception method of receiving a signal transmitted by multiple-input multiple-output (MIMO) using a plurality of fundamental bands, components of data included in an error correction coded block in the signal being allocated to at least two of the fundamental bands, the reception method comprising: performing demodulation of data for each of the fundamental bands; performing MIMO de-mapping with respect to demodulated data; and performing error correction decoding with respect to output of the MIMO de-mapping.

A transmission device (20) is a transmitter that has a function of executing communication via multiple-input multiple-output (MIMO), comprising: an error correction coding unit that performs error correction coding with respect to transmit data; a mapping unit that maps each predefined number of bits in data that is error correction coded to a corresponding modulated symbol, the mapping unit thereby generating mapping data; a MIMO coding unit that performs MIMO coding with respect to the mapping data; a control information generation unit that generates control information that includes a transmission parameter; a frame building unit that builds a transmission frame by including, within the same orthogonal frequency division multiplexing (OFDM) symbol, MIMO coded data outputted from the MIMO coding unit and the control information; and an OFDM signal generation unit that applies an OFDM scheme with respect to the transmission frame, wherein MIMO coding is not performed with respect to the control information, and the control information is transmitted as the same content from multiple transmit antennas or the control information is transmitted from one transmit antenna.

According to the transmission device (20), a transmitter is provided that allows introduction of a new scheme using MIMO without adversely affecting receivers of a SISO scheme, due to building a transmission frame by including, within the same OFDM symbol, MIMO coded data and control information that includes a transmission parameter, and, without performing MIMO coding with respect to the control information, transmitting the control information as the same content from multiple transmit antennas or transmitting the control information from one transmit antenna.

A transmission device (21) is the transmission device (20), wherein the number of transmit antennas used for MIMO is equal to M, where M is a natural number greater than 1, the MIMO coding unit has M output ports, each output port corresponding to a respective one of the transmit antennas, and the transmitter further comprises M interleaving units, each one of the interleaving units performing interleaving with respect to data outputted from respective one of the M output ports.

According to the transmission device (21), a transmitter is provided that allows introduction of a new scheme using MIMO without adversely affecting receivers of a SISO scheme, due to each of the output ports of the MIMO coding unit corresponding to a respective one of the transmit antennas, and the transmitter further including an interleaving unit for each of the output ports.

A transmission device (22) is the transmission device (21), wherein the M interleaving units perform interleaving of the same pattern.

According to the transmission device (22), a transmitter is provided that allows introduction of a new scheme without adversely affecting receivers of a SISO scheme and uses interleaving that has a high compatibility with SISO schemes, due to each of the output ports of the MIMO coding unit corresponding to a respective one of the transmit antennas, and the transmitter further comprising the interleaving units that perform interleaving of the same pattern with respect to data from each of the output ports.

A transmission device (23) is the transmission device (20), wherein the number of transmit antennas used for MIMO is two, and each of the transmit antennas has a different polarity.

According to the transmission device (23), a transmitter is provided that exhibits a polarity diversity effect in a new scheme using MIMO, due to the number of transmit antennas used for MIMO being two, and each of the transmit antennas having a different polarity.

A transmission device (24) is the transmission device (20), wherein the components of data included in the mapping data are allocated to and transmitted from all the transmit antennas.

According to the transmission device (24), a transmitter is provided that exhibits a spatial (antenna) diversity effect in a new scheme that uses MIMO, due to each component of data included in mapping data being allocated to and transmitted from all the transmit antennas.

A transmission device (25) is the transmission device (20) or the transmission device (24), wherein the number of transmit antennas is equal to M, where M is a natural number greater than 1, the MIMO coding unit has M output ports, each output port corresponding to a respective one of the transmit antennas, and the components of data included in the mapping data are outputted from all of the M output ports.

According to the transmission device (25), a transmitter is provided that exhibits a spatial (antenna) diversity effect in a new scheme that uses MIMO, due to the MIMO coding unit outputting each component of data included in mapping data to the output ports corresponding to every antenna.

A transmission device (26) is the transmission device (25), wherein the MIMO coding unit performs MIMO coding using a pre-coding matrix, the pre-coding matrix having M rows and M columns.

According to the transmission device (26), a transmitter is provided that exhibits a spatial (antenna) diversity effect in a new scheme that uses MIMO, due to the MIMO coding unit using the pre-coding matrix and outputting each component of data included in mapping data to the output ports corresponding to every antenna.

A transmission device (27) is the transmission device (20) or the transmission device (24), wherein the MIMO coding unit has a phase change unit that regularly changes a signal phase transmitted from at least one of the transmit antennas.

According to the transmission device (27), a transmitter is provided that, in a new scheme using MIMO, exhibits a reception quality improvement effect for data in a line of sight (LOS) environment in which direct waves are dominant, in addition to a spatial (antenna) diversity effect, due to the MIMO coding unit regularly changing a signal phase transmitted from at least one antenna and due to components of data included in mapping data being allocated to every transmit antenna and transmitted.

A transmission device (28) is the transmission device (20), further comprising a hierarchical layer division unit and a segment division unit, wherein the hierarchical layer division unit divides the transmit data into L hierarchical layers, where L is a natural number greater than 1, the MIMO coding unit is provided in a plurality such that each MIMO coding unit corresponds to a respective one of the layers, the segment division unit divides a transmission band into Q segments, where Q is a natural number greater than 1, and allocates the MIMO coded data in each hierarchical layer to one of the segments, and the frame building unit builds a transmission frame by including, within the same segment, data outputted from the segment division unit and the control information.

According to the transmission device (28), a transmitter is provided that allows introduction of a new scheme using MIMO without adversely affecting receivers of a SISO scheme that supports hierarchical layers and segmentation, due to division into hierarchical layers and segmentation, and building of a transmission frame by including, within the same segment, MIMO coded data and control information.

A transmission device (29) is the transmission device (20), further comprising: a hierarchical layer division unit; multiple-input multiple-output/single-input single-output (MIMO/SISO) coding units; and a segment division unit, wherein the transmitter has a function of executing communication via SISO, the hierarchical layer division unit divides the transmit data into L hierarchical layers, where L is a natural number greater than 1, each of the MIMO/SISO coding units corresponds to a respective one of the hierarchical layers, and performs MIMO coding or SISO coding with respect to the mapping data, the segment division unit divides a transmission band into Q segments, where Q is a natural number greater than 1, and allocates coded data in each hierarchical layer to a different one of the segments, the coded data being either MIMO coded data or SISO coded data, and the frame building unit builds a transmission frame by including, within the same segment, data outputted from the segment division unit and the control information.

According to a transmission device (29), a transmitter is provided that allows co-existence of a SISO scheme and a new scheme using MIMO, and easy introduction of the new scheme, due to MIMO or SISO coding being performed for each hierarchical layer, the segment division unit allocating MIMO or SISO coded data of each hierarchical layer to a different segment, and the frame building unit building a transmission frame by including, within the same segment, data outputted from the segment division unit and the control information.

A transmission device (30) is the transmission device (29), wherein the hierarchical layer division unit divides basic information and extended information of the transmit data into different ones of the hierarchical layers, a MIMO/SISO coding unit of a hierarchical layer to which the basic information is allocated performs SISO coding, a MIMO/SISO coding unit of a hierarchical layer to which the extended information is allocated performs MIMO coding, the basic information is independently decodable, and the extended information is decodable when combined with the basic information.

According to the transmission device (30), a transmitter is provided that allows reception of hierarchical layers of the basic information by receivers that support a SISO scheme, and reception of hierarchical layers of the basic information and the extended information by receivers that support a new scheme using MIMO, due to SISO coding being performed with respect to hierarchical layers of the basic information of transmit data, and MIMO coding being performed with respect to hierarchical layers of the extended information of transmit data.

A transmission device (31) is the transmission device (29), wherein the control information generation unit generates, for each hierarchical layer, control information that indicates MIMO or SISO.

According to the transmission device (31), a transmitter is provided that allows a SISO scheme and a new scheme using MIMO to coexist, and easy introduction of the new scheme, due to generation, for each hierarchical layer, of the control information that indicates MIMO or SISO.

A transmission device (32) is the transmission device (29), further comprising: a pilot signal generation unit that generates pilots signals by using a different pilot signal pattern for a segment to which MIMO coded data is allocated and a segment to which SISO coded data is allocated.

According to the transmission device (32), a transmitter is provided that allows a SISO scheme and a new scheme using MIMO to coexist, and easy introduction of the new scheme, due to generation of a different pilot signal pattern for a segment to which MIMO coded data is allocated and a segment to which SISO coded data is allocated.

A transmission device (33) is the transmission device (32), wherein the pilot signal generation unit, with respect to the lowest frequency sub-carrier of segments to which MIMO coded data is allocated, deploys a continual pilot (CP) signal to one transmit antenna, and deploys a null signal to all other transmit antennas.

According to the transmission device (33), a transmitter is provided that allows a SISO scheme and a new scheme using MIMO to coexist, and easy introduction of the new scheme, due to, with respect to the lowest frequency sub-carrier of segments to which MIMO coded data is allocated, deploying of the CP signal to the one transmit antenna and deploying of the null signal to all the other transmit antennas.

A transmission device (34) is the transmission device (28) or the transmission device (29), further comprising: a different correction coding hierarchical layer allocation unit that allocates at least one portion of the transmit data to a hierarchical layer on which error correction coding is to be performed that is different from error correction coding to be performed on another hierarchical layer, generates timing information, and outputs the timing information with the at least one portion of the transmit data, wherein the error correction coding unit performs error correction coding by accumulating output data from the different correction coding hierarchical layer allocation unit and storing the timing information in a header as information bits.

According to the transmission device (34), a transmitter is provided that allows easy introduction of a new scheme using MIMO and/or MISO using a different error correction coding method to SISO, due to division into hierarchical layers and segmentation of transmit data, and the different correction coding hierarchical layer allocation unit allocating the at least one portion of the transmit data to a hierarchical layer on which error correction coding is to be performed that is different from error correction coding to be performed on another hierarchical layer, generating timing information, and outputting the timing information with the at least one portion of the transmit data.

A transmission device (35) is the transmission device (28) or the transmission device (29), wherein the frame building unit uses the same sub-carrier arrangement pattern of the control information for all segments.

According to the transmission device (35), a transmitter is provided that allows introduction of a new scheme using MIMO and/or MISO without adversely affecting receivers of a SISO scheme that supports hierarchical layers and segmentation, due to use of the same sub-carrier arrangement pattern of the control information for all the segments.

A reception device (36) is a receiver that has a function of executing communication via multiple-input multiple-output (MIMO), comprising: a reception unit that receives a transmission frame in which MIMO coded data and control information that includes transmission parameters are included within the same orthogonal frequency-division multiplexing (OFDM) symbol; a control information decoding unit that decodes the control information and acquires the transmission parameters; and a transmitted data demodulation unit that demodulates the MIMO coded data based on the transmission parameters, wherein MIMO coding is not performed with respect to the control information, and the control information is transmitted as the same content from multiple transmit antennas or the control information is transmitted from one transmit antenna.

According to the reception device (36) or a reception method (38) that is described below, a receiver (reception method) is provided such that a signal is received, the signal being transmitted via MIMO such that MIMO coded data and control information that includes transmission parameters are included within the same OFDM symbol, due to (i) the control information decoding unit (control information decoding step) wherein the control information is decoded and transmission parameters are acquired, and (ii) the transmitted data demodulation unit (transmitted data demodulation step) wherein the MIMO coded data is demodulated based on the transmission parameters.

A transmission method (37) is a transmission method of a transmitter that has a function of executing communication via multiple-input multiple-output (MIMO), comprising: performing error correction coding with respect to transmit data; mapping each predefined number of bits in data that is error correction coded to a corresponding modulated symbol, thereby generating mapping data; performing MIMO coding with respect to the mapping data; generating control information that includes a transmission parameter; building a transmission frame by including, within the same orthogonal frequency division multiplexing (OFDM) symbol, MIMO coded data generated by the MIMO coding and the control information; and generating an OFDM signal by applying OFDM with respect to the transmission frame, wherein MIMO coding is not performed with respect to the control information, and the control information is transmitted as the same content from multiple transmit antennas or the control information is transmitted from one transmit antenna.

According to the transmission method (37), a transmission method is provided that allows introduction of a new scheme using MIMO without adversely affecting receivers of a SISO scheme, due to a transmission frame being built by including, within the same OFDM symbol, MIMO coded data and control information that includes a transmission parameter, and, without MIMO coding being performed with respect to the control information, the control information being transmitted as the same content from multiple transmit antennas or the control information being transmitted from one transmit antenna.

A reception method (38) is a reception method of a receiver that has a function of executing communication via multiple-input multiple-output (MIMO), comprising: receiving a transmission frame in which MIMO coded data and control information are included within the same orthogonal frequency-division multiplexing (OFDM) symbol; decoding the control information and acquiring the transmission parameters; and demodulating the MIMO coded data based on the transmission parameters, wherein MIMO coding is not performed with respect to the control information, and the control information is transmitted as the same content from multiple transmit antennas or the control information is transmitted from one transmit antenna.

INDUSTRIAL APPLICABILITY

The transmission device, transmission method, reception device, reception method, integrated circuit, and program pertaining to the present invention can be applied to MIMO.

REFERENCE SIGNS LIST

100, 150, 300, 500, 700, 900, 1100, 1300, 2000, 3000, 3600, 4000, 4300, 5000 transmitter
200, 250, 270, 400, 450, 600, 650, 800, 850, 1000, 1050, 1400, 1450, 3500, 3800 receiver
240, 241, 242, 440, 441, 640, 641, 840, 841, 1040, 1041, 1440, 1441, 3341, 3541, 3841 integrated circuit
131, 132, 331, 332, 333, 334, 531, 532, 731, 732, 931, 932, 1131, 1132, 2031 MIMO-PLP processing unit
141, 142, 341, 342, 343, 344, 541, 542, 941, 942, 1141, 1142, 1341, 2041 L1 information processing unit
151, 1351, 2051, 3101, 5101 frame building unit
161, 2061, 5111 OFDM signal generation unit
191, 2091, 5121 D/A conversion unit
196, 198, 2096, 5131 frequency conversion unit
2071 input processing unit
572, 582, 2072, 2082 FEC coding unit
233, 633, 3333, 3833 FEC decoding unit
373, 383, 2073, 2083, 5241 mapping unit
176, 177, 376, 377, 2076, 3261 MIMO coding unit
232, 235, 432, 434 MIMO de-mapping unit
174, 2074 interleaving unit
181, 1381, 2081 L1 information generation unit
205, 206, 3305 tuner unit
208, 209, 3308 A/D conversion unit
211, 212, 3311, 3511 demodulation unit
215 frequency de-interleaving/L1 information de-interleaving unit
591, 991, 1191 frequency channel interchange unit 637, 1037 frequency channel inverse interchange unit
221, 222 PLP de-interleaving unit
231 selection unit
214, 378, 379, 581 S/P conversion unit
435, 635, 1435 P/S conversion unit
595, 1195, 3271 selector
1210, 4210 TS generation unit
1321 PLP allocation unit
1221, 4221 audio coding unit
1222, 4222 video coding unit
1223, 4223 packetization unit
1224, 4224 packetized stream multiplexing unit
1225, 4225 L2 information processing unit
3300 ISDB-T receiver
3611, 4011, 4311, 5011 TS re-multiplexing unit
5021 RS coding unit
3631, 5031 hierarchical layer division unit
3041, 5041 hierarchical layer processing unit
5051 hierarchical layer combining unit
5061 time interleaving unit
5071 frequency interleaving unit
3081, 5081 pilot signal generation unit
3091, 3691, 5091 TMCC/AC signal generation unit
5201 energy dispersal unit
5211 byte interleaving unit
5221 convolutional coding unit
3731, 5231 bit interleaving unit
3251 MISO coding unit
3315 frequency de-interleaving unit
3321 time de-interleaving unit
3331, 3531, 3831 multiple hierarchical layer TS reproduction unit
3335, 3535 TMCC signal decoding unit
3401 SISO de-mapping unit
3411, 3911 bit de-interleaving unit
3421 de-puncture unit
3431 TS reproduction unit
3441 Viterbi decoding unit
3451 byte de-interleaving unit
3461 energy dispersal inversion unit
3471 RS decoding unit
3501, 3801 SISO/MISO/MIMO de-mapping unit
3635 LDPC hierarchical layer allocation unit
3645 LDPC hierarchical layer processing unit
3711 BCH coding unit
3721 LDPC coding unit
3941 LDPC decoding unit
3971 BCH decoding unit
3981 LDPC hierarchical layer/non-LDPC hierarchical layer combining unit
4005 hierarchical layer allocation unit
5301 segment division unit
5311 inter-segment interleaving unit
5321 intra-segment carrier rotation unit
5331 intra-segment carrier randomizing unit

The invention claimed is:

1. A transmission device comprising:
a processor; and
a non-transitory computer-readable storage medium comprising instructions that when executed by the processor are configured to cause the transmission device to convert a data stream to a plurality of baseband frames, allocate each baseband frame of the plurality of baseband frames to a first group or a second group, generate a first cell data series from the baseband frames of the first group such that the first cell data series consists of first exchanged cells and first non-exchanged cells, the first exchanged cells and the first non-exchanged cells being alternately arranged,
generate a second cell data series from the baseband frames of the second group such that the second cell data series consists of second exchanged cells and second non-exchanged cells, the second exchanged cells and the second non-exchanged cells being alternately arranged,
exchange the first exchanged cells with the second exchanged cells, respectively, to generate a first exchanged cell data series and a second exchanged cell data series,
transmit the first exchanged cell data series at a first fundamental channel, and
transmit the second exchanged cell data series at a second fundamental channel, the second fundamental channel having a different frequency from the first fundamental channel.

2. A transmission method comprising:
converting a data stream to a plurality of baseband frames,
allocating each baseband frame of the plurality of baseband frames to a first group or a second group,
generating a first cell data series from the baseband frames of the first group such that the first cell data series consists of first exchanged cells and first non-exchanged cells, the first exchanged cells and the first non-exchanged cells being alternately arranged,
generating a second cell data series from the baseband frames of the second group such that the second cell data series consists of second exchanged cells and second non-exchanged cells, the second exchanged cells and the second non-exchanged cells being alternately arranged,
exchanging the first exchanged cells with the second exchanged cells, respectively, to generate a first exchanged cell data series and a second exchanged cell data series,
transmitting the first exchanged cell data series at a first fundamental channel, and
transmitting the second exchanged cell data series at a second fundamental channel, the second fundamental channel having a different frequency from the first fundamental channel.

3. The transmission device according to claim 1, wherein the first exchanged cells each have an odd sequence number and the first non-exchanged cells each have an even sequence number, and
wherein the second exchanged cells each have an odd sequence number and the second non-exchanged cells each have an even sequence number.

4. The transmission method according to claim 2, wherein the first exchanged cells each have an odd sequence number and the first non-exchanged cells each have an even sequence number, and
wherein the second exchanged cells each have an odd sequence number and the second non-exchanged cells each have an even sequence number.

5. The transmission method according to claim 2, wherein the first exchanged cell data series and the second exchanged cell data series are transmitted through a single antenna.

* * * * *